United States Patent [19]

Stark et al.

[11] Patent Number: 5,068,814

[45] Date of Patent: Nov. 26, 1991

[54] INTERACTIVE ADAPTIVE INFERENCE SYSTEM

[75] Inventors: William D. Stark, Ithaca; Gregory C. Prestas, Candor, both of N.Y.

[73] Assignee: Array Analysis, Inc., Ithaca, N.Y.

[21] Appl. No.: 433,612

[22] Filed: Nov. 7, 1989

[51] Int. Cl.$^5$ .................. G05B 19/02; 31/28
[52] U.S. Cl. .................. 364/580; 371/22.1; 371/26; 395/916
[58] Field of Search .............. 364/580, 579, 138, 188, 364/480, 481, 483, 554, 513; 371/21.4, 21.6, 22.1, 22.4, 23, 24, 15.1, 26, 29.1; 324/77 R, 77 A, 114, 121 R, 158 R

[56] References Cited

U.S. PATENT DOCUMENTS

| | | | |
|---|---|---|---|
| 4,168,527 | 9/1979 | Winkler | 364/580 |
| 4,194,113 | 3/1980 | Fulks et al. | 371/22.4 |
| 4,601,033 | 7/1986 | Whelan | 371/22.4 |
| 4,651,088 | 3/1987 | Sawada | 371/22.1 |
| 4,656,632 | 4/1987 | Jackson | 364/580 X |
| 4,709,366 | 11/1987 | Scott et al. | 371/20 |
| 4,766,595 | 8/1988 | Gollomp | 371/23 |
| 4,769,817 | 9/1988 | Krohn et al. | 371/23 |
| 4,841,456 | 6/1989 | Hogan, Jr. et al. | 364/550 |
| 4,847,795 | 7/1989 | Baker et al. | 364/579 |
| 4,857,833 | 8/1989 | Gonzalez et al. | 364/482 X |

Primary Examiner—Joseph L. Dixon
Attorney, Agent, or Firm—Salzman & Levy

[57] ABSTRACT

A human interactive adaptive inference system for testing electric or electronic devices or assemblies. The system includes a testing mechanism for performing position-dependent, time-ordered tests upon electrical or electronic devices or assemblies. The testing mechanism provides a test data array. The testing mechanism has manually provided test parameters and is adapted to operate under at least one of a plurality of operating modes. A reference array is also provided to contain acceptable data for comparison with test data. A reference comparator is connected to the test data array and to the reference array for providing a diagnostic analysis of the electrical or electronic device or assemblies.

4 Claims, 6 Drawing Sheets

INTERACTIVE ADAPTIVE INFERENCE SYSTEM

RELATED APPLICATIONS

The present invention is particularly directed to use in an adaptive inference testing system which will employ varying features and functions, described in differing aspects in any one or more of the following copending patent applications, including this one, all filed concurrently and assigned to the present assignee: U.S. Ser. No. 433,612 for "INTERACTIVE ADAPTIVE INFERENCE SYSTEM"; U.S. Ser. No. 433,591 for "SYSTEM FOR DISPLAYING ADAPTIVE INFERENCE TESTING DEVICE INFORMATION"; U.S. Ser. No. 433,608 for "ARRAY STRUCTURE FOR USE IN AN ADAPTIVE INFERENCE TESTING DEVICE"; U.S. Ser. No. 433,335 for "METHOD FOR CALCULATING ADAPTIVE INFERENCE TEST FIGURE OF MERIT"; U.S. Ser. No. 433,594 for "UNPREDICTABLE FAULT DETECTION USING ADAPTIVE INFERENCE TESTING TECHNIQUES".

BACKGROUND OF THE INVENTION

The present invention relates to a system for testing electric or electronic devices or assemblies and, more particularly, an adaptive inference system that allows a user to test such devices interactively.

In the field of electronics in general and in printed circuit board assembly in particular, electronic components are generally mounted, affixed, plugged into or otherwise associated with printed circuit boards. Such electronic components may be analog devices, digital devices, integrated circuits and the like.

The boards, in turn, usually have electrical contacts along one or more sides thereof for plugging into connectors. On a typical personal computer, for example, some five to ten boards are provided and are associated, by means of connectors, with a so-called mother board. Of course, more sophisticated machines would tend to have a greater number of boards and less sophisticated instruments would have tend to have fewer boards.

As the technology of electronic devices advances and as the consumer market for advanced products matures, not only does the functional complexity and the number of manufactured machines increase, but so too may the number of components per board increase. This makes it difficult to directly access all of the test points required to test a loaded board completely.

Finally, components mounted on the boards become ever more powerful and more difficult to test as new functions are required.

It therefore has become increasingly important to enhance procedures for testing proper operation of components, boards and machines. To the extent that such testing procedures can be improved, more efficient methods and more accurate methods are ensured.

For purposes of this description, the term "adaptive inference" means the ability to predict the cause of a previously unobserved fault from the relationships with other known fault information.

Also for purposes of this description, the term "unit under test (UUT)" is used to identify any component or assembly to be tested. Heretofore, UUTs were tested by technicians with the aid of certain instruments as simple as a voltmeter or as complex as a mainframe computer. Such testing methods were necessarily time consuming and labor intensive.

More recently, programmable systems have been used to test specific UUTs. These systems tend to be more efficient than manual methods, by allowing a greater number of UUTs to be tested in a given amount of time. But in order to use these programmable systems to test every possible condition of a component or board, every possible stimulant must be applied to the UUT and every possible response must be analyzed or at least compared with its associated proper reference response.

Even on a simple UUT, unanticipated problems can arise in many ways. Previous methods required a test engineer to program each of these possible faults into a machine. This required enormous amounts of programming. Over 25,000 lines of code and six months of effort were not unusual.

The present invention eliminates this programming effort for fault isolation by mathematically comparing a new fault to previously stored faults. A figure of merit is derived and displayed to indicate likely causes and closeness to known faults.

For instance, a certain circuit node may be shorted to ground and the faults recorded and stored in memory. When the same node is shorted to $+5v$, the acquired data is not going to be identical, but may be very close. In a traditional programming environment, two separate programs would be needed to cover both those cases. But the present invention indicates a high probability (figure of merit) that the indicated node is the source of the fault.

Powerful display tools in accordance with the present invention, such as waveform displays with color highlighting to show discrepancies, aid in localizing the troublesome area. A figure of merit less than 100% for faults never before experienced can signal the operator to investigate.

In the above example, when the operator discovers that a node is stuck high (not grounded), with a single keystroke the new fault can be added to memory. If the fault occurs again, the message displayed indicates this new fault with a high figure of merit: that same node is likely to be stuck to $+5v$. The next time the test is run with the same node stuck high, the system displays the message and indicates the second most likely diagnosis is the same node stuck low with a figure of merit less than 100%.

In this way, the system accumulates a representation of knowledge that it has gained in the past. It can infer things it has never seen. It operates similarly to the way that a human operator would debug a circuit. Moreover, the system improves with time and, of course, it never forgets.

A particularly vexing problem relates to the fact that test systems of the prior art have predetermined (i.e., predefined or programmed) input and output parameters that require a great deal of programming. Thus, a test, once released to production, cannot be easily modified. There is little or no opportunity to vary the test and no opportunity to learn from previous testing activities without reprogramming. Moreover, prior art test systems do not permit more than cumbersome rudimentary interaction with the human technician responsible for locating and repairing faults on UUTs.

The result, while adequate for a relatively few, predictable, selected fault conditions, is woefully inadequate for sophisticated, complex electronic devices, having a great number of possible and unanticipated failure modes, each resulting in a different response. In short, what is missing in prior art test systems is the ability to incorporate human judgement in a test system that learns.

U.S. Pat. No. 4,766,595 issued to Gollomp discloses a system for diagnosing faults in a UUT using behavior models to incorporate design knowledge of a UUT to run diagnostic tests. The system is capable of being used with automatic test equipment and providing test programs for automatic test. Test data is applied in a feedback arrangement to improve fault diagnosis.

U.S. Pat. No. 4,709,366 issued to Scott et al. discloses a system for isolating circuit faults in an electronic system and guides a technician node by node on a UUT to the source of failure. A computer provides stimulus patterns, and responses at the nodes are measured using a probe. A tailored signal for the node being probed is applied and the response is compared to a predetermined response and either a failure or probe next node response is generated. The computer displays clues to the technician to determine which node is most apt to be defective.

U.S. Pat. No. 4,847,795 issued to Baker et al. discloses a system for diagnosing electronic assembly defects. The system has a knowledge base for storing information on UUT and receiving current test failure. The system has a pattern search which compares current test data to stored information. A voting section recommends a repair process. The knowledge base is updated with information as to whether or not the repair eliminated the defect.

U.S. Pat. No. 4,841,456 issued to Hogan, Jr., et al. discloses a system in which an artificial intelligence system is interfaced with an automatic test system such that the actions of the AI are indistinguishable from those of a human operator. The automatic testing system includes an automatic test equipment controller, at least one test instrument and a UUT. There is a storage means for storing a functional test procedure (FTP) for the UUT. The FTP data set contains the results obtained by executing the FTP. An expert system means processes the FTP data and indicates when a failure has occurred and, if possible, the defective UUT portion that may have caused the failure. The expert system means produces output data identifying the defective UUT portion. The automatic test system may also comprise a diagnostic test procedure for the UUT should the expert system determine that further testing is required.

U.S. Pat. No. 4,857,833 issued to Gonzales et al, discloses a system which determines which of a plurality of electrical devices connected to a node of a circuit under test is causing a failure. The node is driven one device at a time and passive voltages at the node are taken for each device. The different device voltages are measured and analyzed to identify which device is causing the failure.

It would be advantageous to provide an interactive system for testing electronic components and assemblies.

It would also be advantageous to provide an interactive test system using adaptive inference techniques.

It would also be advantageous to provide an interactive test system in which reference data can be compared to test data.

It would also be advantageous to provide an interactive test system in which human judgment is incorporated in an adaptive inference system.

It would also be advantageous to provide an interactive test system using adaptive inference techniques in which a human operator may evaluate detected faults and respond thereto.

It would also be advantageous to provide an interactive test system having adaptive inference techniques in which a human operator can add newly discovered faults to a fault database so that future diagnostic analyses can include newly discovered faults.

SUMMARY OF THE INVENTION

In accordance with the present invention, there is provided a human interactive adaptive inference system for testing electric or electronic devices or assemblies. The system includes a testing mechanism for performing position-dependent, time-ordered tests upon electrical or electronic devices or assemblies. The testing mechanism provides a test data array. The testing mechanism is adapted to operate under at least one of a plurality of operating modes. A reference array is also provided to contain acceptable data for comparison with test data. The reference array is generated as a function of human judgment. A reference comparator is connected to the test data array and to the reference array for providing a diagnostic analysis of the electrical or electronic devices or assemblies.

BRIEF DESCRIPTION OF THE DRAWINGS

A complete understanding of the present invention may be obtained by reference to the accompanying drawings, when taken in conjunction with the detailed description thereof and in which.

DESCRIPTION OF THE PREFERRED EMBODIMENT

Figure 1:
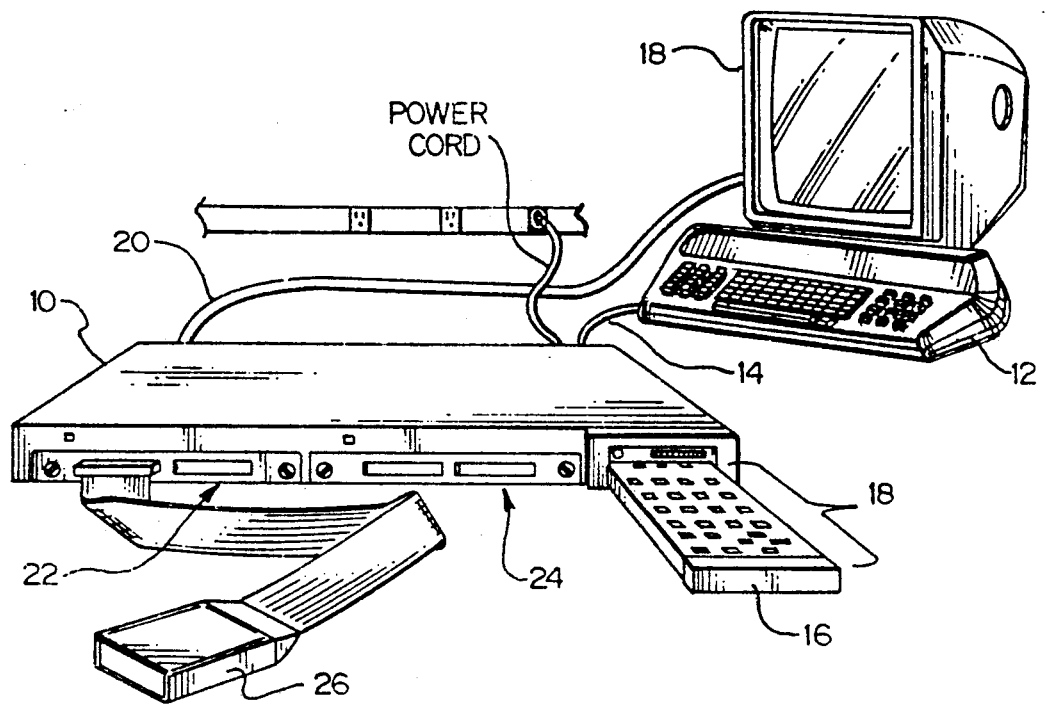
FIG. 1 is a perspective view of the MFI and MCP of the present invention.

Referring now to FIG. 1, there is illustrated the preferred physical embodiment of the present invention. The invention includes a microprocessor-based Multifunction Instrument (MFI) 10.

The MFI 10 supplies system control and power and can perform complex tasks without requiring a host PC 12, such as is manufactured by IBM CORP. However, when the MFI 10 is connected to inferential software, described hereinbelow, which is hosted on the PC 12, other testing functions can be performed, as described herein. The MFI chassis provides an optional printer connector, not shown, communications connector 14, and a GPIB connector, not shown.

A keypad 16 is built into the MFI chassis providing an input interface for stand alone operation. The keypad 16 contains function keys 18 used to respond to MFI menus and data displays, described later herein.

A video monitor 18 is connected to the MFI 10 via a monitor cable 20. The video monitor 18 is used during stand alone operation to view data displays and menus, described later herein.

The MFI chassis has two hardware modules called plug-ins 22 and 24 that configure the MFI 10. There are plug-ins 22 and 24 for data acquisition, pattern generation, EPROM programming, EPROM emulation and other functions. The MFI 10 must have at least one plug-in (two plug-ins are shown in the FIGURE) 22 and 24 installed in order to operate as a testing tool.

Connected to the plug-ins 22 and 24, in turn, are probes 26, at least one or two for each plug-in 22 and 24, only one of which is shown in FIG. 1. Different types of probes 26 can be used with a particular type of plug-in 22 and 24 to achieve different functions.

Figure 2:
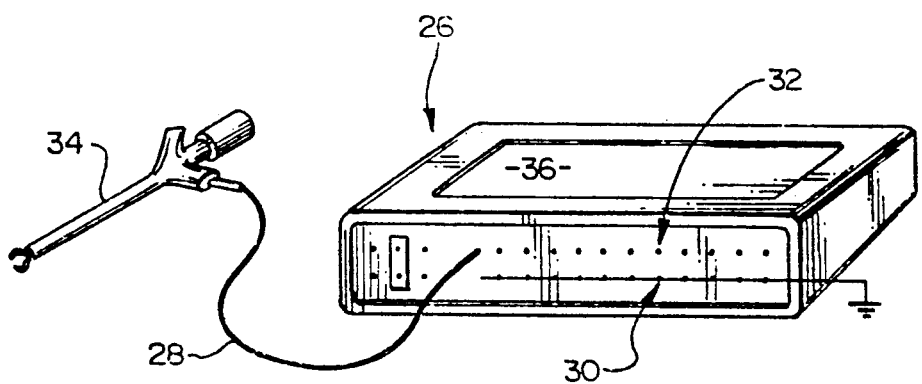
FIG. 2 is a perspective view of the probe assembly.

Referring now also to FIG. 2, there is shown a perspective view of the probe assembly. Probes 26 extend from the plug-ins 22 and 24 (FIG. 1) to test leads 28 attachable to a unit under test (UUT), not shown. In this way, probes are the conduit between the UUT and the MFI 10. Probes 26 contain a set of ground pins 30 and signal pins 32 that are connected by means of test clips 34 to the UUT. Each plug-in 22 and 24 and probe 26 must be correctly matched to perform desired functions (e.g., data acquisition, pattern generation, and continuity testing). A label 36 identifies the function of the probe 26.

Figure 3:
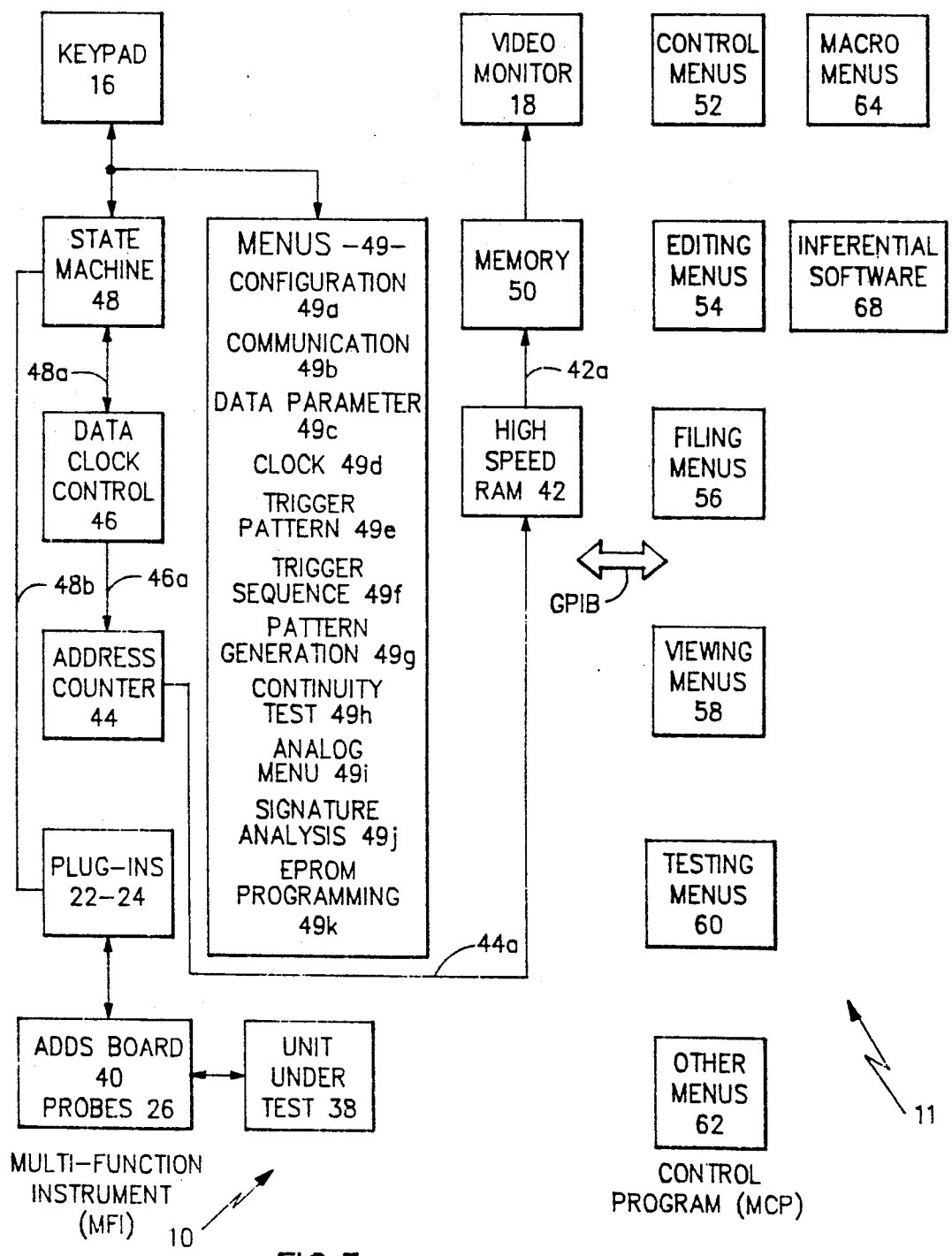
FIG. 3 is a block diagram of the MFI and MCP of the present invention.

Referring now to FIG. 3, there is shown a block diagram of the preferred embodiment of the present invention. The inventive circuit testing tool has the microprocessor-based Multifunction Instrument (MFI) 10 connected to an MFI Control Program (MCP) 11 by means of a GPIB interface (shown by arrow), which MCP 11 is hosted on the personal computer 12 (FIG. 1). A printout to the MCP program listing is provided as Appendix A, filed with the aforementioned patent application titled "Interactive Adaptive Inference System", and is herein incorporated by reference.

Connected to MFI 10 is a unit under test (UUT) 38. UUT 38 may be a large, complex printed circuit board, not shown, or a smaller component that may be disposed on or near such a board. It should also be understood that such a component can be displaced from a larger assembly or disconnected entirely therefrom. Any electrical or electronic device or assembly can be used with the system.

The MFI 10 contains a high speed random access memory 42, an address counter 44, a data clock control 46, a state machine 48 and buffer memory 50. State machine 48 is connected to data clock control 46 by means of lines 48a. Data clock control 46 is connected to address counter 44 by means of lines 46a. State machine 48 is connected to plug-ins 22 and 24 by means of lines 48b.

Address counter 44 is connected to RAM 42 by means of lines 44a. RAM 42 is connected to memory 50 by means of line 42a.

Connected to plug-ins 22 and 24 are probes 26 and Analog/Digital/Drive/Sensor (ADDS) boards 40.

The MFI 10 operates as a logic analyzer, digital pattern generator, continuity tester, signature analyzer, microprocessor, disassembler, digital storage oscilloscope, analog waveform generator, EPROM programmer or EPROM emulator. These functions can be controlled by the MFI 10 in the stand alone mode or by the MCP 11 in the coupled mode. When the MFI 10 is coupled with the MCP 11, the combination of devices can run automatic tests and can learn from the results of completed tests.

MFI 10 runs an internal firmware program generating menus and data displays; responding to keypad inputs (stand alone mode); controlling the operation of the address counter 44, data clock 46, ADDS boards 40, and trigger control 48; and responding to the control status and data communication from the host PC 12 running MCP software.

A plurality of MFI's may be stacked. When in this mode, one MFI 10 acts as the master processor controlling interfaces, not shown, between the other processors.

The multiple MFI's can simultaneously acquire (read) and generate (write) digital and analog data, not shown. Data is acquired or sent via the ADDS boards 40. The MFI 10 typically contains several digital and analog ADDS boards 40. The functionality of ADDS boards 40 (analog/digital, drive/sense) is controlled via MFI menus, described in greater detail hereinbelow. Attached to the ADDS boards 40 are the plug-ins 22 and 24, used to configure the MFI 10 for the data acquisition or pattern generation.

Data output to or input from the UUT 38 via the ADDS boards 40, plug-in 22 and 24, and probes 26 is resident in the RAM 42. The RAM 42 is structured into 96 channels with each channel being 2K samples deep. All data is stored in the RAM 42. Such data is stored in the RAM 42 as digital data, but represents the analog form. That is, analog data input is converted to digital form prior to storage in RAM 42 and converted from digital to analog form when output from RAM 42. RAM control is performed by the address counter 44, data clock control 46 and trigger control 48.

The MFI 10 operates in three states:
a) an IDLE state where the data clock 46 is OFF, the address counter 44 is OFF, and no data is being written to or read from the RAM 42;
b) an ARMED state where the data clock 46 is ON or halted, the address counter 44 is ON and data is being written to or read from the RAM 42; and
c) a TRIGGERED state where the data clock 46 is Stopped, the address counter 44 is stopped, and the contents of the RAM 42 are Frozen.

When the MFI 10 is ARMED, it is active either generating data for or acquiring data from the UUT 38.

The trigger control 48 determines the length of time the data clock 46 will be operable (i.e., how long the MFI 10 will be ARMED). Trigger control 48 monitors the acquired data searching for sequences of trigger patterns.

A trigger pattern is a combinational state of the acquisition channels of the MFI 10. States can be high, low or "don't care". Several trigger patterns can be used simultaneously. Once the specified sequence of trigger patterns has been recognized, the MFI 10 enters a TRIGGERED state. The state machine 48 counts the number of samples past the trigger event.

Several triggers can be used to start and stop data collection. Once the RAM 42 is full or the last trigger is reached, the data clock 46 and address counter 44 are stopped and the RAM 42 frozen. The MFI 10 reads the contents of the RAM 42 into local memory 50.

Once data is in local memory 50, the MFI 10 can create a data display that is output to the video monitor 18 or transferred to the PC 12 for analysis. The address counter 44 points to a sample address in the RAM 42 where data is either written into or read out of the ADDS boards 40. The data clock 46, which may be sourced externally, determines the speed that the address counter 44 counts through the RAM channels and determines the time between samples. Data clock 46 can be made to operate at a speed greater than the speed at which the UUT 38 would normally operate.

In the stand alone mode, the MFI 10 operation described above is controlled by menus 49 accessed via the keypad 16 and viewed on the video monitor 18.

Each menu 49a–49k has a series of questions that, when answered, provides the capability to modify or adjust MFI operation. The MFI 10 reconfigures these menus 49 to show only those questions and answers that relate to the types of plug-ins 22 and 24 and probes 26 that have been installed.

The first menu that appears when the MFI 10 is activated is the configuration menu 49a. This menu 49a provides information about the present configuration of the MFI 10, such as what plug-ins 22 and 24 are attached, whether the MFI 10 is stacked or uncoupled, which machine or operating state the MFI 10 is in, and what SETUP mode is selected.

A SETUP mode is the set of all MFI 10 operating parameters a user can modify on all the menus plus one display parameter. There are two complete setups allowing a user to change setups without having to remodify all the menus. In addition to status information, this configuration menu 49a provides the capability to change configurations.

A communication menu 49b sets up the printer ports and the communication ports on the MFI 10. This menu can be accessed only from the configuration menu 49a.

The data parameter menu 49c provides the capability to select the display mode, trigger delay, probe and channel options, and auto arm. The trigger delay provides the capability to adjust the number of samples to be acquired after the sequence has been satisfied.

The clock menu 49d provides the capability to determine what points in time are to be sample points. Sample points are those points at which acquisition channels sample data and when generation channels output data.

The trigger pattern definition menu 49e provides the capability to set up to 14 trigger patterns. The trigger pattern is a set of logic levels, one logic level defining each acquisition channel. Logic levels can be defined as HI, LO, and DON'T CARE for each acquisition channel. When these logic levels simultaneously occur on all the acquisition channels, the trigger pattern has occurred.

The trigger sequence menu 49f provides the capability to instruct the MFI 10 to perform different actions as different trigger patterns occur.

The pattern generation menu 49g provides the capability to control the pattern generation plug-ins 22 and 24 and probes 26. There are two sources of patterns: algorithmic pattern, useful for generating analog signals; and "from the screen" pattern source which uses data records in the MFI buffer memory 50 as pattern sources.

The continuity test menu 49h controls the continuity tester plug-in 22 and 24 and probe 26.

The analog menu 49i provides the capability to specify that the data records of selected probes 26 be displayed on the timing display shown on either video monitor 18 or PC 12 (FIG. 1) as analog waveforms.

The signature analysis menu 49j provides control over the signature plug-in 22 and 24.

The EPROM programming menu 49k provides the capability to control the EPROM plug-in 22 and 24 and probe 26.

Data displays that appear on video monitor 18 or PC 12 provide the capability to observe and modify data acquired or generated by the MFI 10. There are four data displays provided with the MFI 10:

a) timing display, not shown, displaying waveform data. The timing display acts as an adjustable window on the data record, not shown. The data record is larger than the window, but the window may be moved back and forth or up and down to show the whole data record. The data may also be magnified under the window for more precise observations.

b) binary/hex display. These standard displays, well known in the art and not shown in detail herein, provide the capability to examine the data records sample by sample and channel by channel;

c) octal display. This standard display, well known in the art and not shown in detail, displays the data record as a sequence of octal data; and d) processor disassembly displays, providing the capability to observe the processor code execution in the assembly language of the UUT processor.

Figure 4:
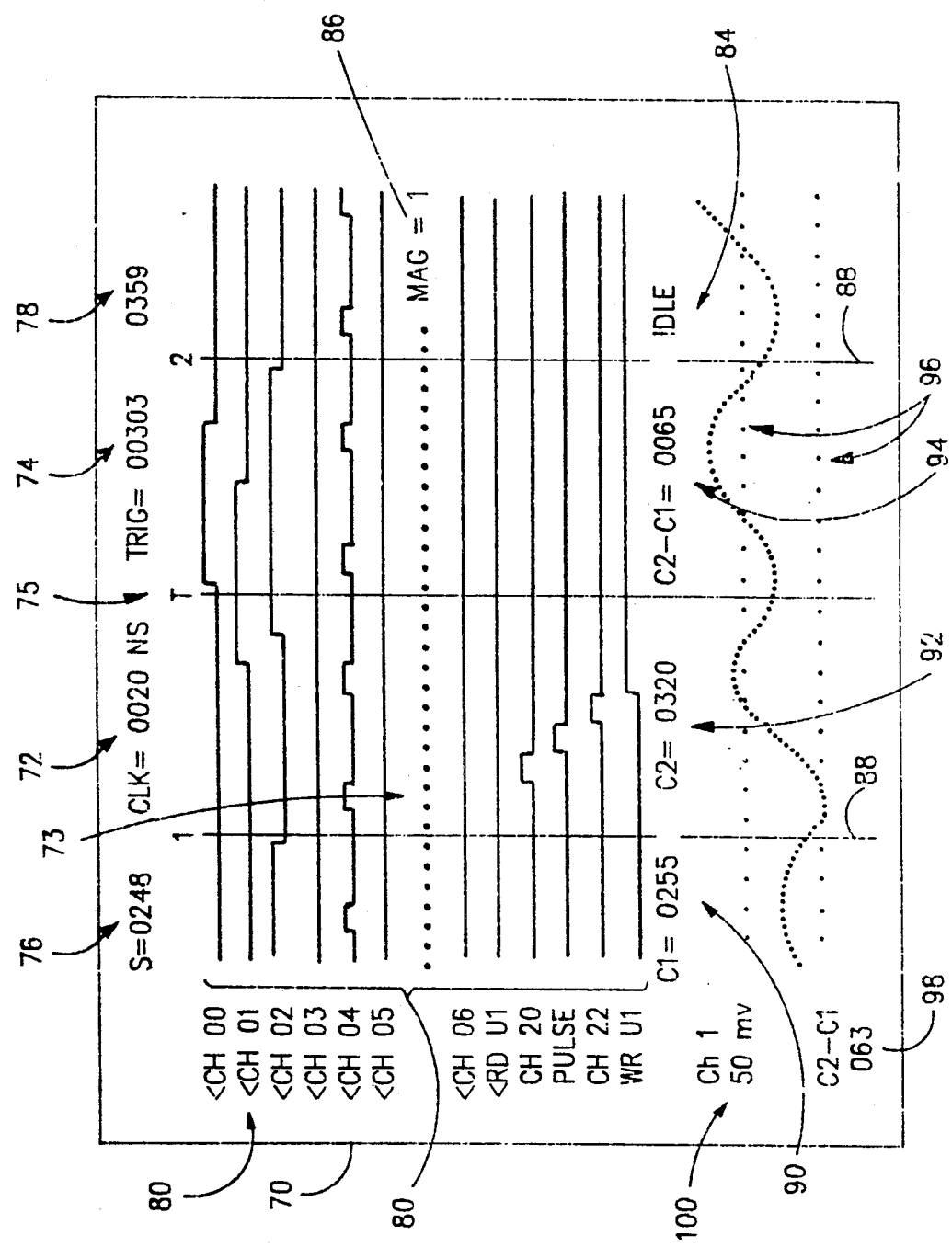
FIG. 4 is a schematic representation of a display on a video monitor.

Referring now also to FIG. 4, there is shown a typical timing diagram displayed on video monitor 18 or the PC 12 (FIG. 1).

The timing diagram display illustrates some of the key concepts described above. This example shows twelve digital channels and one analog channel. In the simplified example observe the following items:

DATA CLOCK 72

The user selected sampling rate for the data shown in this display is 20 ns per sample. The dotted horizontal line 73 in the middle of the display shows the actual positions of the sample clock.

TRIGGER POSITION 74

The trigger event 75 is indicated by the vertical dashed line. At this point in time, the states of the acquisition channels matched the user described trigger pattern. "Trig=00303" indicates the position of the trigger event as sample number 303 in the record.

SCREEN POSITION 76–78

"S=0248" indicates that the left edge of the screen 76 is displaying the 248th sample of the record. At the top right corner 78 "0359" indicates that the right edge of the screen is displaying the 359th sample of the record. Typically, the earliest sample in the record is sample 0 and the last is sample 1023. The last sample number is a function of record size.

CHANNELS 80

The indications on the left edge of the display are the channel labels. These labels identify the plug-in probe pin 32 (FIG. 2) that was connected to the point in the user's circuit that generated the waveform 82 to the right of the label.

WAVEFORMS 82

The waveforms displayed to the right of each channel label are representations of digital data captured by the MFI. This is the result of ACQUISITION.

MFI STATUS 84

This indicates MFI status as either ARMED, TRIGGERED, or as evidenced in this example, IDLE.

MAGNIFICATION 86

This indicates the resolution of the display. In this example, MAG=1 shows separate sample points at the highest resolution, 112 samples across the display.

TIMING CURSOR INDICATORS 88

These vertical solid lines are used to locate the signal events within the data record or to measure the time period of a signal event.

TIMING CURSOR 1 POSITION 90 AND TIMING CURSOR 2 POSITION 92

Indicate the sample number positions of the timing cursors.

DIFFERENCE BETWEEN TIMING CURSORS 94

Indicate the number of samples or time units between the timing cursors 90-92.

VOLTAGE CURSOR INDICATORS 96

Measure the amplitude of the analog waveforms.

DIFFERENCE BETWEEN VOLTAGE CURSORS 98

Indicates the number of vertical divisions between the voltage cursors 96.

ANALOG VOLTS PER DIVISION 100

This indicates the vertical scale of the analog channel. Divisions are actually the pixel size on the display.

When this example has completed its activities, the MFI 10 has obtained a set of data and stored it in the RAM 42. MFI stand alone operation (FIG. 3) is summarized in the following example of the MFI 10 functioning as logic analyzer. The following example is prescribed for explanatory purposes only and is not intended to limit the scope of the invention as defined by the appended claims. The MFI 10 is configured for this example as follows: capacity of 32 channels of timing data represented by two DDA50 plug-ins 22 and 24 (each with 16 channels digital) and each plug-in 22 and 24 with two P8v probes 26 (each probe with 8 channels available). The probes 26 are attached to a set of circuit boards 38. Each acquisition channel 32 (FIG. 2) on the probes 26 is assigned to a point in the unit under test 38 (FIG. 3).

Each channel acquires logic level samples (1's and 0's) from the point in the UUT 38. Sampling occurs at points in time (sample points) determined by the operator's selected data clock 46. An analog channel uses eight digital channels in the preferred embodiment to represent the analog wave form.

Sampling begins when the MFI 10 is ARMED. The MFI 10 is ARMED when one of the following occurs:

The Arm Key Trig Key on the keypad 16, or the MFI 10 receives an Arm Key or Trig Key command over the communications port 14 from the MCP software 11, while the MFI 10 is IDLE (not ARMED).

The MFI 10 is triggered while in AUTO-ARM mode.

Sampling stops when one of the following occurs:

The MFI 10 is disarmed by pressing the Arm Key on the keypad 16 or sending the Arm Key command to the communications port 14 to the MCP software 11, while the MFI 10 is ARMED.

The MFI 10 is triggered.

The MFI 10 is triggered by one of the following:

The occurrence of a specified sequence of trigger patterns followed by a trigger delay number of data clocks 46.

The Trig Key on the keypad 16 is pressed or the Trig Key command is sent to the communications port 14 to the MCP software 11.

When the MFI 10 is triggered it will display the acquired data on the video monitor 18 or on the PC 12.

Each channel maintains a data record of the most recent samples. The number of samples in a channel's record is determined by the plug-in 22 and 24 type and data clock 46 for that channel. The record size can also be affected by concurrent pattern generation with the MFI. Generally, the record size is from 512 to 8192 samples.

A trigger pattern is an operator defined combinational state of input channels. For a particular trigger pattern, the user can assign a state for each acquisition channel, a 1 or a 0 or an x (for "DON'T CARE"). When this combination of states occurs simultaneously on the acquisition channels, the defined trigger pattern is said to have occurred.

| | TRIGGER PATTERN |
|---|---|
| PROBE # | 2222111111100000000 |
| Pin # | 32107654321076543210 |
| TP01 | XXXXXXXXXXXXXXXXXXXX |

When the MFI 10 is triggered, the channel records are available in their final form to be viewed on the MFI's display screens. These records may be viewed as timing diagrams (FIG. 4) or as one of many data domain displays, including microprocessor disassembly, that the MFI 10 can generate.

The above discussion on the invention data acquisitions/sending operations is the same in either the stand alone mode (MFI 10 controls the activity) or the coupled mode (MCP 11 controls the activity).

Referring now again to FIG. 3, the MFI control program (MCP) 11 provides the capability to use PC based technology to control and enhance the performance of the MFI 10.

The MFI 10 is connected to the MCP 11 by standard interfaces 14 (e.g., RS-232 communications port or GPIB IEEE-488 interface). The MCP 11 operates as a menu driven, interactive program organized into six major functions: control 52, editing 54, filing and transfer 56, viewing 58, testing 60, and other 62.

The control menu 52 provides the capability to control the MFI 10 directly, including the MFI menus 49. There are two modes associated with this menu:

a) blind control provides keys on the PC keyboard as replacements for the keys on the MFI keypad 16. Control is exercised by using the keyboard keys to interact with the menus and displays produced by the MFI 10; and b) remote control provides the capability to replace both the MFI keypad 16 and monitor 18 with the PC 12. The PC 12 displays the current MFI display on one half of the monitor 18 and displays valid MCP control keys on the other half.

Editing menus 54 provide the capability to change or modify data contained in the MCP memory 50. Data can be edited using either the digital/analog waveform display (such as illustrated in FIG. 4) or the hexadecimal character display. Additional functions are provided to edit the waveform display; mark, unmark, copy, fill, and duplicate digital waveform segments; generate digital counting patterns; generate simple analog waveforms; and perform mathematical operations on analog waveforms.

Filing and transfer menus 56 provide the capability to control the transfer of information between the MFI 10 and the MCP 11. It allows the MCP 10 and MCP 11 to share setups and data. Setups are the copy of all working menu variables and reflect menu settings (MFI menus 49a–49k and MCP menus 52–62). Filing functions provide disk accessing and storage on the PC disk system.

Viewing menus 58 provide the capability to select the data being displayed, to label and arrange the order of the channels in the display, to control the resolution of the display, to display specific portions of the data, and to select between a waveform representation and a hexadecimal character representation.

Testing menus 60 provide the capability to test chips, circuits, PC boards, and other electrical or electronic devices or assemblies. The MFI 10 is automatically reconfigured for a specific test through the filing functions.

Other menus 62 provide the following miscellaneous functions: setting communications baud rate, copying among buffers, listing files in the working directory, changing directories, outputting a control byte to the parallel port, uploading and downloading EPROM images.

In addition to the aforementioned menus 52–62, the MCP 11 provides the capability to record operator commands as they are entered from the PC 12 (FIG. 1) keyboard or keypad 16 and to execute these sequences on command, generating the same activity as when they were first recorded. The macro functions 64 allow the MCP 11 to run tests without operator interaction.

Figure 5:
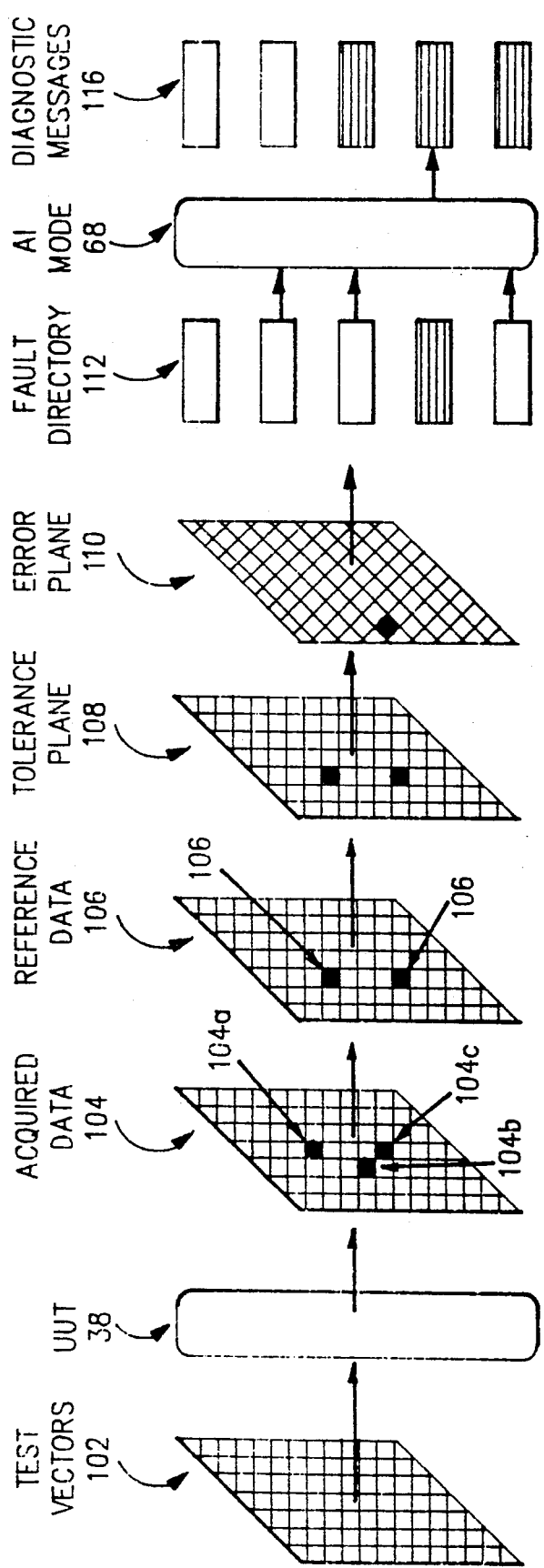
FIG. 5 is a schematic representation of data arrays used in accordance with the present invention.

Referring now also to FIG. 5, there is shown a schematic representation of data arrays as used in accordance with the present invention. In operation, test vectors 102 are applied to a unit under test (UUT) 38. While UUT 38 is usually a printed circuit board, it may also be a single device. The invention contemplates several ways of creating test vectors 102. If UUT 38 contains a microprocessor or other intelligence, and actually performs a function when the power is turned on, MCP 11 (FIG. 3) can learn the function of UUT 38 by connecting to it and observing the normal response.

Alternatively, an operator can visually create test vectors using a highly interactive graphical user interface and editor.

Another method to create test vectors is to download simulation data from a computer aided design (CAD) system database, not shown, to PC 12. When a device or a board is designed, a simulation using a CAD system is often created to validate the design. While such a simulation may not be perfect information for the test process, it is usually a good starting point.

Test vectors 102 are applied to UUT 38 to acquire data for the board under test 38. An acquired data plane or array 104 is generated as a result of applying test vectors 102 to UUT 38. Circles 104a–104c in FIG. 5 indicate information gathered. The two-dimensional representation of this plane of information 104 illustrates one of the unique features of the invention. Wherever a test point is interrogated, information is gathered continuously in the form of a data array. For purposes of this description, it is useful to know that reference data are the responses and information gathered from a known good board.

Data represented by three circles 104a–104c on the acquired data plane 104 are compared to reference data 106a, 106b on reference data plane 106. A single test is sufficient to obtain a reference.

A number of good boards 38 can be used to create a tolerance data plane 108. Since a known good board can have variations that are considered normal, the tolerance plane 108 is a representation of the normal variations of a known good board. For example, a pulse might be one millisecond wide on the board that is being measured. But it is quite likely that a range of, say, from 0.9 to 1.1 milliseconds is valid normal acceptable data.

One could measure a plurality of good boards (e.g., 50 boards) and vary their power supply and temperature to learn normal variance from the good boards. Alternatively, one can use an interactive graphical user interface, hereinbelow described in greater detail, and "tolerate out" (i.e., specify) that range of values, 0.9–1.1 milliseconds. Thus, test vectors 112 are applied to UUT 38 to acquire data 104. Reference data 106 from one good board is already in memory.

A simple logical compare (EXCLUSIVE NOR) is performed on a bit-by-bit basis hundreds of thousands of times between the acquired data 104 and the reference data 106. Any deviations between data in the two planes 104, 106 are then compared to data in the tolerance data plane 108. Here a logical AND operation is used as a mask. Any deviations that have been seen in the first array operations are now compared to this mask 108 again. In this way, massively parallel logical operations occur hundreds of thousands of times.

By the time the error plane 110 is reached, all deviations which have been observed or predicted by simulations are identified. The mode of analyzing data is far different than traditional methods. As a result, faults are defined that would simply be missed by other kinds of test systems.

To build tolerance, an operator decides that the deviations are acceptable; acquired data 104 is compared to reference data 106 and any variances within the tolerance plane 108 are accepted. Once tolerance has been built up, the system is ready to check for errors.

Acquired data 104 not favorably compared to reference data 106 nor within tolerance plane 108 results in errors, stored in an error plane 110. An error is defined as an acquired response that is not tolerated out. A pass/fail, go/no-go test can be performed at this point. If there are no errors, the board under test 38 passes.

If, however, errors exist, the system can memorize data patterns of faults as well as data patterns of known good boards. If there is a variance, the system can identify that condition and associate that pattern with an English language message 116 previously provided by an operator. For example, "U2, pin 3 Shorted to Ground" would be the sort of message that an operator might see, which is associated with a purely internal mathematical representation. One advantage of this diagnosis is that the system can provide an associated fault with an English language message, which an unskilled operator can then use to debug a UUT 38.

The system can store many of these fault patterns, each under a different message. In the process of learning what a good board is or in the process of creating reference data 106, an operator can train the system with a certain number of known faults. In this case, the operator essentially provides the system with a knowledge of faults. For example, U2, pin 2 can be shorted to U2, pin 3. When the test is run, it will fail and the operator enters the appropriate error message. This fault is added to a directory 116 with that English language message. This process can be repeated for different intentionally provoked faults.

Subsequently, a test is performed on another UUT 38, resulting in an error. The board fails and the system checks its memory to see if the fault patterns match any that has been seen before. If such a match occurs, the appropriate English language message is displayed. In such a case, the system indicates close to 100% certainty that an error is caused by a fault previously stored.

Figure 6:
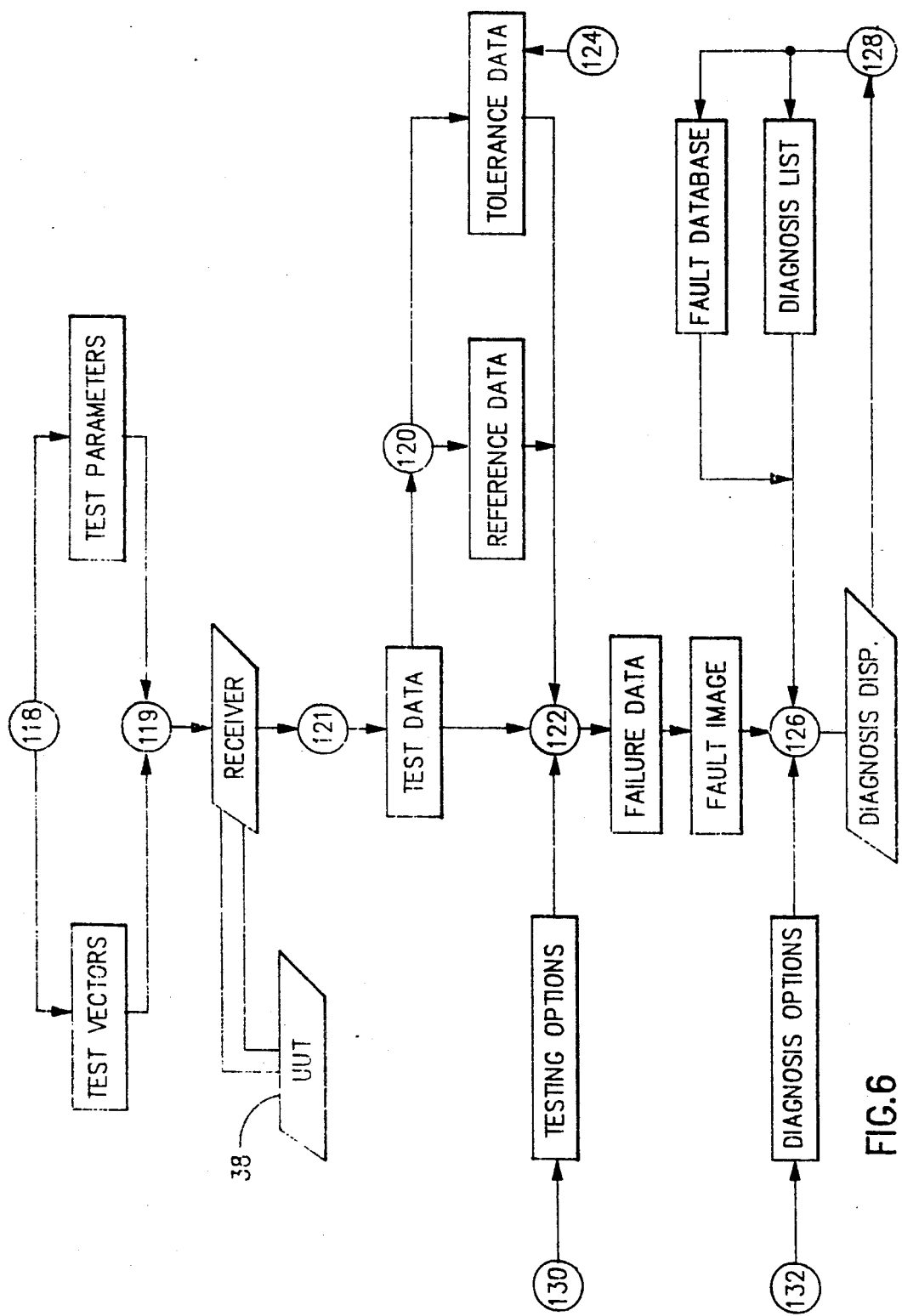
FIG. 6 is a flow chart of the testing process in accordance with the present invention.

Referring now also to FIG. 6, there is shown a flow chart of the testing process.

Test vectors and test parameters are entered into the MCP 11, step 118. These vectors and parameters are downloaded, step 119, into the inferential software 68 (FIG. 5). As explained above, the system enters an ARMED state, step 121, where data is acquired from the UUT 38 until the Trigger is encountered when data is sent to the MCP 11 via the interface 14

Reference and tolerance data are developed, step 120. Initially, these data are developed by setting the reference data set to test data and setting the tolerance data to zero or by using the waveform editor 54 (FIG. 1). Test data acquired from the UUT 38 is compared to the reference and tolerance data, step 124.

Results, step 122, that differ from the reference and tolerance data are entered into the fault database. From known good boards, the tolerance data is increased by the difference, step 120.

Failure data is passed to fault image and displayed, step 126. Fault isolation improves with increased fault database size.

The operator directs any newly discovered fault to the fault database, step 128. At this point in the process the operator can edit any previous diagnosis. The operator can set the testing options, step 130, and the diagnosis options, step 132.

Referring now again to FIG. 5, the inferential software 68 provides the capability to "learn" to recognize fault conditions in analog and/or digital signals. A fault directory is either created by simulating failures or by learning faults as they occur during normal testing.

Once fault data is stored in memory, a newly-detected fault can be compared with the stored faults. A relationship between the stored fault data and the detected fault is determined. The system indicates the cause of the detected fault to the operator based on stored fault data that is most probably related to the detected fault. This system analysis and range of potential causes can be evaluated by an operator.

Figure 7:
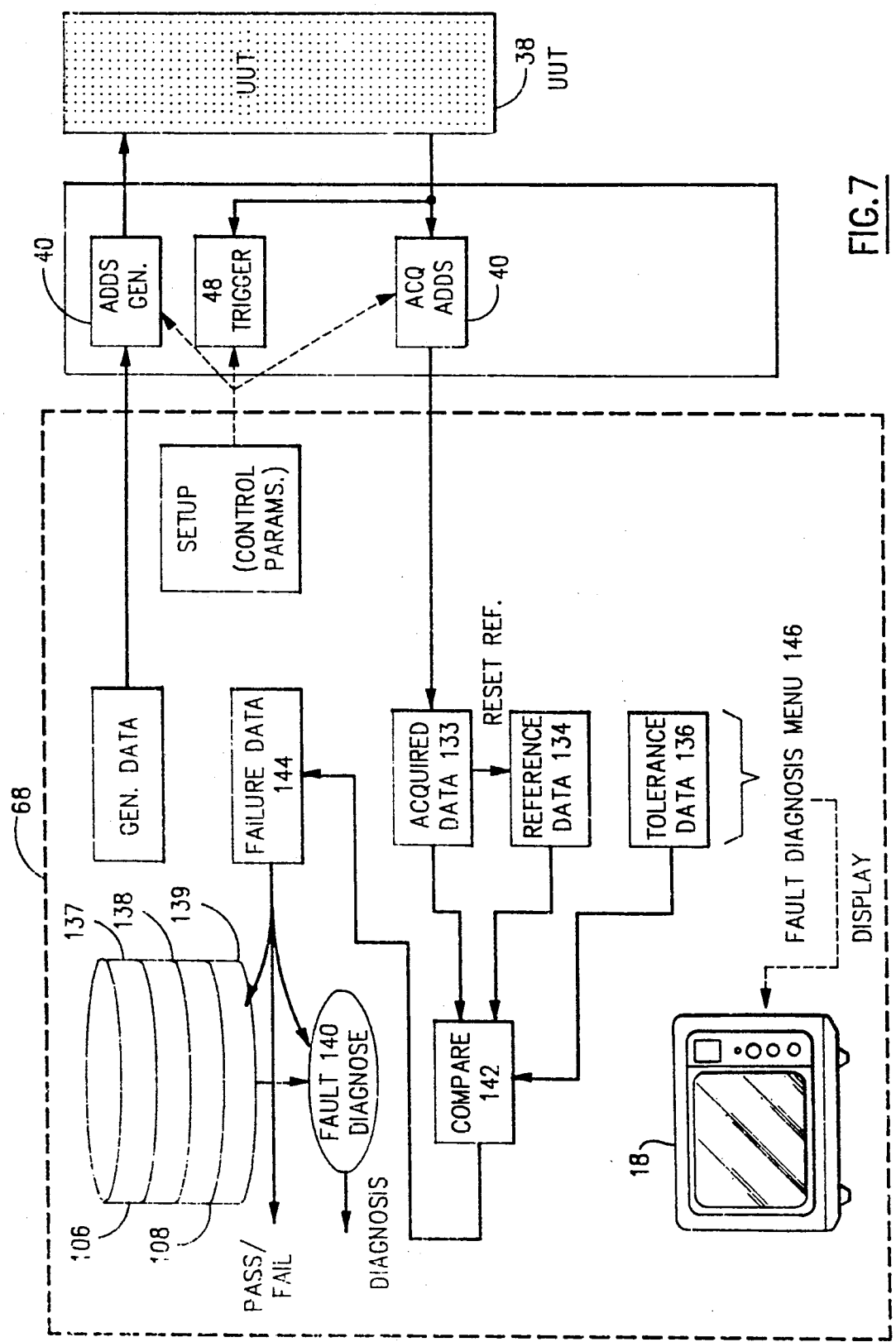
FIG. 7 is a schematic representation of the testing process in accordance with the present invention.

Referring now to FIG. 7, there is shown a schematic representation of the inferential software principles behind the testing strategies. These strategies are summarized below:

Repeatable Results

The principle utilized in testing assumes that the operation of a circuit may be judged by examining its operating signals.

The first step in developing any test is to devise test vectors and acquisition points that, when applied to the unit under test 38, will produce the same results repeatedly. A device that is working properly will produce a predictable and identifiable result. It is assumed that any deviation from predicted operation is produced by an error in the UUT 38. That UUT 38 has failed the test.

Reference and Tolerance Comparison

Even devices which are working properly may show some normal drifting and timing jitter between successive iterations of the same test. The test mechanism was designed to cope with this problem.

In order for the MCP 11 to be able to determine when a device passes and when it fails, the software must have a standard to judge the incoming results (the Acquired data 133). This standard is referred to as the reference image 134. In most cases, the reference image 134 is simply a copy of the first set of results returned by a good device.

The test is performed again and the new results are compared against the old results and stored in the reference image 134. Any differences that occur between successive tests of the same device are recorded in the tolerance image 136.

Once all the deviations of the good device are characterized, the good device will always pass because any deviations from the norm have been recorded in the tolerance image 136 and are ignored. This procedure is then repeated with other known good UUTs 38 until the tolerance image 136 has become broad enough to include all the discrepancies which normally occur among properly working UUTs 38.

Error Pattern Processing

The inferential software, shown in FIG. 7 with dashed lines and identified by reference numeral 68, assumes that, depending upon the specific test configuration, unique faults in the unit under test 38 will produce unique patterns of discrepancies.

One fault, a bad chip for example, might cause massive failures all across four channels; whereas another fault, say one signal stuck low, might cause failures during only part of the test on only one channel.

In each case, the position, timing and location of the resulting test deviations show that each fault produces a very different pattern of failures in the test data 144.

The function of the inferential software 68 can be expressed as follows:

1) Reduce the actual test failure data to a failure synopsis, or fault pattern, which is saved in a database file assigned automatically on a test by test basis.

2) Associate a specific fault diagnosis or comment with each fault pattern stored in the database 138.

3) Compare the incoming fault pattern with all patterns in the database and display the diagnosis descriptions of patterns that match closely 142.

4) Provide a menu-driven interactive interface for developing, utilizing, and maintaining the fault diagnostic databases.

Inferential software 68 keeps a record, or mathematical representation, of the specific error patterns that occur in the process of testing. When a fault pattern is added to the database 138, it is associated with an operator-defined 64-character string referred to as the fault diagnosis 140.

Initially, the fault patterns can be associated with a descriptive comment. As the causes for these errors are determined, the initial comment can be replaced with the diagnosis. The next time an error occurs, the inferential software 68 will report any fault patterns in the database 138 that are similar to the new fault pattern.

Once an error has been identified by the user, the inferential software 68 will be able to recognize and diagnose that error with a high degree of accuracy because it will recognize that fault's unique pattern.

Furthermore, even when processing a pattern for the first time, the inferential software 68 will correlate to the most likely fault already stored and will display at least the best match it can find.

The inferential software 68 is an extension of the testing mechanism already inherent in the MCP 11 (FIG. 3), so all user access to the inferential software 68 is achieved through the testing functions menus 60 (FIG. 3) of the MCP 11.

The inferential software database 138 is maintained in two files (in addition to those generated by the MCP 11 itself). The names of these fields are derived from the MCP 11 data file name and the currently loaded storage frame number.

For example, if the full filename of the data file currently open is "TSTNAME.DAT", the following files would be created during test development and diagnosis:

TSTNAME.22 Reference file 106 and tolerance file 108 for frame 22.
TSTNAME.F22 Inferential software database 138 file of fault descriptions for frame 22.
TSTNAME.X22 Inferential software database 138 file of fault patterns for frame 22.

The fault description file 137 name is formed, as shown above, by taking the reference file 106 name and inserting the letter 'F' between the period '.' and the frame number. This file consists of linefeed terminated strings, each within a fixed 80-character cell. It is possible to use the DOS "TYPE" command or any standard ASCII text editor to display this file. The index number refers to the fault's actual position in the file.

The fault pattern file 139 name is formed in the same way as the fault description file 106 except that the letter 'X' is inserted instead of the letter 'F'. This file consists of fixed size blocks; each block contains one fault pattern. The index number of a fault pattern is identical to the index number of its corresponding position.

The fault diagnosis menu 146 is the focal point for all inferential software 68 activity. On entry to this menu 146, the current failures are abstracted from the exception buffer, not shown, and a new fault pattern is formed, which is matched automatically against all patterns in the database 138. Diagnoses are displayed by group according to the percentage of correlation (figure of merit) between the new fault pattern 139 and each fault in the database 138. Each fault description 116 (FIG. 5) is labeled with its unique fault index. A list of fault diagnosis menu functions appears in Table I, below.

Table I. FAULT DIAGNOSIS MENU FUNCTIONS

Best: Conduct the matching process again in order to display the group of faults which match best.
Change: Select a specific fault by its index and change the fault description or comment.
Delete: Select a specific fault and delete it from participation in the matching process.
Examine: Select a fault and examine the associated error pattern synopsis.
Find: Find all fault descriptions which match the target string entered by the user.
Include: Include the new fault pattern under an existing description.
List: Generate the same display as the Examine function, also sending it to the standard print device.
New: Add the new error pattern to the database with an associated diagnosis or comment.
Options: Select Fault Diagnosis Options such as fault type and weight.
Query: Query the database for matches against a specific fault pattern already in the database.
Replace: Replace the fault pattern for an existing description with the current fault pattern.
Show Next Display the next best group of matching diagnoses.
Test: Return to the Testing Menu (FIG. 3) 60 and execute the Test function.
ESC: Return to the Testing Menu (FIG. 3) 60.

The figure of merit (FOM) is displayed for each group of faults displayed. This value is a percentage from 0 to 100 which indicates how closely the listed fault patterns match the new fault pattern. A figure of merit of 100% indicates that the listed fault pattern matches the new pattern exactly, whereas 0% indicates that the patterns do not match at all.

In order to understand how the figure of merit is calculated, it is helpful to imagine an error plane consisting of "channels" on one axis and "time samples" on the other. All entries are normally binary zero. Each time a discrepant value (i.e., an error) is found, a binary one is placed in the array. The number of channels is arbitrarily 96 and the number of time samples is 2K (i.e., 2048).

The contents of each channel is a number (e.g., 2K in the preferred embodiment) of binary data samples representing error information from the UUT collected during a test frame.

It is desirable to represent the contents of each channel in several forms, each providing a different way of looking at the data. Three ways of describing this information are by means of BIT, GROUP and RANGE.

BIT is a binary word representing the number of errors in the 2K record.

GROUP is a binary word representing the number of times the error data goes from "no error" to "error".

RANGE includes bits that, when set, represent the case when a segment contains an error. The 2K record is divided into sixty four, 32-bit segments.

In the following example, data are placed in groups of eight for simplicity of discussion herein.

|  | 00111010 |  | 11110000 |  | 01010100 |  | 00000000 |  | Derived No. |
|---|---|---|---|---|---|---|---|---|---|---|
| BIT | 4 | + | 4 | + | 3 | + | 0 | = | 11 |
| GROUP | 2 | + | 1 | + | 3 | + | 0 | = | 6 |

| | | | | |
|---|---|---|---|---|
| 00111010 | 11110000 | 01010100 | 00000000 | Derived No. |
| RANGE | 1 | | = | 1 |

Each of the aforementioned three derived numbers is stored on a per channel basis.

The FOM calculation uses the three derived numbers as a basis of its calculations. It is desirable to generate a 1 (100%) if all errors match and a 0 (0%) if no match exists.

In normal operation, these numbers are stored for each specific error pattern. Each pattern has an English language message associated therewith. The test is run on a new UUT and the three derived parameters are generated. These parameters are compared with stored fault information in the following way, in which the following terms are defined as shown below.

Base Bits = No. of error bits in stored error plane.
New Bits = No. of error bits in acquired error plane.
Match Bits = No. of error bits in common between Base Bits and New Bits.

Using the above-mentioned BIT, GROUP and RANGE numbers independently, the following ratios are calculated.

$$FOM_{BIT} = \frac{\text{Match Bits}}{\text{Base Bits}} \times \frac{\text{Match Bits}}{\text{New Bits}}$$

$$FOM_{GROUP} = \frac{\text{Match Groups}}{\text{Base Groups}} \times \frac{\text{Match Groups}}{\text{New Groups}}$$

$$FOM_{RANGE} = \frac{\text{Match Range Bits}}{\text{Base Range Bits}} \times \frac{\text{Match Range Bits}}{\text{New Range Bits}}$$

$$FOM_{TOTAL} = 1/4\ FOM_{BIT} + 1/4\ FOM_{GROUP} + 1/2\ FOM_{RANGE}$$

As can be seen by the foregoing equation, the figure of merit as reported on the monitor represents the weighted average of the different methods. Moreover, other sources of information can be used in this manner, without departing from the scope of the present invention, to contribute to the weighted average. In particular, serial bit streams (as in J-Tag and other boundary scan information) complete data without BIT, RANGE or GROUP calculation. Encoding schemes, including transition encoding, to preserve all information in a compressed form are all valid ways to create a FOM using this technique. Many other ways are possible to accent a way that a UUT might fail in practical situations.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

APPENDIX A

MCP PROGRAM LISTING

```
/* COMMON SOURCE MODULE FOR MFI CONTROL PROGRAM 2 and 48 */
/*   COPYRIGHT(C)1986,1987,1988.  ARRAY ANALYSIS, INC.    */
/* TESTING.C FOR THE MCP2 and MCP-AG48 */
/* version.h selects MFI-1000 or MFI-AG48 conditional source */

/*      Testing Functions */ include         "constant.h"
include         "global.h"

void evaluate(); void dsp_opts(); void vfy_opts(); void log_test();
void put_tstat(); void dig_tst();
unsigned capture();
extern int      numchbnk;

int     jwcount = 0;
int     strtstflg = 0;          /* activation flag for load start frame */
int     strtstfrm = -1;         /* starting test frame */
unsigned        numdif,numfail;

do_band()
{
        unsigned int c;
        topic = "BAND";
        sprintf(tmpstr,
        "Analog Guard Bands are %s.   V)isible or I)nvisible? ",
                bandflag==1?"VISIBLE":"INVISIBLE");
```

```
                put3c(tmpstr);
                c = get_one();
                if (c == 'V') bandflag = 1;
                if (c == 'I') bandflag = 0;
        }
int     trefresh;
int     autotest;
do_test()                       /* Maintain the Test Menu */
{
        int             x,loop;
        int             rr;
        unsigned        c,d;
        char            *temp;
        loop = 1;
        trefresh = 2;
        autotest = 0;
        if (tstlock == 0)               /* check global front door */
                tstlock = 1;            /* lock it, we are in */
        else return(-1);                /* door locked, subrouitne in use */
        if (q.dispflg1) {
                dspcheck();
        }
        else {
                ns_wide();
                zap_stat("");
                brieftestactive = 1;
        }
        do {
                d = ' ';
                rr = rowlen;
                if (trefresh == 1|| trefresh == 4) { /* Control repainting test
                        if (trefresh == 1) trefresh = 2;
                        else trefresh = 0;
                        if (q.dispflg1) {
                                display(tmpsave);
                                put_tstat();
                        }
                }                       /* end of refresh segment */
                if (trefresh == 2) {
                        topic = "TEST";
                        put1(tsmtitle);
                        put2(tst_form);
                        trefresh = 0;
                }
                if (trefresh == 0 || trefresh == 3) {
                        trefresh = 0;
                        put3c("Please Select a Function or Menu");
                        if (!q.dispflg1) {
                                ns_wide(); zap_stat("");
                        }
                }
                if (autotest == 1) {
                        c = 'T';
                        autotest = 0;
                }
                else c = get_one();                     /* Get a character */
againfst:
                put_s2("  ");
                switch (c) {
                case 'A':       /* Add exceptions to Tolerance */
                        add_fail();
                        break;
                case 'B':
                        do_band();
                        trefresh = 1;
                        break;
                case 'C':                       /* compare data to reference */
                        failures = 0;
                        evaluate();
                        trefresh = 4;
                        break;
                case 'F':
                        if ('T' == diagnose(0)) {
                                autotest = 1;
```

```
                        trefresh = 0;
                }
                else
                        trefresh = 2;
                break;
        case 'E':                       /* examine failures */
                if (brieftestactive) brieftestactive++;
                if ('T' == ex_fail()) {
                        autotest = 1;
                        trefresh = 0;
                }
                else
                        trefresh = 1;
                if (brieftestactive) brieftestactive--;
                break;
        case 'G':
                do_guard();
                trefresh = 1;
                break;
        case 'L':                       /* Write comment test to Log */
                topic = "LOGCOM";
                prmpt3("LOG: ");
                if (ESC == (get_con(tmpstr,0,72))) break;
                log_line(tmpstr);
                trefresh = 2;
                break;
        case 'N':
                put_s2("N)ew References command CHANGED to R)eset Refere
                break;
        case 'R':
                new_refs();
                trefresh = 1;
                break;
        case 'O':
                topic = "OPTIO";
                prog_opt();     /* Program test options */
                trefresh = 1;
                break;
        case 'P':
                do_port();
                trefresh = 2;
                break;
        case 'S':
                trefresh = 2;
                topic = "SCAN";
                if (scanst == -1) {
                        scantmp = tmpsave;      /* Default */
                        scanst = dspstate;
                }
                put2(bsc_form);
                put3("Select the Scanning Function to Execute: ");
                c = get_one();
                switch(c) {
                case 'V':
                        x = test_samp(scantmp);
                        if (istate != 1) {
                                sprintf(tmpstr,
                                "Vertical Sample = %x", x);
                                goto axsf1;
                        }
                        break;
                case 'C':
                        x = test_chan(scantmp);
                        if (istate != 1) {
                                sprintf(tmpstr,
"%d Bit%c High, First High %d ,First Low %d,  Transition Count = %d.",
                                        x,x>1?'s':' ',firsthigh,
                                        firstlow, trancount);
                                goto axsf1;
                        }
                        break;
                case 'B':
                        x = scan_buf(scantmp);
```

```
                        if (x != 0) verdict = 0;       /* Failed */
                        else verdict = 1;              /* Passed */
                        failures = x;                  /* set the failures */
                        sprintf(tmpstr,
        "The %s Buffer has %d Bits High.  The Verdict is Set.",
                                dsptag[scanst],x,x>1?'s':' ');
                        goto axsf1;
                case 'F':
                        x = next_high(scantmp,numchnls,0,
                                0,q.mxbs);
                        if (istate != 1) {
                                if (x != -1)
                                        sprintf(tmpstr,
        "First Failure Found on Bank: %d, Chan: %d, Sample %d",
                                                scanpod,scanchan,firsthigh);
                                else
                                        sprintf(tmpstr,
                                                "No Failures Found");
axsf1:
                                        put_s2(tmpstr);
                        }
                        break;
                case 'S':
                        put2(sel_form);
                        sprintf(tmpstr,
        "%s Now Selected.  Select a New Buffer for Scanning: ",
                                dsptag[scanst]);
                        c = posit(tmpstr);
                        if (c == ESC) break;
                        temp = det_buf(c);
                        if (temp != NULL) {
                                scantmp = temp;
                                scanst = bufstate;
                        }
                }
                break;
                case 'T':              /* do the test */
                        trefresh = 0;
                        judge();       /* evaluate data against ref. and tol.*/
                        break;
                case ESC:              /* Continue testing */
                default:
                        d = wrap_up(c);
                        if (d != 0)
                                loop = 0;
                        else
                                trefresh = 2;    /* redisplay banner */
                        break;
                }
        } while (loop);
        brieftestactive = 0;
        tstlock = 0;                   /* unlock the front door. */
        return((int)d);
}
test_samp(src)
char    *src;
{
        int     z,mark;
        char    *st;
        unsigned bp;
        int     c;
        int     ndx,pod,chan;
        char    temp[8];
tslp5:
        prmpt3("Enter the beginning Bank and Channel Number: ");
        c = get_con(temp,0,7);
        if (c == ESC) goto tsmend;
        if (*temp == '*') goto runsamp;
        if (*temp == 0) goto tslp7;

pod  = temp[0] - '0';
        chan = temp[1] - '0';
        ndx = find_chn(pod,chan);
```

```
                if (ndx == -1) {
                        put_s2("Cannot find the Specified Bank and Channel");
                        goto tslp5;
                }
                scanpod = pod;
                scanchan = chan;
    tslp7:
                sprintf(tmpstr,
                        "Scanning Sample %d.  Enter the Sample Number to Scan: ",
                        startscan);
                prmpt3(tmpstr);
                if (get_int(&startscan) == ESC) goto tsmend;
                if (startscan < dsmin || startscan > dsmax) goto tslp7;
    runsamp:
                failures = 0;                              /* scan count */
                mark = 0x01;
                ndx = find_chn(scanpod,scanchan);
                for ( z = 0; z< 16; z++) {
                        init_chan(ndx);
                        bp = 0x80 >> (startscan/expansion) % 8;    /* first bit */
                        st = src + caloff(cndx) +
                                (startscan/expansion)/8; /* start of scan */
                        if ( *st & bp ) {
                                failures |= mark;
                        }
                        mark <<= 1;
                        if (ndx + 1 < numchnls) {
                                ndx++;
                        }
                        else
                                break;
                }
    tsmend:
                return(failures);
    }
    test_chan(src)
    char    *src;
    {
                int     c;
                int     pod,chan;
                int     x;
                char    *st,tchain[8];
                unsigned bp;
    loop5:
                prmpt3("Enter the Bank and Channel #: ");
                c = get_con(tchain,0,7);
                if (c == ESC) goto compl;
                if (*tchain == '*') goto runchan;
                if (*tchain == 0) goto loop7;

pod = tchain[0] - '0';
    #ifdef MCP96
                if (pod > 9) pod -= 7;
    #endif
                chan = tchain[1] - '0';
                x = find_chn(pod,chan);
                if (x == -1) {
                        put_s2("Cannot find Specified Bank and Channel");
                        goto loop5;
                }
                scanpod = pod;
                scanchan = chan;

loop7:
                sprintf(tmpstr,
                        "Starting at %d.  Enter the New Starting Sample Number: ",
                        startscan);
                prmpt3(tmpstr);
                if (get_int(&startscan) == ESC) goto compl;
                if (startscan < dsmin || startscan > dsmax) {
                        put_s2("Starting Sample Out of Range");
                        goto loop7;
                }
```

```
loop8:
        sprintf(tmpstr,"Ending at %d.  Enter the New Ending Sample Number: ",
                stopscan);
        prmpt3(tmpstr);
        if (get_int(&stopscan) == ESC) goto compl;
        if (stopscan< dsmin || stopscan > dsmax) {
                put_s2("Ending Sample Out of Range");
                goto loop8;
        }
        if (stopscan < startscan) {              /* switch relative position */
                x = startscan;
                startscan = stopscan;
                stopscan = x;
        }
        put3c("Scanning the Channel Segment");
runchan:
        x = find_chn(scanpod,scanchan);
        init_chan(x);
        failures = 0;                            /* scan count */
        firsthigh = -1;
        firstlow = -1;
        trancount = 0;
        bp = 0x80 >> (startscan/expansion) % 8;           /* first bit */
        st = src + caloff(cndx) + (startscan/expansion)/8;  /* start of scan
        if (*st & bp)
                lastlevel = 1;
        else
                lastlevel = 0;
        for ( x = startscan; x<= stopscan; x += expansion) {
                if ( *st & bp ) {                 /* bit is high */
                        failures += expansion;
                        if (firsthigh == -1)
                                firsthigh = x;    /* set first high marker */
                        if (lastlevel == 0) {
                                trancount++;      /* count transition */
                                lastlevel = 1;    /* set tracking level */
                        }
                }
                else {                            /* bit is low */
                        if (firstlow == -1)
#endif
        chan = tchain[1] - '0';
        x = find_chn(pod,chan);
        if (x == -1) {
                put_s2("Cannot find Specified Bank and Channel");
                goto loop5;
        }
        scanpod = pod;
        scanchan = chan;

loop7:
        sprintf(tmpstr,
                "Starting at %d.  Enter the New Starting Sample Number: ",
                startscan);
        prmpt3(tmpstr);
        if (get_int(&startscan) == ESC) goto compl;
        if (startscan < dsmin || startscan > dsmax) {
                put_s2("Starting Sample Out of Range");
                goto loop7;
        }
loop8:
        sprintf(tmpstr,"Ending at %d.  Enter the New Ending Sample Number: ",
                stopscan);
        prmpt3(tmpstr);
        if (get_int(&stopscan) == ESC) goto compl;
        if (stopscan< dsmin || stopscan > dsmax) {
                put_s2("Ending Sample Out of Range");
                goto loop8;
        }
        if (stopscan < startscan) {              /* switch relative position */
                x = startscan;
                startscan = stopscan;
                stopscan = x;
        }
        put3c("Scanning the Channel Segment");
```

```
runchan:
        x = find_chn(scanpod,scanchan);
        init_chan(x);
        failures = 0;                                   /* scan count */
        firsthigh = -1;
        firstlow = -1;
        trancount = 0;
        bp = 0x80 >> (startscan/expansion) % 8;         /* first bit */
        st = src + caloff(cndx) + (startscan/expansion)/8;  /* start of scan
        if (*st & bp)
                lastlevel = 1;
        else
                lastlevel = 0;
        for ( x = startscan; x<= stopscan; x += expansion) {
                if (*st & bp) {                         /* bit is high */
                        failures += expansion;
                        if (firsthigh == -1)
                                firsthigh = x;          /* set first high marker */
                        if (lastlevel == 0) {
                                trancount++;            /* count transition */
                                lastlevel = 1;          /* set tracking level */
                        }
                }
                else {                                  /* bit is low */
                        if (firstlow == -1)
                                firstlow = x;
                        if (lastlevel == 1) {
                                trancount++;
                                lastlevel = 0;
                        }
                }
                if (bp == 0x01) {
                        bp = 0x80;
                        st++;
                }
                else
                        bp >>= 1;
        }
compl:
        return(failures);
}
ex_fail()
{
        int     w,dsave,vsave,hssv2;
        int     bw,             /* rounded off width in bits */
                tc,             /* total channels */
                vs,             /* mumber of channels on the screen */
                vo,             /* number oc chnnels offset vertically */
                dof,            /* display offset for start of screen */
                done;
        char    *hsave;
        unsigned c;
        hsave = highsrc;
        hssv2 = highstate;
        dsave = dspoff;
        vsave = voffset;
        topic = "EXAMF";
        dspinit();
        do_high('E');
        dof = dsmin;            /* display offset */
        vo = 0;                 /* vertical offset */
        done = 0;
        tc = numchnls;                  /* total channels */
        if (dspmode == 1) vs = tc;      /* Hex display vertical size */
        else vs = clim;                         /* digital channels on s
        put3c("Searching for Failures");
        dspinit();
        if (dspmode == 1) bw = (nohgrps*nodrows/8)*8;   /* hex */
        else bw = (rowlen/8)*8;
        do {
                w = next_high(newbuf,vs,vo,dof,bw);
                if (dof+rowlen > dsmax) dspoff = dsmax - rowlen;
                else dspoff = dof;
```

```
                    if (w != -1) {
                            vo = nhchn;
                            if (vo + clim > tc) voffset = tc - clim;
                            else voffset = vo;
                            display(tmpsave);
                            put_dstat();
                            sprintf(tmpstr,
                            "FAILURES FOUND: BEGINNING ON %X%d AT SAMPLE %d. ",
                            scanpod,scanchan,dof+w);
                            put_s2(tmpstr);
                            put3c("EXAMINE FUNCTION: E)xamine more, T)est Again, ESC
exloop:

c = get_one();
                            if(c == ESC || c=='T') break;
                            if (c != ' '&&c != 'E') {
                                    dspkey(c,tmpsave,0);
                                    goto exloop;
                            }
                            put3c("Searching for Failures");
                    }
                    vo += vs;                                   /* next vertical segment
                    if (vo + vs >= tc || vs==0) {   /*last v. segment or analog only
                            if (vo >= tc || vs==0) {
                                    if (done) {
                                            done = 2;
                                            put_s2("EXAMINATION COMPLETE");
                                            continue;
                                    }
                                    vo = 0;
                                    if (dspmode == 1) vs = tc;        /* Hex display
                                    else vs = clim;                           /* digit
                                    dof += bw;                        /* next horizontal segme
                                    if (dof + bw >= dsmax) {
                                            bw = dsmax - dof;
                                            done = 1;
                                    }
                            }
                    }
            } while(done!=2);
            dspoff = dsave;
            voffset = vsave;
            highsrc = hsave;
            highstate = hssv2;
            return(c);
} next_high(src,vs,vo,dof,hs)                 /* Returns Position of the first High Bi
char    *src;
int     vs,vo,                      /* vertical size */
        dof,hs;                     /* horizontal size */
{
        char    *st;
        int     mark,x,z,bp,y,rr,ssn;
        rr = hs;
        nhchn = -1;
        firsthigh = -1;
        mark = 32000;
        if (SO_ANSIZ < 3)                           /* if digital display is on at a
        for(x=0; x<vs; x++) {           /* Test The Digital Data */
                if (init_chan(x+vo) == 0xff) break;
                z = 0;
                st = src + caloff(cndx);            /* start of data */
                ssn = dof - sampskew + bankskew;        /* neutalize bankskew te
                if (ssn + rowlen <= 0) continue;        /* off screen */
                if (ssn <= 0) z = -ssn; /* # of samples not really here */
                else st += ssn/expansion/8; /* first byte*/ while (z<rr) { /* check specified area */
                        if (*st != 0){                      /* not zero == e
                                for (y=0,bp=0x80;(*st&bp)==0;bp/=2) y++;
                                y = z + (y+bankskew) * expansion;
                                if (y < mark) { /*earlier and legitimate */
```

```
                            mark = y;
                            firsthigh = mark;
                            scanpod = cpdn;
                            scanchan= cchn;
                    }
                    if (nhchn == -1) nhchn = x + vo; /* first channe
                    break;
                }
                z += 8*expansion;
                st++;
            }
        }
        if (vo==0 && analcnt>0 && SO_ANSIZ!=0)  /* first vertical segment */
        for (x=0; x<MAXPD1; x++) {                      /* check all ban
            if (SO_PODDT[x] == 1) {                     /* ANalog On ? *
                z = 0;
                setoffset(x);
                st = src + offset;                      /* start of bank */
                ssn = dof - sampskew + bankskew; /* neutalize bankskew t
                if (ssn + rowlen <= 0) continue;        /* off screen */
                if (ssn <= 0) z = -ssn; /* # of samples not really here
                else st += ssn/expansion; /* first byte*/
                for ( ; z<rr; z += expansion) {
                    if (*st++ != 0) {
                        if (z + bankskew < mark) {      /* earli
                            mark = z + bankskew;
                            firsthigh = mark;
                            scanpod = x;
                            scanchan = 0;
                        }
                        break;
                    }
                }
            }
        }
        dspinit();
/*      sprintf(tmpstr,"VS(%d), VO(%d), TC(%d), HO(%d), HS(%d), EO(%d)",
                vs,vo,numchnls,dof,rr,mark);    zap_stat(tmpstr); */
        if (mark == 32000) return(-1);  /* no fault found */
        else
                return(mark);
}
judge()
{
        int     c,x,rcode,d;
        rptc = 0;
        jwcount = 0;
        differences = 0;
        failures = 0;
        rcode = -1;
        chk_topts();    /* check for vaild test options */
        if (!strtstflg) strtstfrm = curframe;
        else {  /* check starting test frame */
                if ( strtstfrm != curframe) {
                        load_frame(strtstfrm);
                }
                strtstflg = 0;          /* clear the flag */
        }
jurstrt:
        putbanner("TESTING",q.hattr,0);         /* testing banner */
jdgstrt:
        if (mon_esc()) goto juret;
        if (HO_PRMCODE) {
                put3(HO_PROMPT);
                put_s2 ("Press Space Bar when Ready");
                d = hard_pause();
                put_s2(" ");
        }
        if (HO_MUXCODE != -1) {
                out_mux (q.llport, HO_MUXCODE);
        }
        if (HO_MUXDELAY > 0) {
                set_tmo(HO_MUXDELAY);
                put_s2("MUX Delay in Progress ...");
```

```
                while (!tst_tmo())
                        if (mon_esc()) break;
                put_s2(" ");
        }
        rptc++;
        curpass = 0;
        curfail = 0;
        glbfom = 0;             /* clear at beginning of test */
        if (HO_FOMCUTOF != -1)
                HO_ONFAIL = -1;
        put_tstat();
        while (curpass < HO_MAXPASS && curfail < HO_MAXFAIL) {
                if (mon_esc()) goto juret;
                jwcount++;
                c = capture();
                if (c == -1) {
                        put_s2("TEST ABORTED");
                        goto juret;
                }
                dspclean = 0;                   /* screen needs update */
                put3c("Testing the Display Data");
                evaluate();             /* sets the verdict */
                put_tstat();
        }
        c = rcvset();
        if (c == -1) goto juret;
        if (curpass == HO_MAXPASS) {
                verdict = 1;            /* True, Pass */
                opts = HO_PASSOPT;
        }
        else {
                verdict = 0;            /* False, Fail */
                opts = HO_FAILOPT;
        }
        stamp();
        men_regen();
        if (verdict == 1)
                putbanner("PASSED",q.pattr,0);
        else if (verdict == 0)
                putbanner("FAILED",q.fattr,0);
        if (HO_MUXCD2 != -1)
                out_mux (q.llport, HO_MUXCD2);
        if (test_opts(opts,'E')) {
                if (brieftestactive) brieftestactive++;
                c = ex_fail();
                trefresh = 1;
                if (brieftestactive) brieftestactive--;
                if ('T' == c) {
                        autotest = 1;
                        trefresh = 0;
                }
        }
        if (test_opts(opts,'F')) {
                if ('T'==diagnose(1)) {
                        autotest = 1;
                        trefresh = 0;
                }
                else
                        trefresh = 2;
        } if (q.autolog) {        /* log */
                log_test();
        }
        if (test_opts(opts,'D')) display(tmpsave);
        if (test_opts(opts,'A'))        add_fail();     /* add failures */
        if (test_opts(opts,'S')) {      /* save data in new frame */
                if (write_frame(dtafile,totframe + 1,hdb) == 0)
                        totframe++;
                else
                        goto juret;
        }
        if (verdict == 1) x = HO_ONPASS;
        else if (verdict == 0) x = HO_ONFAIL;
```

```
                if (x > -1) {
                        strtstflg = 1;
                        trefresh = 0;
                        if (0 == load_frame(x)) goto jdgstrt;
                        else goto juret;
                }
                if (test_opts(opts,'R')) {      /* do this test again */
                        goto jurstrt;
                }
                rcode = 0;
juret:
        return(rcode);
}
void evaluate()         /* compare data to reference against tolerance */
{
        unsigned int x,y;
        exflag = 0;
        dig_tst();                      /* sets numdif and numfail for the test */
        y = numdif;     /* Number of differences */
        x = numfail; /* Number of Exceptions */
        if ((unsigned)differences + y <= 0x7fff) differences += y;
        if ((unsigned)failures + x <= 0x7fff) failures += x;
        if (x==0) {
                curpass++;
                verdict = 1;
                if (y > 0) {
                sprintf(tmpstr,"%d Differences but No Failures",numdif);
                        put_s2(tmpstr);
                }
                else {
                        put_s2("Data and Reference Match");
                }
        }
        else {
                curfail++;
                verdict = 0;
                sprintf(tmpstr,"%d Failure%c",x,x>1?'s':' ');
                put_s2(tmpstr);
        }
}
settstopt()
{
        HO_MUXCODE = -1;        /* no initial mux setting */
        HO_MUXCD2 = -1;         /* no final mux setting */
        HO_MAXPASS = 1;
        HO_MAXFAIL = 1;
        vfy_opts(HO_PASSOPT,"D",1);
        vfy_opts(HO_FAILOPT,"E",0);
        HO_ONPASS = -1;         /* no forward link on pass */
        HO_ONFAIL = -1;         /* no forward link on fail */
        HO_FFON = 1;    /* turns transition mode on */
        HO_FFSPAN = 16; /* width in samples of first fault window */
        HO_FFWEIGHT = 33;       /* 33 percent becomes fraction 33/100 */
        HO_FRMPORT = 0; /* no port setting */
        HO_PRMCODE = 0; /* user prompt code */
        *HO_PROMPT = 0;
        HO_MUXDELAY =0; /* delay after initial MUX write */
        *HO_AUXPRG = 0;
        *HO_AUXP2 = 0;
        *HO_AUXP3 = 0;
}
prog_opt()      /* interrogate testing options */
{
        int     x,c,b,k;
        char    tmp[16];
b = ' ';
while (b != ESC) {
    put2(mxr_form);
    put3("Press the First Letter to Modify an Option or ESC to Exit: ");
    show_opts();
    b = get_one();
    put_s2(" ");
    switch (b) {
```

```c
            case 'A':
                do_auxprg();
                break;
        case 'D':
            settstopt();
            break;
        case 'M':
            topic = "MUXOPT";
            do {
                    put3("Write to MUX Port BEFORE the TEST? Y)es or N)o: ");
                    c = get_one();
            } while (c!=ESC&&c!='Y'&&c!='N'&&c!=CR);
            if (c == ESC) break;
            if (c == 'N') HO_MUXCODE = -1;
            else if (c != CR) {
                    x = HO_MUXCODE;
                    prmpt3("INITIAL MUX CODE: Enter the Output Code in Hex:");
                    c = get_hex(&x);
                    if (c != ESC) HO_MUXCODE = x & 0xff;
            }
            do {
                    prmpt3("MUX DELAY: Delay after Write to MUX? Y)es or N)o: ");
                    c = get_one();
            } while (c!=ESC && c!=CR && c!='N' && c!='Y');
            if (c == ESC) break;
            if (c == 'N') HO_MUXDELAY = 0;
            else if (c != CR) {
                    x = HO_MUXDELAY;
                    put3c("MUX DELAY: Enter Delay in Hundreths of a Second: ");
                    c = get_int(&x);
                    if (c != ESC) HO_MUXDELAY = x;
            }
            do {
                    prmpt3("Write to MUX Port AFTER the TEST? Y)es or N)o: ");
                    c = get_one();
            } while (c!=ESC && c!=CR && c!='N' && c!='Y');
            if (c == ESC) break;
            if (c == 'N') HO_MUXCD2 = -1;
            else if (c != CR) {
                    x = HO_MUXCD2;
                    prmpt3("FINAL MUX CODE: Enter the Output Code in Hex:");
                    c = get_hex(&x);
                    if (c != ESC) HO_MUXCD2 = x & 0xff;
            }
            break;
        case 'P':
pocntu:
            topic = "PASOPT";
            show_opts();
            put2(popt_form);
            prmpt3("C)ount, L)ink or Select PASS OPTIONS and Press Enter: ");
            if ((c=get_one()) == ESC) break;
            if (c== CR) break;
            if (c == 'C') {
                    topic = "PASCNT";
                    prmpt3("PASS COUNT: Enter the New Pass Count: ");
                    x = HO_MAXPASS;
                    if (get_int(&x) == ESC) break;
                    if (x > 0 ) HO_MAXPASS = x;
                    break;
            }
            else
            if (c=='L') {
                    topic = "PASLNK";
                    prmpt3("LINK ON PASS: Enter the Frame # or 0 for No Link: ");
                    x = HO_ONPASS + 1;
                    if (ESC == get_int(&x)) break;
                    if (x >= 0 && x <= totframe+1) HO_ONPASS = x-1;
                    break;
            }
            *tmp = c; *(tmp+1) = 0;
            put_ch(c);
            topic = "PASCHC";
```

```
                if (get_con(tmp,1,15) == ESC) break;
                vfy_opts(HO_PASSOPT,tmp,1);
                break;
        case 'S':
polp4:
                topic = "SPTOPT";
                put3("Select MFI Port BEFORE LOADING the TEST? Y)es or N)o: ");
                c = get_one();
                if (c == ESC) break;
                if (c == 'N') HO_FRMPORT = '0';
                else if (c== CR) break;
                else if (c != 'Y') goto polp4;
                else {
                        prmpt3("MFI PORT SELECTION: Enter the Port Selection:");
                        c = get_one();
                        if (c == ESC) break;
                        HO_FRMPORT = c;
                }
                break;
        case 'F':
                topic = "FALOPT";
                show_opts();
                put2(fopt_form);
                prmpt3("C)ount, L)ink or Select FAIL OPTIONS and Press Enter: ");
                if ((c = get_one()) == ESC) break;
                if (c== CR) break;
                if (c == 'C') {
                        topic = "FALCNT";
                        prmpt3("Enter the Maximum Fail Count: ");
                        x = HO_MAXFAIL;
                        if (get_int(&x) == ESC) break;
                        if (x > 0) HO_MAXFAIL = x;
                }
                if (c == 'L') {
                        topic = "FALLNK";
prmpt3("LINK ON FAIL: Enter Minimum FOM(1-100) or 0 for Direct Link: ");
                        x = HO_FOMCUTOF;
                        if (ESC != get_int(&x)) {
                                if (x > 0 && x <= 100) HO_FOMCUTOF = x;
                                else {
                                        HO_FOMCUTOF = -1;
        prmpt3("LINK ON FAIL: Enter the Frame Number or 0 for No Link: ");
                                        x = HO_ONFAIL + 1;
                                        if (ESC == get_int(&x)) break;
                                        if (x >= 0 && x <= totframe+1)
                                                HO_ONFAIL = x - 1;
                                }
                        }
                        break;
                }
                put_ch(c);
                topic = "FALCHC";
                *tmp = c; *(tmp+1) = 0;
                if (get_con(tmp,1,15) == ESC) return(ESC);
                vfy_opts(HO_FAILOPT,tmp,0);
                break;
        case 'L':
polp3:
                topic = "LOGOPT";
                put3("Write Reults of Test to the Log File?  Y)es / N)o: ");
                k = get_one();
                if (k == 'N') q.autolog = 0;
                else if (k=='Y') q.autolog = 1;
                else if(k!=ESC&&k!=CR) goto polp3;
                break;
        case 'U':       /* prompt and pause after test */
                topic = "USPOPT";
                put3("C)ancel or E)dit the User Prompt Message?");
                k = get_one();
                if (k == 'C') {
                        HO_PRMCODE = 0;
                }
```

```
                else if (k=='E') {
                        HO_PRMCODE = 1;
                        prmpt3("PROMPT: ");
                        put_con(HO_PROMPT,0);
                        strcpy(tmpstr,HO_PROMPT);
                        k = get_con(tmpstr,0,62);
                        if (k == ESC) break;
                        strcpy(HO_PROMPT,tmpstr);
                }
                break;
        case 'T':
                topic = "TMOOPT";
                sprintf(tmpstr,"Timeout is %d seconds.   Enter New Timeout:",q.timeout);
                prmpt3(tmpstr);
                x = q.timeout;
                if (ESC == get_int(&x)) break;
                q.timeout = x;
                break;
        case 'W':
                write_head(dtafile,curframe);
                break;
        default:
                glblcmnd(b);
                break;
        }   /* end switch(b) */
    }   /* end while(b) */
}
do_auxprg()
{
        unsigned        c;
        topic = "AXPOPT";
        set_axprg(HO_AUXPRG,"INITIAL");
        set_axprg(HO_AUXP2,"ARMED");
        set_axprg(HO_AUXP3,"FINAL");
} set_axprg(str,str2)
char    *str,*str2;
{
        char    ts[AXPSIZE+16];
        strcpy(ts,str);
        sprintf(tmpstr,"Enter %s Aux. Program: ",str2);
        put3c(tmpstr);
        put_con(ts,0);
        if (ESC!=get_con(ts,0,AXPSIZE-1)) {
                strcpy(str,ts);
                show_opts();
        }
}
show_opts()
{
        char    *s;
        char    t1[32],t2[32],t3[32];
        new_screen();
        sprintf(tmpstr,"FRAME %2d: %s",curframe+1,HO_TITLE);
        mon_screen(tmpstr,1);                   /* one */
        sprintf(tmpstr,"  PROMPT: %s",HO_PRMCODE?HO_PROMPT:"OFF");

mon_screen(tmpstr,1);                   /* three */
        friend_hex(t1,HO_MUXCODE,-1);
        friend_hex(t2,HO_MUXCD2,-1);
        friend_int(t3,HO_MUXDELAY,0);
        sprintf(tmpstr,
        " INITIAL MUX CODE: %3s   MUX DELAY: %3s   FINAL CODE: %3s",t1,t3,t2);
        mon_screen(tmpstr,1);                   /* four */
        friend_char(t1,HO_FRMPORT,'0');
        sprintf(tmpstr, "  MFI PORT SELECTION:-%s",t1);
        mon_screen(tmpstr,1);                   /* five */ mon_screen("     PASS OPTIONS                  FAIL OPTIONS",1);  /* six */
        sprintf(tmpstr,"    COUNT: %3d                     COUNT: %3d",HO_MAXPASS, HO
        mon_screen(tmpstr,1);                   /* seven */
        friend_int(t1,HO_ONPASS+1,0);
        friend_int(t2,HO_FOMCUTOF==-1?HO_ONFAIL+1:HO_FOMCUTOF,0);
```

```
            sprintf(tmpstr,"    LINK: %3s                        %s%s",t1,
                    HO_FOMCUTOF==-1?"LINK: ":"FOM >= ",t2);
            mon_screen(tmpstr,1);            /* 8 */
            sprintf(tmpstr,"    ACTIONS: %3s              ACTIONS: %3s",HO_PASSOPT,H
            mon_screen(tmpstr,1);            /* 9 */
            mon_screen(" ",1);                              /* 10 */
            sprintf(tmpstr,"    INITAL PROGRAM: %s",*HO_AUXPRG?HO_AUXPRG:"OFF");
            mon_screen(tmpstr,1);            /* four */
            sprintf(tmpstr,"    ARMED  PROGRAM: %s",*HO_AUXP2?HO_AUXP2:"OFF");
            mon_screen(tmpstr,1);            /* four */
            sprintf(tmpstr,"    FINAL  PROGRAM: %s",*HO_AUXP3?HO_AUXP3:"OFF");
            mon_screen(tmpstr,1);            /* four */
            mon_screen(" ",1);                              /* 10 */ mon_screen("GLOBAL TESTING OPTIONS");   /* 11 */
            friend_int(t1,q.timeout,0);
            sprintf(tmpstr,"    LOGGING: %s     TIMEOUT: %s",q.autolog?"ON":"OFF",t1);
            mon_screen(tmpstr,1);            /* 12 */
}
void dsp_opts()
{
            sprintf(tmpstr,          /* build the status line */
"F(%d) MUX(%d,%d) PASS:(Max=%d,Opts[%s],Link=%d) FAIL:(Max=%d,Opts=[%s],%s%d)",
            curframe+1,HO_MUXCODE,HO_MUXCD2,HO_MAXPASS,HO_PASSOPT,HO_ONPASS+1,
            HO_MAXFAIL,HO_FAILOPT,HO_FOMCUTOF==-1?"Link=":"FOM>=",HO_FOMCUTOF==-1?HO
            zap_stat(tmpstr);
}
void vfy_opts(dst,str,f)
char    *dst,*str;
int     f;              /* 1 - pass, 0 - fail. */
{
            unsigned c;
            if (*str == 'C' || *str == 'c') *dst= 0;
            else
            while (*str != 0) {
                    c = toupper(*str);
                    switch (c) {
                    case 'A':       /* add failures */
                    case 'D':       /* display data */
                    case 'E':       /* examine failures */
                    case 'F':       /* fault dianosis */
                    case 'L':       /* link to next test */
                    case 'R':       /* repeat this test */
                    case 'S':       /* save data */
                            *dst++ = c;
                            break;
                    default:
                            break;

}
                    *dst = 0;
                    str++;
            }
}
test_opts(src,c)                 /* returns true if found, false if not */
char    *src,c;
{
            while (*src != 0) {
                    if (toupper(*src) == c)
                            return(1);
                    src++;
            }
            return(0);
}
void tst_stat(dst)
char *dst;
{
            stamp();
            sprintf(dst,
"R%2d F%2d T%2d C%2d %s: P=(%d..%d,%s), F=(%d..%d,%s), %4d DFS,%4d FLS. %c:%s",
            rptcycle,curframe+1,rptc,jwcount,verdict==1?"PASS":"FAIL",
            curpass,HO_MAXPASS,HO_PASSOPT,curfail,HO_MAXFAIL,
            HO_FAILOPT,
            differences,failures,lrnstate[0],lrnstate[0]==' '?"":q.lrnname);
```

```
}
void log_stat(dst,line)
char    *dst;
int     line;
{
        if(line == 1) {
                stamp();
                sprintf(dst,"\nFile:%s  Frame:%d  %s  %s  %s",
        q.dtaname,curframe+1,HO_DATE,HO_TIME,verdict==1?"PASSED":"FAILED",
                HO_DATE,HO_TIME,lrnstate[0] ==' '?"":q.lrnname);
        }
        else if (line == 2) {
                sprintf(dst,"     Diagnosis #: %d    Figure of Merit: %d\%",
                        glbdnum,glbfom);
        }
        else if (line == 3)
                sprintf(dst,"     :\"%s\"",glbdiag);
}
void log_test()
{
        int     i,j;
        char    tstr[90];

if (glbfom > 0) j = 4;
        else j = 2;
        for (i=1;i<j;i++) {
                log_stat(tstr,i);
                log_line(tstr);
        }
} log_line(str)
char    *str;
{
        int     x;
        if (log_file == NULL) {
                log_file = fopen(q.log_name,"at");
                if (log_file == NULL) {
                        put_s2("Cannot open Log file");
                        return(0);
                }
        }
        x = fprintf(log_file,"%s\n",str);
        fclose(log_file);
        log_file = NULL;
        return(x);
}
void log_close()
{
        if (log_file != NULL) {
                fclose(log_file);
                log_file = NULL;
        }
}
void put_tstat()
{
        statflg = 't';
        tst_stat(tmpstr);
        if (q.dispflg1) zap_stat(tmpstr);
} void doxor(dst,src,src2,count)
unsigned char   *dst,*src,*src2;
int     count;
{
        while (count--) {
                *dst++ = *src++ ^ *src2++;
        }
} void doand(dst,src,src2,count)
unsigned char   *dst,*src,*src2;
int     count;
{
```

```
                while(count--)
                        *dst++ = *src++ & *src2++;
} void door(dst,src,src2,count)
unsigned char   *dst,*src,*src2;
int     count;
{
        while (count--)
                *dst++ = *src++ | *src2++;
}
void dig_tst()  /* newbuf=exceptions */
{
        int     x, pod;
        unsigned tdif,tfail;
        dspinit();
        tdif = 0; tfail = 0;
        for (pod = 0; pod < MAXPD1; pod++) {
                numdif = 0; numfail = 0;                /* modified by tst_dpod
                if (q.quickmode == 1 && SO_AGIO[11-pod] == 1)   /*Generation on
                        clear_fail(pod);                                        /* clear
                else if (SO_PODDT[pod] == 0)            /* digital bank */
                        tst_dpod(pod);
                else                                                            /* analo
                        tst_apod(pod);
                tdif += numdif; if (tdif > 0x7fff) tdif = 0x7fff;
                tfail += numfail; if (tfail > 0x7fff) tfail = 0x7fff;
        }
        numdif = tdif;
        numfail = tfail;
}
clear_fail(pod)         /* clear failures for one bank */
int     pod;
{
        int     count,*dst1;
        setoffset(pod);
        offset /= sizeof(int);
        dst1 = (unsigned int *) newbuf + offset;
        count = 0;
        while (count++ < banksize/sizeof(int)) *dst1++ = 0;
                                /* zero filled, not tested, no difs or f
}
tst_dpod(pod)
int     pod;
{
        int count;
        unsigned int *dat,*ref,*tol,*dst1,tmp1,tmp2,m;

setoffset(pod);
        offset /= sizeof(int);
        dat = (unsigned int *) databuf + offset;
        ref = (unsigned int *) maskbuf + offset;
        tol = (unsigned int *) tolbuf + offset;
        dst1 = (unsigned int *) newbuf + offset;
        count = 0;
        do {
                tmp1 = *dat++ ^ *ref++;
                tmp2 = (tmp1 ^ *tol++) & tmp1;
                *dst1++ = tmp2;
                if(tmp1 != 0 )  for(m=0x8000;m>0;m>>=1) {
                        if(tmp1&m)numdif++;
                                if(tmp2&m)numfail++;
                }
        } while (++count < banksize/sizeof(int));               /* number of int
}
tst_apod(pod)           /* counts all failures into numfail */
int     pod;
{
        int count,tmp,sign;
        unsigned char *dat,*ref,*tol;
        signed char *dst1;
        setoffset(pod);
```

```c
                dst1 = (signed char *) newbuf + offset;
                count = 0;
                if (SO_PODDT[pod] == 2) {
                        while (count++ < banksize) *dst1++ = 0;
                }
                else {
                    dat = (unsigned char *) databuf + offset;
                    ref = (unsigned char *) maskbuf + offset;
                    tol = (unsigned char *) tolbuf + offset;
                    while ( count++ < banksize) {
                                if (*dat < *ref) {
                                        tmp = (*dat - *ref);
                                        if (tmp < -127) tmp = -127;
                                        numfail+= abs(tmp);
                                }
                                else
                                if (*dat > *tol) {
                                        tmp = (*dat - *tol);
                                        if (tmp > 127) tmp = 127;
                                        numfail+= tmp;
                                }
                                else tmp = 0;
                                *dst1 = tmp;
                                dat++; ref++; tol++; dst1++;
                        }
                }
        }
add_fail()
{
        int     x;
        if (locked())
                put_s2("THIS FRAME IS LOCKED AGAINST MODIFICATION");
        else {
                for (x = 0; x<MAXPD1; x++) {
                        setoffset(x);
                        if (SO_PODDT[x] == 0)
                        door(tolbuf+offset,tolbuf+offset,newbuf+offset,banksize)
                        else if (SO_PODDT[x] == 1)
                                aanal_fail(x);
                }
                put_s2("Failures Added to Tolerance");
        }
}
aanal_fail(pod)
int     pod;
{
        int count;
        unsigned char *dat,*ref,*tol;
        dspinit();
        setoffset(pod);
        dat = (unsigned char *) databuf + offset;
        ref = (unsigned char *) maskbuf + offset;
        tol = (unsigned char *) tolbuf + offset;
        count = 0;
        while ( count++ <= banksize) {
                if (*dat < *ref) {
                        *ref = *dat;
                }
                else
                if (*dat > *tol) {
                        *tol = *dat;
                }
                dat++; ref++; tol++;
        }
}
do_guard()
{
        int     c,i,j,x,factor;
        int     blip,last,sbit,dbit,j1,j2,ch;
        unsigned char   *src, *dst, *tmpdst,scratch[512];
        do {
                topic = "GGUARD";
                put3("GUARD DATA: A)nalog or D)igital Guarding? ");
                c = get_one();
```

```
} while (c!=ESC && c!='A' && c != 'D');
if (c== ESC) return(0);
if (c=='A'){
        topic = "AGUARD";
        anal_guard();
        return(1);
}
do {
        topic = "DGUARD";
        put3("DIGITAL GUARD: A)dd, E)xpand, or N)ew Tolerances? ");
        c = get_one();
} while(c!= ESC && c != 'A' && c != 'N' && c != 'E');
if (c==ESC) return(0);
put3c("DIGITAL GUARD: Enter the Guarding Factor: ");
factor = 0;
if (get_int(&factor) == ESC) return(0);
put3 ("Working ...");
if (c == 'N') gen_ref('D');        /* setup new digital references */
for (x = 0; x < MAXPD1; x++)   {
        if (SO_PODDT[x] == 0) {                     /* digital bank */
                setoffset(x);
                if (c!='E') {
                        src = newbuf + offset;
                        dst = tolbuf + offset;
                        door(dst,dst,src,banksize);
                }
                for (ch=0; ch<numchbnk; ch++) {
                        if (c=='E')
                                src = tolbuf + offset + ch*chnsize;
                        else
                                src = databuf + offset + ch*chnsize;
                        dst = tolbuf + offset + ch*chnsize;
                        for (j1=0;j1<chnsize;j1++) scratch[j1]=0;
                        j1 = 0; j2 = 0;
                        blip = 0;                /* tolerate this edge */
                        last = 0;                /* last bit sampled */
                        sbit = 0x80;
                        do {                     /* do full channel */
                                if ((last==0 && *src!=0) || (last==1&& *
                                do {             /* do 8 bits worth */
                                        if (*src & sbit) {     /* bit i
                                                if (last == 0) {
                                                        blip = 1;
                                                        last = 1;
                                                }
                                        }
                                        else if (last) {
                                                blip = 1;
                                                last = 0;
                                        }
                                        if (blip == 1) {
                                                blip = 0;
                                                dbit = sbit;
                                                j2 = j1;
                                                for (i=0; i<=factor; i++
                                                        scratch[j2] |= d
                                                        if (dbit == 0x80
                                                                if (j2==
                                                                        j2--;
                                                                dbit = 0
                                                        }
                                                        else dbit <<= 1;
                                                }
                                                j2 = j1;
                                                dbit = sbit;
                                                for (i=1; i<factor; i++)
                                                        if (dbit == 0x01
                                                                j2++;
                                                                if (j2>=
                                                                        dbit = 0
                                                        }
                                                        else dbit >>= 1;
                                                        scratch[j2] |= d
```

```
                                            }
                                    if (sbit > 0x01) sbit >>= 1;
                                    else sbit = 0x80;
                            } while (sbit !=0x80 );
                            j1++;
                            src++;
                    } while (j1 < chnsize && j2 < chnsize);
                    door(dst,dst,scratch,chnsize);
                }
            }
        }
    }
}
anal_guard()
{
        int     i,x,y;
        int     factor,hfactor,c,count;
        unsigned char *s1,*s2,*s3;
        if (locked()) {
                put_s2("THIS FRAME IS LOCKED AGAINST MODIFICATION");
                return(0);
        }
        put3c("Select the Bank Number to Guard: ");
        c = get_probe("");
        if (c == ESC || c == -1) return(0);
        x = c;
        sprintf(tmpstr,"Enter the Vertical Analog Guard Factor for A%d: ",x);
        prmpt3(tmpstr,0);
        c = get_int(&factor);
        if (c != ESC) {
        sprintf(tmpstr,"Enter the Horizontal Analog Guard Factor for A%d: ",x);
                prmpt3(tmpstr,0);
                c = get_int(&hfactor);
        }
        put3("A)dd to Bands, N)ew Bands");
        c = get_one();
        if (c != ESC) {
                if (SO_PODDT[x]==1) {
                        setoffset(x);
                        s1 = maskbuf+offset;
                        s2 = tolbuf+offset;
                        s3 = databuf + offset;
                        count = banksize;
                        if (c == 'N') {
                                for (y=0; y<count; y++) {
                                        s1[y] = s3[y];
                                        s2[y] = s3[y];
                                }
                        }
                        do {
                                y = *s3 - factor;                   /* vertical factor */
                                if (y < 0) y = 0;
                                if (y < *s1) *s1 = y;
                                for (i=1;i<=hfactor;i++) {          /* horiz factor */
                                    if (count-i < 0) break;         /* space behind */
                                    if (banksize-count < i) break;  /* space in front */
                                    y = *(s3+i)-factor;             /* change the minimum */
                                    if (y <= 0) y = 0;
                                    if ( y < *s1) *s1 = y;          /* check ahead */
                                    y = *(s3-i)-factor;             /* change the minimum */
                                    if (y < 0) y = 0;
                                    if ( y < *s1) *s1 = y;          /* check ahead */
                                }
                                y = *s3 + factor;
                                if (y > 255) y = 255;
                                if (y > *s2) *s2 = y;
                                for (i=1;i<=hfactor;i++) {
                                    if (count-i < 0) break;
                                    if (banksize-count < i) break;
                                    y = *(s3+i)+factor;
                                    if (y > 255) y = 255;
                                    if (y > *s2) *s2 = y;
                                    y = *(s3-i)+factor;
                                    if (y > 255) y = 255;
```

```
                                if (y > *s2) *s2 = y;
                        }
                        s1++; s2++; s3++;
                } while (--count > 0);
        }
        clip_pod(maskbuf,x,0);
        clip_pod(tolbuf,x,0xff);
        sprintf(tmpstr,"Analog Guarded by +/- VER:%d,  +/- HOR:%d",
                factor,hfactor),
        put_s2(tmpstr);
        }
}
new_refs()
{
        int     x;
        unsigned c;
        if (locked()) {
                put_s2("THIS FRAME IS LOCKED AGAINST MODIFICATION");
        }
        else {
                topic = "NEWREF";
                do {
                        put3("Reset References for : A)nalog, D)igital, or B)oth
                        c = get_one();
                } while (c !=ESC && c!= 'A' && c != 'B' && c != 'D');
                put3("working ...");
                if (c != ESC) gen_ref(c);
                put_s2("REFERENCE RESET COMPLETE: New Ref. and Tol. data in memo
        }
}
gen_ref(c)
int     c;
{
                int     x;
                for (x = 0; x< MAXPD1; x++) {
                        setoffset(x);
/* digital */           if (SO_PODDT[x]==0 && (c=='D' || c == 'B') ) {
                                memcpy(maskbuf+offset,databuf+offset,banksize);
                                clear_buf(tolbuf+offset,banksize,0);
                                clip_pod(tolbuf,x,0xff); /* set margins hi */
                        }
                        else
/* analog data */       if ( SO_PODDT[x] == 1 && (c == 'A' || c == 'B') ){
                                memcpy(maskbuf+offset,databuf+offset,banksize);
                                memcpy(tolbuf+offset,databuf+offset,banksize);
                                clip_pod(maskbuf,x,0);   /* min band */
                                clip_pod(tolbuf,x,0xff); /* max band */
                        }
                }
}
clip_pod(buf,pod,bitval)        /* bitval is 00 or ff */
unsigned char   *buf;
int     pod;
int     bitval;
{
    int marg,x;
    int chsz,noch,chmin,chmax,expf;
    unsigned char           *src,*s2;
    if (dsmin == 0 && dsmax >= q.mxbs) return(0);       /* nothing to clip */
        setoffset(pod);
        if (pod < MAXPD0 ) {
                chsz = csz0; noch = ncp0; expf = exp0;
        }
        if (pod >= MAXPD0 ){
                chsz = csz1; noch = ncp1; expf = exp1;
        }
        chmin = dsmin / expf;
        chmax = dsmax / expf;
        src = buf + offset;
/* sprintf(tmpstr,"BANK:%d,CHSZ:%d,NOCH:%d, LIM1:%d,LIM2:%d,EXP:%d,OFF:%d",
pod,chsz,noch,chmin,chmax,expf,offset);
put1(tmpstr);
delay(5);*/
```

```c
        if (SO_PODDT[pod] == 0) {        /* if the data is digital */
            while(noch-- > 0) {
                s2 = src;        /* start of this channel */
                marg = chmin;
                while (marg >= 8) {
                    *s2++ = (unsigned char)bitval;
                    marg -= 8;
                }
                x = 0x00ff;
                while (marg-- > 0)        /* set up clip mask */
                    x >>= 1;
                if (bitval == 0)
                    *s2 &= (unsigned char)x;        /* clip bits */
                else {
                    x ^= bitval;
                    *s2 |= (unsigned char)x;/* fill margin with bitval */
                }
                src += chsz;            /* start of next channel */
                s2 = src - 1;            /* end of previous channel */
                marg = q.mxbs/expf - chmax;    /* margin bits to clip */
                while (marg >= 8) {      /* whole bytes */
                    *s2-- = bitval;
                    marg -= 8;
                }
                x = 0xff;
                while(marg-- > 0)
                    x <<= 1;
                if (bitval == 0)
                    *s2 &= (unsigned char)x;    /* mask any bits */
                else {
                    x ^= 0xff;
                    *s2 |= (unsigned char)x;    /* fil margin high */
                }
            }
        }
        else { /* analog pod */
            s2 = src;
            for (marg=chmin;marg>0;marg--)
                *s2++ = bitval;
            s2 = src + q.mxbs/expf - 1;     /* last sample */
            for(marg=q.mxbs/expf-chmax;marg>0;marg--)
                *s2-- = bitval;
        }
}
load_frame(x)
int     x;
{
        if ( x >= 0 && x <= totframe) {
            curframe = x;
            zap_sbar(10,10);
            if (-1 !=get_frame(dtafile,curframe,hdb)) {
                if (HO_FRMPORT > '0') {
                    if (q.current_port != HO_FRMPORT) {
                        if (!set_port(HO_FRMPORT))
                            return(-1);
                    }
                }
                if (-1 != sndset())
                if (-1 != snddata()) {
                    get_mask();
                    return(0);
                }
            }
        }
        return(-1);
}
chk_topts()
{
        if (HO_MAXPASS == 0) {
            HO_MUXCODE = -1;
            HO_MAXPASS = 1;
            HO_MAXFAIL = 1;
            HO_PASSOPT[0] = 'D';
            HO_FAILOPT[0] = 'E';
```

```
                HO_ONPASS = -1;
                HO_ONFAIL = -1;
                HO_FOMCUTOF = -1;
        }
}
unsigned capture()      /* Level One Capture Function for Testing */
                        /* returns 0-OK, or -1-Error */
{
        unsigned      c;
        if (*HO_AUXPRG != 0) execute(HO_AUXPRG,0);      /* Initial */
        put3("Capture Data From the MFI-1000");
        c = arm();
        if (c == -1) return(c);
        if (*HO_AUXP2 != 0) execute(HO_AUXP2,0);        /* Armed */
        c = trigger();
        if (c == -1 ) return(c);
        if (*HO_AUXP3 != 0) execute(HO_AUXP3,0);        /* Final */
        c = rcvdata();
        return(c);
}
/* COMMON SOURCE MODULE FOR MFI CONTROL PROGRAM 2 and 48 */
/*    COPYRIGHT(C)1986,1987,1988.  ARRAY ANALYSIS, INC.    */
/* SCREEN.c */ include         "constant.h"
include         "global.h"
#include         "direct.h"

void    put_ch();
void    b_s();

extern  int      boxrows,clim,alim,
                 pxpcol,pxprow; /* found in display.c */ close_raw(file)
int     file;
{
        int     temp;
        temp = close(file);
        if (temp == -1)
                put_s2("Cannot close file");
        return(temp);
} void pad_str(d,s,n)
char    *d,*s;
int     n;
{
        while (*s != 0 && *s != '\n') {
                *d++ = *s++;
                if (--n == 0)
                        break;
        }
        while (n >0) {
                *d++ = ' ';
                n--;
        }
        *d = 0;
}
void set_str(d,n)
char    *d;
int     n;
{
        while (*d != 0 ) {
                if (n <= 0) {
                        *d = 0;
                        break;
                }
                else {
                        n--;
                        d++;
                }
        }
}
```

```
unsigned get_con(string,offset,maxlen)          /* Returns the terminator used */
char    *string;                                /* CR or U_ARW */
int     offset,maxlen;
{
        int     c,d,e;   char    *save;
int     tlen,loop = 1;
save = string;                          /* save original value */
tlen = offset;                          /* set starting count */
string += offset;
do {
        if (c_ready() != 0) {
                e = c = c_get();
                if ( c == 0) {          /* Extended char set */
                        c = 0xff;       /* Anticipate a good code */
                        e = d = c_get();        /* get ext code */
                        switch (d) {
                        case R_ARW:
                                c = *string;
                                if (c == 0)
                                        c = CR;
                                break;
                        case EN_D:
                                while (*string != 0&&tlen<maxlen){
                                        tlen++;
                                        put_ch(*string++);
                                }
                                break;
                        case HOME:
                                while (tlen>0) {
                                        tlen--;
                                        string--;
                                        b_s();
                                }
                                break;
                        case L_ARW:
                                if (tlen>0) {
                                        tlen--;
                                        string--;
                                        b_s();
                                }
                                break;
                        case INS:
                                ins_char(string,' ');
                                c = 0xff;
                                break;
                        case DEL:
                                del_char(string);
                                c = 0xff;
                                break;
                        case U_ARW:
                        case D_ARW:
                                c = 0xff;       /* ignore */
                                break;
                        }
                }
                switch (c) {
                case CR:                        /* carriage return */
                        *string++ = 0;
                case ESC:
                        loop = 0;
                        break;
                case BS:                        /* Back space key */
                        if (tlen > 0) {
                                tlen--;
                                string--;
                                        b_s();
                                        put_ch(' ');
                                        b_s();
                        }
                case 0xff:
                        break;
                default:
                        if ( tlen < maxlen) {
                                tlen++;
```

```c
                            *string++ = c;
                            put_ch(c);
                            break;
                    }
                }
        } while(loop);
        return((unsigned)e);
}
unsigned get_one()
{
        unsigned        c,d;
        c = c_get();
        if (c == 0) {
                d = c_get();
                c = d * 256;
        }
        else
                c = toupper(c);         /* Returns upper case */
        if (debugflg==1){putl("Character received from c-get()");delay(2);}
        return(c);
}
unsigned get_int(x)
int     *x;
{
        unsigned c;
        char    ts[24];
        c = get_con(ts,0,23);
        if (c != ESC && c != U_ARW && c!= D_ARW && *ts != 0)
                        *x = atoi(ts);
        return(c);
}
unsigned get_hex(x)     /* gets hex string and converts to integer */
int     *x;
{
        unsigned c;
        char    ts[24];
        ts[0] = 0;
        c = get_con(ts,0,23);
        if (c != ESC && *ts != 0)
                stch_i(ts,x);
        return(c);
}
unsigned get_lhex(lx)
long    *lx;
{
        unsigned c;
        char    ts[24];
        c = get_con(ts,0,23);
        if (c!=ESC && *ts != 0) {
                stchl_i(ts,lx);
        }
        return(c);
}
chk_hexchar(c)  /* call with hex digit in ascii: return 0x0 -- 0xF */
int     c;
{
        if ( c < '0' || (c>'9'&&c<'A') || c > 'F') return false;
        else return true;
}
cnv_hexchar(c)
int     c;
{
        c -= '0';
        if (c > 9) c -= 7;
        return(c);
}
stchl_i(str,lx)
char    *str;
long    *lx;
{
        char    *s;
        long    tx;
        int     cnt;
        char    c;
```

```
            tx = 0L;
            cnt = 0;
            s = str;
            while ( (c=*s++) != 0) {
                    c &= 0x00ff;
                    c = toupper(c);
                    if (c < 0x30) break;

if ( (c-=0x30) > 9)
                            if ( (c -= 7) < 0x0a) break;

if (c >0x0f) break;

tx <<= 4;
                    tx += c;

cnt++;
                    if (cnt > 8) break;
            }
            *lx = tx;
            return(cnt);
}
unsigned wait_one()
{
            unsigned    c,d;
            while (!kbhit());
            c = getch();
            if (c == 0) {
                    d = getch();
                    c += d * 256;
            }
            else
                    c = toupper(c);
            return(c);
}
/*   25 * 80 Text Cursor */
int     prevrow= -1,prevcol=-1;
int     cur_set = 0;
int     mcr,mcc;
void move_cur(row,col)                    /* text cursor */
int     row,col;
{
            row--; col--;
            erase_cur();
            typedot(1);
            grrtulc(col*pxpcol,row*pxprow,pxpcol-1,pxprow-1,q.keyattr);
            typedot(0);
            cur_set = 1;
            prevrow = row; prevcol = col;
            pcvscp(row,col);
}
erase_cur()
{
            int     r,c;
            if (cur_set == 1) {
                pcvgcp(&r,&c);
                typedot(1);
                grrtulc(prevcol*pxpcol,prevrow*pxprow,pxpcol-1,pxprow-1,q.keyattr);
                typedot(0);
                pcvscp(r,c);
                cur_set = 0;
            }
}
frsh_cur()
{
            if (curset == 0) {
                    move_cur(prevrow,prevcol);
            }
}
clear_cur()
{
            cur_set = 0;
}
```

```
int     micpr=-1,micpc=-1;
int     mic_set = 0;
move_mic(row,col)                           /* text cursor */
int     row,col;
{
        erase_mic();
        typedot(1);
        grrtllc(col-1,row-1,tpxcol-1,tpxrow-1,q.keyattr);
        fcurloc(col,row);
        typedot(0);
        mic_set = 1;
        micpr = row; micpc = col;
}
erase_mic()
{
        if (mic_set == 1) {
                typedot(1);
                grrtllc(micpc-1,micpr-1,tpxcol-1,tpxrow-1,q.keyattr);
                typedot(0);
                mic_set = 0;
        }
}
frsh_mic()
{
        if (mic_set == 0 && micpr != -1) {
                move_mic(micpr,micpc);
        }
}
clear_mic()
{
        mic_set = 0;
}

FILE    *thcfile;
void put_con(str,f)                         /* F == 0 - do not move cursor */
char    *str;                               /*   == 1 - move cursor to end */
int     f;                                  /*   == 2 - auto newline */
{
        int     r,c;
        int     i,len;
        char    tstr[68],*s;
        char    ts2[128];
        if (inhbflg != 1) {
                len = len_str(str);
                pcvgcp(&r,&c);
                erase_cur();                /* erase cursor */
                for (i=0,s=str; i<62-(c-coloff); i++) {
                        if (*s != 0 && *s != '\n') tstr[i] = *s++;
                        else break;
                }
                tstr[i] = 0;
                big_str(tstr,c,r,q.hattr,0);
                if (f == 2) if ( r < 22) r++;
                if (f == 1) move_cur(r+1,1+c+len);
                else move_cur(r+1,c+1);
                if (log_menu) log_line(str);
        }
        if (hardcopy) {
                sprintf(ts2,"%s\n",str);
                log_line(str);
        }
}
int     pcr,pcc;
void put_ch(s)
char    s;
{
        int r,c;
        if (inhbflg != 1) {
                if (microflg == 1) {
                        fcurget(&c,&r);
                        erase_mic();
                        grrtllc(c,r,tpxcol-1,tpxrow-1,q.battr);
                        fcurch(0,s,0,q.keyattr,0);
                        c += tpxcol;
```

```c
                    move_mic(r,c);
            }
            else {
                    erase_cur();
                    pcvgcp(&pcr,&pcc);
                    r = pxprow*(pcr+1)-1;
                    c = _pxpcol*pcc;
                    grrtllc(c,r,pxpcol-1,pxprow-1,q.keyattr/16);
                    fontch(1,s,c,r-pxprow/5,q.keyattr%16,0);
                    pcc += 1;
                    move_cur(pcr+1,pcc+1);
            }
        }
} void b_s()
{
        int r,c;
        if (microflg == 1) {
                fcurget(&c,&r);
                c -= tpxcol;
                move_mic(r,c);
        }
        else {
                pcvgcp(&r,&c);
                c -= 1;
                if (c >= 0)
                        move_cur(r+1,c+1);
        }
} void clear_buf(dst,count,fill)
char    *dst;
int     count,fill;
{
        while (count--) *dst++ = fill;
}

/*      DOS Directory Display   */
void dir_disp()
{
        put2(lf_form);
        prmpt3("Enter a File Mask (Such as: *.DAT) If Desired: ");
        get_con(tmask,0,15);
        put3("  ");
        directory(tmask,0);
} char    * pack_one(dst,src,len,flg)     /* Return next Destination */
char    *dst,*src;
int     len,flg;
{
        char    *s;
        int     x;
        x = 0;
        s = src;
        while (*src != 0) {
                if (flg == 1 && *src == '.')
                        break;
                else
                        *dst++ = *src++;
                x++;
        }
        while (x++ < len) {
                *dst++ = ' ';
        }
        *dst = 0;
        return(dst);
}
unsigned pause()
{
        unsigned c;
```

```c
                put_s2("Press any key to continue:");
                c = get_one();
                put_s2("");
                return(c);
}
int     line_control;   /* used to control scrolling */
new_screen()
{
            line_control = 0;       /* works with mon_screen routine */
            dspclean = 0;
            erase_cur();
            clr_screen(boxrows,coloff,boxrows+nodrows,79-coloff);
            move_cur(boxrows+1,coloff+1);
            dsp_regen = 1;
}
ns_wide()
{
            line_control = 0;
            dspclean = 0; erase_cur();
            clr_screen(boxrows,0,boxrows+nodrows,79);
            move_cur(boxrows+1,coloff+1);
            dsp_regen = 1;
}
mon_screen(src,flg)     /* returns 0=more room, 1=last line */
char    *src;
int     flg;    /* 0=pause and clear,  1=pause and scroll, 2 = return */
{               /*    on last line, */
        if (inhbflg == 1) return(0);
        put_con(src,2);
        if (++(line_control) >= 16) {
                if (flg == 0 || flg == 1) {
                        put_s2("Press A key to Continue ... ");
                        get_one();
                        put_s2(" ");
                        if (flg == 1) {
                                scroll_up(coloff,boxrows,nodcols,nodrows,8);
        clr_screen(boxrows+(nodrows-8),coloff,boxrows+nodrows,coloff+nodcols);
        move_cur(boxrows+(nodrows-8)+1,coloff+1);
                                move_cur(boxrows+16);
                                line_control -= 8;
                        }
                        else {
                                new_screen();
                                line_control = 0;
                        }
                }
                return(1);
        }
        else
                return(0);
}
struct find_t dfi;
directory(temp,flg) /* Flg used in pack_one to drop extensions */
char    *temp;
{
        char    tmp2[65],*s;
        int     c2,x,count,z;
        z = 0;
        if (inhbflg == 1) return(-1);
        new_screen();
        dspclean = 0;                           /* clear clean flag */
        getcwd(tmp2,65);                        /* get current directory */
        if (temp[0] == 0)
                strcpy(tmask,"*.*");
        else
                strcpy(tmask,temp);
        sprintf(tmpstr,"Files Matching \"%s\" In %s\n",
                tmask,tmp2);
        pad_str(tmpstr,tmpstr,62);
        put_con(tmpstr,2);
        pad_str(tmpstr,"   ",62);
        put_con(tmpstr,2);
        c2 = 0;
        count = 2;
```

```
                s = tmpstr;
                x = _dos_findfirst(&tmask[0],_A_NORMAL,&dfi);
                while( x == 0) {
                        s = pack_one(s,dfi.name,15,flg);
                        c2 += 20;
                        if (c2 > 62) {          /* Full line */
                                pad_str(tmpstr,tmpstr,62);
                                put_con(tmpstr,2);
                                count++;
                                if (count >= nodrows) {
                                        count = 1;
                                        z = 1;
                                        pause();
                                        new_screen();
                                }
                                c2 = 0;
                                s = tmpstr;
                        }
                        x = _dos_findnext(&dfi);
                }
                if (c2 > 0) {                           /* One screen full */
                        pad_str(tmpstr,tmpstr,62);
                        put_con(tmpstr);                        /* screen buffer */
                        count++;
                }
}
ioread(address,count)
char    *address;
unsigned count;
{
        int     x,y;
        y = 0;
        while (count > 0) {
                x = iioget();
                if (x != 0xffff) {
                        *address++ = x;
                        count--;
                        y = 0;
                }
                else {
                        if (++y > 500) break;
                        if (mon_esc()) break;
                }
        }
        return(count);
}
ioget()
{
        int     x;
        x = 0;
        do {
                x=iioget();
                if (mon_esc()) {x = 0xff; break;}
        } while (x == 0xffff);
        return(x);
} stch_i(str,x)
char    *str;
int     *x;
{
        char    temp[32];
        strcpy(temp,str);
        strupr(temp);
        sscanf(temp,"%X",x);
}
friend_int(dst,val,offv)
char    *dst;
int     val,offv;
{
        if (val <= offv) strcpy(dst,"OFF");
        else sprintf(dst,"%3d",val);
}
```

```c
friend_char(dst,val,offv)
char    *dst;
int     val,offv;
{
        if (val <= offv) strcpy(dst,"OFF");
        else sprintf(dst," %c ",val);
}
friend_hex(dst,val,offv)
char    *dst;
int     val,offv;
{
        if (val <= offv) strcpy(dst,"OFF");
        else sprintf(dst,"%3X",val);
}
 /* COMMON SOURCE MODULE FOR MFI CONTROL PROGRAM 2 and 48 */
 /*    COPYRIGHT(C)1986,1987,1988.  ARRAY ANALYSIS, INC.    */
 /* DSPLBLS.C: version.h selects MFI-1000 or MFI-AG48 conditional source */ include         "constant.h"
include         "global.h"

extern  int     dbgflag,cdval,latfac,lndx,cndx;
extern  char    bkpnt[];
char    *cku[] = {       {"NS"},{"US"},{"MS"},{"S."} };
#define ALBLPLUS    3
int     alncount = 0;            /* anlog display label line count */
char    ts[16],ts2[16],ts3[16];
int     save_sbar[20];
char    save_sbstrings[4][16];
orientsb()       /* set orientation point for status side bar */
{
        rl2(0,q.vsw);
        vpxo += tpxrow;
        hpxo = lsdcoff*pxpcol+tpxcol/2+2;
}
orientad()               /* set orientation for analog display labels */
{
        rl2(clines,pxprow); vpxo += 3*tpxrow/2;
        hpxo = tpxcol/2+2;
}
int     sv_voffset=-1,sv_vsw = -1;
int     sv_clim= -1, sv_alim = -1;
int     sv_numch = -1;

shwlabel(flg)
int     flg;    /* 0 = Normal Labels if Present; 1 = Show channel numbers */
{
        char    ts[16],ts2[16];
        int     y,x,atr,startcol;
        char    *lb;
        atr = q.nattr;
        startcol = tpxcol/2+1;
        if (sv_voffset!=voffset || sv_vsw!=q.vsw || rgn_dgtl
                    ||sv_clim!=clim || sv_numch!=numchnls || dsp_regen) {
                rl2(0,q.vsw);
                sv_voffset = voffset;
                sv_vsw = q.vsw;
                sv_clim = clim;
                sv_numch = numchnls;
                grrtulc(0,vpxo,sbxcols*pxpcol+2,2+clines*pxprow,q.battr);
                grrtul(0,vpxo,sbxcols*pxpcol-1,2+clines*pxprow,q.hattr);
                grline(3*tpxcol,vpxo,3*tpxcol,2+vpxo+clines*pxprow,q.hattr);
                rl2(1,q.vsw); vpxo += 1;
                for (x = 0; x < clim; x++){              /* digital labels */
                        y = init_chan(x+voffset);
                        if (y != -1) {
                                lb = HO_LABELS[lndx].x;
                                sprintf(ts,"%1X%d %s",cpdn,cchn,lb);
                                fontsprt(0,ts,startcol,vpxo,0,atr,0);
                        }
                        vpxo += q.vsw;
                }
                rgn_dgtl = 0;  /* clear regenerate digital labels flag */
        }
```

```
            if (alim > 0) {
                    sv_alim = alim;
                    rl2 (clines,pxprow);
                    grrtulc(0,vpxo+3,sbxcols*pxpcol+2,2+alines*pxprow,q.battr);
                    grrtul(0,vpxo+3,sbxcols*pxpcol-1,2+alines*pxprow,q.hattr);
                    orientad();
                    for (x=0; x<MAXPD1+ALBLPLUS; x++) {/* Analog Labels   */
                            do_anlbl(x,0);
            }
            if (dsp_regen) {
                    rl2(0,q.vsw);
                    grrtulc(lsdcoff*pxpcol,vpxo,sbxcols*pxpcol-1,nodrows*pxprow,q.ba
                    grrtul(lsdcoff*pxpcol,vpxo,sbxcols*pxpcol-1,nodrows*pxprow,q.hat
            }
            orientsb();
            atr = q.nattr;
            for (x=0; x<12; x++){
                    do_sbar(x,0);
            }
            dsp_regen = 0;
            putdsmp();
            return(0);
}
do_anlbl(x,flg)
int     x,flg;
{
        int mode,tlines;
        int     y,z,atr,lines = 0;
        atr = q.nattr;
        *ts3 = 0;
        if (x==0) {
                alncount = 0;
        }
        tlines = alines * pxprow / tpxrow;              /* lines available */
        y = analcnt*3 + 7 + analcnt/3;   /* lines needed */
        if (y <= tlines) mode = 3;
        else if (y - analcnt <= tlines) mode = 2;
        else mode = 1;
        lines = 0;
        if (analcnt > 0 && alncount <= tlines - analcnt/3) {
                if (x < MAXPD1) {
                        if (SO_PODDT[x] == 1) { /* test for analog */
                                atr = q.analatr[x];
                                analbl(x,ts,ts2,ts3,mode);
                                lines = pisb(ts,ts2,ts3,atr,1);
                                vpxo += tpxrow/3;
                        }
                }
                else {
                    x -= MAXPD1;
                    switch(x) {
                    case 0:                                         /* Horizontal Cu
                            z = HO_AC1 - 128;
                            sprintf(ts,"C3: %3d",z);
                            y = HO_AC2 - 128;
                            sprintf(ts2,"C4: %3d",y);
                            y -= z;
                            sprintf(ts3,"DF:%4d",y);
                            lines = pisb(ts,ts2,ts3,atr,1);
                            vpxo += tpxrow/3;
                            break;
                    case 1:
                            if(q.glbscale > 100)
                                    strcpy(ts,"MAGNIFY");
                            else strcpy(ts,"REDUCE");
                            sprintf(ts,"MAG:%3d%%",q.glbscale);
                            sprintf(ts2,"OFF:%3d",q.gbaoff);
                            lines = pisb(ts,ts2,ts3,atr,1);
                            vpxo += tpxrow/3;
                            break;
                    default:
                            return(0);
                    }
```

```
                }
                alncount += lines;
        }
        return(lines);
}
sbar_strdif(i,str)
int     i;
char    *str;
{
        char    *c;
        c = (char *) &(save_sbstrings[i][0]);
        if (strcmp(c,str) != 0) {
                strcpy(c,str);
                return(1);
        }
        else return(0);
}
sbar_dif(i,value)
int     i;
int     value;
{
        if (save_sbar[i] != value) {
                save_sbar[i] = value;
                return(1);
        }
        else return(0);
}
do_sbar(x,flg)          /* set flag to 1 to inhibit display */
int     x,flg;
{
        int     cunit,j;
        float   rslt;
        int     len,atr,lines=0;
        char    *s;
        if (inhbflg != 1) {
                j = dsp_regen;
                atr = q.nattr;
                *ts = 0; *ts2 = 0; *ts3 = 0;
                switch(x) {
                case 1:
                        j |= sbar_dif(0,SO_PLUG0) | sbar_dif(1, SO_PLUG1);
                                sprintf(ts,"0:%s",plgtag[SO_PLUG0]);
                                sprintf(ts2,"1:%s",plgtag[SO_PLUG1]);
                        break;
                case 2: /* clock */
                        j |= sbar_dif(2, SO_CLKPER)|sbar_dif(3,SO_CLKUNIT);
                        strcpy(ts," CLOCK ");
#ifdef MCP96
                        j |= sbar_dif(4,SO_CLKCOD);
                        if(SO_CLKCOD == 34) strcpy(ts2,"   EXT  ");
                        else
                        if (SO_CLKCOD == 35) strcpy(ts2," LOCAL ");
                        else
#endif
                        sprintf(ts2," %4u%2s",SO_CLKPER,cku[SO_CLKUNIT])
                        break;
                case 3:
                        j |= sbar_dif(5, SO_DTRIG);
                           strcpy(ts," TRIGGER");
                                sprintf(ts2," %c%-5u",SO_NEGTRIG==1?'-':' ',SO_
                        break;
                case 4: /* cursor 1 */
                        j |= sbar_dif(6, HO_SC1) | sbar_dif(7, HO_SC2);
                                sprintf(ts, " C1 %4d",HO_SC1);
                                sprintf(ts2," C2 %4d",HO_SC2);
                        break;
                case 5:
                        rslt = (float)(HO_SC2-HO_SC1) * (float)SO_CLKPER;
                        cunit = SO_CLKUNIT;
                        if ( fabs(rslt) >= 1000.0 && cunit < 3) {
                                cunit++;
                                rslt /= 1000.0;
                        }
                        j |= sbar_dif(8,SO_CLKUNIT)|sbar_dif(9,HO_SC2-HO_SC1);
```

```
                        sprintf(ts,"DF IN %s",cku[cunit]);
                        sprintf(ts2,"%4.3f",rslt);
                break;
        case 6:
                j |=sbar_dif(10,q.hsw) | sbar_dif(11,q.compress);
                if (q.compress>1)
                        sprintf(ts,"CMPRS:%2d",q.compress);
                else
                        sprintf(ts,"WIDTH:%2d",q.hsw);
                break;
        case 7:
                j |= sbar_dif(12,dspstate) | sbar_dif(13,highstate);
                        sprintf(ts, "V: %s",dsptag[dspstate]);
                        sprintf(ts2,"H: %s",dsptag[highstate]);
                break;
        case 8:
                j |= sbar_dif(14, 80 + q.gpib + q.comport);
                        strcpy(ts,"  PORT");
                        sprintf(ts2," %s%d",q.gpib==0?"COM":"GPIB",
                                q.gpib==0?q.comport+1:q.gpib);
                break;
        case 9:
                mon_stat();
                j |= sbar_dif(15,status);
                strcpy (ts," STATUS");
                sprintf(ts2,"  %s",latag[status]);
                break;
        case 10:
                s=q.dfname;len=0;
                while(*s!=0&&*s!=' ') {s++; len++;}
                if (len > 8) len -=8;
                else len = 0;
                pad_str(ts,q.dfname+len,8);
                j |= sbar_strdif(0,ts);
                s = ts;
                while (*s != 0 && *s != '.') {
                        *s = toupper(*s);
                        s++;
                }
                *s = 0;
                j |= sbar_dif(16,totframe) | sbar_dif(17,curframe);
                        sprintf(ts2,"TOTAL:%2d",totframe+1);
                        sprintf(ts3,"FRAME:%2d",curframe+1);
                break;
        case 11:
                j |= sbar_strdif(1,HO_DATE) | sbar_strdif(2,HO_TIME);
                pad_str(ts,HO_DATE,8);
                pad_str(ts2,HO_TIME,8);
                break;
        default:
                j = 0;
                *ts = 0;
                *ts2 = 0;
                break;
        }
        lines = pisb(ts,ts2,ts3,atr,j); /* put in side box */
        vpxo += tpxrow/3+1;
    }
    return(lines);
}
zap_sbar(n,mx)
int     n,mx;
{
        int     x,flg;
        orientsb();
        for (x = 0; x < 12; x++) {
                if (x>=n && x<=mx) flg = 0;
                else flg = 1;           /* suppress display */
                do_sbar(x,flg);
        }
}
zap_albl(n,mx)
int     n,mx;
{
```

```
        int     x,flg;
        orientad();
        for (x = 0; x < MAXPD1 + ALBLPLUS; x++) {
                if (x>=n && x<=mx) flg = 0;
                else flg = 1;           /* suppress display */
                do_anlbl(x,flg);
        }
}
pisb(ts,ts2,ts3,atr,j)  /* set flg to 1 to inhibit display */
char    *ts,*ts2,*ts3;
int     atr;
int     j;
{
        int     z;
        z = 0;
        if (*ts != 0) z++;
        if (*ts2 != 0)  z++;
        if (*ts3 != 0)  z++;
        if (j != 0) {
                grrtulc(hpxo-tpxcol/2,vpxo-tpxrow,sbxcols*tpxcol,
                        z*tpxrow,q.battr);
                if (*ts != 0) {
                        fontsprt(0,ts,hpxo,vpxo,0,atr,0);
                }
                if (*ts2 != 0) {
                        fontsprt(0,ts2,hpxo,vpxo+tpxrow,0,atr,0);
                }
                if (*ts3 != 0){
                        fontsprt(0,ts3,hpxo,vpxo+2*tpxrow,0,atr,0);
                }
                grrtul(hpxo-tpxcol/2,vpxo-tpxrow,
                        sbxcols*tpxcol+tpxcol/2,z*tpxrow,q.cattr);

}
        vpxo += z * tpxrow;
        return(z);
}
/* analog voltage tags */
char    *avltag[] = { {" 50MV"},{" 10MV"},{" 20MV"},{"50MV"},{"100MV"},
                      {"200MV"},{"500MV"},{0} };
int     avlfact[] = { 50,10,20,50,100,200,500,0};
analbl(n,tstr,tstr2,tstr3,mode)
int     n;
char    *tstr,*tstr2,*tstr3;
int     mode;           /* number of lines to display */
{
        int     x;
        float   z;
        char    *tmp1;
        x = SO_ANALSET[n];      /* scale setting */
        if (x < 0 || x > 6) x = 0;
        sprintf(tstr,"A%X %s",n,avltag[x]);
        if (mode > 1) {
                sprintf(tstr2,"%3d%%%c%3d ",achscale[n],
                SO_ANOFF[n].xxx[0]==0?'+':'-',SO_ANOFF[n].xxx[1]);

}
        else *tstr2 = 0;
        if (mode > 2) {
                if (achscale[n] <= 0 || achscale[n] >500)
                        achscale[n] = 100;
                z = HO_AC2; z -= HO_AC1;
                z = z * (float)avlfact[x] * 100.0 / (float)achscale[n];
                tmp1 = "MV";
                if (z > 999.999 || z < -999.999) {
                        z /= 1000.0;
                        tmp1 = "V.";
                }
                sprintf(tstr3,"%3.2f%s",z,tmp1);

}
        else *tstr3 = 0;
}
putdsmp()       /* dsipaly left and right sample number for display */
{
        int     x;
        char    ts[16];
```

```c
                if (inhbflg == 1) return(0);
                rl2(0,q.vsw);vpxo -= 2;
                hpxo -= pxpcol+4*tpxcol;
                grrtllc(0,vpxo,coloff*pxpcol-1,topbrdr-2,q.battr);
                sprintf(ts,"%4d",dspoff);
                fontsprt(0,ts,hpxo,vpxo+1,0,q.cattr,0);
                hpxo = (sbxcols + nodcols + 2) * pxpcol;
                grrtllc(hpxo,vpxo,sbxcols*pxpcol-1,topbrdr-2,q.battr);
                if (dspmode == 1) x = nohgrps*nodrows;
                else x = rowlen;
                sprintf(ts,"%-4d",dspoff+ x - 1);
                fontsprt(0,ts,hpxo,vpxo+1,0,q.cattr,0);
}
show_tick()
{
        int     x,y;
        rl2(0,q.vsw); vpxo -= 1;
        hpxo = (sbxcols*pxpcol);
        grrtllc(hpxo,vpxo,(nodcols+2)*pxpcol-1,topbrdr-1,q.battr);
        hpxo += pxpcol;
        y = hpxo + nodcols*pxpcol;
        vpxo -= topbrdr/2;
        for (x = hpxo; x < y; x+=q.hsw*gexp) dot(x,vpxo,q.cattr);
        /* tick row */
}
void put_stat()
{
        statflg = 's';
        sprintf(tmpstr,"%6s %c",insmode==1?"INSERT":"      ",lrnstate[0]);
        zap_stat(tmpstr);
        zap_sbar(9,10);
}
void put_dstat()                /* Status during display function */
{
        int     xpos;
        if (dspmode != 1)
                xpos = dspoff + rowlen -1 ;
        else
                xpos = dspoff + 3 * nodrows - 1;
        statflg = 'd';
        sprintf(tmpstr, "%c ",  lrnstate[0]);
        zap_stat(tmpstr);
        zap_sbar(9,9);
        putdsmp();
} void put_estat()                /* Status during display edit function */
{
        int     xpos,cpos,vpos;
        char    ts[128];
        if (dspmode != 1) {             /* wave edit */
                if (editmode == 1) {
                        cpos = dspoff + eccol*q.compress;
                        init_chan(voffset+ecrow);
                        sprintf(tmpstr,
                        "DIGITAL CURSOR: CH:%X%d, SAMPLE:%d, EXPANSION:%d.",
                        cpdn,cchn,cpos,expansion);
                }
                else
                if (editmode == 3) {
                        cpos = dspoff + anecol*q.compress/q.hsw;
                        if (aneon == -1)
                        vpos=(int)((long)(anezero-anerow)*100L/(long)q.glbscale)
                        else {
                                sa_init(aneon,0);
                                vpos = (int) ( ((long)(anezero-anerow)*100L/
                        (long)ascale+(long)aoff)*100L/(long)q.glbscale );
                        }
                        if (aneon == -1) strcpy(ts,"ANALOG EDITING CURSOR IS OFF
                        else
                                sprintf(ts,"ANALOG EDITING ON FOR CHANNEL A%X.",
                        sprintf(tmpstr,"%s    SAMPLE #%d.   VALUE = %d",ts,cpos,vp
                }
```

```c
        }
        else {                          /* hex edit */
            xpos = dspoff + 3 * nodrows - 1;
            cpos = dspoff + hexgrp * nodrows + ecrow;
            sprintf(tmpstr,"HEX EDITING POSITION: Sample %d.",cpos);
        }
        statflg = 'e';
        zap_stat(tmpstr);
        zap_sbar(9,9);
        putdsmp();
}
put_tdstat()                    /* Status during Menu Timing Display function */
{
        statflg = 's';
        sprintf(tmpstr,
        "%c.",
        lrnstate[0]);
        zap_stat(tmpstr);
        zap_sbar(9,9);
        putdsmp();
}
void supdate()
{
        switch(statflg) {
        case 's': put_stat(); break;
        case 'd': put_dstat(); break;
        case 'e': put_estat(); break;
        case 't': put_tstat(); break;
        case 'm': put_mstat(); break;
        }

} put_mstat()
{
        char    *str,*str2,*str3;
        char    temp[128];
        char    temp2[64];

switch (istate) {
        case 0:
                str = "CLOSED";
                break;
        case 3:
        case 1: if (lrepeat == 0) str = "EXECUTING";
                else              str = "REPEATING";
                break;
        case 4:
        case 2:
                str = " PROGRAMING";
        }
        switch(dbgflag & 0x07) {
        case 0: str2 = "OFF"; break;
        case 1: str2 = "SINGLE STEP"; break;
        case 2: str2 = "TRACE"; break;
        case 6:
        case 4: sprintf(temp2,"%sBREAK ON (%s)",
                dbgflag == 6 ? "TRACE & " : "",bkpnt);
                str2 = temp2;
                break;
        }
        if (dbgflag & 0x08) {
                if (dbgflag & 0x10)
                        str3 = "HEX ";
                else
                        str3 = "DECIMAL ";

}
        else
                str3 = "";
        sprintf(temp,
                "%s:%s  SPEED DELAY = %d,  DEBUG: %s%s.",
                str,lrnfile==NULL?"":q.lrnname,cdval/100,str3,str2);
        zap_stat(temp);

}
#ifdef  MCP96
```

```
dfltlabs()      /* write display defaults into header */
{
        int     i,j;
        char    *s, *d;
        for (j=0; j < np0+np1; j++) {
                achscale[j] = 100;
                SO_PODDT[j] = 0;        /* digital bank */
        }
        for (j=0; j<96&&j<nc0+nc1; j++) {
                d = HO_LABELS[j].x;
                if(j>=nc0 && j < nc0 + nc1)     /* plug in 1 */
                        sprintf(tmpstr,"CH %X%d",np0+(j-nc0)/ncp1,(j-nc0)%ncp1);
                else
                        sprintf(tmpstr,"CH %X%d",j/ncp0,j%ncp0);
                s = (char *)&tmpstr[0];
                for (i=0; i<5; i++)
                        *d++ = *s++;            /* copy five characters */
                *d = 0;                         /* terminate the string */
        }
        dsp_regen = 1;                          /* regenerate display */
}
#endif
/* COPYRIGHT BY ARRAY ANALYSIS, INC. (c)1986,1987,1988 */
/* 5/24/88 Added variables for dynamic buffer allocation, checks for mismatch
    of buffer size and buffer division when reading/writing to/from files. */
/* 6/29/88 Added out_mux routine to select mux port */ include "constant.h"
include "global.h"
include <sys\timeb.h> void close_data(); void put_one(); void put_mul(); void put_byte();
void put_com(); void fz(); void put_stat(); void out_mux ();
unsigned get_ioc(); unsigned gp_get();
unsigned        tocnt,remcnt,curcnt,iocnt,curpkn,iopkn,curcks,iocks;

unsigned        get_bufsize ();
unsigned        file_bufsize;
char            convbuf[PODSIZE48];

int     glberflg = 0;
char    *curadr;
int     liversion;
char    livestring[20];
char    pkbuf[2064];
extern  int     bd0;            /* 488 board descriptor */
extern  int     ibsta;
extern  unsigned bioerr;        /* declared in io module */
extern  alim;
extern  int     mficlean;
extern  int     origoff;        /* from pc.c: synchronize changes in dspoff*/
open_data(flag)                 /* Opens a data file, existing or new */
int     flag;
{
        int     c;
        char    *hsave;
        char    ts[66];
        hsave = topic;
        topic = "SELECT";
        if (c_ready() == 0)
                directory("*.dat",1);
        prmpt3("OPEN: Enter the File Name: ");
        strcpy(ts,q.dfname);
        c = get_con(ts,0,64);                   /* Get file name */
        if (c == ESC){
                topic = hsave;
                return(dtafile);                /* Never mind anyway */
        }
        if (dtafile != -1) {
                close_data();
        }
        strcpy(q.dfname,ts);
        sprintf(q.dtaname,"%s.dat",q.dfname);   /* Construct full name */
        do_open(flag);
```

```c
        if (dtafile == -1) {
        }
        put_stat();
        topic = hsave;
        return(dtafile);
}

/* 5/24/88 Added check for buffer size and division compatibility */
do_open (flag)
int     flag;
{
        int     x, y;
        char    tbuf[8];
        dtafile = open(q.dtaname,O_BINARY|O_RDWR,0);
        if (dtafile == -1) {                            /* Cannot open */
                if (flag == 0) {
                        sprintf(tmpstr,
                        "Cannot Find %s.  Is This A New File?  (Y/N):",q.dtaname
                        prmpt3(tmpstr);
                        x = get_one();
                        if (x == 'Y') {
                        dtafile = open(q.dtaname,O_BINARY|O_RDWR|O_CREAT,S_IWRITE|S_IREAD);
                                if (dtafile == -1)
                                        put_s2("Cannot Create the New File");
                                else
                                        file_bufsize = get_bufsize (dtafile);
                        }
                }
                if (dtafile == -1) {
                        strcpy(q.dfname,"No File");
                        strcpy(q.dtaname,"No File");
                }
        }
        else {                                  /* this file already exists */
                file_bufsize = get_bufsize(dtafile);
                if (file_bufsize != blocksize || file_pilstart != pilstart) {
                        put_s2 ("Buffer Size Mismatch, Reallocating Buffers");
                        if (alloc_buf (file_bufsize)) {
                                pilstart = file_pilstart;
                                blocksize = file_bufsize;
                        }
                }
                else
                        put_s2("Storage File Open, Buffers NOT Changed");
                curframe = -1;
                while( 1 ) {
                        if (seek_frame(dtafile,curframe+1)==1) {
                                if (read(dtafile,tbuf,4) == 4)
                                        curframe++;
                                else
                                        break;
                        }
                }
                totframe = curframe;
                if (flag == 1) curframe = 0;
        }
}
browse()
{
        int     c,x = 0;
        int     index = -1;
        char    temp[96];
        index = -1;
        while (1) {
                if (index == -1) {
                        new_screen();
                        put_con("FRAME                   TITLE",2);
                        put_con("                             ",2);
                        x = 3;
                }
                if (index < totframe) {
                        index++;
                        get_title(dtafile,index,temp);
```

```c
                    sprintf(tmpstr,"  %2d:    %s",index+1,temp);
                    put_con(tmpstr,2);
                    x++;
            }
brwlp:
            if (x >= nodrows || index == totframe) {
                    if (totframe + 3 > nodrows)
                            prmpt3(
"PgUp), PgDn), ESC), or Enter the Frame Number: ");
                    else
                            prmpt3("ESC), or Enter the Frame Number: ");
                    c = get_one();
                    if (c == 256*PG_U) {
                            x = 1;
                            new_screen();
                    }
                    else
                    if (c == 256*PG_D) {
                            index -= nodrows - 1;
                            index -= nodrows;
                            if ( index < -1)
                                    index = -1;
                            x = 0;
                    }
                    else
                    if (c >='0' && c <='9') {
                            *tmpstr = c;
                            put_ch(c);
                            if (get_con(tmpstr,1,16) != ESC) {
                                    x = atoi(tmpstr);
                                    x--;    /*convert to internal 0 count*/
                                    if ( x <= totframe && x >= 0)
                                            curframe = x;
                            }
                            break;
                    }
                    else
                    if (c == ESC)
                            break;
                    else
                            goto brwlp;
            }
    }
    if (c != ESC)
            return(index);
    else
            return(ESC);
} void close_data()
{
        strcpy(q.dfname,"        ");
        strcpy(q.dtaname,"        ");
        close(dtafile);
        dtafile = -1;
        curframe = -1;
        totframe = -1;
}

/* 5/24/88 Modified for dynamic buffer allocation */
seek_frame (storfile,f)
int     storfile,f;
{
        long    pos;
        pos = ((long)hdrsize+(long)setupsize+(long)file_bufsize) * (long) f;
        if (pos == lseek (storfile,pos,SEEK_SET))
                return (1);
        return(-1);
}

/* 5/24/88 Modified for dynamic buffering */
get_title (storfile, f, dst)
```

```
int     storfile, f;
char    *dst;
{
        long    x, pos;
        pos = ((long) hdrsize + setupsize + file_bufsize) * (long) f + 32L;
        x = lseek (storfile, pos, SEEK_SET);
        if (x != pos) return (-1);
        read (storfile, dst, 96);
        return (1);
}

/* 5/24/88 Modified for dynamic buffering, check for buffer mismatch */
write_frame (storfile, f, src)              /* Write frame to file from buffer */
int     storfile;
int     f;
char    *src;
{
        int     y;
        if (locked ()) {
                put_s2 ("FRAME IS LOCKED!  WRITE WAS NOT PERFORMED!");
                return (-1);
        }
        if (lseek (storfile, 0L, SEEK_END) > 0L &&
                (file_bufsize != blocksize || file_pi1start != pi1start)) {
                put_s2 ("Error: Current plug-ins different from file plug_ins");
                return (-1);
        }
        file_bufsize = blocksize;

sprintf(tmpstr,"Write Frame #%d ",curframe+1);
        put_s2 (tmpstr);
        HO_SSZ = setsize;                       /* Set the setup size */
        HO_LOCK = 0L;                           /* Always write */
        HO_BUFSIZE = blocksize;
        HO_PI1START = pi1start;

/*      putslabs (); */
        y = seek_frame (storfile,f);
        if (y == 1) {
                y = write (storfile, src, hdrsize + setupsize);
                y += write (storfile, databuf, blocksize);
        }
        else
                y = 0;

if (y != hdrsize + setupsize + blocksize) {
                if (istate == 1) {      /* Macro execution in progress */
                        close_mac ();
                }
                if (y == -1)
                        put_s2 ("DISK ERROR: The Frame was NOT Written");
                else
                        put_s2 ("DISK FULL:  The Frame was NOT Written");
                return (-1);
        }
        else
                return (0);
}

/* 5/24/88 Added buffer size check, buffer division check */
get_frame (storfile, f, dst)                /* Seek and load a frame into buffer */
int     storfile;
int     f;
char    *dst;
{
        int     y;

/*
Check for buffer or division mismatch
*/
        if (file_bufsize != blocksize || pi1start != file_pi1start) {
                put_s2 ("Buffer Size Mismatch, Reallocating Buffers");
                file_bufsize = get_bufsize (storfile);
                if (!alloc_buf(file_bufsize)) {
```

```
                    put_s2 ("ERROR: Not enough memory to allocate buffers");
                    return -1;
                }
                pilstart = file_pilstart;
        } sprintf(tmpstr,"Read Frame #%d ",curframe+1);
        put_s2 (tmpstr);
        seek_frame (storfile, f);

y = read (storfile, dst, hdrsize + setupsize);
        y += read (storfile, databuf, blocksize);
        if (y != (hdrsize + setupsize + blocksize)) {
                sprintf (tmpstr, "CANNOT READ FRAME %d", f+1);
                put_s2 (tmpstr);
                return (-1);
        }
/*      getfset ();*/
        dsp_regen = 1;          /* signals regeneration of display */
        if (HO_SSZ > 0 && HO_SSZ <= 2048) {
                setsize = HO_SSZ;
                dspinit ();
                if (dspstate == 0)
                        do_disp ('D');
        }
        return (0);
}
/* 5/24/88 Added dynamic buffer allocation variables */
write_head (storfile, f)                /* Write frame to file from buffer */
int     storfile;
int     f;
{
        int     y;
        char    *src;
        src = hdb;
        if (locked ()) {
                put_s2 ("FRAME IS LOCKED!  WRITE WAS NOT PERFORMED!");
                return (-1);
        }
        if (storfile == -1) {
                put_s2("CANNOT WRITE TO FRAME: NO FILE IS OPEN");
                return(-1);
        }
        sprintf(tmpstr,"Write Control Header for Frame #%d ",curframe+1);
        put_s2 (tmpstr);
        HO_SSZ = setsize;               /* Set the setup size */
        HO_LOCK = 0L;
        HO_BUFSIZE = blocksize;
        HO_PI1START = pilstart;

/*      putslabs (); */
        y = seek_frame (storfile, f);
        if (y == 1)
                y = write (storfile, src, hdrsize);
        else
                y = 0;

if (y != hdrsize) {
                if (istate == 1) {      /* Macro execution in progress */
                        close_mac ();
                }
                if (y == -1)
                        put_s2 ("DISK ERROR: The Frame was NOT Written");
                else
                        put_s2 ("DISK FULL:  The Frame was NOT Written");
                return (-1);
        }
        else
                return (0);
} get_head(storfile, f)           /* Seek and load a frame into buffer */
int     storfile;
int     f;
```

```
{
        int     y;
        char    *dst;
        dst = hdb;
/*
Check for buffer or division mismatch
*/
        if (file_bufsize != blocksize || pilstart != file_pilstart) {
                put_s2 ("Buffer Size Mismatch, Reallocating Buffers");
                file_bufsize = get_bufsize (storfile);
                if (!alloc_buf(file_bufsize)) {
                        put_s2 ("ERROR: Not enough memory to allocate buffers");
                        return -1;
                }
                pilstart = file_pilstart;
        } sprintf(tmpstr,"Read Control Header from Frame #%d ",curframe+1);
        put_s2 (tmpstr);
        y = seek_frame (storfile, f);
        if (y = 1)
                y = read (storfile, dst, hdrsize);
        if (y != hdrsize) {
                sprintf (tmpstr, "CANNOT READ HEADER %d", f+1);
                put_s2 (tmpstr);
                return (-1);
        }
/*      getfset ();*/   /* do eventually for old plugins */
        dsp_regen = 1;          /* signals regeneration of display */
        if (HO_SSZ > 0 && HO_SSZ <= 2048) {
                setsize = HO_SSZ;
                dspinit ();
                if (dspstate == 0)
                        do_disp ('D');
        }
        return (0);
} get_mask ()     /* Restore the Reference */
{
        int x;
        if (maskfile == -1) {
                if (dtafile == -1) {
                        open_data(1);
                        if (dtafile == -1) return(-1);
                }
                sprintf (q.maskname, "%s.%d", q.dfname, curframe+1);
                maskfile = open(q.maskname,O_BINARY|O_RDONLY,0);
                if(maskfile == -1) {
                        put_s2 ("Cannot find Reference for this Frame");
                        x = -1;
                }
        }
        if (maskfile != -1) {
                if (lseek (maskfile, 0L, SEEK_END) != (long) blocksize * 2) {
                        put_s2 ("Reference not for current plug-ins; Load setup
                        close (maskfile);
                        maskfile = -1;
                        return -1;
                }
                sprintf(tmpstr,"Reference and Tolerance Restored from %s",
                        q.maskname);
                put_s2(tmpstr),
                lseek(maskfile,0L,SEEK_SET);
                x = read(maskfile,maskbuf,blocksize);
                x = read(maskfile,tolbuf,blocksize);
                close(maskfile);
                maskfile = -1;
        }
        return(x);
} put_mask()      /* save the reference */
```

```
{
        int     x;
        long    l;
        if (locked()) {
                put_s2("FRAME IS LOCKED!  WRITE WAS NOT PERFORMED!");
                return(-1);
        }
        if (maskfile == -1) {
                if (dtafile == -1) {
                        open_data(0);
                        if (dtafile == -1)
                                return(-1);
                }
                sprintf(q.maskname,"%s.%d",q.dfname,curframe+1);
        maskfile = open(q.maskname,O_BINARY|O_RDWR|O_CREAT,S_IREAD|S_IWRITE);
                if(maskfile == -1) {
                        x = 0;
                }
        }
        if (maskfile != -1) {
                l = lseek(maskfile,0L,SEEK_SET);
                x = write(maskfile,maskbuf,blocksize);
                if (x == blocksize)
                        x = write(maskfile,tolbuf,blocksize);
                close_raw(maskfile);
                maskfile = -1;
                if (x == blocksize) {
                sprintf(tmpstr,"Reference and Tolerance Saved in file %s",
                                q.maskname);
                        put_s2(tmpstr);
                }
                else
                        x = 0;
        }
        if (x == 0)
                put_s2("DISK FULL:  Reference and Tolerance NOT Written");
        else
        if (x == -1)
                put_s2("DISK ERROR: Reference and Tolerance NOT Written");
        return(x);
}
unsigned long get_lock ()
{
        long    pos, tlock;
        pos = (long) (hdrsize + setupsize + file_bufsize) * (long)curframe;
        pos += (long)HOFF_LOCK;
        if (pos == lseek (dtafile, pos, SEEK_SET))
                if (sizeof(long) == read(dtafile,(char *)&tlock,sizeof(long)))
                        return (tlock);
        return (0L);
} put_lock (tlock)
unsigned long *tlock;
{
        long    pos;
        pos = (long) (hdrsize + setupsize + file_bufsize) * (long)curframe;
        pos += (long)HOFF_LOCK;
        if (pos == lseek (dtafile, pos, SEEK_SET))
                if (sizeof(long)==write(dtafile,(char *)tlock,sizeof(long)))
                        return (1);
        return (0);
}
unsigned long gargle(tstr)
char    *tstr;
{
        int     i;
        char    *s;
        unsigned long tsum;
        s = tstr;
        tsum = 0L;
        for (i=3; i<39;i+=3) {
                tsum += (long)*s * i;
                s++;
```

```c
                if (*s == 0) break;
        }
        return(tsum);
}
openlock() {
        char    tstr[32];
        int i;
        long    x,pos,tsum;
        unsigned long tlock;
        topic = "OPLOCK";
        tlock = get_lock();
        if (tlock == 0L) {
                put_s2("Frame is Already Unlocked");
                return(0);
        }
        prmpt3("LOCKED: TO Unlock Enter the Key: ");
        if (ESC == get_con(tstr,0,12)) return(0);
        pad_str(tstr,tstr,12);
        if (tlock == gargle(tstr)) {
                tlock = 0L;
                if (put_lock(&tlock)) {
                        HO_LOCK = 0L;
                        put_s2("Current Frame is NOW UNLOCKED");
                }
                return(0);
        }
        put_s2("You MUST have the Correct Key to Unlock the Frame");
}
setlock()
{
        int i;
        long    x,pos;
        unsigned long   tlock;
        char    tstr[32];
        topic = "SETLCK";
        tstr[0] = 0;
redo:
        prmpt3("UNLOCKED: To Lock Enter A 12 Character Key: ");
        if (ESC == get_con(tstr,0,12)) return(0);
        pad_str(tstr,tstr,12);
        tlock = gargle(&tstr[0]);
        prmpt3("Re Enter the Key.  Up to 12 characters: ");
        if (ESC == get_con(tstr,0,12)) return(0);
        pad_str(tstr,tstr,12);
        if (tlock != gargle(tstr)) {
                put_s2("Incorrect, Start Over");

goto redo;
        }
        if (put_lock(&tlock)) {
                HO_LOCK = tlock;
                put_s2 ("Current Frame is NOW LOCKED");
        }
}
locked()
{
        unsigned long   t;
        t = get_lock();
        if (t== 0L)
                HO_LOCK = t;
        return(t != 0L);
}
int     msflag = 0;                     /* Used to control Status polling */
mfi_present()
{
        int     x;
        x = test_mfi();
        if (x >= '0' && x <= '3') return(1);
        put_s2("NO RESPONSE FROM HARDWARE");
        return(0);
}
test_mfi()      /* check for presence of mfi */
{
```

```
        int         s;
        unsigned    timer = 10;           /* 90 * 1/3 = 30 seconds */
        if (q.gpib) timer = 1;
        else timer = 10;
        do {
                s = mfi_stat();
                if (s != -1) break;
        } while (--timer > 0);
        if (s >='0' && s<= '3') {
                status = s - '0';
                msflag = 0;
        }
        return(s);
}
try_stat()
{
        if (msflag > 2) msflag--;
        return(mon_stat());
}
mon_stat()              /* Shut off after three tries */
{
        int     x;
        if (msflag < 3) {
                x = mfi_stat();
                if (x == -1) {
                        x = '4';
                        msflag++;       /* Three consecutive retries */
                }
                else
                if (x < '0' || x > '3') {
                        x = '5';
                        msflag++;
                }
                else
                        msflag = 0;     /* valid status received */
        }
        else
                x = '6';                /* Shut off, no more tries */ status = x - '0';               /* put hex value in status index */
        return(x);
}
mfi_stat()              /* Fetch the status from the analyzer */
{
        int     d,x,state;
        int     svstat;
        if (q.gpib == 0) {      /* rs-232 */
                d = -1;
                set_tmo(500);
                while((iostat() & 0x0100) != 0) { /* if chars are ready */
                        ioget();                  /* clean up */
                        if (tst_tmo() || mon_esc()) {
                                return(ESC);
                        }
                }
                put_com('y');
                set_tmo(1000);
                while (1) {
                        if ((iostat() & 0x0100) != 0) {
                                d = ioget();
                                break;
                        }
                        tck();
                        if(mon_esc()) return(ESC);
                }
        }
        else {
                svstat = 0;
                d = 0;
                x = 0;
                state = 0;
                set_tmo(1000);
                do {
```

```
                        tck();
                        if (state == 0) {
                                if(mon_esc()) {
                                        state = 3;
                                        break;
                                }
                                ibtmo(bd0,13);          /*ten second  timeout */
                                gx_talk();
                                ibwrt(bd0,"*y",2);      /* async gpib read */
                                if (!terror()) {
                                        state = 1;
                                }
                        }
                        else if (state == 1) {
                                ibtmo(bd0,0);           /*no timeout */
                                gx_list();
                                ibrda(bd0,&d,1);        /* async gpib read */
                                set_tmo(400);
                                do {
                                        ibwait(bd0,0);
                                        if (tst_tmo() && mon_esc()) {
                                                ibsta = 0x8000;
                                        }
                                } while (ibsta & 0x8100 == 0);
                                if (!terror()) {
                                        state = 2;
                                }
                                else {
                                        d = '4';        /* Return SIlent */
                                        state = 4;
                                }
                        }
                } while(state < 2);
                gx_clear();
                if (state == 3) {
                        d = ESC;
                }
                ibtmo(bd0,12);
        }
        return(d);
}
getfset()
{
        HO_AC1 = SO_HC1;
        HO_AC2 = SO_HC2;
        HO_SC1 = SO_DCU1;
        HO_SC2 = SO_DCU2;
}
putfset()
{
        SO_HC1 = (unsigned char)HO_AC1;
        SO_HC2 = (unsigned char)HO_AC2;
        SO_DCU1 = HO_SC1;
        SO_DCU2 = HO_SC2;
}
putslabs()      /* copy label string buffers back to setup area */
{
        int     i,j;
        char    *s, *d,c;
        d = SO_TDLAB;                   /* destination in setup label area */
        for (j=0; j<32; j++) {
                s = (char *) HO_LABELS[j].x;
                for (i=0; i<5; i++) {
                        if (*s != 0) {
                                c = toupper(*s++);
                                if ( (c >= '0' && c <= '9') ||
                                        (c >= 'A' && c <= 'Z')  )
                                        *d++ = c;
                                else
                                if (c >= 'a' && c <= 'z')
                                        *d++ = c - 0x20;
```

```
                        else
                                if (c==' ' || c=='/' || c=='*')
                                        *d++ = c;
                                else
                                        *d++ = ' ';     /* fill short label */
                        }
                        else *d++ = ' ';
                }
        }
}
tck()
{
        if (tst_tmo()) {
                zap_stat("DELAY IN MFI STATUS POLLING: PRESS 'ESC' TO CONTINUE."
                set_tmo(1000);
        }
}
set_error()
{
        ibsta |= 0x8000;
}
terror()        /* gpib error routine */
{
        if ((ibsta & 0x8000) != 0) {    /* On error send interface clear */
                        ibonl(bd0,1);
                        ibsic(bd0);
                        ibdma(bd0,1);
                        gx_clear();
                        return(1);
        }
        else
                return(0);
}
arm()                   /* Arm the analyzer, and verify */
{
        unsigned        d;
        put_s2("Waiting for Armed Status (ESC to Cancel) ... ");
        d = relayrsp();
        if (d != '1')
                put_com('O');
        do {
                d = relayrsp(); /* Get the MFI Status */
                if (d == ESC) {
                        return(-1);
                }
        } while (d != '1' && d != '3'); /* wait for armed status */
        put_s2("Armed.");
        return(0);
}
trigger()               /* Wait for Armed state to resolve */
{
        int     d;
        struct timeb strt,chkt;
        put_s2("Waiting for Trigger (ESC Key to Exit) ... ");
        ftime(&strt);
        do {
                d = relayrsp();   /* Get the MFI Status */
                if (d == ESC) {
                        put_com('O');   /* disarm MFI */
                        return(-1);
                }
                if (q.timeout > 0) {
                        ftime(&chkt);
                        if (chkt.time > strt.time+q.timeout ||
                                (chkt.time==strt.time+q.timeout &&
                                chkt.millitm>strt.millitm)){
                                put_com('O');   /* disarm MFI */
                                put_s2("TIMEOUT: MFI Did Not Trigger");
                                return(-1);
                        }
                }
        } while (d != '3');     /* wait for triggered status */
```

```
                put_s2("Triggered.");
                mfiClean = 0;
                return(0);
        }
disarm()                                /* DISArm the analyzer, and verify */
{                               /* Returns: 1==Sucessful; 0== Not sucessful */
        unsigned        d;
        if (ESC == (d = relayrsp())) return(0);         /* get MFI status */
        if (d == '1') {                         /* if MFI IS armed now */
                put_com('0');   /* send ARM key to disarm it */
                do {
                        d = relayrsp(); /* Get the MFI Status */
                        if (d == ESC) return(0);
                } while (d =='1');      /* wait for armed status to go away */

}
        return(1);
}
/*
Return 0 if not armed, otherwise print error message and return 1.
*/
int chk_armed ()
{
        int     x,d;
        x = 0;
        if (q.mnemflg == 1) {           /* suspend Menu emulation */
                clr_mnem();                     /* before testing armed state */
                q.mnemflg = 2;
        }
        d = relayrsp ();                /* Get the MFI status */
        if (d == ESC) {
                x = 1;
        }
        else
        if (d == '1') {
                if (disarm()) x = 0;
                else {
                        put_s2("ERROR: MFI Cannot be Disarmed, Operation Aborted
                        x = 1;
                }
        }
        else
        if ( d == '2') {
                put_s2("ERROR: MFI in Auto Arm state, Operation Aborted.");
                x = 1;
        }
        return(x);
} relayrsp()
{
        int     d;
        char    *s;
        d = test_mfi();
        if ( d == -1 ) {
                s = "No response.";
        }
        else
        if (d == ESC) {
                s = "Cancelled.";
        }
        else
        if (d >= '4') {
                s ="Invalid response.";
        }
        else return(d);
        put_con(s,1);
        return(ESC);
}
save()                          /* Append frame to file */
{
        int     c;
```

```c
        if (dtafile == -1)
                if (open_data(0) == -1)
                        return(-1);
        put3("Save the Contents of the Current Frame");
        totframe++;
        curframe = totframe;
        put_stat();
        clear_notes();
        comment();
        c = write_frame(dtafile,totframe,hdb);  /* Write the 8k chunk */
        return(c);
}

/* 5/24/88 Modified routine to allow different plug in uploads.  Calls
   different formats of rcv_block for AG48 or other plug-ins.  Allows
   for uploading combinations of plug-ins, with different size uploads.
   WARNING!! Reading the AG48 will trash the display buffer on the MFI.
   Therefore we will need to upload the buffer before reading an AG48. */ rcvdata ()                      /* Upload data from LA and write to file */
{
        int     c, i,af;
        char    *tmpbuf1, *tmpbuf2, *tmpptr;
        if (!mfi_present()) return(-1);
        put_s2 ("Uploading Display Data ");
        tmpbuf1 = databuf;
        tmpptr = NULL;
        tmpbuf2 = tmpptr;
        c = 0;
        if(is48(2))                             /* are ther any ag48's */
        if ( chk_armed())                       /* returns true if mfi is still armed*/
                c = -1;
        get_live_version();
        /* If either plugin is not AG48 upload old buffer */
        if ((!is48(0) && SO_PLUG0 != 0xf) || (!is48(1) && SO_PLUG1 != 0xf)) {
                tmpptr = (char *)calloc(dfltbuf,1);/* Allocate space for a temp
                if (tmpptr == NULL) {
                        c = -1;
                        put_s2("Not Enough Memory to Upload Data");
                        glberflg = 1;
                        return(c);
                }
                else c = rcv_block (tmpptr, dfltbuf, 0, 0);    /* Read in displ }
        if (is48 (0)) {         /* See what's in slot 0 and read it in */
                for (i = 0; i < 6; i++) {
                        if (c == -1) break;
                        if (q.quickmode==0 || SO_AGIO[11-i]==0) /* acquisition *
                                c = rcv_block (tmpbuf1, blocksize, 3, i);
                        tmpbuf1 += PODSIZE48;
                }
        }
        else {                  /* If not AG48, transfer half display buffer */
                tmpbuf2 = tmpptr;
                for (i = 0; i < dfltbuf/2; i++)
                        *tmpbuf1++ = *tmpbuf2++;

}
        if (SO_PLUG0 == 0xf)
                tmpbuf1 = databuf;
        if (is48(1)) {  /* See what's in slot 1 */
                for (i = 6; i < 12; i++) {
                        if (c == -1) break;
                        if (q.quickmode==0 || SO_AGIO[11-i]==0) /* acquisition *
                                c = rcv_block (tmpbuf1, blocksize, 3, i);
                        tmpbuf1 += PODSIZE48;
                }
        }
        else {
                tmpbuf2 = tmpptr + dfltbuf/2;
                for (i = dfltbuf/2; i < dfltbuf; i++)
                        *tmpbuf1++ = *tmpbuf2++;
        }
        if (tmpptr != NULL) free (tmpptr);
        stamp ();
```

```
            if (c == 0)
                    put_con (" Complete",1);
            else {
                    put_con (" Error",1);
            }
            mficlean = 1;
            return (c);
}

/* 5/24/88 Add check for buffer mismatch when uploading set up, if mismatch
    reallocate buffers */ rcvset ()
{
        int     c;
        unsigned        dbs;
        if (!mfi_present()) return(-1);
        put_s2 ("Upload Setup Data ");
        c = rcv_block (spb, setupsize, 2, 0);    /* Overlay new setup */
        if (c ==0) {
                setsize = tocnt;                /* set the actual setup size */
                sprintf (tmpstr, " Complete: %X Hex bytes",setsize);
                put_con (tmpstr, 1);
                dbs = dfltsize();       /* sets tmp_pilstart */
                if (dbs != blocksize || tmp_pilstart != pilstart) {
                        put_s2 ("Buffer Size Mismatch, Reallocating Buffers");
                        pilstart = tmp_pilstart;
                        if (!alloc_buf (dbs)) {
                                put_s2("Not enough Memory");
                                return 1;
                        }
                }
/*              getfset ();*/
                dspinit ();
                origoff = dspoff;
                dsp_regen = 1;
        }
        else {
                put_con (" Error",1);
        }
        return (c);
}

/* 5/24/88 Added variable size buffers for down loading */ snddata ()
{
        char    *p1,*p2,*tmpbuf,*tmpptr;
        int     c, i;
        if (!mfi_present()) return(-1);
        put_s2("Download Display Data");
        topic = "SNDDTA";
        c = 0;
        tmpptr = NULL;
        if(!is48(2)) {                          /* are there any ag48 plug_ins */
                c = snd_block(databuf,dfltbuf,0,0);
        }
        else
        if (!chk_armed()) {     /* if still armed there is a problem */
                tmpbuf = databuf;
                if (!is48(0) || !is48(1)) {
                        tmpptr = (char *)calloc(dfltbuf,1);/* Allocate space for
                        if (tmpptr == NULL) {
                                put_s2("Not Enough Memory to Upload Data");
                                return(1);
                        }
                }
                if (is48 (0)) {
                        for (i = 0; i < 6; i++) {
                                if (q.quickmode==0 || SO_AGIO[11-i]==1)  /* gener
                                        c |= snd_block (tmpbuf, PODSIZE48, 3, i)
                                tmpbuf += PODSIZE48;
                        }
```

```
                }
                else {                          /* copy plug-in 0 data */
                        p1 = tmpbuf;    /* source */
                        p2 = tmpptr;    /* destination */
                        for (i = 0; i < dfltbuf/2; i++) *p2++ = *p1++;
                        tmpbuf += dfltbuf/2;
                }
                if (is48 (1)) {
                        for (i = 6; i < 12; i++) {
                                if (q.quickmode==0 || SO_AGIO[11-i]==1) /* gener
                                        c |= snd_block (tmpbuf, PODSIZE48, 3, i)
                                tmpbuf += PODSIZE48;
                        }
                }
                else {                          /* copy plugin 1 data */
                        p1 = tmpbuf;

p2 = tmpptr + dfltbuf/2;
                        for (i = 0; i < dfltbuf/2; i++) *p2++ = *p1++;
                }
                if (tmpptr != NULL) {
                        c |= snd_block(tmpptr,dfltbuf,0,0);
                        free(tmpptr);
                }
        }
        if (c == 0)
                put_con (" Complete",1);
        else {
                put_con (" Error",1);
        }
        return (c);
}

/*
5/24/88 Added new format of snd_block
*/
sndset ()
{
        int     c;
        if (!mfi_present()) return(-1);
        sprintf (tmpstr, "Download Setup Data: %X Hex bytes", setsize);
        put_s2 (tmpstr);
/*      putslabs (); */
        putfset ();                     /* load setup from frame control header */
        c = snd_block (spb, setsize, 2, 0);
        if (c == 0) {
                put_con (" Complete",1);
                origoff = dspoff;
        }
        else {
                put_con (" Error",1);
                delay (3);
        }
        return (c);
}

/* 5/24/88 Added bufcode 3 for AG48 upload, bank selection */ rcv_block (buffer, size, bufcode, bank)
char    *buffer;
int     size, bank;
char    bufcode;
{
        char    cstr[16];
        char    tstr[16];
        int     x;
        bioerr = 0;
        glberflg = 0;
        if (q.gpib) q.pkmode = 'b';
        else
                while(iostat() & 0x100) ioget();

if (liversion >= 810) {         /* if version is modern */
                if (bufcode == 3) {     /* if request is for AG48 data */
```

```
                sprintf (cstr, "*s%c%1X%1X%4X", q.pkmode,
                            bufcode, bank, PODSIZE48);
                    fz(cstr);         /* fill in any spaces with 0 */
            }
            else {
                    sprintf(cstr, "*s%c%1X", q.pkmode,bufcode);
            }
        }
        else {
            if (bufcode == 3) {         /* old roms ag48 */
                    sprintf (cstr, "*s%c%1X%1X", q.pkmode,bufcode, bank);
            }
            else {  /* old roms non ag48 */
                    sprintf(cstr, "*s%c%1X", q.pkmode,bufcode);
            }
        }
        put_mul (cstr);
        get_rsp (tstr,5);
        tstr[5] = 0;
        sscanf (tstr, "+%4x", &tocnt);
        if (tstr[0] != '+' || tocnt == 0){
                sprintf (tmpstr, "NO ACK: Str(%s), Val(%X).", tstr, tocnt);
                put_con (tmpstr,1);
                put_one ('.');          /* Terminate command to MFI */
                get_ioc ();
                glberflg = 1;
                return (-1);
        }
        remcnt = tocnt;
        curadr = buffer;
        curpkn = 0;
        while (remcnt > 0) {
                if ((x = rcv_pak (curadr)) != 0)
                        break;
        }
        if (x == 0) {
                put_one ('.');
                get_ioc ();
                if (bufcode == 3 && SO_PODDT[bank] == 0)    /* AG48 and digi
                        ctdf48 (buffer, 0);
        }
        else glberflg = 1;
        return (x);                    /* returns number of bytes */
}
rcv_pak(adr)                    /* receive packet from the MFI */
char    *adr;
{
        char    str[8];
        int     sz1,sz2;
        char *p,*s,*p1,*p2;
        int     d,retry,phase,actsize;
        unsigned c,cc;
        suspend();
        retry=0;
        phase = 0;
        c = (unsigned)'+';
        if (q.gpib) {
grxrlp:
                gx_talk();
                ibwrt(bd0,&c,1);        /* send ack to  start transfer */
                gx_list();
                ibrd(bd0,str,6);
                str[7] = 0;
                sscanf(str,"%c%1x%4x",&c,&iopkn,&curcnt);
                iocnt = curcnt;   iocks = 0;
                p1 = adr;
                sz1 = iocnt;
                ibrd(bd0,adr,sz1);
rcvpklp:
                p2 = p1 + sz1;
                sz2 = iocnt - sz1;
                if (sz2 > 1024)
                        sz2 = 1024;
```

```
                if (sz2 > 0)
                        ibrda(bd0,p2,sz2);
                if (sz1 > 0) {
                        iocnt -= sz1;
                        while (sz1--)
                                iocks += *p1++;
                        sz1 = sz2;
                        goto rcvpklp;
                }
                curcks = 0;
                ibrd(bd0,&curcks,1);
                gx_clear();
        }
        else {
rtrloop:
                phase = 0;
                s = pkbuf+6;                    /* first packet byte */
                while (iostat() & 0x100) ioget();
                if (q.pkmode == 'h')            /* Size of binary packet data */
                        actsize = 2 * (pksize + 1);
                else
                        actsize = pksize + 1;
                put_one(c);
                d = ioread(pkbuf,6 + actsize);  /* set read pending */
                if ((bioerr&0x80) == 0 && (bioerr&0x0f) != 0 ){
                        sprintf(tmpstr,"BIOS IO Error(%X),", bioerr);
                        put_con(tmpstr,1);
                        resume();
                        return(-1);
                }
                sscanf(pkbuf,":%1x%4x",&iopkn,&curcnt);
                if (iopkn != ((curpkn+1)&0x0f)) {
                        phase = 3;
                }
                p = adr;
                iocnt = curcnt;                 /* set up for one packet */
                iocks = 0;

if (q.pkmode != 'h') {
                        while(iocnt-- > 0) {            /* if Binary mode */
                                c = (unsigned)(*s++);
                                *p++ = (unsigned char)c;
                                iocks += c;
                        }
                        curcks = (unsigned) *s++;       /* received checksum */
                }
                else {
                        while(iocnt-- > 0) {
                                c = (unsigned)(*s++) - 0x30;
                                        if (c > 9) c -= 7;

c <<= 4;
                                cc = (unsigned) (*s++) - 0x30;
                                        if (cc > 9) cc -=7;
                                c |= cc;
                                *p++ = (unsigned char)c;        /* high nibble *
                                iocks += c;     /* checksum */
                        }
                        c = (unsigned)(*s++) - 0x30;if (c > 9) c -= 7;
                        c <<= 4;
                        cc = (unsigned) (*s++) - 0x30;if (cc > 9) cc -=7;
                        curcks = c | cc;/* checksum recieved*/
                }       /* finish this piece */
        }
        iocks  &= 0x0ff;
        curcks &= 0x0ff;
        curcks ^= 0x0ff;
        if (curcks != iocks) {
                if (retry++ <=  4) {
                        if (retry == 4)         /* we skipped this packet */
                                c = '+';        /* ack it so we can move on */
                        else
                                c = '-';        /* call for that one again */
                        put_ch('-');            /* fill in the user */
```

```
                        resume();
                        if (q.gpib)
                                goto grxrlp;
                        else
                                goto rtrloop;    /* try again */
                }
                else {
                        put_con("Checksum error. ",1);
                        resume();
                        return(-1);
                }
        }
        put_ch('+');                    .               /* reflect operation to user */
        remcnt = remcnt > curcnt ? remcnt-curcnt:0;
        curadr += curcnt;
        curpkn = iopkn;
        resume();
        return(0);
}

/* 5/24/88 Added multiple bank down load capability */ snd_block (buffer, size, code, bank)
char            *buffer;
unsigned        size;
char            code;
int             bank;
{
        int             x;
        char            cstr[16],tstr[16];     /* command str, test string */
        if (!mfi_present()) {
                put_s2("NO RESPONSE FROM HARDWARE");
                return(-1);
        }
        glberflg = 0;
        if (q.gpib) q.pkmode = 'b';

if (code == 3) {
                size = PODSIZE48;
                sprintf (cstr, "*r%c%1X%1X%4X", q.pkmode, code, bank ,size);
                blt (&convbuf[0], buffer, PODSIZE48);
                buffer = convbuf;
                if (SO_PODDT[bank] == 0)
                        ctaf48 (buffer, 0);
        }
        else
                sprintf (cstr, "*r%c%1X%4X", q.pkmode, code, size);
        fz (cstr);                      /* fill any spaces with zeroes */
        put_mul (cstr);                 /* send the receive command to mfi */
        get_rsp (tstr, 1);              /* get the response */
        if (*tstr != '+') {
                put_con ("Command not Acknowledged. ",1);
                put_one ('.');
                get_ioc ();             /* get the reply */
                glberflg = 1;
                return (-1);
        }
        tocnt = remcnt = size;          /* count in bytes */
        curadr = buffer;                /* starting address */
        if (q.gpib)
                curcnt = blocksize;
        else
                curcnt = pksize;                        /* Initial packet size */
        curpkn = 1;                     /* start with packet number 1 */
        while (remcnt > 0) {
                if ( (x = snd_pak ()) != 0)
                        break;
        }
        put_one ('.');
        get_ioc ();
        if (x) glberflg = 1;
        return (x);                     /* return number of bytes sent */
```

```
}
snd_pak()
{
        char    c,*s,tstr[8];
        int     retry;
        retry = 0;
        suspend();
        curcnt = remcnt>curcnt ? curcnt : remcnt;
sprtry:
        s = curadr;
        iocks = 0;
        iocnt = curcnt;
        iopkn = curpkn;
        sprintf(tstr,":%1X%4X",iopkn,iocnt);
        fz(tstr);
        if (q.gpib) {
                gx_talk();
                ibwrt(bd0,tstr,6);
                ibwrta(bd0,curadr,iocnt);
                while (iocnt-- > 0)
                        iocks += *s++;
                c = (iocks&0xff)^0xff;  /* invert the checksum */
                ibwait(bd0,0x4100);     /* wait for timout or compl */
                ibwrt(bd0,&c,1);        /* write the checksum */ gx_list();
                c = 0;
                ibrd(bd0,&c,1);
                gx_clear();
        }
        else {
                put_mul(tstr);                  /* put the packet header */
                if (q.pkmode == 'h') {
                        while (iocnt-- > 0) {           /* put the data */
                                c = *s++;               /* get one character */
                                iocks += c;             /* add to the checksum */
                                put_byte(c);
                        }                               /* finished with the dat
                        c = iocks & 0x00ff;
                        c ^= 0x00ff;                    /* invert the checksum */
                        put_byte(c);            /* put the checksum */
                }
                else {                  /* do binary transfer */
                        while (iocnt-- > 0) {
                                c = *s++;       /* get binary character */
                                iocks += c;     /* add to checksum */
                                ioput(c);       /* send character to mfi */
                        }
                        c = (iocks & 0xff) ^ 0xff;/* invert the checksum */
                        ioput(c);
                }
                c = get_ioc();          /* get the response */
        }
        if ( c != '+') {                /* not acceptable */
                if (retry++ <=4 && c == '-') {  /* only four retries */
                        put_ch('-');
                        goto sprtry;    /* try again */
                }
                else {
                        resume();
                        return(-1);     /* can't do, return error code */
                }
        }
        if(curpkn < 15)
                curpkn++;
        else    curpkn = 0;
        curadr += curcnt;
        remcnt -= curcnt;
        put_ch('+');
        resume();
        return(0);
```

```
}
void put_one(a)
char    a;
{
        if (q.gpib)
                gp_write(&a,1);
        else
                ioput(a);
}
void put_two(a,b)
char    a,b;
{
        char    c[4];
        if (q.gpib) { c[0] = a;
                c[1] = b;
                gp_write(c,2);
        }
        else {
                ioput(a);
                ioput(b);
        }
}
void put_mul(str)
char    *str;
{
        char    *p;
        int     x = 0;

if (q.gpib) {
                p = str;
                while (*p++ != 0) x++;
                gp_write(str,x);
        }
        else
        while (*str != 0) {
                ioput(*str++);
        }
}
void put_byte(c)
unsigned char   c;
{
        unsigned char   d;

d = c>>4;                       /* upper nibble */
        d = d>9 ? d+0x37 : d+0x30;      /* to hex char */ c &= 0x0f;                      /* lower nibble */
        c = c>9 ? c+0x37 : c+0x30;      /* to hex char */
        put_two(d,c);
}
void put_com(a)
char    a;
{
        put_two('*',a);
}

/* out_mux will output mux value to selected port, printer port, monochrome
   adapter, or the MFI parallel port */ void out_mux (llport, value)
int     llport, value;
{
        if (llport == 0xfff) {          /* Is mux value directed to the MFI? */
                sprintf (tmpstr, "*p%2X", value);
                fz(tmpstr);
                put_mul(tmpstr);
        }
        else
                outp (llport, value);
} unsigned get_ioc()
```

```
{
        unsigned        c;
        if (q.gpib)
                c = gp_get();
        else {
                c = 0xff;
                set_tmo(750);
                while (tst_tmo() == 0) {
                        if ((iostat() & 0x0100) != 0) {
                                c = ioget();
                                break;
                        }
                        if(mon_esc() == 1) break;
                }
        }
        return(c);
}
get_rsp(str,cnt)
char    *str;
int     cnt;
{
        int     c;
        if (q.gpib)
                c = gp_read(str,cnt);
        else
                c = ioread(str,cnt);
        str += cnt;
        *str = 0;
        return(c);
}
void fz(p)
char    *p;
{
        for( ; *p != 0; p++)
                if (*p == ' ')
                        *p = '0';
}
#define EPBSIZE 4096
rcv_epr(name,fxsize,flag)
char    *name;
unsigned        fxsize;
int     flag;
{
        int     epfile;
        char    tstr[12],cstr[12];
        int     e,x;
        char    *epbuffer;

epbuffer = (char *)calloc(EPBSIZE,1);
        if (epbuffer==NULL) {
                put_s2("Not Enough Memory");
                return(-1);
        } epfile = open(name,O_BINARY|O_RDWR,0);   /* Binary, unfiltered file */
        if (epfile != -1) {
                prmpt3("File Exists!  Do You Wish to Overwrite It?  (Y/N)?");
                if (get_one() != 'Y') {
                        close(epfile);
                        free(epbuffer);
                        put_s2("Operation Cancelled");
                        return(-1);
                }
        }
        else
                epfile=open(name,O_BINARY|O_RDWR|O_CREAT|O_EXCL,S_IWRITE|S_IREAD
put3(" ");
put_s2("Sending the Command ");
sprintf(cstr,"*s%cl",q.pkmode);
put_mul(cstr);                          /* send command to mfi "*sb1" */
get_rsp(tstr,5);                        /* get the reply "+xxxx" */
if (*tstr != '+') {                     /* test for command acknowledgement */
        put_con("COMMAND NOT ACKNOWLEDGED",1);
```

```
                put_one('.');
                get_ioc();
                close(epfile);
                free(epbuffer);
                return(-1);
        }
        sscanf(tstr,"+%4x",&tocnt);     /* get overall size of transfer */
        sprintf(tmpstr,"Uploading IMAGE of %X Hex Bytes.",tocnt);
        put_s2(tmpstr);
        x = 0;
        curpkn = 0;
        remcnt = tocnt;
        while (remcnt > 0) {
                curadr = epbuffer;
                if((x = rcv_pak(curadr)) != 0) {
                        x = -2;
                        put_con("PACKET ERROR: ",1);
                        break;
                }
                e = write(epfile,epbuffer,curcnt);
                if(e != curcnt) {
                        x = -2;
                        if (e == -1)
                                put_con("DISK WRITE ERROR: ",1);
                        else
                                put_con("DISK FULL: ",1);
                        break;
                }
                if (mon_esc()) {
                        x = -2;
                        put_con("ESCAPE PRESSED: ",1);
                        break;
                }
        }
        put_one('.');
        get_ioc();
        close(epfile);
        free(epbuffer);
        return(x);
}
snd_epr(name,fxsize,flag)
char    *name;
unsigned        fxsize;
int     flag;
{
        char    tstr[12],cstr[12];
        int     epfile;

int     rsize,x;
char    *epbuffer;
epbuffer = (char *)calloc(EPBSIZE,1);
if (epbuffer==NULL) {
        put_s2("Not Enough Memory");
        return(-1);
} epfile = open(name,O_BINARY|O_RDONLY);  /* Binary, unfiltered file */
if (epfile == -1) {
        put_s2("Could not Find EPROM Image File");
        free(epbuffer);
        return(-1);
}
put3("  ");
sprintf(cstr,"*r%cl%4X",q.pkmode,fxsize);
fz(cstr);
put_mul(cstr);
get_rsp(tstr,1);
if (*tstr != '+') {
        put_s2("COMMAND NOT ACKNOWLEDGED ");
        put_one('.');
        get_ioc();
        close(epfile);
        free(epbuffer);
        return(-1);
```

```
}
sprintf(tmpstr,"Downloading IMAGE of %X Hex Bytes: ",fxsize);
put_s2(tmpstr);
x = 0;
curpkn = 1;
tocnt = remcnt = fxsize;
while (remcnt > 0) {
        if (q.gpib == 0)
                curcnt = pksize;
        else
                curcnt = blocksize;
        if (curcnt > remcnt)
                curcnt = remcnt;
        rsize = read(epfile,epbuffer,curcnt);
        if (rsize != curcnt) {
                x = -2;
                put_con("DISK READ ERROR: ",1);
                break;
        }
        curadr = epbuffer;
        x = snd_pak(curadr);
        if (x != 0) {
                x = -2;
                put_con("PACKET ERROR: ",1);
                break;
        }
        if (mon_esc()) {
                x = -2;
                put_con("ESCAPE KEY PRESSED: ",1);
                break;
        }
}
put_one('.');
get_ioc();

close(epfile);
        free(epbuffer);
        return(x);
} chk_mag() {
        if (SO_DSPMAGC != (char)0) {
                SO_DSPMAGC = (char)0; SO_DSPMAG = (char)5;
        }
}
get_live_version()      /* acquires live version from MFI or sets default */
{
        int     d,i,x,y,state;
        int     svstat;
        char    *s,tstr[32];
        float   f;
        s = livestring;
        if (msflag != 0) {              /* set by mfi_stat() */
                strcpy(livestring,"NO MFI ATTACHED");
                liversion = 810;
                state = 3;
        }
        else
        if (q.gpib == 0) {       /* rs-232 */
                while((iostat() & 0x0100) != 0) { /* if chars are ready */
                        ioget();                  /* clean up */
                        if (mon_esc()) {
                                return(0);
                        }
                }
                put_com('v');
                set_tmo(50);
                for (i=0; i<16; ) {
                        if ((iostat() & 0x0100) != 0) {   /* character ready */
                                *s++ = ioget();
                                i++;
                        }
                        if (tst_tmo()) {
                                break;
```

```
                }
                if (i==16) state = 2;
                else state = 4;
        }
}
else {
        state = 0;
        do {
                if (state == 0) {
                        ibtmo(bd0,12);   /* set one second timeout */
                        gx_talk();
                        ibwrt(bd0,"*v",2);
                        if (!terror()){          /* On error send interfa
                                state = 1;
                        }
                        else state = 4;
                }
                else if (state == 1) {
                        ibtmo(bd0,0);            /*no timeout */
                        gx_list();
                        ibrda(bd0,livestring,16);   /* async gpib read */
                                set_tmo(50);
                                do {
                                        ibwait(bd0,0);
                                        if (tst_tmo()) {
                                                ibsta |= 0x8000;
                                        }
                                } while ((ibsta & 0x8I00) == 0);
                                if (!terror()) {
                                        state = 2;
                                }
                                else {
                                        state = 4;
                                }
                }
        } while(state < 2);
        gx_clear();
        ibtmo(bd0,12);
}
if (state == 2) {                     /* successfull */
        livestring[16] = 0;
        for (i=0; i<16; i++) {
                if (livestring[i] == '.') {
                        tstr[0] = livestring[i-1];
                        tstr[1] = livestring[i+1];
                        tstr[2] = livestring[i+2];
                        tstr[3] = 0;
                        sscanf(tstr,"%d",&liversion);
                        break;
                }
        }
}
else
if (state == 4) {
        liversion = 700;
        strcpy(livestring,"DEFAULT  VERSION");
}
sprintf(tmpstr,       "ARRAY ANALYSIS, INC.    %s(%d)     (C)1988",
        livestring,liversion);
return(d);
}
/* COMMON SOURCE MODULE FOR MFI CONTROL PROGRAM 2 and 48 */
/*   COPYRIGHT(C)1986,1987,1988.  ARRAY ANALYSIS, INC.   */
/* GPIB.C */
#include     "constant.h"
include     "global.h"

/* VARIABLES DECLARED BY NATIONAL INSTRUMENTS GPIB LIBRARY */
extern  int    iberr;        /* gpib error */
extern  int    ibcnt;        /* gpib count */
extern  int    ibsta;        /* status word */
```

```c
#define GPERR   0x8000
char    tlkadr[17] ={"@ABCDEFGHIJKLMNO"};
char    lstadr[17] = " !\"#$%&'()*+,-./";
char    xstr[8] = "?_    ";
int     bd0 = -1;

gp_init(n)
int     n;
{
        int     x = 0;

if (bd0 < 0) {
                bd0 = ibfind("GPIB0");
                if (bd0 < 0) {
                        q.gpib = 0;
                        x = -1;
                }
                else {
                        ibsic(bd0);
                        ibdma(bd0,1);
                }
        }
        else
                bd0 = -1;
        return(x);
}
void gx_talk()                  /* n = device to talk to */
{
        xstr[2] = lstadr[q.gpib];               /* MFI listen Address */
        xstr[3] = tlkadr[q.gpctl];              /* Controller Talk address */
        ibcmd(bd0,xstr,4);
}
void gx_list()  .               /* n = device to listen to */
{
        xstr[2] = lstadr[q.gpctl];
        xstr[3] = tlkadr[q.gpib];
        ibcmd(bd0,xstr,4);
}
void gx_clear()
{
        ibcmd(bd0,"?_",2);
}
void gp_put(c)
char    c;
{
        gx_talk(q.gpib);
        ibwrt(bd0,&c,1);
        gx_clear();
}
gp_write(adr,cnt)               /* call gp_talk() before this call */
char    *adr;
int     cnt;
{
        int     x = 0;
        if (cnt > 0) {
                gx_talk();
                ibwrt(bd0,adr,cnt);
                if (ibsta & GPERR != 0)
                        x = -1;
                gx_clear();
        }
        return(x);
} gp_get()
{
        char    c;
        int     x;
        gx_list(q.gpib);
        ibrd(bd0,&c,1);
        if (ibsta & GPERR == 0)
                x = c;
        else
```

```
                x = 0xff;
        gx_clear();
        return(x);
} gp_read(adr,cnt)
char    *adr;
int     cnt;
{
        int     x = 0;
        if (cnt > 0) {
                gx_list();
                ibrd(bd0,adr,cnt);
                if (ibsta & GPERR != 0)
                        x = -1;
                gx_clear();
        }
        return(x);
}
/* 5/24/88 Module alloc added because compiler puked on this file */ include         "constant.h"
include         "global.h"
#include         "malloc.h"

/*
5/24/88 Routine will return true if requested slot has an AG48 in it.
If slot requested = 2, is48 will return true if either slot has an AG48 in it.
*/
is48 (slot)
int     slot;
{
        if (slot == 0 && SO_PLUG0 == ag48)
                        return (true);
        else if (slot == 1 && SO_PLUG1 == ag48)
                        return (true);
        else if (slot == 2 && (SO_PLUG0 == ag48 || SO_PLUG1 == ag48))
                        return true;
        return false;
}
/* 5/24/88 Dfltsize will return the buffer size needed to accomodate the
   current plug-ins.  Will also return a temp variable pointing to where
   the buffer should be divided btween slot 0 and slot 1 */ dfltsize ()
{
        int tmp_size;

tmp_size = 0;
        if (is48 (0))
                tmp_size += PISIZE48;
        else
                tmp_size += dfltbuf / 2;
        tmp_pilstart = tmp_size;                 /* mark division of plug-ins */
        if (is48 (1))
                tmp_size += PISIZE48;
        else
                tmp_size += dfltbuf / 2;
        return (tmp_size);
}

/* 5/24/88 get_bufsize added for dynamic buffer allocation when reading
        a frame.  Modified routine to account for plug in 1 buffer division */ unsigned get_bufsize(storfile)
int     storfile;
{
        unsigned        u;
        int             toffset;

if (lseek(storfile, 0L, SEEK_END) <= 0L) {       /* empty file */
                dfltsize ();                             /* Get buffer division from setu
                file_pilstart = tmp_pilstart;
                return (unsigned) blocksize;
```

```
}
u = 0;
if ((long)HOFF_BUFSIZE==lseek(storfile,(long) HOFF_BUFSIZE,SEEK_SET))
        read(storfile, (char *) &u, sizeof(u));
        if ((long)HOFF_PI1START==lseek(storfile,(long)HOFF_PI1START,SEEK_SET))
                read(storfile, (char *)&file_pi1start, sizeof(file_pi1start));

if (u == 0) {
                u = (unsigned) dfltsize ();
                file_pi1start = tmp_pi1start;
        }
        return u;
}
/* Alloc_bufs added to dynamically allocate buffers */
/* This routine only allocates the display buffers: databuf, maskbuf,
   tolbuf, and newbuf */ int alloc_buf (size)
int     size;                           /* new size of display buffers */
{
        int     rv;

rv = true;
er_again:
        if (databuf!=NULL)
                hfree (databuf);
        if (maskbuf!=NULL)
                hfree (maskbuf);
        if (tolbuf!= NULL)
                hfree (tolbuf);
        if (newbuf!=NULL)
                hfree (newbuf);

/* see if there is enough memory to allocate full size buffers */ databuf = (char *)halloc ((long)size, 1);
        maskbuf = (char *)halloc ((long)size, 1);
        tolbuf  = (char *)halloc ((long)size, 1);
        newbuf  = (char *)halloc ((long)size, 1);

if (newbuf == NULL) {
                if (!rv) {
                        return(false);
                }
                if (blocksize == 0)
                        return false;
                rv = false;
                size = blocksize;
                goto er_again;
        }
        blocksize = size;
        reset_dispbufs();               /* set new addresses for displays */
        return rv;
}
/* 5/24/88 This module contains the analog and digital buffer conversion
   routines.  ctaf, ctdf are used for display buffer conversions, ctaf48,
   ctdf48 are used for AG48 conversions. */ ctaf (dtb,probe)                        /* convert to analog format */
char    *dtb;
int     probe;
{
        char    *src,*ssrc,*tmp,*stmp,t[8];
        int     i,j,k,ch[8],bit,byte,mask;
setoffset(probe,0);
ssrc = src = dtb + offset;              /* start of this probe */
stmp = tmp = (char *)calloc(chnsize+4,8);
if (tmp != NULL) {
        for (i=0; i<8; i++) ch[i] = i * chnsize;                /* array of offs while (ch[0] < chnsize) {
                for(i=0; i<8; i++)
                        t[i] = src[ch[i]++];    /* load one group */
```

```
                        bit = 0x80;
                        for (j=0;j<8;j++) {
                                byte = 0;
                                mask = 1;
                                for (k=0; k<8; k++) {
                                        if (t[k] & bit)
                                                byte |= mask;
                                        mask <<= 1;
                                }
                                *stmp++ = byte;
                                bit >>= 1;
                        }
                }
                stmp = tmp;
                for ( i=0; i < chnsize*8; i++)
                        *ssrc++ = *stmp++;
                free(tmp);
        }
}
ctdf (dtb,probe)                        /* convert to digital format */
char    *dtb;
int     probe;
{
        char    *src,*ssrc,*tmp,*stmp,t[8];
        int     i,j,ch[8],bit,byte,mask;
        setoffset(probe,0);
        ssrc = src = dtb + offset;      /* start of this probe */
        stmp = tmp = (char *)calloc(chnsize+4,8);
        if (tmp != NULL) {
                for (i=0; i<8; i++) ch[i] = i * chnsize;
                while (ch[0] < chnsize) {
                        for (i=0; i<8; i++)
                                t[i] = 0;
                        mask = 0x80;
                        for (i=0; i<8; i++) {
                                byte = *ssrc++;
                                bit = 0x01;
                                for (j=0;j<8;j++) {
                                        if (byte & bit)
                                                t[j] |= mask;
                                        bit <<= 1;
                                }
                                mask >>= 1;
                        }
                        for (i=0; i<8; i++) {
                                stmp[ch[i]++] = t[i];
                        }
                }
                ssrc = src;
                for ( i=0; i < chnsize*8; i++)
                        *ssrc++ = *stmp++;
                free(tmp);
        }
}

/* 5/19/88 Routine modified to accomodate any size bank specified, will only
        convert a bank at a time */ ctdf48 (dtb,probe)                      /* convert to digital format */
 char   *dtb;
int     probe;
{
        char    *src,*tmp;
        unsigned short nsamps;
        nsamps = PODSIZE48;
        src = dtb + probe * nsamps;     /* start of this probe */
        tmp = (char *)malloc (nsamps + 16);
        if (tmp != NULL) {
                conva2d(tmp,src,nsamps);
                memcpy(src,tmp,nsamps);
                free (tmp);
        }
}
ctaf48 (dtb,probe)                      /* convert to digital format */
 char   *dtb;
int     probe;
```

```c
{
        char    *src,*tmp;
        unsigned short nsamps;
        nsamps = PODSIZE48;
        src = dtb + probe * nsamps;     /* start of this probe */
        tmp = (char *)malloc (nsamps + 16);
        if (tmp != NULL) {
                convd2a(tmp,src,nsamps);
                memcpy(src,tmp,nsamps);
                free (tmp);
        }
}
/*
ctaf48(dtb,probe)
char    *dtb;
int     probe;
{
        char    *src,*ssrc,*tmp,*stmp,t[8];
        int     i,j,k,ch[8],bit,byte,mask;
        ssrc = src = dtb + probe * PODSIZE48;
        stmp = tmp = (char *)calloc (PODSIZE48 + 10,1);
        if (tmp != NULL) {
                for (i = 0; i < 8; i++) ch[i] = i * PODSIZE48 / 8;
                while (ch[0] < (PODSIZE48 / 8)) {
                        for(i=0; i<8; i++)
                                t[i] = src[ch[i]++];
                        bit = 0x80;
                        for (j = 0;j < 8; j++) {
                                byte = 0;
                                mask = 1;
                                for (k = 0; k < 8; k++) {
                                        if (t[k] & bit)
                                                byte |= mask;
                                        mask <<= 1;
                                }
                                *stmp++ = byte;
                                bit >>= 1;
                        }
                }
                stmp = tmp;
                for ( i=0; i < PODSIZE48; i++)
                        *ssrc++ = *stmp++;
                free(tmp);
        }
}
*/ include         <fcntl.h>
include         <sys\types.h>
include         <sys\stat.h> define ESC              27
define BUF_SIZE         1024
        char    buffer[BUF_SIZE];

main(argc,argv)
int     argc;
char    **argv;
{
        int     inf,outf;
        int     incount,outcount;
        inf = open(argv[1],O_RDONLY|O_BINARY);
        if (inf==-1) {
                printf("\nCANNOT OPEN THE \"%s\"!\n",argv[1]);
                return(-1);
        }
        outf = open("PRN",O_WRONLY|O_BINARY);
        if (outf==-1) {
                close(inf);
                printf("\nCANNOT OPEN THE PRINTER!\n");
                exit(-1);
        }
        printf("Dumping \"%s\" to Printer ...",argv[1]);
        while (eof(inf)==0) {
```

```c
                incount = read(inf,buffer,BUF_SIZE);
                if (incount == -1) {
                        printf("\nERROR READING \"%s\"",argv[1]);
                        break;
                }
                if (incount == 0) break;
                outcount = write(outf,buffer,incount);
                if (outcount == -1 || outcount != incount) {
                        printf("\nERROR WRITING TO PRINT DEVICE\n");
                        break;
                }
                if(kbhit()) {
                        if(getch()==ESC) {
                                printf("OPERATION ABORTED!");
                                break;
                        }
                }
        }
}
printf(" Operation Complete ");
close(inf);
close(outf);
exit(0);

/* COMMON SOURCE MODULE FOR MFI CONTROL PROGRAM 2 and 48 */
/*   COPYRIGHT(C)1988.  ARRAY ANALYSIS, INC.   */
/* DIAGNOSE.C: version.h determines conditional source for MCP2 or MCP-AG48 */ include "constant.h"
include "global.h"
#include "malloc.h"
#include "diagnose.h"           /* local structures */
extern  char    vlxs[],datline[];
char    *cpyrghtf[] ={
#ifdef  MCP32
        {" MFI-1000  CONTROL PROGRAM 2              ARRAY   ANALYSIS, INC"},
#endif
ifdef  MCP96
        {" MFI-1000  CONTROL PROGRAM 48             ARRAY   ANALYSIS, INC"},
#endif
        datline,
        {" Copyright (c)1987,1988                        Ithaca, NY 14850"},
        vlxs,
        0 };
extern  char    fdmtitle[];
#ifdef  MCP32
#define         OBBUFR          40
#endif
ifdef  MCP96
#define         OBBUFR          10
#endif
/* ALways change file dumydiag to keep up with Versions and Dates */
/* MCP2 Mods */ char    *fdm_form[] = {
{"A)dd Diagnosis       D)elete Fault      R)eplace Fault       N)ext Best    "},
{"C)hange Diagnosis    E)xamine Fault     Q)uery On Fault      S)how Best    "},
{"F)ind Diagnosis      L)ist Fault        O)ption Selection    T)est Again   "},
{"                     I)nclude Fault                          ESC)ape       "},
        {0}
};
char    *fdopt_form[] = {
{"-------------- FAULT  DIAGNOSIS  OPTIONS --------------"},
{"A)utonomous Node Analysis                   N)umber of Matches to Show"},
{"C)heck for Shorts     S)ize of Fault Window                           "},
{"F)ault Status Line    T)ype of Fault Storage  W)eighting on First Fault "},
{0}
};
int     archfile;
char    archname[65];
char    faultnam[65];
int     faultfile;
char    *tfb = NULL;
float   *fom = NULL;
float   *fom2 = NULL;
int     ffon = true;
```

```c
int     ffspan = 8;         /* defaults to off */
int     ffweight = 50;
int     ffdebug = 0;
int     fdi = 0;
float mf2;
OBC     *curobs;            /* holds structure from archive file */
OBC     *whlobs;            /* holds secondary abstract */
                            /* holds recent abstraction */
float weight_match(index)
int     index;
{
        float tmv;
        if (fom2[index] != -1.0) {
                tmv = fom2[index] * (float)ffweight;
                tmv += fom[index] * (float)(100-ffweight);
        }
        else tmv = fom[index] * 100.0;
        return(tmv);
}
size_rec(p)
UC      *p;
{
        int     size;
        switch(p->a.t) {
        case 1:
                size = sizeof(DCA);
                break;
        case 2:
                size = DTRHD + p->t.c * sizeof(int);
                break;
        case 3:
                size = ASRHD +p->s.c * ASFSZ;
                break;
        }
        return(size);
}
#define next_rec(p) ((UC *)((char *)p + size_rec(p)))
#define first_rec(p) ((UC *)((char *)p + sizeof(OBC)))

read_rec(tfb,ndx)           /* (buffer,index number */
char    *tfb;
int     ndx;
{
        OBC     *p;
        int     i,j;
        long    x,pos = 0L;
        i = 0;
        while (i < ndx) {
                x = lseek(archfile,pos,SEEK_SET)        /* beginning of file */
                j = read(archfile,tfb, sizeof(OBC));
                if (x != pos || j != sizeof(OBC)) return(0);
                pos += sizeof(OBC) + p->link;
                i++;
        }
        x = lseek(archfile,pos,SEEK_SET);       /* position to this record*/
        if (x == pos) read(archfile,tfb,sizeof(OBC)+p->link);
}
diagnose(tflg)
int     tflg;               /* title flag */
{
        int     i,j,lnc,totm,bmi,equm,k,brkflg,lnc2,f;
        int     archindx = 0;
        unsigned c,d,e;
        char    curdiag[80];
        char    fltmsk[80];
        char    tprmpt[40];
        long    pos,x;
        float   bmt,bestmatch,tfom,tmv,svfom=0.0,
                svfom2=0.0,svbmt;
        int     delindx,deleted[16],svbmi;
        OBC     *archbuf,*tmpobc;
        UC      *p
        float   matchob();
```

```
            tfb = (char *)halloc(
                    (long)(64+OBBUFR*ABSIZE+2*FPBUFSIZE*sizeof(float)),1);
            curobs = (OBC *)halloc(8000,1);
            wholobs = (OBC *)halloc(2000,1);
            if (tfb==NULL || curobs == NULL || wholobs == NULL) {
                    put_s2("NOT ENOUGH MEMORY FOR FAULT DIAGNOSIS");
                    goto dgexit;
            }
            fom = (float *)(32+tfb+OBBUFR*ABSIZE);
            fom2 = (float *)(48+tfb+OBBUFR*ABSIZE+FPBUFSIZE*sizeof(float));
            if (tflg == 0) put2(fdm_form);
            archfile = -1;
            if (archfile == -1) {           /* open the fault diagnosis files */
                    sprintf(archname,"%s.X%d",q.dfname,curframe+1);
                    sprintf(faultnam,"%s.F%d",q.dfname,curframe+1);
                    sprintf(tmpstr,"Interrogating Data Base File %s",archname);
                    put_s2(tmpstr);
                    archfile = open(
                            archname,O_BINARY|O_RDWR|O_CREAT,S_IREAD|S_IWRITE);
                    if (archfile == -1) {
                            put_s2("Cannot open the archive file");
                            hfree(tfb);
                            return(-1);
                    }
                    faultfile = open(
                            faultnam,O_BINARY|O_RDWR|O_CREAT,S_IREAD|S_IWRITE);
                    if (faultfile == -1) {
                            put_s2("Cannot open the fault file");
                            close(archfile); archfile == -1;
                            hfree(tfb);
                            return(-1);
                    }
            }
newtype:
            put1(fdmtitle);
            ffon = 1;       /* get first fault abstract */
            abstract(curobs,newbuf,0);      /* process new error plane */
            abstract(curobs,newbuf,1);      /* second half */
            ffon = 0;       /* get whole fault abstract */
            abstract(wholobs,newbuf,0);
            abstract(wholobs,newbuf,1);
            ffon = HO_FFON; /* set to preferred operating mode for frame */
            ffspan = HO_FFSPAN;
            ffweight = HO_FFWEIGHT;
stover:
            /* read file and build relative match table */
            ns_wide();
            archindx = 0;
            delindx = 0;                    /* next free space for deleted */
            brkflg = 0;
            glbfom = 0;
            fdi = 0;
            pos = 0;
            totm = 0;
do {
            i = 0;
            archbuf = (OBC *)tfb;
            x = lseek(archfile,pos,SEEK_SET); /* beginning of record */
            if (x == pos) i = read(archfile,tfb,sizeof(OBC)); /* header */
            if (i != sizeof(OBC)) {
                    brkflg = 1;
                    continue;
            }
            i = read(archfile,tfb+sizeof(OBC),archbuf->link); /* body */
            if (i != archbuf->link) {
                    brkflg = 1;
                    continue;
            }
            pos += sizeof(OBC) + archbuf->link;
            for (j=0; j < 1; j--) {
                    if (archbuf->cnt == -1) { /* deleted */
                            if (delindx < 16)
                                    deleted[delindx++] = archindx;
```

```
                                    tfom = 0.0;
                                    mf2 = 0.0;
                            }
                            else {
                                    tfom = matchob(archbuf,curobs,whlobs);
                            }
                            fom[archindx] = tfom;
                            fom2[archindx] = mf2; /* set by matchob()*/
                            archindx++;
                    }
            } while(brkflg == 0);
            if (ffdebug && fdi) {
                    put_s2("Press A key or ESC to Cancel Dump ... ");
                    if (ESC == hard_pause()) ffdebug = 0;
            }
/*      sprintf(tmpstr,"%d Entries in the Open Data Base",archindx);
        put_s2(tmpstr);*/
nextbst:
            ns_wide();
            if (totm==0) {
                    mon_screen(" ",2);
                    scan_critical();
            }
            mon_screen(" ",2);
            sprintf(tmpstr,"  #      FOM              DIAGNOSIS");
            mon_screen(tmpstr,2);
            lnc = 0;
            totm = 0;
autobest:
            bmi = -1;
            bestmatch = 0.0;
            for (j=0;j<archindx;j++){
                    if (fom[j]==0.0&&fom2[j]==0.0)
                            tmv = 0.0;
                    else
                            tmv = weight_match(j);
                    if (tmv > bestmatch) {
                            bestmatch = tmv;
                            bmi = j;
                    }
            }
            if (bmi != -1) {
                    bmt = bestmatch;
                    j=bmi;
fdf0:
                    for (j=j;j<archindx;j++) {
                            if (fom[j]==0.0&&fom2[j]==0.0)
                                    tmv = 0.0;
                            else
                                    tmv = weight_match(j);
                            if (fabs(tmv-bestmatch) < .05) {
                                    totm++;
                                    get_fault(j,curdiag);
                                    sprintf(tmpstr,
                                            "%3d    %3.1f%%:   %s",j,bmt,curdiag);
                                    lnc++;
                                    lnc2 = mon_screen(tmpstr,2);
                                    if(totm==1){    /* first match */
                                            svbmi = bmi;
                                            svfom=fom[bmi];
                                            svfom2=fom2[bmi];
                                            svbmt = bestmatch;
/* set macro variables */               glbfom = (int)bmt;
                                            glbdnum = j; /* ditto */
                                            strcpy(glbdiag,curdiag);
                                            if (scnforlnk(curdiag)) {
                                                    d = ' ';
                                                    goto dgexit;
                                            }
                                    }
                                    fom[j] = 0.0;
                                    fom2[j] = 0.0;
                                    if (lnc2) {
```

```
                    put3("Press M for More, Select a Function or Press ESC: ");
                    e = get_one();
                    if (e != 'M') {
                            d = e;
                            goto nextb3;
                    }
                    else {
                            ns_wide();
                            goto fdf0;
                    }
                }
            }
        }       /* end for(j */
        if (lnc < q.numfltdsp) goto autobest;
    }   /* end if (bmi != -1) */
    else {
            strcpy(tprmpt,"End of Data Base.");
            put_s2(tprmpt);
    }
nextb2:
    topic = "FDIAG";
    if (q.shwfdstat) {
            sprintf(tmpstr,
"FRAME(%d) %s:#%d   M1=%2.3f  SIZE=%d  M2=%2.3f  WEIGHT=%d   FOM = %2.3f",
                curframe+1,ffon?"FIRST":"WHOLE",svbmi,svfom*100.0,
                    ffspan,svfom2*100.0,ffweight,svbmt);
            zap_stat(tmpstr);
    }
    put3("Select a Function or Press ESC for Test Menu: ");
    d = get_one();
nextb3:
    put_s2(" ");
    if (!q.shwfdstat) zap_stat("");
    if (ffon) tmpobc = curobs;
    else tmpobc = whlobs;
    switch (d){
    case 'A':
            prmpt3("ADD FAULT: ");
            topic = "FDADD";
            bmi = archindx; archindx++;
            tmpobc->ndx = bmi;
            tmpobc->cnt = 1;
            pad_str(curdiag," ",79);
            if (ESC == get_con(curdiag,0,62)) goto nextb2;
            lseek(archfile,0L,SEEK_END)) goto fdierr;
            i=write(archfile,(char *)tmpobc,sizeof(OBC)+tmpobc->link))
            if (i!=sizeof(OBC) +tmpobc->link)
                    goto fdierr;
            pos = (long)bmi * 80L;
            if (pos != lseek(faultfile,pos,SEEK_SET)) goto fdierr;
            if (80 != write(faultfile,curdiag,80)) goto fdierr;
            sprintf(tmpstr,"Fault %d ADDED: %s",bmi,curdiag);
            put_s2(tmpstr);
            goto nextb2;
    case 'C':
            topic = "FDCHAN";
            prmpt3("Enter the Fault # to Edit:");
            if (ESC == get_int(&bmi)) goto nextb2;
            pos = (long)bmi * 80L;
            if (pos != lseek(faultfile,pos,SEEK_SET)) goto fdierr;
            if (80 != read(faultfile,curdiag,80)) goto fdierr;
            sprintf(tmpstr,"Changing Fault Number %d.",bmi);
            put_s2(tmpstr);
            prmpt3("CHANGE FAULT: ");
            put_con(curdiag,0);
            if (ESC == get_con(curdiag,0,79)) goto nextb2;
            pos = (long)(bmi * 80);
            if (pos != lseek(faultfile,pos,SEEK_SET)) goto fdierr;
            if (80 != write(faultfile,curdiag,80)) goto fdierr;
            sprintf(tmpstr,"# %d Changed: %s",bmi,curdiag);
            put_s2(tmpstr);
            goto nextb2;
```

```
        case 'D':
                topic = "FDDEL";
                prmpt3("Enter the Fault Number to Delete:");
                if (ESC == get_int(&bmi)) goto nextb2;
                if (read_rec(tfb,bmi);
                pos = (long)bmi * ABSIZE;
                if (pos != lseek(archfile,pos,SEEK_SET)) goto fdierr;
                if (ABSIZE != read(archfile,tfb,ABSIZE)) goto fdierr;
                if (pos != lseek(archfile,pos,SEEK_SET)) goto fdierr;
                archbuf = (OBC *)tfb;
                archbuf->cnt = -1;
                if (ABSIZE != write(archfile,tfb,ABSIZE)) goto fdierr;
                pad_str(curdiag," ",62);
                pos = (long)bmi * 80L;
                if (pos != lseek(faultfile,pos,SEEK_SET)) goto fdierr;
                if (80 != write(faultfile,curdiag,80)) goto fdierr;

sprintf(tmpstr,"Fault #%d DELETED.",bmi);
                put_s2(tmpstr);
                goto nextb2;
        case 'F':
                topic = "FDFIND";
                prmpt3("Find: ");
                if (ESC == get_con(fltmsk,0,62)) goto nextb2;
                ns_wide();
                x = lseek(faultfile,0L,SEEK_SET);
                j=0; k=-1;
fdf1:
                lnc = 0;
                put_con(" ",2);
                sprintf(tmpstr,"Faults Matching: %s",fltmsk);
                put_con(tmpstr,2);
                put_con(" ",2);
                do {
                        if (80 != read(faultfile,curdiag,80)) break;
                        k++;
                        if (1 == find_str(fltmsk,curdiag)) {
                                sprintf(tmpstr,"%3d: %s",k,curdiag);
                                put_con(tmpstr,2);
                                j++;
                                lnc++;
                                if (lnc > 12) {
                        sprintf(tmpstr,"%d Fault Description%s Found.",j,j>1?"s"
                                                put_s2(tmpstr);
                                                put3("Press M for More, Select a Functio
                                                e = get_one();
                                                if (e != 'M') {
                                                        d = e;
                                                        goto nextb3;
                                                }
                                                else {
                                                        ns_wide();
                                                        goto fdf1;
                                                }
                                }
                        }
                } while(1);
                goto nextb2;
        case 'I':                       /* include a new pattern */
                topic = "FDINCL";
                prmpt3("Include New Pattern with Fault #? ");
                if (ESC == get_int(&k)) goto nextb2;
                if (k < 0 || k >= archindx) goto fdierr;
                if (delindx > 0) bmi = deleted[--delindx];
                else { bmi = archindx; archindx++;}
                tmpobc->ndx = bmi;
                tmpobc->cnt = 1;
                pos = (long)k * 80L;
                if (pos != lseek(faultfile,pos,SEEK_SET)) goto fdierr;
                if (80 != read(faultfile,curdiag,80)) goto fdierr;
                sprintf(tmpstr,"INCLUDING %d as: %s",bmi,curdiag);
                put_s2(tmpstr);
                pos = (long)bmi * 80L;
                if(pos != lseek(faultfile,pos,SEEK_SET)) goto fdierr;
                if (80 != write(faultfile,curdiag,80)) goto fdierr;
                pos = (long)bmi * (long)ABSIZE;
                if (pos != lseek(archfile,pos,SEEK_SET)) goto fdierr;
```

```
                    if (ABSIZE == write(archfile,(char *)tmpobc,ABSIZE))
                            goto nextb2;      /* add to file */
fdierr:             put_s2("Operation NOT Successfull");
                    goto nextb2;
        case 'N':
                    for (j=0;j<archindx;j++) {
                            tmv = weight_match(j);
                            if (fabs(tmv-bestmatch) < .01) {
                                    fom[j] = 0.0;
                                    fom2[j] = 0.0;
                            }
                    }
                    goto nextbst;
        case 'Q':                   /* redefine a fault */
                    topic = "FDQUER";
                    prmpt3("Enter the Fault # to Query On:");
                    if (ESC == get_int(&bmi)) goto nextb2;
                    if (bmi < 0 || bmi >= archindx) goto nextb2;
                    pos = (long)bmi * (long)ABSIZE;
                    if (pos != lseek(archfile,pos,SEEK_SET)) goto fdierr;
                    if (ABSIZE != read(archfile,(char *)curobs,ABSIZE)) goto fdierr;
                    goto stover;
        case 'R':                   /* redefine a fault */
                    topic = "FDREPL";
                    prmpt3("Enter the Fault # to be Replaced:");
                    if (ESC == get_int(&bmi)) goto nextb2;
                    if (bmi < 0 || bmi >= archindx) goto nextb2;
                    tmpobc->ndx = bmi;
                    tmpobc->cnt = 1;
                    pos = (long)bmi * (long)ABSIZE;
                    if (pos != lseek(archfile,pos,SEEK_SET)) goto fdierr;
                    if (ABSIZE != write(archfile,(char *)tmpobc,ABSIZE))
                            goto fdierr;
                    sprintf(tmpstr,"Fault %d Replaced with New Pattern.",bmi);
                    put_s2(tmpstr);
                    goto nextb2;
        case 'S':                   /* start over */
                    goto stover;
        case 'X':
                    new_screen();
                    scan_critical();
                    goto nextb2;
        case ' ':
                    put2(fdm_form);
                    ns_wide();
                    goto nextb2;
        case 'Z':
                    if (ffdebug) ffdebug = 0;
                    else ffdebug = 1;
                    goto nextb2;
        case 'T':
        case ESC:
                    ns_wide();
                    break;
        case 'L':
                    hardcopy = 1;
        case 'E':                              /* examine fault */
                    topic = "FDEXAM";
                    prmpt3("Enter the Fault Number to Examine: ");
                    if (ESC == get_int(&bmi)) goto nextb2;
                    lnc = 0;
                    ns_wide();
exflp1:
                    if (bmi >= 0) {
                            if( bmi >= archindx) goto nextb2;
                            get_fault(bmi,curdiag);
                            i = read_rec(tfb,bmi);
                            archbuf = (OBC *)tfb;
                    }
                    else {
                            i = 1;
                            archbuf = tmpobc;
                            if (abs(bmi) < archindx)
                                    bmt = weight_match(abs(bmi));
```

```
                else bmt = 0.0;
                sprintf(curdiag,
                "Undiagnosed Error Pattern, F.O.M = %1.3f\%",bmt);
        }
        if (i==1) {
                sprintf(tmpstr,"Examine %d: %s (%d)",bmi,curdiag,
                archbuf->ftran);
                put_con(tmpstr,2);
                lnc += 1;
                p = first_rec(archbuf);
                for (i=0; i<archbuf->records,i++) {
                    f = 0;
                    if (p->a.t == 1 && p->a.b > 0) {
                        f = 1;
                        sprintf(tprmpt,"%8lx%8lx",
                                p->a.r1,p->a.r2[k]);
                        fz(tprmpt);
                        sprintf(tmpstr,
                                "%X %5s      %5d    %5d          %s",
                                p->a.id,HO_LABELS[i].x,
                                p->a.b,p->a.g,tprmpt);
                    }
                    else
                    if (p->t.t == 2 && p->t.c > 0) {
                        f = 1;
                        sprintf(tprmpt,"%d, %d, %d, %d",
                            p->t.l[0],p->t.l[1],p->t.l[2],p->t.l[3]);
                        sprintf(tmpstr,"%X %5s      %5d    %5d     %s",
                            p->id,HO_LABELS[i].x,p->t.b,p->t.c,tprmpt);
                        p = next_rec(p);
                    }
                    else
                    if (p->s.t==3 && p->s.c>k*4){
                        f = 1;
sprintf(tprmpt,"(%d,%d),(%d,%d),(%d,%d),(%d,%d)",
                            p->s.l[k*4].s,p->s.l[k*4].v,
                            p->s.l[k*4+1].s,p->s.l[k*4+1].v,
                            p->s.l[k*4+2].s,p->s.l[k*4+2].v,
                            p->s.l[k*4+3].s,p->s.l[k*4+3].v);
                        sprintf(tmpstr,"Analog %X %d %d    %s",
                            p->id,p->s.c,1+k*4,tprmpt);
                    }
                    if (f) {
                        lnc++;
                        put_con(tmpstr,2);
                    }
                        if (lnc >= 16 && hardcopy == 0) {
                            put3("Press M for More, Select a Function or Pre
                            e = get_one();
                            if (e != 'M') {
                                    d = e;
                                    goto nextb3;
                            }
                            else {
                                    ns_wide();
                                    lnc = 0;
                                    i -= 2;
                            }
                        }
                    p = next_rec(p);
                }       /* end of for loop */
        }
        if (bmi < 0)  {
                bmi = abs(bmi);
                goto exflp1;
        }
        if (hardcopy == 1) hardcopy = 0;
        goto nextb2;
    case 'O':
fdloop:
        topic = "FDOPTI";
        put2(fdopt_form);
        sprintf(tmpstr,
```

```
                "TYPE=%s  WEIGHT=%d  SIZE=%d  NUMBER=%d  STATUS=%s  AUTON=%s  SHORTS=%s"
                ffon?"FIRST":"WHOLE",ffweight, ffspan,q.numfltdsp,
                q.shwfdstat?"ON":"OFF",
                q.autonomous?"ON":"OFF",q.shorts?"ON":"OFF");
                zap_stat(tmpstr);
                put3("Select a Fault Diagnosis Option: ");
                k = get_one();
                switch(k) {
                case 'W':
                        sprintf(tmpstr,
                "First Fault Weighting is %d\%.  Enter a Percentage (0--100): ",
                        ffweight);
                        prmpt3(tmpstr);
                        x = ffweight;
                        if (ESC != get_int(&x)) {
                                if (x <= 100 && x >= 0) {
                                        ffweight = x;
                                        HO_FFWEIGHT = x;
                                }
                        }
                        goto fdloop;
                case 'S':
        sprintf(tmpstr,"First Fault Window Size is %d samples.  Enter New Size:"
                        prmpt3(tmpstr);
                        x = ffspan;
                        if (ESC != get_int(&x)) {
                                ffspan = x;
                                HO_FFSPAN = x;
                        }
                        goto fdloop;
                case 'A':
fdolp2:
                        put3("Check for Errors on Autonomous Nodes? Y)es / N)o: ");
                        k = get_one();
                        if (k == 'N') q.autonomous = 0;
                        else if (k=='Y') q.autonomous = 1;
                        else if(k!=ESC&&k!=CR) goto fdolp2;
                        goto fdloop;
                case 'C':
fdolp3:
                        put3("Check for Shorts on Channels in Error? Y)es / N)o: ");
                        k = get_one();
                        if (k == 'N') q.shorts = 0;
                        else if (k=='Y') q.shorts = 1;
                        else if(k!=ESC&&k!=CR) goto fdolp3;
                        goto fdloop;
                case 'F':
fdoplp:
                        put3("Display the Fault Diagnosis Status Line? Y)es or N)o: ");
                        k = get_one();
                        if (k == 'N') q.shwfdstat = 0;
                        else if (k=='Y') q.shwfdstat = 1;
                        else if(k!=ESC&&k!=CR) goto fdoplp;
                        goto fdloop;
                case 'T':        /* Set the type of Fault Storage: First or Whole
polp3:
                        sprintf(tmpstr,
                "Storage is %s Fault.  Select F)irst or W)hole Fault: ",
                        ffon ? "First":"Whole");
                        prmpt3(tmpstr);
                        k = get_one();
                        if (k == 'F') ffon = 1;
                        else if (k == 'W') ffon = 0;
                        else if (k != ESC&&k!=CR) goto polp3;
                        goto fdloop;
                case 'N':
                        sprintf(tmpstr,
"Show How Many Matches at a Time? (Current Value is %d) ",q.numfltdsp);
                        put3c(tmpstr);
                        x = q.numfltdsp;
                        if ( ESC==(k = get_int(&x))) goto fdloop;
                        if ( x < 1) x = 1;
                        else if (x > 12) x = 12;
                        else q.numfltdsp = x;
```

```
                        goto fdloop;
                case ESC:
                        put2(fdm_form);
                        if (ffon != HO_FFON) {
                                HO_FFON = ffon;
                                goto newtype;
                        }
                        break;
                default:
                        goto fdloop;
                }
                put2(fdm_form);
                goto nextb2;
        default:
                k = wrap_up(d);
                put2(fdm_form);
                tflg = 0;
                if (k == 0)
                        goto nextb2;
        }
dgexit:
        if (tfb != NULL) { hfree(tfb); tfb = NULL; }
        if (curobs != NULL) { hfree(curobs); curobs = NULL; }
        if (whlobs != NULL) { hfree(whlobs); whlobs = NULL; }
        close(archfile); archfile = -1;
        close(faultfile); faultfile = -1;
        return(d);
}
find_str(m,s)
char    *m,*s;
{
        char   *m2,*s2;
        while (*m!=0 && *s!=0) {
                if (toupper(*m) == toupper(*s) || *m == '?') { m++; s++;}
                else if (*m == '*') {
                        m2 = m + 1;
                        if (*m2==0) return(1);
                        s2 = s;
                        while (*m2 != 0 && *s2 != 0) {
                                if (toupper(*m2) == toupper(*s2) || *m2 == '?')
                                        m2++; s2++;
                                }
                                else if (*m2 == '*') {
                                        break;
                                }
                                else {
                                        m2 = m+1;
                                        s++;
                                        s2 = s;
                                }
                        }
                        m = m2; s = s2;
                }
                else return(0);
        }
        if (*m == *s) return(1);
        else return(0);
}
get_fault(index,dst)
int     index;
char    *dst;
{
        long pos,x;
        int     bmi,j;
        pos = (long)(index * 80);
        x = lseek(faultfile,pos,SEEK_SET);       /* beginning of file */
        j = read(faultfile,dst,80);
        if (j == 80) return(0);
        else    return(-1);
}
/* Determine degreee of correlation for two observation records */
/* aob points to the archive observation record ie from the data base */
/* nove points to the new observation record using digital transitions */
/* nobw points to the new observation using whole fault abstraction */
```

```
float matchob(aob,nob,nobw)                /* returns 1.00 for perfect match */
OBC     *aob,*nob,*nobw;
{
        UC      *ap,*np,*nwp;
        unsigned long   newbits,basebits,matbits,numdig,numanl,
        newgrps,basegrps,matgrps,
        newrnge,basernge,matrnge,
        newchns,basechns,matchns;
int     a,b,c,d,e,f,i,numchn,sz,j,temp[FFDEPTH*2],jj,k,
        trndx,j1,j2,tmin,tmax;
char    tstr[128];
float   x,y,z,z2,matchfac,tmf;
unsigned        nb,bb,ng,bg;
unsigned long   m,rmin,rmin2;
int     tc = 50;        /* test constant */
matchfac = 0.0;
mf2 = 0.0;
numchn = 0;
matbits = basebits = newbits = 0L;
matgrps = basegrps = newgrps = 0L;
matrnge = basernge = newrnge = 0L;
newchns = basechns = matchns = 0L;
numdig = 0; numanl = 0;
ap = first_rec(aob);
np = first_rec(nob);
tc = 34;
if (ffweight > 0) {                /* first fault comparison */
    tmin = nob->ftran - ffspan; if (tmin<dsmin) tmin = dsmin;
    tmax = nob->ftran + ffspan; if (tmax>dsmax) tmax = dsmax;
}
else {
        tmin = 0; tmax = 0;        /* first fault range */
}
for (i=0, j=0; i<aob->records&&j<nob->records; ) {
        if (ap->t.id < np->t.id) {
                matbits += ap->t.c * tc;
                basebits += ap->t.c * tc;
                ap = next_rec(ap);
                i++;
        }
        else if (ap->t.id > np->t.id) {
                matbits += np->t.c * tc;
                basebits += np->t.c * tc;
                np = next_rec(np);
                j++;
        }
        else if (ap->s.t==3 && np->s.t==3) {    /* analog bank */
                j1 = 0; j2 = 0;
                c = ap->s.c;  d = np->s.c; /* load counts */
                while (j1 < c && j2 < d) {
                        e = ap->s.l[j1].s - np->s.l[j2].s);
                        if (abs(e) <= tc) {
                                matbits += abs(e);
                                basebits += tc;
                                f = abs(ap->s.l[j1].v - np->s.l[j2].v);
                                if (f>tc) f = tc;
                                matbits += f;
                                basebits += tc;
                                j1++; j2++;
                        }
                        else {
                                matbits += tc;
                                basebits +=tc;
                                if (e < 0) /* archive sample is earlier
                                        j1++;
                                        else j2++;
                        }
                }
                if (d-j2 > 0) { /* add in for unpaired samples */
                        a = (d-j2) * tc;
                        matbits += a;
                        basebits += a;
                }
                else if ( c-j1 > 0) {
```

```
                                a = (c-j1) * tc;
                                matibts += a;
                                basebits += a;
                            }
                            if (ffweight>0) {
                                a = np->s.l[0].s;
                                b = ap->s.l[0].s;
                                e = 2 * ffspan;
/* in range */                  if (np->s.c>0&&a<=tmax&&a>=tmin){
                                    if (ap->s.c > 0) {
                                        e = abs(a-b);
                                        f=abs(np->s.l[0].v-ap->s.l[0].v);
                                        if (e > ffspan) e = ffspan;
                                        if (f > ffspan) f = ffspan;
                                        e += f;
                                    }
                                }
                                matgrps += e;
                                basegrps += 2*ffspan;
                            }
                        i++; j++;
                        ap = next_rec(ap);
                        np = next_rec(np);
                } /* end of if analog bank */
                else
                if (ap->s.t==2 && np->s.t==2) { /* digital transitions */
                        j1 = 0; j2 = 0;
                        c = ap->t.c;  d = np->t.c; /* load counts */
                        if (c>0 || d>0) {          /* if either tran is here */
                            if (c>0 && d>0) {   /* if both exist */
                                while (j1 < c && j2 < d) {
                                    e = ap->t.l[j1] - np->t.l[j2]);
                                    if (abs(e) <= tc) {
                                        matbits += abs(e);
                                        basebits += tc;
                                        j1++; j2++;
                                    }
                                    else {
                                        matbits += tc;
                                        basebits +=tc;
                                        if (e < 0) /* archive sample is earlier
                                                j1++;
                                        else j2++;
                                    }
                                }
                            }
                        } /* if either transition end */
                        e = 0;
                        if (j1<c) e = (c-j1) * tc;
                        else if (j2 < d) e = (d-j2) * tc;
                        matbits += e;
                        basebits += e;
                        if (ffweight > 0) {
                                a = np->t.l[0];
                                b = ap->t.l[0];
                                e = 2 * ffspan;
/* in range */                  if (np->s.c>0&&a<=tmax&&a>=tmin){
                                    if (ap->s.c > 0) {
                                        e = abs(a-b);
                                        if (e > 2*ffspan) e = 2*ffspan;
                                    }
                                }
                                matgrps += e;
                                basegrps += 2*ffspan;
                        }
                        i++; j++;
                        ap = next_rec(ap);
                        np = next_rec(np);
                } /* end of if digital transition record */
        }       /* end of major for loop */
        if (basebits == 0L) /* nobody home in common at all */
            matchfac = 0.0;
        else {  /* compute resultant factors */
            matchfac = matbits;
```

```
                    matchfac /= basebits;
                    matchfac = 1.0 - matchfac;         /* convert from dif to like */
                    if (ffweight > 0) {                /* first fault comparison */
                        mf2 = matgrps;
                        if (basegrps > 0) mf2 /= basegrps;
                        else mf2 = 1.0;
                        mf2 = 1.0 - mf2;    /* convert from dif factor to like facto
                    }
                }   /* end of for j */
        }
        return(matchfac);
}
sum_bits(r)
unsigned long    r;
{
        unsigned long m;
        int      e,a=0;
        m = 0x80000000L;
        for (e=0; e<32; e++) {
                if ((m & r) != 0L) a++;
                m >>= 1;
        }
        return(a);
}
/* fills observation buffer with abstraction from error plane */
abstract(dst,src,pgin)
OBC      *dst;
unsigned char   *src;
int      pgin;
{
        int      len,nch,coff,boff,lastbit,reccnt=0;
        UC       *p;                /* point to current uinion cell */
        unsigned char *tsrc;
        unsigned      m,c;
        int      i,x,g,gc,bc,rf1,rf2,j,trndx,tran,sz,k;
        unsigned long   tr,ormask;
        int      rngwidth;
    int      totalsize = 0, size;
if(pgin==1) {
    len = csz1; nch=nc1;
    coff = nc0; boff = nc0*csz0;
}
else { /* first plugin */
    len=csz0; nch=nc0; coff=0; boff=0;
    dst->ftran = 40000;
    dst->records = 0;
    dst->link = 0;
}
rngwidth = (len * 8) / 64;   /* in bits */
dst->ftype = ffon;
dst->mweight = 50;
dst->fweight = ffweight;
src += boff;
p = (UC *)((char *)dst + dst->link + sizeof(OBC));
for ( j = coff/8; j < (nch + coff) / 8; j += 1) {
    if (SO_PODDT[j] == 0) { /* is this bank digital */
        if (!ffon ) {
        /* process fault in whole mode ie create digital abstraction */
            for (i=0; i<8; i++) {      /* total number of channels */
                p->a.t = 1;                       /* digital abstract */
                p->a.id = j*16 + i;
                tsrc = src + len*i;
                tr = 0L;
                ormask = 0x80000000L;
                g=0; gc=0; bc=0; rf1 = 0; rf2 = 0;
                x = len;
                while (x-- > 0) {       /* total number of bytes */
                        c = *tsrc++;
                        if (c == 0) g = 0;       /* clear group contact flag */
                        else {
                                rf2 = 1;                    /* signal the action */
                                for(m=0x80;m>0;m>>=1){
                                        if((c & m) != 0){
                                                bc++;
```

```
                                        if (g == 0){
                                                g = 1;   /* in a group no
                                                gc++;    /* count it */
                                        }
                                }
                                else g = 0;      /* clear group */
                        }
                }
                rf1 += 8;        /* begin to measure range in bits */
                if (rf1 % rngwidth == 0) {       /* set one range bit */
                        if (rf2 != 0) {          /* range monitor tripped
                                tr |= ormask;    /* set bit for active */
                                rf2 = 0;         /* clear action flag */
                        }
                        if (rf1 != rngwidth*32)  /* first long full */
                                ormask >>= 1;    /* shift existing range
                        else {
                                p->a.r1 = tr;
                                tr = 0L;
                                ormask = 0x80000000L;
                        }
                }
        }       /* end while */
        if (p->a.b > 0) {
                p->a.r2 = tr;
                p->a.g = gc;
                p->a.b = bc;
                size = sizeof(DCA);
                p = (UC *)((char *)p + size;
                totalsize += size;
                reccnt++;
        }
    }   /* end of for i loop */
}
else {          /* First Fault DIGITAL Mode */
    for (i=0; i<8; i++) {       /* total number of channels */
        p->t.t = 2;
        p->t.id = j*16 + i
        tsrc = src + len*i;
        x = len;
        tran = 0;
        trndx = 0;
        lastbit = 0;
        while (x-- > 0) {       /* total number of bytes */
                if ((*tsrc==0 && lastbit==0)
                        ||(*tsrc==0xff && lastbit==1))
                        tran += 8*sizeof(char);
                else
                for (rf1=0x80; rf1>0 && trndx<FFDEPTH; rf1/=2) {
                        if (*tsrc & rf1) {  /* is bit high */
                                if (lastbit == 0) {
                                        lastbit = 1;
                                        p->t.l[trndx++]=tran;
                                }
                        }
                        else if (lastbit == 1) {
                                lastbit = 0;
                                p->t.l[trndx++]=tran;
                        }
                        tran++;
                }
                tsrc++;
                if ( trndx >= FFDEPTH ) break;
        }
        if (trndx<FFDEPTH && lastbit==1) {       /* left things high */
                lastbit = 0;
                p->t.l[trndx++] = len*8-1;
        }
        if (trndx > 0) {                 /* list index */
                if (p->t.l[0] < dst->ftran)
                        dst->ftran = p->t.l[0];
                p->t.c = trndx; /* number of transitions */
                size = (3 + trndx) * sizeof(int));
```

```
                    p = (UC *)((char *)p + size);
                    totalsize += size;
                    reccnt++;
                }
        } /* end of for (i*/
    }           /* end of first fault processing */
}               /* end of digital processing */
        else if (SO_PODDT[j] == 1) {    /* ANalog channel */
                p->s.t = 3;
                p->s.id = j*16;
                i = 0;
                tsrc = src;
                for (x = 0; x < len; x++) {
                        if (*tsrc != 0) {
                                p->s.l[i].s = x;         /* sample number */
                                p->s.l[i].v = *tsrc;
                                if (++i >= FFDEPTH*8) break;
                        }
                        tsrc++;
                }
                if (i > 0) {    /* if this channel has errors */
                        p->s.c = i;
                        if (p->s.l[0].s < dst->ftran)    /*check early first */
                                dst->ftran = p->s.l[0].s;        /* fault */
                        size = ASRHD + i * ASFSZ;
                        p = (UC *) ((char *)p + size);
                        reccnt++;
                        totalsize += size;
                }
        }
        src += len*8;
    }           /* end of for j loop */
    dst->records += reccnt;             /* number of channels */
    dst->link += totalsize;             /* number of bytes all records */
}
scnforlnk(str)          /* scan dignosis for link to another test */
char    *str;
{
        int     x,z = 0;
        while(*str != 0) {
                switch(z) {
                case 0: if(*str=='*') z++; else z = 0;break;
                case 1: if(*str=='/') z++; else z = 0; break;
                case 2: if(*str == '$') {
                                x = 0;
                                x = atoi(str+1);
                                x--;
                                if (x >= 0 && x <= totframe) {
                                        if(HO_FOMCUTOF!=-1&&glbfom>=HO_FOMCUTOF){
                                                HO_ONFAIL = x;
                                                put_s2("Fault Diagnosis Link Processed")
                                                        return(1);
                                        }
                                }
                        }
                        else z = 0;
                        break;
                }
                str++;
        }
        return(0);
}
count_tran(tsrc,len)    /* returns number of transitions on channel */
char    *tsrc;
int     len;
{
        int     x;
        int     tran = 0;
        int     count = 0;
        int     lastbit;
                                        l=0;
                                        while (*st4 == *st3) {
                                                st4++;
```

```
                                            st3++;
                                            l++;
                                            if (l == chnsize/2)
                                                break;
                                    }
                                    if (l==chnsize/2) {
                                        sprintf(tmpstr,
        "%s(%X%d) and %s(%X%d) Identical: Possible Short",
                    s,p,c,HO_LABELS[cndx].x,cpdn,cchn);
                                        mon_screen(tmpstr,0);
                                    }
                                }
                            }
                            break;
                        }
                        else
                            st++;
                }
            }
        return(errors);
}
/*
                        if (ffdebug) {
                            for (jj = 0; jj <FFDEPTH; jj++)
                                temp[jj] = nob->u[j].t.tl[k][jj];
                            for (jj = 0; jj <FFDEPTH; jj++)
                                temp[jj+FFDEPTH] = aob->u[j].t.tl[k][jj]
                            sprintf(tstr,"N(%d,%d,%d,%d) B(%d,%d,%d,%d)",
                                    temp[0],temp[1],temp[2],temp[3],
                                    temp[4],temp[5],temp[6],temp[7]);
                            sprintf(tmpstr,"FRM=%d #%d CH%x%d %s DIF=(%ld/%l
        curframe+1,aob->ndx,i/8,i%8,tstr,matbits,basebits);
                            put_con(tmpstr,2);
                            if (++fdi >= 16) {
                                put_s2("Press A key or ESC to Cancel Dum
                                if (ESC == hard_pause()) ffdebug = 0;
                                put_s2(" ");
                                ns_wide();
                                fdi = 0;
                            }
                        }
*/
/* COMMON SOURCE MODULE FOR MFI CONTROL PROGRAM 2 and 48 */
/*   COPYRIGHT(C)1986,1987,1988.  ARRAY ANALYSIS, INC.   */
/* TIMER.C */

/* This module provides a real time delay timer */
/* Call set_tmo(h) to set the delay in Hundreths of Seconds */
/* Call tst_tmo() to monitor the delay. (0 = Not expired, 1 = Expired) */

/* 7/14/88 fixup for use with Microsoft compiler */ include         <sys\timeb.h>                 /* microsoft */
void set_tmo(); void gt(); void geint();

unsigned long    tstart,tfinish;               /* storage for seconds */
unsigned int     strtmils,finmils;             /* stroage for milliseconds */ void delay(x)    /* x is in half seconds */
int    x;
{
        set_tmo(x*50);
        while(tst_tmo() == 0);
} void rawtime(secs,mils)              /* set variables to current time values */
unsigned long    *secs;
unsigned int     *mils;
{
        struct   timeb    tbfr;      /* buffer for returned time values */
        ftime(&tbfr);                /* get system time into structure */
        *secs = tbfr.time;
        *mils = tbfr.millitm;
```

```c
}
void set_tmo(h)
unsigned int    h;                  /* duration in hundredths of seconds */
{
        rawtime(&tstart,&strtmils);     /* starting time */
        tfinish = tstart + (h/100);     /* finish time in seconds */
        finmils = strtmils + 10*(h % 100);          /* finish time extra mil */
        if ( finmils > 999) {
                tfinish++;
                finmils -= 1000;
        }
}
tst_tmo()
{
        unsigned long ttemp;
        unsigned int tmpmils;

rawtime(&ttemp,&tmpmils);       /* get current seconds and mills */
        if (ttemp < tfinish)            /* current seconds not enough */
                return(0);
        if (ttemp > tfinish)
                return(1);
        else            /* they are equal */
        if (tmpmils < finmils)  /* test milliseconds */
                return(0);
        else
        return(1);
}
/* COMMON SOURCE MODULE FOR MFI CONTROL PROGRAM 2 and 48 */
/*   COPYRIGHT(C)1986,1987,1988.  ARRAY ANALYSIS, INC.   */
/* PC.C: version.h selects MFI-1000 or MFI-AG48 conditional source */
/*      Main Module: This program uses the PC as a front end to the LA */

/* v1.43,7/8/88 add display compression variable processing in prm file */ include         "constant.h"
include         "global.h"

unsigned wrap_up(); unsigned rdq1(); unsigned wrq1(); unsigned dochar();
void do_port(); void copywait(); void help_open();
char    *save_screen();

extern  int     strtstfrm;              /* declared in testing.c */
extern  int     pxprow,pxpcol;
extern  int     boxrows;        /* menu emulation mode flag */
extern  int     memstatus;
extern  int     glberflg;
extern  int     macromenu;      /* defined in learn.c */
int     dsp_flag = 0;   /* controls redisplay of main menu header */
int     residue = 0;
char    prm_prfx[65];
char    automac[67];
int     mficlean = 0;
int     overvideo = 0;          /* video override from command line */
void init_io()
{
        ioswitc = q.biomode;
        ioinit(q.comport);
        iobaud(q.baudrate,3,0,0);
}
esg_init(m)
int     m;
{
        if (m == 16) { setega();       /* initialize for EGA */
                initgraf(m,0,q.battr);
        }
        else if (m == 20) {
                setherc(2);     /* initialize for HERCULES */
                initgraf(m,0,0);
        }
        else initgraf(m,0,0);
```

```c
}
void init()              /* All init stuff goes here */
{
        int     i;
        char    *temp;
        char tpath[80];
        hdb = (char *)calloc(16+hdrsize+setupsize,sizeof(char));
        drawbuf = (int *)calloc(dbmax,sizeof(int));
        if (hdb==NULL||drawbuf==NULL) {
                printf("\nNOT ENOUGH MEMORY TO RUN\n");
                exit(-1);
        }
        spb = hdb + hdrsize;
        if (!alloc_buf (dfltsize ())) {
                printf ("Not enough memory to allocate buffers.\n");
                exit (1);
        }
        pilstart = tmp_pilstart;
        topic = "COPYRI";
        status = 0;
        opmode = 0;
        dtafile = -1;
        maskfile = -1;
        curframe = -1;
        totframe = -1;
        glberflg = 0;
        tmpsave = &databuf[0];
        get_parm();
        if (q.mnemflg == 2) q.mnemflg = 1;
        pksize = 1024;
        init_io();
        if (overvideo == 20) {          /* default attributes for Hercules */
                q.videomd = overvideo;
                q.nattr = 0x01;         /* data display attributes */
                q.hattr = 0x01;         /* menu display */
                q.rattr = 0x10;         /* reverse fields */
                q.tattr = 0x01;
                q.cattr = 0x01;
                q.eattr = 0x01;
                q.battr = 0x00;
                q.gattr = 0x01;
                q.pattr = 0x01;
                q.fattr = 0x01;
                q.keyattr=0x01;
                for (i=0;i<NUMAC;i++) q.analatr[i] = 1;
        }
        if (overvideo == 16) {          /* default attributes for EGA */
                q.videomd = overvideo;
                q.nattr = 0x0f;         /* data display attributes */
                q.hattr = 0x0b;         /* menu display */
                q.rattr = 0x1e;         /* reverse fields */
                q.tattr = 0x09;
                q.cattr = 0x0b;
                q.eattr = 0x04;
                q.battr = 0x00;
                q.gattr = 0x02;
                q.pattr = 0x02;
                q.fattr = 0x74;
                q.keyattr=0x0f;
                for (i=0;i<NUMAC;i++) q.analatr[i] = i+2;
        }
        esg_init(q.videomd);
        fontinit();             /* essential graphics routines */
        if (0 != load_font(0,"mcp2.esi") || 0 != load_font(1,"mcp2b.esi")
                || 0 != load_font(2,"mcp2c.esi") ) {
                ioquit();
                fontunld(0);
                if (q.videomd == 16)
                        esg_init(3);
                else
                        esg_init(2);
                printf("\n FATAL PROGRAM ERROR: CANNOT LOAD FONT FILES\n");
                exit(-1);
        }
        modfont();              /* modify fonts 0 and 1 */
```

```
        menu_init();
        chq_init();
        stamp();
        gp_init(1);
        help_open();
        dsp_flag = 0;
        residue = 0;
        dspstate = 0;          /* state of display */
        clear_notes();
        if (*automac == 0) {
                copyright();
        }
        if (mfi_stat()==ESC) {
                msflag = 3;
                q.mnemflg = 0;
        }
        q.sprdest = 0;         /* default to printer ouput, not file */
        sprflag = -1;
        do_open(1);
        if(dtafile != -1)
                get_frame(dtafile,curframe,hdb);
        else
                settstopt();   /* set default test options */
        put_stat();
        get_live_version();
}
load_font(ndx,name)
int     ndx;
char    *name;
{
        char    tpath[96];
        sprintf(tpath,"%s%s",q.hlp_prfx,name);
        if (0 != fontld(ndx,tpath))
                if (0 != fontld(ndx,name))
                        return(-1);
        return(0);
}
modfont()
{
        int     b,c,d,e,f,g;
        fontinfo(0,&b,&c,&d,&e,&f,&g);
        fontchg(0,0,tpxcol,2,-1);
        fontinfo(1,&b,&c,&d,&e,&f,&g);
        fontchg(1,0,8,1,-1);
}
#define prmname         "mcp2.prm"
#define MCP_PARM        ((char *)&q)
#define MCP_PSIZ        (sizeof(q))
int     prmfile = -1;   /* parmater file handle */
get_parm()
{
        int     i;
        int     count;
        char    temp[65];
        sprintf(temp,"%smcp2.prm",prm_prfx);
        prmfile = open(temp,O_BINARY|O_CREAT|O_RDWR,S_IREAD|S_IWRITE);
        if (prmfile != -1) {
                count = read(prmfile,MCP_PARM,MCP_PSIZ);
                lseek(prmfile,0L,SEEK_SET);    /* beg. of file */
                if( count == MCP_PSIZ)
                        return(0);
        }
        q.baudrate = 7;        /* 9600 baud */
        q.comport = 0;         /* communications port */
        q.current_port = 'X';
        q.pkmode = 'b';        /* default to binary communications */
        q.llport = 0x378;              /* default to printer board address */
        q.gpib = 0;
        q.gpctl = 0;
        q.videomd = 16;        /* setting for high resolution EGA */
        q.nattr = 0x0f;        /* data display attributes */
        q.hattr = 0x0b;        /* menu display */
        q.rattr = 0x1e;        /* reverse fields */
        q.tattr = 0x09;
```

```
        q.cattr = 0x0b;
        q.eattr = 0x04;
        q.battr = 0x00;
        q.gattr = 0x02;
        q.pattr = 0x02;
        q.fattr = 0x74;
        q.keyattr=0x0f;
        for (i=0;i<NUMAC;i++) q.analatr[i] = i+1;
        q.analtype = 1;
        q.analdiv = 1;
        q.biomode = 0;
        q.mnemflg = 0;
        strcpy(q.dfname,"mcp2");
        strcpy(q.dtaname,"mcp2.dat");
        strcpy(q.log_name,"mcp2.log");
        strcpy(q.hndxname,"mcp2.ndx");
        q.vsw = 7;
        q.hsw = 4;
        q.prtype = 0;
        q.prdir = 1;
        q.prsize = 0;
        q.gbaoff = 0;
        q.glbscale = 100;
        strcpy(q.sprfname,"SCRNDUMP.PRN");
        q.sprdest = 0;   /* default to printer ouput */
        q.compress = 1;
        q.dispflg1 = 1; /* Testing Display Flag */
        q.lastmacro[0] = 0;    /* zero the last macro string */
        q.shwfdstat = 0;       /* show status in fault diag menu */
        q.numfltdsp = 4;       /* number of best matches to show */
        q.autonomous = 0;      /* Autonomous node processing in Diagnosis */
        q.shorts = 0;          /* short detection in Diagnosis */
        q.autolog = 0;         /* write results of test automatically to log*/
        q.timeout = 0;
        q.macprefix[0] = 0;    /* null macro prefix */
        q.bskewmode = 0;       /* display skew correction-off */
        for (i=0; i<12; i++) q.bskew[i] = 0;
        q.trgskewmode = 0;     /* automatic trigger correction-off */
        q.trgskew = 0;
        q.quickmode = 0;
        for (i=0;i < PRMFILSIZ;i++) q.filler[i] = 0;
        return(-1);
}
put_parm()
{
        int     count;
        char    temp[65];
        sprintf(temp,"%smcp2.prm",prm_prfx);
        if (prmfile == -1) return(-1);
        count = write(prmfile,MCP_PARM,MCP_PSIZ);
        close(prmfile);
        return(count);
}
void go_home()          /* All termination stuff goes here */
{
        put_parm();
        help_close();
        if (dtafile != -1)
                close(dtafile);
        ioquit();
        fontunld(0);
        if (q.videomd == 16)
                esg_init(3);
        else
                esg_init(2);

if (hdb != NULL) free(hdb);

if (drawbuf != NULL) free(drawbuf);
        if (newbuf!=NULL)
                free(newbuf);
        if (maskbuf!=NULL)
                free(maskbuf);
        if (tolbuf!=NULL)
```

```
                free(tolbuf);
        printf("\n");
        exit(xecrsp);
} void main(argc,argv)
int     argc;
char    *argv[];
{
        char    *p;
        int     i;
        overvideo = 0;
        *automac = 0;
        for (i=1; i<argc; i++) {
                p = argv[i];
                if (*p == '-' || *p == '/') {
                        p++;
                        switch (toupper(*p)) {
                        case 'P':
                                p++;
                                if (*p != ':') break;
                                p++;
                                strcpy(prm_prfx,p);
                                break;
                        case 'M':
                                p++;
                                if (*p != ':') break;
                                p++;
                                strcpy(automac,p);
                                break;
                        case 'H':
                                overvideo = 20;         /* set hercules mode */
                                break;
                        case 'E':
                                overvideo = 16;
                                break;
                        }
                }
                else {
                        strcpy(automac,p);
                }
        }
        if (*automac != 0) inhibit();
        init();
        if (*automac == 0 && msflag != 3) {
                copywait();
        }
        keypad();
        go_home();
}
#define INTRVLMX        700
keypad()                                /* Main Menu Control Loop */
{
        int     intrvl = 0;
        int     count,loop,c,d;
        int     mf1,mf2;
        char    *cp,**cm,*ct;   /* current title, c. menu, c. title */
        residue = 0;
        count = 0;
        loop = 1;                       /* Controls overall loop */
        ptmode = 0;                     /* Pass through mode disabled*/
        if (*automac != 0) {
                if (open_mac(automac) == 1 ) {
                        strcpy(q.lastmacro,automac);
                        lrnstate[0] = 'E';
                        lrepeat = 0;
                        istate = 1;
                        dsp_flag = 1;   /* don't cause display */
                }
        }
        mf1 = q.mnemflg;                        /* Monitor flag for menu emulation flag
        mf2 = memstatus;        /* Monitor flag for menu emul. status */ while( loop ) {         /* Main Program Idle loop */
```

```
if (residue == 0) {
        if (q.mnemflg != mf1) { /* did it change? */
                dsp_flag = 0;   /* force new display */
                if (q.mnemflg == 2)
                        q.mnemflg = 1;
                mf1 = q.mnemflg;
        }
        if (memstatus != mf2) { /* emulation status change? */
                if (memstatus == 1) {   /* is it timing? */
                        dsp_flag = 0;   /* yes, display. */
                }
                else if (mf2 == 1) {    /* was it timing */
                        topic = "MNEMUL";
                        ct = memtitle;  /* fix menu block */
                        cm = kmn_form;  /* ditto */
                        cp = memprompt;
                        if (dsp_flag != 0) {
                                put1(ct);put2(cm);
                                put3(cp);
                                dsp_regen = 0;
                                dspclean = 0;
                        }
                }
                mf2 = memstatus;
        }
}
if (residue == 0 && dsp_flag == 0) {
        if (q.mnemflg==0 ){                     /* Blind Mode */
                topic = "KEY";
                clr_mnem();
                ct = kemtitle;
                cm = key_form;
                new_screen();
                dsp_regen = 0;
                cp = kempromp;
                dspclean = 0;
        }
        else
        if (q.mnemflg == 1) {
                topic = "MNEMUL";
                set_mnem();
                if (memstatus != 1) {
                        topic = "MNEMUL";
                        ct = memtitle;
                        cm = kmn_form;
                        cp = memprompt;
                        new_screen();
                        dsp_regen = 0;
                        dspclean = 0;
                }
                else { /* set up for timing disp emulation */
                        topic = "MNEMTD";
                        ct = temtitle;
                        cm = tdm_form;
                        cp = temprompt;
                        if (mficlean==0&&rcvset()==0
                                &&rcvdata()==0) {
                                dspclean = 0;
                        }
                }
        }
        put1(ct);
        put2(cm);
        put3(cp);
        dsp_flag = 1;   /* toggles redisplay of this stuff */
        if (q.mnemflg == 1) {
        if (memstatus != 1) {
                        rrr_mnem();
                        put_stat();
                }
                else {
                        dspcheck();
                        put_tdstat();
                }
```

```
                }
        }
        if (c_ready() || residue || istate==1) {
                if (residue == 0) {
                        c = get_one();   /* Get character */
                        put_s2("  ");
                }
                else
                        residue = 0;
                if (q.mnemflg == 1 && memstatus == 1)   {
                        d = dotmem(c);
                }
                else
                        d = dochar(c);   /* Translate and send */
                if (d == 0)
                        loop = 0;
                else {
                        if (d==256*ALT_E  || d == 256*ALT_C ||
                            d==256*ALT_F  || d==256*ALT_O   ||
                            d==256*ALT_T  || d==256*ALT_V   ||
                            d == ESC) {
                                if (q.mnemflg == 1) {
                                        clr_mnem(); /* stop on exit*/
                                        q.mnemflg = 2;
                                }
                                residue = 1;    /* set for next comand*/
                                c = d;
                                dspcheck();
                        }
                        else {
                                if (q.mnemflg==1) {             /* emula
                                        intrvl = 0;
                                        if (memstatus==1) {     /* Timin
                                                put_tdstat();
                                        }
                                        else put_stat();
                                }
                                else
                                        put_stat();
                        }
                }
                if (q.mnemflg == 1) {
                        if (intrvl == 0) {
                                intrvl = INTRVLMX;
                                mem_sync();
                        }
                        else
                                intrvl--;
                }
        }
    }
    return('\033');
}
file_men()
{
        int     change = 1;
        int     loop = 1;
        unsigned        c,d,e;
        dspcheck();
        while (loop) {
                topic = "FILE";
                if (change >= 2) {
                        change--;
                        display(tmpsave);
                }
                if (change==1) {
                        put1(fmntitle);
                        put2(file_form);
                }
                put3("Choose a Function from the List Above");
                put_stat();
                c = get_one();
                put_s2("  ");
                switch(c) {
```

```
            case 'A':
                    put3("Arm Command");
                    arm();
                    put3("Wait for Trigger");
                    trigger();
                    break;
            case 'C':
                    close_data();
                    break;
            case 'D':
                    topic = "DOWNLOAD";
                    put2(di_form);
                    put3("D)isplay Data, S)etup Data, or B)oth?  ");
                    c = get_one();
                    if (c == 'S' || c == 'B') sndset();
                    if (c == 'D' || c == 'B') snddata();
                    change = 1;
                    break;
            case 'E':                   /* Edit the Comment Area */
                    comment();
                    change = 2;
                    break;
            case 'L':
                    do_load(2);
                    change = 2;
                    break;
            case 'N':
                    new_refs();
                    change = 2;
                    break;
            case 'O':
                    topic = "SELECT";
                    put2(sf_form);
                    open_data(0);              /* Allow new files */
                    change = 2;
                    break;
            case 'P':
                    do_port();
                    change = 0;
                    break:
            case 'R':
                    topic = "READ";
                    put2(rf_form);
                    change = 2;

if (dtafile == -1)
                            open_data(1);
                    if (dtafile == -1)
                            break;
                    e = rdq1();
                    if (e == 0xff)   /* read question 1 */
                            break;
cont:
                    if (curframe == -1) break;
        prmpt3("H)eader Only, D)ata, R)eference, or B)oth Data & Ref.?  ");
                    d = get_one();
                    if (d == 'D' || d == 'B') {
                            get_frame(dtafile,curframe,hdb);
                    }
                    if (d == 'R' || d == 'B') {
                            get_mask();
                    }
                    if (d == 'R' || d == 'D' || d == 'B'|| d == ESC)
                            break;
                    if (d == 'H' ) {
                            get_head(dtafile,curframe);
                            break;
                    }
                    else
                            goto cont;
            case 'S':
                    do_save(1);
                    change = 1;
```

```
                        break;
                case 'U':
                        topic = "UPLOAD";
                        put2(ui_form);
                        put3("D)isplay Data, S)etup Data, or B)oth?   ");
                        c = get_one();
                        change = 2;
                        if (c == 'D')    rcvdata();
                        else
                        if (c == 'S')    rcvset();
                        else
                        if (c == 'B')    {
                                rcvset();
                                rcvdata();
                        }
                        break;
                case 'W':
                        topic = "WRITE";
                        put2(wf_form);
                        change = 1;
                        if (dtafile == -1) {
                                open_data(0);
                                if (dtafile == -1)
                                        break;
                        }
                        e = wrq1();
                        if (e == 0xff)
                                break;
                        else
                        if (totframe == -1) {
                                curframe = totframe = 0;
                        }
                        put_stat();
        prmpt3("H)eader Only, D)ata, R)eference, or B)oth Data & Ref.?   ");
                        d = get_one();
                        if (d == 'D' || d == 'B') {
                                write_frame(dtafile,curframe,hdb);
                        }
                        if (d == 'R' || d == 'B')
                                put_mask();
                        if (d == 'H')
                                write_head(dtafile,curframe);
                        if (d == ESC && e == 'A')
                                curframe = --totframe;
                        break;
                case 'Z':
                        if (locked()) openlock();
                        else setlock();
                        break;
                default:
                        if (wrap_up(c) != 0)
                                loop = 0;
                        break;
                }
        }
        return((int)c);
}
unsigned wrap_up(c)
unsigned c;
{ switch (c) {
        case 256*ALT_C:
        case 256*ALT_E:
        case 256*ALT_F:
        case 256*ALT_K:
        case 256*ALT_O:
        case 256*ALT_Q:
        case 256*ALT_T:
        case 256*ALT_V:
        case ESC:
                break;
        default:
                dspkey(c,tmpsave,0);
                c = 0;
```

```c
        }
        return(c);
}
unsigned rdq1()  /* read question one */
{
        unsigned d,e;
rq1lp:
        prmpt3("C)urrent Frame, N)ext Frame, or S)pecific Frame?  ");
        d = get_one();
        if (d == 'S') {
                e = browse();
                if (e == ESC) d = 0xff;
        }
        else if (d == ESC) d = 0xff;
        else if (d == 'N') curframe = curframe <totframe?curframe+1:0;
        else if (d != 'C') goto rq1lp;
        return(d);
}
unsigned wrq1() /* write question 1 */
{
        int             savframe;
        unsigned        d,e;
wq1lp:
        if (totframe == -1)
                prmpt3("A)dditional Frame or ESC)ape?  ");
        else
        prmpt3("A)dditional, C)urrent, N)ext, S)pecific Frame, or ESC)ape?  ");
        d = get_one();
        savframe = curframe;
        if (totframe == -1) {
                if(d == 'A')
                        curframe = ++totframe;
                else
                if (d == ESC)
                        return(0xff);
                else
                        goto wq1lp;
        }
        else
        if (d == 'S') { /* Jump to specific frame */
                e = browse();
                if ( e == ESC)
                        d = 0xff;
        }
        else
        if (d == ESC)
                d = 0xff;
        else
        if (d == 'A') {
                curframe = ++totframe;
        }
        else
        if (d == 'N') {
                if (curframe < totframe) curframe++;
                else curframe = 0;
        }
        else
        if (d != 'C')
                goto wq1lp;
        if (locked()) {
                put_s2("FRAME IS LOCKED!  WRITE NOT PERFORMED!");
                curframe = savframe;
                d = 0xff;
        }
        return(d);
}
do_load(f)
int     f;
{
        int     x = 0;
        topic = "LOAD";
        if (dtafile == -1) {
                open_data(1);
                if (dtafile == -1)
                        goto dld2;
```

```
                }
                topic = "LOAD";
                if (totframe==-1) {
                        put_s2("This File is Empty");
                }
                else {
                        put2(li_form);
                        if (rdq1() != 0xff) {
                                x = 1;
                                put_stat();
                                if (-1 !=get_frame(dtafile,curframe,hdb)) {
                                        if (HO_FRMPORT > '0') {
                                                if (q.current_port != HO_FRMPORT) {
                                                        if (!set_port(HO_FRMPORT))
                                                                return(-1);
                                                }
                                        }
                                        if (-1 != sndset())
                                        if (-1 != snddata()) {
                                                strtstfrm = curframe;
                                                if (f==2) get_mask();
                                        }
                                }
                        }
                }
dld2:
        return(x);
}
do_save(f)
int     f;
{
        int     x = 0;
        if (dtafile == -1) {
                open_data(1);
                display(tmpsave);
                if (dtafile == -1)
                        return(x);
        }
        topic = "SAVE";
        put2(si_form);
        if (wrq1() != 0xff) {
                x = 1;
                if ( 0 == rcvset())
                if ( 0 == rcvdata()) {
                        write_frame(dtafile,curframe,hdb);
                        if (f==2)
                                put_mask();
                }
        }
        return(x);
}
unsigned dochar(c)                              /* Process the input character */
unsigned int    c;      /* NOTE: F3, F4, F10 trapped in c_get():LEARN.C */
{
        if (istate == 0) macromenu = ALT_C;
        switch(c) {
        case 256*ALT_F:
                if (istate == 0) macromenu = ALT_F;
                if (q.mnemflg == 1) { clr_mnem(); q.mnemflg = 2; }
                c = file_men();
                goto tieup;
        case 256*ALT_V:
                if (istate == 0) macromenu = ALT_V;
                if (q.mnemflg == 1) { clr_mnem(); q.mnemflg = 2; }
                c = disp_men();
                goto tieup;
        case 256*ALT_O:
                if (istate == 0) macromenu = ALT_O;
                if (q.mnemflg == 1) { clr_mnem(); q.mnemflg = 2; }
                c = fun_men();
                goto tieup;
        case 256*ALT_T:
                if (istate == 0) macromenu = ALT_T;
                if (q.mnemflg == 1) { clr_mnem(); q.mnemflg = 2; }
```

```
                    c = do_test();
                    goto tieup;
            case 256*ALT_E:
                    if (locked()) {
                            put_s2("THIS FRAME IS LOCKED AGAINST EDITING");
                            return(' ');
                    }
                    if (istate == 0) macromenu = ALT_E;
                    if (q.mnemflg == 1) { clr_mnem(); q.mnemflg = 2; }
                    c = do_edit();
                    goto tieup;
            case 256*ALT_G:
            case 256*ALT_A:         /* Alt A */
            case 256*ALT_L:
            case 256*ALT_S:
            case 256*ALT_U:

case 256*ALT_W:
            case 256*ALT_D:
            case 256*F10:           /* f10 */
                    glblcmnd(c);    /* perform global command */
                    c = ' ';
                    goto tieup;
            case 'B':               /* Back / B */
                    c='H';
                    goto comarow;
            case 'C':
            case 'M':               /* Menu / C */
                    c = 'I';
                    goto comarow;
            case 256*U_ARW:
                    c = '@';
                    goto comarow;
            case 256*D_ARW:
                    c = 'D';
                    goto comarow;
            case 256*R_ARW:
                    c = 'E';
                    goto comarow;
            case 256*L_ARW:
                    c = 'A';
comarow:
                    break;
            case 'H':       /* Help */
                    c = 'B';
                    break;
            case CR:                /* enter key */
                    c = 'C';
                    break;
            case 'T':               /* Trigger key */
                    c='F';
                    break;
            case 'F':
            case '-':               /* decrement / F */
                    c='G';
                    break;
            case 'D':               /* D key */
                    c = 'J';
                    break;
            case 'E':
            case 'I':
            case '+':               /* Incerement */
                    c = 'K';
                    break;
            case '7':               /* 7 key */
                    c = 'L';
                    break;
            case '8':               /* 8 key */
                    c='M';
                    break;
            case '9':               /* 9 key */
                    c = 'N';
                    break;
```

```c
        case 'A':                    /* Arm and A key */
                c = 'O';
                break;
        case '3':
                c = 'P';
                break;
        case '4':
                c = 'Q';
                break;
        case '5':
                c = 'R';
                break;
        case '6':
                c = 'S';
                break;
        case 'X':
                c = 'T';
                break;
        case '0':
        case 256*INS:    /* Insert Key */
                c = 'U';
                break;
        case '1':
                c='V';
                break;
        case '2':
                c='W';
                break;
        case 256*CF10:   /* Passthrough Mode */
                c=255;
                ptmode=1;
                break;
        case 'P':
                if (q.mnemflg == 1) {
                        clr_mnem();
                        do_port();
                        set_mnem();
                        gmnstat();
                        if (memstatus == 1)
                                rfr_mnem();
                }
                else do_port();
                c = ' ';
                goto tieup;
        case 'Q':
                c = 0;
                goto tieup;
        case 'R':
                c = 'x';                     /* reset the LA */
                break;
        case 'S':
                c = ' ';
                if (q.mnemflg == 0) {
                        try_stat();
                        if (msflag < 3) {        /* if we have a live MFI */
                                set_mnem();
                                gmnstat();
                                if (memstatus == 1)
                                        rfr_mnem();
                        }
                        else
                                q.mnemflg = 0;
                }
                else {
                        clr_mnem();
                        try_stat();
                        put_stat();
                }
                goto tieup;
        case 'V':
                c = ' ';
                check_version(1);
                goto tieup;
        case 'U':
```

```
                        c = ' ';
                        if (q.mnemflg == 0) goto tieup; /* drop if menu emulation */
                case '*':
                        c = ' ';
                        try_stat();
                        if (msflag < 3) {
                                set_mnem();
                                gmnstat();
                                if (memstatus == 1)
                                        rfr_mnem();
                        }
                        else
                                q.mnemflg = 0;
                        goto tieup;
                case '.':
                        c = ' ';
                        clr_mnem();
                        try_stat();
                        put_stat();
                        goto tieup;
                case ESC:
                default:
                        return(' ');
tieup:
                        dsp_flag = 0;           /* flag that we moved to key_men */
                        return(c);
                }
                if (c < 253) {                  /* Do we send it? */
                        mecurtog = 1;
                        if (c == 'x') {
                                put_com(c);
                                put_s2("Reset ...");
                                if ( -1 != test_mfi()) {
                                        msflag = 0;
                                        put_con("Complete ",1);
                                        dsp_flag = 0;
                                }
                        }
                        else
                        if (c >= '@' && c <= 'W') {
                                if (baby_sit(c,0) == 0)
                                        put_s2(hextag[c-0x40]); /* Report the key press */
                        }
                }
                return(' ');
}
/* COMMON SOURCE MODULE FOR MFI CONTROL PROGRAM 2 and 48 */
/*    COPYRIGHT(C)1986,1987,1988.  ARRAY ANALYSIS, INC.   */
/* DSPMENU.C: version.h determines MFI-1000 or MFI-AG48 conditional source */ include         "constant.h"
include         "global.h"

void blink(); void blunk(); void do_resol(); void put_estat();
unsigned dmk(); unsigned hex_edit(); unsigned dw_edit();
void ex_fail(); void put_dstat();
int      dsplp = 1;
int      dspflg = 0;
extern   int     aneon,lndx;

unsigned disp_men()
{
        unsigned        c,d;
        dspcheck();
        dsplp = 1;
        dspflg = 1;
        while (dsplp) {
                if (dspflg >0) {
                        topic = "ANAL";
                        put1(vwmtitle);
                        put2(disp_form);
                        if (dspflg==2)
                                display(tmpsave);
                        dspflg = 0;
```

```
                }
                put_dstat();    /* display menu status line */
                put3("Select a Function");
                c = get_one();
                put_s2(" ");
                d = dmk(c);
                if (d != 0) dsplp = 0;
        }
        return(d);
}
unsigned dmk(c)
unsigned        c;
{
        unsigned        d,e;
        d = 0;
        switch(c) {
        case 'A':
                arm();
                if (trigger() != ESC) {
                        rcvset();
                        rcvdata();
                        dspflg = 2;
                }
                break;
        case 'B':
                do_band();
                dspflg = 2;
                break;
        case 'C':
                query_ch();
                dspflg = 1;
                break;
#ifdef MCP96
        case 'D':
                dfltlabs();
                shwlabel(0);
        prmpt3("DEFAULT LABELS: Y)es to Write New Labels to Disk, or N)o:");
                e = get_one();
                if (e == 'Y') write_head(dtafile,curframe);
                dspflg = 1;
                break;
#endif
        case 'E':       /*Examine the Exceptions */
                ex_fail();
                dspflg = 2;
                break;
        case 'H':       /* Overlay the Display */
                topic = "HIGHLI";
                put2(hl_form);
                put3("Choose the Source Buffer to Highlight From");
                c = get_one();
                do_high(c);
                dspflg = 2;
                break;
        case 'M':               /* Toggle Hex/Waveform display */
                topic = "DSPMODE";
                sprintf(tmpstr,
                "Display is Now in %s Mode.  H)exadecimal or W)aveform?  ",
                dspmode==0?"Waveform":"Hexadecimal");
                prmpt3(tmpstr);
                c = get_one();
                if (c=='H')
                        dspmode = 1;            /* Set Hex Mode */
                else
                if (c=='W')
                        dspmode = 0;            /* Set Wave Mode */
                dspflg = 2;
                break;
        case 'P':
                do_anpar();
                dspflg = 1;
                break;
        case 'R':
                do_resol();
```

```
                                dspflg = 2;
                                break;
                        case 'S':
                                topic = "DISP";
                                put2(sel_form);
                                put3("Select the buffer to be Displayed");
                                c = get_one();
                                do_disp(c);
                                dspflg = 2;
                                break;
                        case 'T':
                                put_com('F');              /* Trigger key */
                                if (trigger() != ESC){
                                        rcvset();
                                        rcvdata();
                                        dspflg = 2;
                                }
                                break;
                        case 0xff:
                                break;
                        default:
                                dspflg = 1;
                                d = wrap_up(c);
                                return(d);
                }
                return(d);
        }
}
do_edit()
{
        int     c;
        if (dspmode == 0) {
                topic = "EDIT";
                c = dw_edit();
                stamp();
        }
        else
        if (dspmode == 1) {        /* Hex Edit */
                dspcheck();
                c = hex_edit();
                stamp();
        }
        return(c);
}
unsigned hex_edit()
{
        int     refresh = 1;
        int     loop = 1;
        unsigned        c;

hexmax = (nc1 + nc0) / 4 - 1;
        set_eccol();
        ec_show();
        editmode = 2;              /* Hex Edit Mode */
        while (loop) {
                topic = "HEXEDIT";
                if (refresh == 2) {
                        display(tmpsave);
                        refresh = 1;
                }
                if (refresh==1) {
                        put1(hemtitle);
                        put2(hex_form);
                        put3("Edit the Selected Buffer");
                        ec_show();
                        refresh = 0;
                }
                if (c_ready() == 0) {
                        stamp();
                        put_estat();
                }
                c = get_one();
                if ((c >='0' && c <= '9') || (c >= 'A' && c <= 'F')) {
                        pcvscp(ecrow+rowoff,eccol-1);
                        put_ch(c);
```

```
                        c = c > '9' ? c - 0x37 : c - 0x30;        /* Convert */
                        stuf_sample(c,tmpsave); /* Hex Nibble into buffer */
                        c = dspkey(256*R_ARW,tmpsave,1);/* Advance Cursor right
                }
                else
                switch(c) {
                case 'S':
                        topic = "DISP";
                        put2(sel_form);
                put3("Please Select a Buffer for Display and Editing: ");
                        c = get_one();
                        do_disp(c);
                        refresh = 2;
                        break;
                case CR:
                        hexpos = hexmax;
                        dspkey(256*R_ARW,tmpsave,0);
                        break;
                case BS:
                        if (hexpos > 0)
                                dspkey(256*L_ARW,tmpsave,0);
                        break;
                case 0xff:
                        c = ' ';
                        break;
                default:
                        refresh = 1;
                        ec_clear();
                        if (wrap_up(c) != 0) {
                                put3("   ");
                                editmode = 0;
                                loop = 0;
                        }
                        else ec_show();
                        break;
                }
        }
        return(c);
}
int     edmsave = -1;
unsigned dw_edit()
{
        int     refresh = 1;
        int     loop = 1;
        int     x,y,z;
        char    *src,*dst,tstr[80],tstr2[80],istr[80];
        int     sstate,dstate;
        float   f;
        unsigned        c,d;
        dspcheck();                                     /* restore display if need be */
        if (edmsave != -1) editmode = edmsave;
        else editmode = 1;
        if (editmode == 1 && mrkflg != 0 && hidemrk != 1) show_mrk();
        ec_show();
        refresh = 1;
        while (loop) {
                if (refresh > 0) {
                        if (editmode == 1) {
                                topic = "EDIT";
                                put1(demtitle);
                                put2(wved_form);
                                init_chan(ecrow+voffset);
                        }
                        else if (editmode == 3) {
                                topic = "ANEDIT";
                                put1(aemtitle);
                                put2(aned_form);
                        }
                        if (refresh == 2) {
                                ec_clear();
                                display(tmpsave);
                                ec_show();
                        }
```

```
                    put3("Edit the Selected Display Buffer");
                    refresh = 0;
            }
            if (c_ready() == 0) {
                    stamp();
                    put_estat();
            }
            c = get_one();
            put_s2(" ");
            if (editmode == 3)      /* analog editing */
            switch(c) {
            case 'D':
                    analedit(0);
                    refresh = 1;
                    break;
            case 'G':
                    topic = "ANAGEN";
                    put1("ANALOG WAVEFORM GENERATION");
                    gen_anal(tmpsave);
                    refresh = 2;
                    break;
            case 'P':
                    do_anpar();
                    refresh = 1;
                    break;
            case 'O':               /* perform analog operation */
                    topic = "ANOPER";
                    f = 0.0;
                    refresh = 2;
                    src = tmpsave; sstate = dspstate;
                    dst = tmpsave; dstate = dspstate;
aeloop1:
                    if (dst == NULL){ dst = tmpsave;dstate=dspstate;}
                    sprintf(tstr,"OPERATION: (%s)",dsptag[dstate]);
                    put_s2(tstr);
                    put2(ao2_form);
            put3c("Destination Bank (0-B), S)elect Buffer, or ESC: ");
                    x = get_probe("S");
                    if (x==ESC) break;
                    if (x==-1) goto aeloop1;
                    if (x=='S') {           /* Select dest buffer */
                            put2(ao4_form);
                            put3("Select the Destination Buffer:");
                            d = get_one();
                            if (d=='S'||d==ESC) goto aeloop1;
                            dst = det_buf(d);       /* get dst buf */
                            dstate = bufstate;      /* set by det_buf()*/
                            goto aeloop1;
                    }
                    sprintf(tstr,"OPERATION: (%s A%X)",dsptag[dstate],x);
                    put_s2(tstr);
                    put2(aop_form);
                    put3(" Select an Operation from Above: ");
                    z = get_one();
                    sprintf(tstr2,"%s %c",tstr,z);
                    put_s2(tstr2);
                    if (z!='A'&&z!='L'&&z!='R') {
aeloop2:
                            sprintf(tstr,"%s (%s)",tstr2,dsptag[sstate]);
                            put_s2(tstr);
                            put2(ao3_form);
                            put3c("Source Bank (0-B), C)onstant, or S)elect
                            y = get_probe("CS");
                            if (y == ESC) break;
                            if (y==-1)  goto aeloop2;
                            if (y == 'C') {
                                    put_s2(tstr2);
                    put3c("Enter a Floating Point Constant Using a Decimal Point: ")
                                    strcpy(tmpstr,"       ");
                                    if (ESC==(get_con(istr,0,79))) break;
                                    sscanf(istr,"%f",&f);
                                    sprintf(tstr,"%s %f",tstr2,f);
                                    src = NULL;
```

```
                }
                else
                if (y=='S') {        /* Select source buffer */
                        put2(ao4_form);
                        put3("Select the Source Buffer: ");
                        d = get_one();
                        if (d=='S'||d==ESC) goto aeloop2;
                        src = det_buf(d);         /* get dst buf */
                        if (src==NULL) {
                                src = tmpsave;
                        }
                        else sstate = bufstate;
                        goto aeloop2;
                }
                else {
        sprintf(tstr,"%s (%s A%X)",tstr2,dsptag[sstate],y);
                }
                put_s2(tstr);
        }
        else y = 0;
        op_anal(dst,x,src,y,z,f);
        break;
case 'S':
        topic = "DISP";
        put2(sel_form);
        put3("Please Select a Buffer for Editing");
        c = get_one();
        do_disp(c);
        refresh = 2;
        break;
case CR:
        if ( aneon == -1) {
           put3c("Press Key for Bank # To Edit: ");
           c = get_probe("");
           if (c != ESC && c != -1) {
                if (SO_PODDT[c]==1)
                        aneon = c;
           }
           ane_set(dspoff);
        }
        else
                aneon = -1;
        refresh = 2;
        break;
case 0xff:
        c = ' ';
        break;
case ESC:       /* EXit fro waveform edit mode */
default:
        refresh = 1;
        ec_clear();
        if (wrap_up(c) != 0) {
                edmsave = editmode;
                editmode = 0;
                loop = 0;
        }
        else ec_show();
        break;
}
else
if (editmode == 1)
switch(c) {
case 'A':
        analedit(1);
        refresh = 1;
        break;
case 'C':                       /* Copy from mark */
        do_copymrk();
        refresh = 2;
        break;
case 'D':
        do_duplic();
        refresh = 2;
        break;
```

```c
                        case 'F':
                        case 'G':
                                do_gen(c);
                                refresh = 2;
                                break;
                        case 'H':          /* Highligh Buffer */
                                topic = "HIGHLI";
                                put2(hl_form);
                                put3("Choose the Source Buffer to Highlight From");
                                c = get_one();
                                do_high(c);
                                refresh = 2;
                                break;
                /* Hide the Mark */
/*                              hidemrk = hidemrk == 1 ? 0 : 1; */
/*                              refresh = 2; */
                        case 'U':
                                if (mrkflg != 0 && hidemrk != 1)
                                        show_mrk();
                                hidemrk = 0;
                                mrkflg = 0;
                                smkx = -1;
                                emkx = -1;
                                refresh = 0;
                                break;
                        case 'M':                              /* Mark function */
                                do_mark();
                                refresh = 1;
                                break;
                        case 'S':
                                topic = "DISP";
                                put2(sel_form);
                                put3("Please Select a Buffer for Editing");
                                c = get_one();
                                do_disp(c);
                                refresh = 2;
                                break;
                        case 0xff:
                                c = ' ';
                                break;
                        case ESC:       /* EXit fro waveform edit mode */
                        default:
                                refresh = 1;
                                ec_clear();
                                if (wrap_up(c) != 0) {
                                        edmsave = editmode;
                                        if (mrkflg != 0 && hidemrk != 1) {
                                                show_mrk();
                                                ec_clear();
                                        }
                                        editmode = 0;
                                        loop = 0;
                                }
                                else ec_show();
                                break;
                }
        }
        return(c);
}
toomc()         /* test order of mark coordinates */
{
        int     x;
        if (smkx > emkx ){      /* Ensure proper relation */
                x = emkx;
                emkx = smkx;
                smkx = x;
        }
        if (smky > emky) {
                x = emky;
                emky = smky;
                smky = x;
        }
```

```
scr2ec(col,row,flag)      /* flag=0: starting coord; flag=1: ending coord */
int     col,row;
{
        int change = 0,x;
        eccol = col - dspoff;           /* start with real sample */
        if ( eccol > rowlen || eccol < 0) {    /* if not on screen */
                change = 1;     /* screen must be redisplayed */
                if (flag==0)
                        eccol = 10 * q.compress;
                else
                        eccol = rowlen - 10 * q.compress;
                x = col - eccol;
                dspoff = x;
                if (x < dsmin) {
                        dspoff = dsmin; /* Display first mark */
                        eccol = col;
                }
                if (x > dsmax - rowlen) {
                        dspoff = dsmax - rowlen;
                        eccol = col - dspoff;
                }
        }
        eccol /= q.compress;    /* adjust for display compression */
        ecrow = row - voffset;
        if ( ecrow > clim || ecrow < 0) {
                change = 1;
                if (flag==1)
                        ecrow = 3;
                else
                        ecrow = clim - 3;
                x = row - ecrow;
                voffset =x;
                if (x < 0) {
                        voffset = 0;
                        ecrow = row;    /* Vertical offset adjusted */
                }
                else
                if (x > numchnls - clim) {
                        voffset = numchnls - clim;
                        ecrow = row - voffset;
                }
        }
        return(change);
}
do_mark()
{
        int     change = 0, loop = 1;
        unsigned c;
        int     inf;    /* initial mark flag: 0=new, 1=old first */
        topic = "MARK";
        ec_clear();     /* clear off cursor */
        if (hidemrk) {
                hidemrk = 0;
                show_mrk();
        }
        if (mrkflg == 0) {      /* Initial state, no mark yet */
                inf = 0;        /* indicate this as a virgin mark */
                mrkflg = 1;     /* get ending coordinate */

/* Set initial coordinates to the current cursor location */
                smkx = dspoff + eccol * q.compress;
                emkx = smkx;
                smky = voffset + ecrow; /* raw buffer coordinates */
                emky = smky;
                mrksrc = tmpsave;
                show_mrk();                     /* show the mark if any */
                put3("MARK: Move Cursor to Lower Right Corner and Press 'M'");
        }
        else
        if (mrkflg == 2) {              /* Move a Segment Mark */
                inf = 1;        /* indicate reworking an old mark */
                mrkflg = 3;     /* rework starting coordinate */
                change = scr2ec(smkx,smky,0); /* display cursor @ start */
                put3("MARK: Move Cursor to Upper Left Corner and Press 'M'");
```

```c
        }
        ec_show();
        while(loop) {
                if (change != 0) {
                        ec_clear();
                        change = 0;
                        display(tmpsave);
                        ec_show();
                }
                if (c_ready()==0) put_estat();
                c = get_one();
                if (c>255 || c == ESC || c == 'J') {
                        if (0 != wrap_up(c,tmpsave)) {
                                mrkflg = 2;
                                loop = 0;
                                break;
                        }
                        ec_clear();
                        show_mrk();     /* erase mark */
                        if(mrkflg==1) {         /* get l.l. point */
                                emkx = dspoff + eccol*q.compress;       /* end m
                                emky = voffset + ecrow;
                                                /* Insure proper relation */
                        }
                        else
                        if (mrkflg == 3) {
                                smkx = dspoff + eccol*q.compress;
                                smky = voffset + ecrow;
                                                /* raw buffer coordinates */
                        }
                        show_mrk();     /* Show New Mark */
                        ec_show();
                }
                else
                if (c == 'M') {
                        if (mrkflg == 1) {      /* Set the End point */
                                mrkflg = 2;
                                mrksrc = tmpsave;       /* Record source buffer
                                toomc();        /* check order of first last */
                                loop = 0;
                        }
                        else
                        if (mrkflg == 3) {      /* Move Mark, set first mark */
                                mrkflg = 1;
                                ec_clear();
                                change = scr2ec(emkx,emky,1);
                                ec_show();
                                put3("MARK: Move Cursor to Lower Right Corner an
                        }
                }
        }
        return(0);
}
do_copymrk()
{
        if (mrkflg == 2) {                      /* If a segment is Marked */
                dmkx = dspoff + eccol*q.compress;
                dmky = voffset + ecrow;
                copy_seg();
                put_s2("Segment Copied to Cursor Position");
                return(mrkflg);
        }
}
do_duplic()
{
        int     x,len;

topic = "DUPLIC";
        put1("DUPLICATE  MARKED   SEGMENT");
        prmpt3("Enter the Number of Copies You Wish to Make:   ");
        if (get_int(&x)==ESC) return(0);
        put3("Duplicating the Marked Segment ...");
        dmkx = dspoff + eccol*q.compress;
        dmky = voffset + ecrow;
```

```
                while (x > 0) {
                        copy_seg();
                        init_chan(smky);
                        len = expansion + (emkx - smkx);
                        if (dmkx + 2*len < dsmax)
                                dmkx += len;
                        x--;
                }
                put_s2("Segment Duplicated At Cursor Position");
} query_ch()
{
        int     e,x,y,change=0;
        char    *lb;
        unsigned lc,c;
        int     startcol;
        int     i;
        char    s1,s2,s3,s4;
        lc = ' ';
        topic = "CHLIST";
        put2(cl_form);
        x = voffset;
        microflg = 1;           /* controls the get_con() subroutine */
        startcol = tpxcol/2 + 1;
        while (1) {
                if (x >= voffset + clim) {
                        voffset = 1 + (x - clim);
                        change = 1;
                }
                else
                if (x < voffset) {
                        voffset = x;
                        change = 1;
                }
                if (!c_ready() && change) {
                        erase_mic();
                        shwlabel(0);
                        rl2(1+x-voffset,q.vsw); vpxo +=1; hpxo = startcol;
                        move_mic(vpxo,hpxo);    /* set cursor to channel */
                        set_tmo(200);
                }
                while(!c_ready() && !tst_tmo());
                if (!c_ready()) {
                        erase_mic();
                        display(tmpsave);
                        change = 0;
                }
        }
        init_chan(x);
        lb = (char *) HO_LABELS[lndx].x;
        rl2(1+x-voffset,q.vsw); vpxo +=1; hpxo = startcol;
        move_mic(vpxo,hpxo);    /* set cursor to channel */
        c = get_one();
        if (c == ESC) {
                erase_mic();
                microflg = 0;
                if (change != 0) display(tmpsave);
                return(0);
        }
        if (c == BS||c==256*U_ARW) {
                if (x > 0)
                        --x;
                else
                        x = numchnls - 1;
        }
        else
        if (c == CR || c == ' ' || c == 256*D_ARW) {
                                        /* adavance line */
                if (++x == numchnls)
                        x = 0;
        }
        else if (c == 256*PG_U) {
                if (voffset + clim <= numchnls - clim) {
                        x += clim;
                        voffset += clim;
```

```
                }
                else {
                        voffset = numchnls - clim;
                        x = voffset + clim -1;
                }
                change = 1;
        }
        else if (c == 256*PG_D) {
                if (voffset >= clim) {
                        x -= clim;
                        voffset -= clim;
                }
                else {
                        x = 0;
                        voffset = 0;
                }
                change = 1;
        }
        else
        if (c == 'L' || c == 256*R_ARW) {
                erase_mic();
                grrtllc(startcol+3*tpxcol,vpxo,5*tpxcol,q.vsw-1,q.battr)
                move_mic(vpxo,startcol + 3*tpxcol);
                c = get_con(lb,0,5);
                if (++x >= numchnls)    x = 0;
        }
        else
        if (c==256*INS){
                if (numchnls < nc0+nc1) {
                    SO_CHNUM++;
                    numchnls++;
                    s1 = SO_CHLST[2*x];
                    s2 = SO_CHLST[2*x+1];
                    for (i=2*x+2; i <= numchnls*2; i+=2) {
                        s3 = SO_CHLST[i];
                        s4 = SO_CHLST[i+1];
                        SO_CHLST[i] = s1;
                        SO_CHLST[i+1] = s2;
                        if (s1==0xff||s2==0xff)break;
                        s1 = s3;
                        s2 = s4;
                    }
                    change = 1;
                }
        }
        else
        if (c==256*DEL) {
                if (numchnls > 0) {
                    for (i=x*2;i<numchnls*2; i+=2) {
                        SO_CHLST[i]=SO_CHLST[i+2];
                        SO_CHLST[i+1] = SO_CHLST[i+3];
                    }
                    numchnls--;
                    SO_CHNUM--;
                    change = 1;
                }
        }
        else if (chk_hexchar(c)) {
                cpdn = cnv_hexchar(c);
                if(cpdn < 0 || cpdn >= np0+np1) continue;
                change = 1;
                rgn_dgtl = 1;    /* set to dispaly digital labels */
                put_ch(c);       /* put pod selection */
                e = get_one();
                cchn = e - '0';
                if(cchn < 0 || cchn > 7) continue;
                put_ch(e);
                y = cnv_raw();
                if (y != 0xff) {
                        SO_CHLST[x*2] = cpdn;
                        SO_CHLST[x*2+1] = cchn;
                        change = 1;
                }
        }
}
```

```c
        }
        erase_cur();
        microflg = 0;    /* return get_con,move_cur, erase_cur to normal*/
}
void do_resol()
{
        int     x,y;
        topic = "RESOL";
        put2(cr_form);
        prmpt3("Enter the Sample Width, Use a '-' sign for Compression:   ");
        resolution = 1;
        if (get_int(&x) != ESC) {
                if (x < 0) {
                        q.hsw = 1;
                        x = abs(x);
                        y = q.mxbs / (nodcols*pxpcol);
                        if(x > y)   x = y;
                        q.compress = x;
                }
                else
                if (x > 0 && x <= 32) {
                        q.hsw = x;
                        q.compress = 1;
                }
                dspinit();
        }
} char    *det_buf(c)
unsigned c;
{
        char    *temp = NULL;
        switch(c) {
        case 'D':
                bufstate = 1;
                temp = databuf;
                break;
        case 'E':
        case 'F':
                bufstate = 5;
                temp = newbuf;
                break;
        case 'R':
                bufstate = 2;
                temp = maskbuf;
                break;
        case 'T':
                bufstate = 3;
                temp = tolbuf;
                break;
        case 'S':
                bufstate = 0;
                temp = spb;
                break;
        }
        return(temp);
} do_gen(c)
int     c;
{
        if (mrkflg == 0) {                /* No marke available */
        put_s2("ERROR: Mark Segment before Using Generate or Fill Function!");
                return(ESC);
        }
        if (c == 'G') {
                topic = "GENERA";
                put2(gen_form);
                prmpt3("Enter the Starting Value in Hex: ");
                if (get_lhex(&gvalue)==ESC)return(ESC);
                prmpt3("Enter the Step Value in Hex: ");
                if (get_lhex(&gstep)==ESC) return(ESC);
```

```c
                prmpt3("Enter the Number of Counts to Generate in Hex: ");
                if (get_hex(&gcount)==ESC)return(ESC);
                put3c("Generating the Counting Pattern");
        }
        else {
                topic = "FILL";
                put3("Fill Marked Area with Z)eroes or O)nes? ");
                c = get_one();
                if (c == 'Z') gvalue = 0L;
                if (c == 'O') gvalue = 0xffffffffL;
                gstep = 0L;
                gcount = 1;
                if (c==ESC) return(ESC);
        }
        gstart = -1;            /* causes initialization */
        while(gcount>0){
                if (gstart >= dsmax || mon_esc()) break;
                one_cell(gvalue);                /* call with cell value */
                gvalue += gstep;
                gcount--;
        }
}
/* COMMON SOURCE MODULE FOR MFI CONTROL PROGRAM 2 and 48 */
/*   COPYRIGHT(C)1986,1987,1988.  ARRAY ANALYSIS, INC.   */
/* WFG.C: version.h selects MFI-1000 or MFI-AG48 conditional source */ include "constant.h"
include "global.h"
#include "math.h"

define pods     NUMAC          /* maximum number of pods */ define hdr_size 7      /* number of lines in pod header      */
define sc 1            /* starting column for text display   */
#define sl 5            /* starting line for text on screen   */
#define scl 18          /* starting column for pod#1          */
#define bwa 19          /* starting line of working area on screen */

/***************************************************************
*     This is a structure of input data for WFG - wave form Generator *
*     ------------------------------------------------------------- *
***************************************************************/
/*      header line is an image of screen formatting during    data entry */

/*-----------------------------------------------------------*/
struct pod_line {       /* This is a main storage for pod data. */
float   val;            /* After input data validated and all   */
int     typ;            /* vital information for generation     */
};                      /* of wave is stored in this structure  */
struct pod_line p_l[pods][hdr_size];  /* 7 lines in header */

/*-----------------------------------------------------------*
*               MAIN DATA BUFFERS                            *
*-----------------------------------------------------------*/
float tmp[hdr_size];    /* temporary velues for podin and validate */

/* frec_type - text to be displayed along with value *
-----------------------------------------------------------*/
struct frec_type {
        char nam[4];
} typ_t[]={" hz","khz","mhz"};
/*-----------------------------------------------------------*
*               wave form type name                          */ struct wf_typ {
        char nam[9];
} wf_type[] = {"        "," square ", "triangle", " sine  ", " cosine "};

float dcc[31]={25000000,10000000,2000000,1000000,
               500000,200000,10000,50000,20000,10000,5000,2000,
               1000,500,200,100,50,20,10,5,2,1,0.5,0.2,0.1,
               0,05,0.02,0.01,0.005,0.002};
```

```c
/*--------------------------------------------------------*/
/*        PODIN - input one pod entry                     */
/*--------------------------------------------------------*/
podin(podn,wf)
int podn;                /* bank number */
char *wf;                /* address of first byte of probe */
{
        int     i,j;
        unsigned k,c2p_max=1023;
        float fv,fv1,fv2;
        char atxt[100];
        int c;
        topic = "AWVGEN";
        i=0;
        while (i<hdr_size) {
           tmp[i] = p_l[podn][i].val;
           sprintf(atxt,"%f",tmp[i]);
           switch (i) {
     /* wave form type */
           case 0:
             put3c("1) Rectangular, 2) Triangle, 3) Sine).  Select Waveform Type:
                     atxt[0] ='0' + (int)tmp[0];
                     atxt[1] = 0;
                     put_con(atxt,0);
                     c = get_one();
                     if (c == ESC) return(ESC);
                     if (c != CR) {
                             j = c - '0';
                             tmp[0] = (float)j;
                     }
                     p_l[podn][0].val=tmp[0];
                     i=i+validate(0,podn);
                     break;
     /* mfi-clock */
           case 1:
         put3c("Enter the MFI Clock Period (40ns, 200us, 1ms, etc.): ");
                     switch (p_l[podn][1].typ) {
                     case 1: c = 'm';
                             break;
                     case 2: c = 'u';
                             break;
                     case 3: c = 'n';
                             break;
                     default:c = ' ';
                             break;
                     }
                     sprintf(tmpstr,"%s%c",atxt,c);
                     strcpy(atxt,tmpstr);
                     put_con(atxt,0);
                     if (ESC == get_con(atxt,0,80)) return(ESC);
                     if (atxt[0] != 0) {
                             for (k=0; atxt[k]!='\0'; k++)
                                     atxt[k]=tolower(atxt[k]);
                             tmp[1]=atof(atxt);
                             if (strchr(atxt,'m')) p_l[podn][1].typ=1;
                             else if (strchr(atxt,'u')) p_l[podn][1].typ=2;
                             else if (strchr(atxt,'n')) p_l[podn][1].typ=3;
                             else p_l[podn][1].typ = 0;
                     }
                     fv = tmp[1];
                     fv1=(float)(pow((double)1000,(double)p_l[podn][1].typ))/tmp[1];
                     tmp[1]=fv1;
                     i+=validate(i,podn);
                     tmp[1]=fv;
                     break;
     /* data clock */
           case 2:
         put3c("Enter the Generation Frequency (50, 100k, 25m, etc.): ");
                     switch (p_l[podn][2].typ) {
                     case 1:
                             c = 'k';
                             break;
                     case 2: c = 'm';
                             break;
```

```c
                default:c = ' ';
                        break;
                }
                sprintf(tmpstr,"%s%c",atxt,c);
                strcpy(atxt,tmpstr);
                put_con(atxt,0);
                if (ESC == get_con(atxt,0,80)) return(ESC);
                if (atxt[0] != 0) {
                        tmp[2]=atof(atxt);
                        for (k=0; atxt[k]!='\0'; k++)
                            atxt[k]=tolower(atxt[k]);
                        if (strchr(atxt,'k')) p_l[podn][2].typ=1;
                        else
                        if (strchr(atxt,'m')) p_l[podn][2].typ=2;
                        else p_l[podn][2].typ = 0;
                }
                fv2=tmp[2]*(float)(pow((double)1000,(double)p_l[podn][2].typ));
                fv=tmp[2];
                tmp[2]=fv2;
                i+=validate(i,podn);
                tmp[2]=fv;
                k=fv1/fv2;
                if (k>c2p_max) {
                        sprintf(tmpstr,"cursor-2 > 1023. repeat");
                        put_s2(tmpstr);
                        i=2;
                }
                break;
/* amplitude_min */
        case 3:
                put3c("Minimum Voltage: ");
                put_con(atxt,0);
                if (ESC == get_con(atxt,0,80) ) return(ESC);
                if (*atxt != 0)
                        sscanf(atxt,"%f",&tmp[3]);
                i+=validate(i,podn);
                        break;
/* amplitude_max */
        case 4:
                put3c("Maximum Voltage: ");
                put_con(atxt,0);
                if (ESC == get_con(atxt,0,80) ) return(ESC);
                if (*atxt != 0)
                        sscanf(atxt,"%f",&tmp[4]);
                i+=validate(i,podn);
                break;
/* phase */
        case 5:
                put3c("Phase (%% of One Cycle): ");
                put_con(atxt,0);
                if (ESC == get_con(atxt,0,80)) return(ESC);
                if (*atxt != 0)
                        sscanf(atxt,"%f",&tmp[5]);
                i+=validate(i,podn);
                break;
        case 6:
                if (tmp[0]==3) {            /* Test for SIne Wave */
                        tmp[6]=50.0;
                }
                else {
                        put3c("Duty Cycle (%% of One Cycle): ");
                        put_con(atxt,0);
                        if (ESC == get_con(atxt,0,80)) return(ESC);
                        if (*atxt != 0)
                                sscanf(atxt,"%f",&tmp[6]);
                }
                i+=validate(i,podn);
                break;
        } /* switch */
} p_l[podn][0].typ=get_dcc(fv2);
p_l[podn][6].typ=k;
```

```c
        k=tmp[3]*20;                /* number mv_units per volt=20   */
        for (i=1; i<hdr_size; i++) p_l[podn][i].val=tmp[i];
        p_l[podn][3].typ=127+k;
        p_l[podn][4].typ=tmp[4]*20+127;
        p_l[podn][5].typ=tmp[5]*360/100;

do_wave(podn,wf);

} /* end function */

/*========================================================*
 *     VALIDATE - validates entry in 'podin'              *
 *                parameter i=entry line number           *
 *========================================================*/
#define mv_p_unit       (float)50
#define max_offset      (float)127
#define max_types       (float)3
#define max_mfi_cl      (float)25000000
#define min_mfi_cl      (float)0.002
#define max_dat_cl      (float)12500000
#define min_dat_cl      (float)0.001
#define max_ampl        mv_p_unit*max_offset/(float)1000
#define min_ampl        (float)0-max_ampl
#define min_phase       (float)0-50
#define max_phase       (float)50
#define max_dc          (float)100
validate(i,podn)
int i,podn;

{
int     x;
x = 1;
switch (i)
{
   case 0: if ((tmp[i]>max_types)|| (tmp[i]< 0))
                x = 0;
           break;
   case 1: if ((tmp[i]>max_mfi_cl) || (tmp[i]<min_mfi_cl))
                x = 0;
           break;
   case 2: if ((tmp[i]>max_dat_cl) || (tmp[i]<min_dat_cl))
                x = 0;
           break;
   case 3: if ((tmp[i] < min_ampl) || (tmp[i] > max_ampl))
                x = 0;
           break;
   case 4: if ((tmp[i] < min_ampl) || (tmp[i] > max_ampl))
                x = 0;
           break;
   case 5: if ((tmp[i] > max_phase) || (tmp[i] < min_phase))
                x = 0;
           break;
   case 6: if ((tmp[i] > max_dc) || (tmp[i] < 0)) {
                x = 0;
           }
           break;
}       /* end of switch */
if (x==0) {
        sprintf(tmpstr,"Value of %f Out of Range for %d",tmp[i],i);
}
else {
        sprintf(tmpstr,"Value of %f Accepted for Parameter %d",tmp[i],i)
}
put_s2(tmpstr);
return(x);
} /* end of function */

/***********************************************************
 *     DO_WAVE - this function creates image of            *
 *               wave form in buffer, supplied by          *
 *               caller. Input data from p_l[podn][]       *
 * There are wave form types: 0 - empty, 1- rectangular,   *
 *       2- triangle, 3-sine, 4-cosine.                    *
 ***********************************************************/
```

```
do_wave(podn,wf)
int     podn;
char wf[];
{
        int i,j;
        int    c2p,          /* cursor-2 position (end of wave period) */
               c_max,        /* position of max right adjusted         */
               c_min,        /* position of min right adjusted         */
               duty_c,       /* duty cycle in clocks                   */
               phase,        /* phase in clocks                        */
               a_max,        /* amplitude in units                     */
               a_min,        /* min amplitude in units                 */
               wft,          /* wft -wave form type                    */
               zero_point;   /* logical zero = (max+min)/2             */ float step,          /* step for sin function                  */
              pgrad, ngrad,  /* for triangle wave */
              tval,          /* ditto           */
              arg,           /* argument of function                   */
              pi=3.14159,    /* constant                               */
              ftmp,          /* temporary value                        */
              a_maxf=0;      /* amplitude as a floaf for sin, cos      */
        /*----------------------------------*/
        /*       fill in variable           */
        /*----------------------------------*/
        wft=p_l[podn][0].val;
        c2p=p_l[podn][6].typ;               /* cursor_2 position    */
        phase= p_l[podn][5].val *c2p / 100;
        duty_c = p_l[podn][6].val * c2p / 100;
        a_min=p_l[podn][3].typ;
        a_max=p_l[podn][4].typ;
        zero_point=(a_max+a_min)/2;
/*----------------------------------*/
/*      If rectangular        */
/*---------    ---------------*/
        j = 0;
        if (phase < 0) i = phase + c2p;
        else i = phase;
        if (wft==1){
                put_s2("RECTANGULAR ");
                c_max=duty_c;
                c_min = c_max + c2p-duty_c;                 /* may be does not exist
                while (j<c2p) {
                        if (j++ < c_max) wf[i] = a_max;
                        else wf[i] = a_min;
                        if (++i >= c2p) i=0;
                } /* end while */
        }       /* end rectangular */
        else
/*----------------------------------*
*            TRIANGLE               *
*----------------------------------*/
   if (wft==2) { put_s2("TRIANGULAR");
           c_max = duty_c/2;
           c_min = c_max+ c2p - duty_c;
           if (duty_c == 0) {
                   pgrad = 0; ngrad = 0;
           }
           else {
                   pgrad=(float)(a_max-a_min)/(duty_c);
                   ngrad = (float)(a_max-a_min) / (c2p - duty_c);
           }
           tval = (float) zero_point;
           while  (j < c2p) {
                   wf[i++]=(unsigned char)tval;
                   if (j < c_max || j >= c_min )
                           tval+=pgrad;
                   else
                           tval-=ngrad;
                   j++;
                   if (i >= c2p) i = 0;
           } /* end while  */
   } /* end if triangle */
        else
```

```
/*--------------------------------------------------------*
 *                  If sin(x)                             *
 *--------------------------------------------------------*/
	if (wft==3) {
		put_s2("SIN(X) ");
		step=2*pi/c2p;
		a_maxf=(float)(a_max-a_min)/2;
		arg = 0;
		while (j++ < c2p) {
			ftmp= a_maxf * sin(arg);
			tval=ftmp+zero_point;
			arg+=step;
			wf[i++]=(unsigned char)tval;
			if (i >= c2p) i = 0;
		}  /*  while  */
	}       /* end if */
	i=0;
	while(i+c2p < banksize )
		wf[i+c2p]=wf[i++];  /* extend to the end */
} /* end function */
/*--------------------------------------------------------*
 *   gen_anal() - new pod info. calls podin for           *
 *                details, but loops in entry             *
 *                until done                              *
 *--------------------------------------------------------*/
gen_anal(wf)
char    *wf;
{
	int more=1;              /* loop variable: once only */
	int podn=0;
	unsigned       c;
	while (more-->0) {
		sprintf(tmpstr,"Select the Bank Number (0 - %X): ",MAXPD1-1);
		prmpt3(tmpstr);
		if (ESC == (c=get_one())) { more = 0; continue; }
		else    podn = c>='A'?c-'7':c-'0';
		if ((podn < 0) || (podn >=np0+np1) ||SO_PODDT[podn] != 1) {
			put_s2("Bank out of range. Try again");
			more = 1;
			continue;
		}
		/* now, if podn valid go ahead */
		setoffset(podn);         /* sets globals: offset,banksize */
		podin(podn,wf+offset);
	} /* end while loop */
} /* end gen_anal()*/

/*========================================*
 *       GET DATA CLOCK CODE              *
 *========================================*/
get_dcc(frecv)
float frecv;
{
	int     i;
	for (i=0; i<=30; i++) if (frecv>=dcc[i]) return(i);
	return(-1);
} /* END GET_DCC  */
#define AZCAL   128
int     anlsclfct[8] = {20,100,50,20,10,5,2,0};
/* Operate on Analog channels */
op_anal(dbuf,dprb,sbuf,sprb,op,f)
unsigned char   *dbuf;
int     dprb;
unsigned char   *sbuf;
int     sprb;
int     op;
float   f;
{
	unsigned char    *src,*dst;
	int     i,x,y,z,flg,ovf;
	setoffset(sprb);
	src = sbuf + offset;
	setoffset(dprb);
	dst = dbuf + offset;
```

```
flg = 0;
if (sbuf==NULL&&sprb=='C') flg = 1;     /* use constant for op */
switch(op) {
case 'C':
        if (flg==0)
        for(i=0; i<banksize; i++){
                *dst++ =   *src++;
        }
        else for (i=0;i<banksize;i++) {
                *dst++ = (int)f + AZCAL;
        }
        break;
case '+':
        if (flg==0)
        for(i=0; i<banksize; i++){
                x = *dst + (*src++) - AZCAL;
                if (x > 255) x = 255;
                else if (x < 0) x = 0;
                *dst++ = x;
        }
        else for (i=0;i<banksize;i++) {
                *dst++ += (int)f;
        }
        break;
case '-':
        if (flg == 1) for(i=0; i<banksize; i++){
                *dst++ -= (int)f;
        }
        else
        for(i=0; i<banksize; i++){
                x = *dst - ( (*src++) - AZCAL);
                if (x > 255) x = 255;
                else if (x < 0) x = 0;
                *dst++ = x;
        }
        break;
case '*':
        if (flg == 1) {
                for(i=0; i<banksize; i++){
                        x = *dst;
                        x = AZCAL + (int)((float)(x - AZCAL) * f);
                        if (x > 255) x = 255;
                        else if (x < 0) x = 0;
                        *dst++ = x;
                }
        }
        else {
                z = SO_ANALSET[sprb];
                if (z < 0 || z > 6) z = 0;
                z = anlsclfct[z];
                for(i=0; i<banksize; i++){
                        x = *dst - AZCAL;
                        y = *src++ - AZCAL;
                        x = x * y / z + AZCAL;
                        if (x > 255) x = 255;
                        else if (x < 0) x = 0;
                        *dst++ = x;
                }
        }
        break;
case '/':
        ovf = 0;                /* clear overfolw flag */
        if (flg == 1) for(i=0; i<banksize; i++){
                x = *dst;
                if (f != 0.0)
                        x = AZCAL+(int)((float)(x - AZCAL) / f);
                else {
                        ovf = 1;
                        x = AZCAL + (x<0?-1:1) * AZCAL;
                }
                if (x>255) x = 255;
                else if (x < 0) x = 0;
                *dst++ = x;
```

```
                    }
                    else
                    for(i=0; i<banksize; i++){
                            x = *dst;
                            x -= AZCAL;
                            y = *src++;
                            y -= AZCAL;
                            if ( y != 0)
                                    x /= y;
                            else {
                                    ovf = 1;
                                    x = AZCAL + (x<0?-1:1) * AZCAL;
                            }
                            *dst++ = x;
                    }
                    if (ovf == 1) put_s2("Divide by Zero");
                    break;
        case '%':
                    if (flg == 1) for(i=0; i<banksize; i++){
                            x = *dst - AZCAL;
                            x = x % (int)f;
                            *dst++ = x + AZCAL;
                    }
                    else
                    for(i=0; i<banksize; i++){
                            x = *dst - AZCAL;
                            y = *src++ - AZCAL;
                            x %= y;
                            *dst++ = x + AZCAL;
                    }
                    break;
        case 'A':
                    for(i=0; i<banksize; i++){
                            x = *dst - AZCAL;
                            x = abs(x);
                            *dst++ = x + AZCAL;
                    }
                    break;
        case 'L':   /* shift wave form left  use sprb for amount */
                    y = *dst;
                    for(i=1; i<banksize; i++){
                            *dst = *(dst+1);
                            dst++;
                    }
                    *dst = y;
                    break;
        case 'R':   /* shift wave form left  use sprb for amount */
                    src = dst;
                    x = *dst;
                    for(i=1; i<banksize; i++){
                            dst++;
                            y = *dst;
                            *dst = x;
                            x = y;
                    }
                    *src = x;
                    break;
        }
}
/* COMMON SOURCE MODULE FOR MFI CONTROL PROGRAM 2 and 48 */
/*     COPYRIGHT(C)1986,1987,1988.  ARRAY ANALYSIS, INC.    */
/* MENUEMU.C */
/* This Module handles the MFI-1000 Menu Emulation using Talkback Mode */ include        "constant.h"
include        "global.h"

extern  int     bd0;
extern  int     iberr;          /* gpib error */
extern  int     ibcnt;          /* gpib count */
extern  int     ibsta;          /* status word */
extern  int     dsp_flag;
extern  int     pxpcol,pxprow,hedge,vedge;
```

```
extern   unsigned        bioerr;         /* io error flag */
extern   int     alim;
#define  GPERR   0x8000
#define  STX     0x1d            /* use GS char. for start of message */
define  EOT     0x1e            /* use RS char. for end of Transmission */ int      mesrow = 0, mescol = 0;
int      memstatus=-1,memmenu=-1;
set_mnem() {
        q.mnemflg = 1;
        mecurtog = 1;
        mesrow = -1; mescol = -1;
        put_mul("*m1");
}
clr_mnem() {
        q.mnemflg = 0;
        put_mul("*m0");
        mpmsg("          ");
}
████(s)
char *s;
{
        int     r,c,x,y,z,atr;
        pcvgcp(&r,&c);          /* save internal cursors coordinates */
        atr = q.rattr;
        x = 584; y = boxrows*pxprow + topbrdr + nodrows*pxprow - tpxrow/2;
        z = fontpixn(0,s,0,strlen(s));
        grrtllc(x-2,y,z+4,tpxrow-1,atr/16);          /* erase space */
        fontsprt(0,s,x,y,0,atr%16,0);                /* write new message */
        pcvscp(r,c);            /* restore internal coordinates */
}
rfr_mnem() {
        if (q.mnemflg == 1) {
                baby_sit('2',1);
        }
}
mem_sync()                      /* dump any changes, including the cursor */
{
        mpmsg("Polling");
        gmnstat();
        baby_sit('3',1);
}
tst_mnem()
{
        return(q.mnemflg == 1);
}
int      bserrflg = 0;
baby_sit(val,flg)                                    /* -1 indicates a refresh operat
int      val,flg;
{
        char    *src,tstr[16];
        int     count;
        int     x = 0;
        unsigned        c,d;
        if (q.mnemflg != 1) {
                if (flg == 0)
                        if (val != -1)
                                put_com(val);
                return(0);
        }
        mpmsg("Standby");
        bserrflg = 0;
        do {
                count = 0;
                src = (char *)drawbuf;
                bioerr = 0;
                c = ' ';
                if (val != -1) {
                        if (flg==0)
                                sprintf(tstr,"*%c",val);
                        else
                                sprintf (tstr,"*m%c",val);
                        put_mul(tstr);
                        val = -1;
```

```c
                if (q.gpib != 0) {
                        if (terror()) x = ESC;
                        ibtmo(bd0,14);          /* 30 second timeout */
                        ibeos(bd0,0x041e);      /* 7 bit term char = RS
                        gx_list();
                }
        }
        bioerr = 0;
        set_tmo(1000);
        if (q.gpib == 0) {
                do {
                        d = iioget();   /* get the new char */
                        if (d!=0xffff) {
                                *src++ = d;
                                count++;
                                if (d == EOT)    /*Test for the EOT char
                                        break;
                        }
                        else {
                                if (mon_esc()) { x = ESC; break;}
                                commchk();
                        }
                } while (count < 4000);
                *src = 0;
        }
        else {          /* use the GPIB interface */
                if (x != ESC) {
                   ibrda(bd0,src,4000);
                   do {
                        if (mon_esc()) ibsta = 0xc100;
                        else ibwait(bd0,0);
                        commchk();
                   } while ((ibsta &0xc100) == 0);
                   count = ibcnt;
                   if (terror())
                        x = ESC;
                }
        }
        if (x==ESC||mon_esc()) {
                x = ESC;
                q.mnemflg = 0;
                msflag = 3;
        }
        if (count > 1)
                x = show_men(drawbuf,count);
        else x = 1;
    } while (x == 0);
    if (q.gpib != 0) {
                gx_clear();
                ibeos(bd0,0);
                ibtmo(bd0,13);          /* ten second timeout */
    }
    mpmsg("Ready  ");
    return(x);
}
commchk()
{
        if (tst_tmo()) {
                zap_stat(
"MFI COMM DELAY: WHEN READY PRESS THE 'ESC' KEY AND THEN THE '*' CHARACTER.");
                set_tmo(1000);
        }
}
tst_ahead(src,count)
char    *src;
int     count;
{
        int     result = 0;
        while (count-- > 0) {
                if (*src++ == STX) {
                        result = STX;
                        break;
                }
        }
```

```c
        return(result);
}
orientme()                    /* set up orientation point for menu emulation */
{
        rl2(0,q.vsw);
        vpxo = vpxo - 1 + 3*tpxrow;
        hpxo = hpxo + (nodcols * pxpcol - 40 * tpxcol) / 2;
}
show_men(src,count)
char    *src;
{
        int     blankflg = 0;
        char    *svsrc;
        unsigned        row,rp,col,cp,c;
        int     loop,scrnflg,y,x = 0,pset=0;
        loop = 1;
        scrnflg = 0;
        orientme();
        erase_mic();
        while (loop && count > 0 && *src != 0) {
                if (*src++ != STX) {
                        count--;
                        continue;
                }
gotdllr:
                if (mon_esc()==1) return(ESC);
                c = toupper(*src++);
                if (blankflg == 1) {
                        if (c == '.') {
                                td();
                                gmnstat();
                        }
                        else {          /* erase emulation display area */
                                grrtulc(hpxo-tpxcol,vpxo-2*tpxrow,tpxcol*42-1,
                                        tpxrow*26-1,q.rattr/16);
                                grrtul(hpxo-tpxcol+1,vpxo-2*tpxrow+2,
                                        tpxcol*42-3,tpxrow*26-5,q.rattr%16);
                                grrtul(hpxo-tpxcol/2,vpxo-tpxrow-tpxrow/2,
                                        tpxcol*41-2,tpxrow*25-1,q.rattr%16);
                                scrnflg = 1;
                        }
                        blankflg = 2;
                }
                if (memstatus != 1) pset |= 1;
                switch (c) {
                case 'T':
                case 'C':
                        blankflg = 1;
                        count -= 2;
                        break;
                case 'P':
                        if (tst_ahead(src,4) != 0) break;
                        sscanf(src,"%2x%2x",&row,&col);
                        src += 4;
                        row = row * tpxrow + vpxo;
                        col = col * tpxcol + hpxo;
                        if (mecurtog != 0) {
                                mecurtog = 0;
                                mescol = col; mesrow = row;
                                pset |= 2;
                        }
                        count -= 6;
                        break;
                case 'M':
                        if (tst_ahead(src,4) != 0)
                                break;
                        erase_mic();
                        sscanf(src,"%2x%2x",&rp,&cp);
                        src += 4;
                        svsrc = src;
                        count -= 6;
                        while (*svsrc != STX && count-- > 0) svsrc++;
                        *svsrc = 0;
```

```
                        fix_mnem(src);
                        y = strlen(src);
                        if (cp + y > 40) {
                                if (rp+1 < 24) {
                                        mic_str(src+40-cp,hpxo+cp*tpxcol,
                                            vpxo+(rp+1)*tpxrow,q.rattr,0);
                                            /* was blankflg-1, now 0 */
                                }
                                *(src +(40-cp)) = 0;
                        }
                        mic_str(src,hpxo+cp*tpxcol,vpxo+rp*tpxrow,
                            q.rattr,0);
                        src = svsrc + 1;
                        goto gotdllr;
                case 0x00:
                case EOT:
                case '.':
                        x = 1;
                        loop = 0;
                        count -= 2;
                        break;
                default:
                        count--;
                }
        }
        if (pset & 2) move_mic(mesrow,mescol);
        else if (pset & 1) frsh_mic();
        return(x);
}
mic_str(s,x,y,atr,flg)
char    *s;
int     x,y,atr,flg;
{
        int     z;
        if (flg != 1) {
                z = fontpixn(0,s,0,strlen(s));
                grrtllc(x,y,z,tpxrow-1,atr/16);
        }
        fontsprt(0,s,x,y,0,atr%16,0);
}
fix_mnem(str)
char    *str;
{
        while(*str != 0) {
                switch (*str) {
                case 1:
                        *str = '^';
                        break;
                case 2:
                        *str = '~';
                        break;
                case 3:
                        *str = '>';
                        break;
                case 4:
                        *str = '<';
                }
                str++;
        }

}
gmnstat()       /* get the mfi menu status word */
{
        char    tstr[16];
        int     x1,x2,y;
        put_mul("*m4");
        get_rsp(tstr,6);
        y = sscanf(tstr,"\035S%2x%2x",&x1,&x2);
        if (y==2) {
                memstatus = x1;
                memmenu = x2;
                y = 0;
        }
        else
```

```c
            y = -1;
        return(y);
}
td()
{
        if (q.gpib!= 0) {
                gx_clear();
                ibeos(bd0,0);
                ibtmo(bd0,13);          /* ten second timeout */
        }
        if (rcvset() == 0)
        if (rcvdata()== 0) {
                do_disp('D');
                display(tmpsave);
                dsp_flag = 0;

}
}
int     origoff;
int     gtmstate = 0;
dotmem(c)
unsigned        c;
{
        unsigned d;
        if (gtmstate == 0) {gtmstate = 1; origoff = dspoff;}
        switch(c) {
        case 'M':
        case 'B':
                new_screen();
        case 'A': case 'D': case 'P':  case 'T': case'.':
        case 'R': case'S': case 'U':
        case 'H': case 'Q': case '*': case '9':
                d = dochar(c);   /* MFI Keypad Control Command Processor */
                break;
        case '1':
        case '2':
        case '3':
        case '4':
                d = wrap_up(c);
                dsp_flag = 0;
                sndset();
                goto dtmdone;
        case 'C':
                query_ch();
                dsp_flag = 0;
                sndset();
                goto dtmdone;
        case 256*ALT_P:
                d = wrap_up(c);
                sndset();
                goto dtmdone;
        default:
                d = wrap_up(c);
dtmdone:
                if (d == 0) d = ' ';            /* no exit keys */
                else if (origoff != dspoff) {   /* on exit if dspoff changed*/
                        chk_mag();
                        sndset();
                        gtmstate = 0;
                }
        }
        return(d);
}
/* version number for MCP2 without the Expert System Software */
char    vlmcp[] =
        " Version  3.26                                          (800) 451-8514";

/* version number for XS48: MCP2 with Expert System */
char    vlxs[] =
        " Version  3.26     with Expert System V3.31·            (800) 451-8514";

/* Title for Expert System Menu */
char    fdmtitle[] = {"Expert System Fault Diagnosis Module (V3.31)"};
```

```c
/* date for both versions */
char    datline[] =
        "          05/07/89                              Langmuir Lab., Brown Rd";
/* COMMON SOURCE MODULE FOR MFI CONTROL PROGRAM 2 and 48 */
/*   COPYRIGHT(C)1986,1987,1988.  ARRAY ANALYSIS, INC.   */
/* LEARN.C */
/* 8/8/88 fix macro language character to compare to process '\' */
/*        fix handling of F10 key in Macro */
#include        "constant.h"
include        "global.h"
#include        <conio.h>
void new_mac(); void rstrt_mac(); void close_mac();
void do_trace(); void chkbrkp(); void sub_parm(); void chq_stash();
void tuc_str(); void supdate(); void put_mstat(); void put_trace();
void place(); void zcache(); void end_mac();
extern  int     glberflg;

int     csave = (-1);
int     cdelay = 0;
int     cdval = 100;
int     ccount = 0;
int     forcend = 0;
char    *dmsave;
int     macromenu;              /* most recent macro entered */
char    macroname[65];          /* name of function macro to execute */ define VMAX    100
define RSMAX   100 static  unsigned vark[VMAX];
static  int     varx[VMAX];
static  int     vary[VMAX];
static  int     varz[VMAX];
static  long    rmark[RSMAX];
static  char    vars[VMAX][64];

int     rmpi = -1;

int     escflag = 0;
int     ctlxflag = 0;
int     logflag = 0;

int     dbgflag = 0;    /* b0-Single Step, b1-Trace, b2-Bkpnt */ define DBGMAX  80
char    dbgstr[DBGMAX+1];
char    dbgndx=0;
char    bkpnt[32];
char    stctime[16];
char    stcdate[16];

char    dbglabel[32] = "                ";

static  svmcflg = 0;    /* escape flag used by svmc to flag '\' */ static gchflag = 0;
static int      gchcount = 0;
static char gchsave[82]= {0,0,0,0,0,0,0,0,0,0,0,0,0,0,0,0,0};
static char *gchp = gchsave;
static int      errxx;

FILE    *isfile = NULL;
int     isstat = 0;     /* 0-closed, 1-open, -1-eof */
char    ismode[8];

unsigned gch_mac();
int     *pars_arg();
int     *pars_ndx();
int     *locate();

char *save_screen()
{
```

```c
                char    *x;
                int     rx,cx;
                unsigned z;
                z = 32;
                x = (char *)calloc(28000,1);
                if (x != NULL) {
                        pcvgcp(&rx,&cx);
                        erase_cur();
                        *x = (unsigned char) rx;
                        *(x+1) = (unsigned char) cx;
                        get(0,0,639,83,x+2);
                }
                return(x);
        } rest_screen(x)
char    *x;
{
        int     rx,cx;

if (x != NULL) {
                erase_cur();
                put(0,0,x+2,1);
                if (*x >=0 && *x <=5) {
                        rx = *x;
                        cx = *(x+1);
                        move_cur(rx+1,cx+1);
                }
                return(free(x));
        }
        else {
                clr_screen(0,0,24,79);
                put_s2("The Previous Screen Image Was Lost.  Please continue");
                return(0);
        }
} c_ready()               /* return keyboard or character ready status */
{
        if (istate != 1) {
                if (csave != -1)
                        return(1);      /* one in the pipe */
                else
                if (chq_ready())
                        return(1);
                else
                        return(kbhit());
        }
        else {                          /* If files open theres more */
                if (cdelay) {           /* set by c_get() */
                        cdelay--;
                        return(0);
                }
                else
                        return(1);
        }
} int     dmlock = 0;
c_get()
{
        int     c,d,f;
        char    *xxsave;
        while(1) {                      /* loop until ? */
                switch(istate) {        /* determines source of input */
                case 1:                 /* regurgitate output from file */
cgtryag:
                        c = gch_mac();
                        if ( c == EOF) {        /* end of macro file input */
                                if (lrepeat != 0) {     /* is repeat set? */
                                        rptcycle++;     /* times repeated */
                                        rstrt_mac();    /* restart the file */
                                        if (lrepeat != -1) /* if not forever */
                                                lrepeat--; /* decrement count*/
```

```c
                                goto cgtryag;   /* get a chatracter */
                        }
                        else {
                                close_mac();    /* end of macro */
                                continue;
                        }
                }
                cdelay = cdval; /* was 1100: Counted in c_ready() */
                return(c);
        case 4:                         /* suspended recording */
        case 3:                         /* suspended execution */
        case 2:                         /* copy char from kbd to macro file */
        case 0:                         /* straight keyboard input */
                do {
                        f = 0;                  /* used as a flag */
                        if (csave != -1) {
                                c = csave;
                                csave = -1;
                        }
                        else {
                                c = chq_score(); /* get keyboard */
                        }
/* Extended char */     if (c == 0) {
                                d = chq_score();
                                switch(d) {
/* ALT_H for help */            case ALT_H:
                                        c = 0xff;
                                        if (istate==0 || istate==2
/* allow help for opening macro */       || dmlock != 0)
                                                help_all(topic);
                                        break;
                                case SF10:
                                        c = 0xff;
                                        log_menu = 0;
        put_s2("AUTO MENU LOGGING: OFF      (Use Ctrl F10 to Turn On");
                                        break;
                                case CF10:
                                        c = 0xff;
        put_s2("AUTO MENU LOGGING: ON       (Use Shift F10 to Turn Off");
                                        log_menu = 1;
                                        break;
/* F10 for print */             case F10:
                                        c = 0xff;
                        scrndump(q.prtype,q.prdir,q.prsize,0,0,1,1,1);
                                        break;
                                case ALT_M:
                                        c = do_mac();
                                        break;
                                case ALT_Z:
                                        f = 1;  /* reexecute */
                                case ALT_X:     /* f zero on entry */
macexec:
                                        c = ' ';
                                        if (istate == 0 && dmlock == 0) {
                                            dmlock = 1;
                                            cpy_str(dbglabel,"        ");
                                            dmsave = save_screen();
                                            if (lrn_open('E',f))
                                                    free(dmsave);
                                            else rest_screen(dmsave);
                                            dmlock = 0;
                                        }
                                        break;
                                default:
                                            if (istate == 0 && dmlock == 0
/* writes macro name into q.lastmacro */    && fkey_mac(d)) {
                                                    f = 2;
                                                    goto macexec;
                                            }
                                            else csave = d;
                                            break;
                                }
                        }
                } while (c == 0xff);
```

```c
                    if (istate == 1) {
                            continue;
                    }
                    else
                    if (istate == 2) {
                            pch_mac(c); /* put character to mac file */
                    } return(c);
            }
        }
}
fkey_mac(c)
int     c;
{
        char    *str;
        switch(c) {
        case F1: str = "F1"; break;
        case F2: str = "F2"; break;
        case F3: str = "F3"; break;
        case F4: str = "F4"; break;
        case F5: str = "F5"; break;
        case F6: str = "F6"; break;
        case F7: str = "F7"; break;
        case F8: str = "F8"; break;
        case F9: str = "F9"; break;
        case SF1: str = "SF1"; break;
        case SF2: str = "SF2"; break;
        case SF3: str = "SF3"; break;
        case SF4: str = "SF4"; break;
        case SF5: str = "SF5"; break;
        case SF6: str = "SF6"; break;
        case SF7: str = "SF7"; break;
        case SF8: str = "SF8"; break;
        case SF9: str = "SF9"; break;
        case AF1: str = "AF1"; break;
        case AF2: str = "AF2"; break;
        case AF3: str = "AF3"; break;
        case AF4: str = "AF4"; break;
        case AF5: str = "AF5"; break;
        case AF6: str = "AF6"; break;
        case AF7: str = "AF7"; break;
        case AF8: str = "AF8"; break;
        case AF9: str = "AF9"; break;
        case CF1: str = "CF1"; break;
        case CF2: str = "CF2"; break;
        case CF3: str = "CF3"; break;
        case CF4: str = "CF4"; break;
        case CF5: str = "CF5"; break;
        case CF6: str = "CF6"; break;
        case CF7: str = "CF7"; break;
        case CF8: str = "CF8"; break;
        case CF9: str = "CF9"; break;
        default: return(0);
        }
        strcpy(macroname,str);
        return(1);
}
mon_esc()
{
        xmon();
        if (escflag > 0) {
                escflag--;
                return(1);
        }
        return(0);                              /* nothing hit */
}
mon_ctlx()
{
        xmon();
        if (ctlxflag > 0) {
                ctlxflag--;
                return(1);
        }
```

```
                return(0);                          /* nothing hit */
} xmon()
{
        int c;
        if (kbhit()) {
                c = getch();
                if (c == CTLX) ctlxflag++;
                if (c == ESC)  escflag++;
                else
                        chq_stash(c);
        }
        return(0);                                  /* nothing hit */
}
do_mac()                    /* Maintain the Test Menu */
{
        char    temps[128];
        int     loop,refresh,stflg;
        int     c,d,e,x;
        char    *hsave;
        if (dmlock == 0) {        /* prevent recursive calling */
                dmlock = 1;
        }
        else
                return(0xff);

hsave = topic;
        dmsave = save_screen();
        suspend();      /* suspend inhibition of display, if present */
        stflg = 0;
        refresh = loop = 1;
        if (istate == 2 || istate == 1) {
                istate += 2;                        /* suspend recording state */
                stflg = 1;
        }
        men_regen();
        do {
                d = 0xff;
                if (istate == 0) {
                        topic = "MACRO";
                        put2(mac_form);
                }
                else
                if (istate == 3) {
                        topic = "EXMACRO";
                        put2(mex_form);
                }
                else
                if (istate == 4) {
                        topic = "PGMACRO";
                        put2(mpg_form);
                }
                put_mstat();
                put3c("Please  Select  A  Function");
                c = get_one();
                put_c2("  ");
                if (istate == 4) {       /* programming options */
                        if (pgm_key(c)== ESC)
                                loop = 0;
                        refresh = 1;
                }
                else
                switch (c) {
                case 'R':                           /* Repeat Performnce */
                case 'E':                           /* Execute */
                        if (istate == 0) {
                        cpy_str(dbglabel,"         ");
                        if (lrn_open(c,0)) {
                                d = 0;
                                loop = 0;
                                free(dmsave);
                                dmsave = NULL;
```

```
                        }
                        refresh = 1;
                }
                break;
        case 'T':
                if(istate == 3 && lrepeat != 0) {
                        lrepeat = 0;    /* zap repeat mode */
                        lrnstate[0] = 'E';
                        put_s2("Macro Repetition Has Been Terminated");
                }
                else
                if (istate == 3) {
                        forcend = 1;    /* force end of macro */
                        put_s2("Macro Execution Terminated");
                        loop = 0;
                }
                refresh = 1;
                break;
        case 'P':                       /* F3 for Learn */
                if (istate == 0) {      /* nominal status */
                        new_mac();
                        if (lrnfile != NULL)
                                loop = 0;
                }
                else
                        put_s2("A Macro File is Already Open");
                break;
        case 'S':
                topic = "MSPEED";
                sprintf(tmpstr,
                "Speed Delay Factor is Now %d.  Enter the New Factor: ",
                cdval/100);
                prmpt3(tmpstr);
                        if (get_int(&x) != ESC) {
                        cdval = x * 100;
                        sprintf(tmpstr,
                "Macro Speed Delay Factor is Now = %d",(cdval/100));
                        put_s2(tmpstr);
                }
                refresh = 1;
                break;
        case 'D':
                topic = "DEBUG";
prmpt3( "B)reakpoint, C)ancel All, S)ingle Step, T)race, V)ariable Displ
                c = get_one();
                switch(c) {
                case 'B':
                topic = "BREAKP";
                if ((dbgflag & 4) == 0)
                        sprintf(tmpstr,"Enter the Breakpoint Label:");
                else
                        sprintf(tmpstr,
                        "Breakpoint Set: %s.  Enter the New Breakpoint L
                prmpt3(tmpstr);
                strcpy(temps,bkpnt);
                if ( get_con(temps,0,7) != ESC ) {
                        If (*temps == 0)
                                dbgflag &= 0x1b;
                        else {
                                strcpy(bkpnt,temps);
                                tuc_str(bkpnt);
                                dbgflag &= 0x1e;
                                dbgflag |= 4;
                                sprintf(tmpstr,"Breakpoint Set to: %s.
                                put_s2(tmpstr);
                        }
                }
                break;
                case 'C':
                        dbgflag = 0;
                        put_s2("Debugging Options Cancelled");
                        break;
```

```
                case 'S':
                        if (dbgflag & 1) {
                                put_s2("Single Step Mode Turned Off");
                                dbgflag &= 0x1e;
                        }
                        else {
                                put_s2("Single Step Mode Turned On");
                                dbgflag &= 0x18;/* break,trace off */
                                dbgflag |= 1;
                        }
                        break;
                case 'T':
                        if (dbgflag & 2) {
                                put_s2("Trace Mode Turned Off");
                                dbgflag &= 0x1c;
                        }
                        else {
                                put_s2("Trace Mode Turned On");
                                dbgflag &= 0x1c;
                                dbgflag |= 2;
                        }
                        break;
                case 'V':
                        topic = "DBGVAR";
prmpt3("Debug Var. Display in D)ecimal, H)exadecimal, or N)ot at All? ");
                        e = get_one();
                        if (e == 'N')
                                dbgflag &= 0x07;
                        else
                        if (e == 'D') {
                                dbgflag &= 0x07;
                                dbgflag |= 0x08;/* decimal display*/
                        }
                        else
                        if (e == 'H') {
                                dbgflag &= 0x07;
                                dbgflag |= 0x18;
                        }
                        break;
                }
                break;
        case ESC:                       /* Continue testing */
                        loop = 0;
                        break;
                default:
                        break;
                }
        } while (loop);
        if (stflg == 1)
                if (istate == 4 || istate == 3)
                        istate -= 2;
        resume();
        if (dmsave != NULL)
                rest_screen(dmsave);
        topic = hsave;
        supdate();
        dmlock = 0;
        return(d);
}
pgm_key(c)
int     c;
{
        int d,e,k;
        int     x;
        d = ' ';
        switch(c) {
                case 'C':
                put3c("CALL: On K)ey, P)ass, F)ail, or U)nconditionally?  ");
                        goto kpcntu;
                case 'B':
                put3c("BRANCH: On K)ey, P)ass, F)ail, or U)nconditionally?  ");
kpcntu:
                        if ((e = get_one())==ESC) break;
                        if (e == 'K') {
```

```
                    putJc("Type the Character to Test For: ");
                    if ((k = get_one()) == ESC) break;
                }
                prmpt3("Please Enter a Label of Up to 7 Characters: ");
                if (get_con(tmpstr,0,7)==ESC) break;
                set_str(tmpstr,7);
                if (e == 'K')
                        fprintf(lrnfile,"\r\n%s0%c=%c,%s\r\n",
                                c=='C'?"??":"?",e,k,tmpstr);
                else
                        fprintf(lrnfile,"\r\n%s%c,%s\r\n",
                                c=='C'?"??":"?",e,tmpstr);
                break;
        case 'E':                  /* chain */
                prmpt3("Enter the Macro Name to Execute: ");
                if (get_con(tmpstr,0,63) != ESC)
                        fprintf(lrnfile,"\r\n*E%s\r\n",tmpstr);
                break;
        case 'D':
                prmpt3("Enter the Delay Length in Seconds?  ");
                if (get_int(&x) != ESC)
                        fprintf(lrnfile,"\r\n*D%d\r\n",x);
                break;
        case 'L':
                prmpt3("Enter a Label of Up to 7 Characters: ");
                c = get_con(tmpstr,0,7);
                set_str(tmpstr,7);
                if (c != ESC)
                        fprintf(lrnfile,"\r\n:%s\r\n",tmpstr);
                break;
        case 'P':                  /* Prompt and Wait */
pkloop1:
                prmpt3(
      "CHOICES: 0)Inhibit, 1-6)Prompt, 7)Scroll, 8)Restore, 9)Clear: ");
                if ( (c = get_one()) == ESC) break;
                if (c < '0' || c > '9') goto pkloop1;
                if (c != '0' && c != '8' && c != '9') {
                        prmpt3("Prompt: ");
                        if (get_con(tmpstr,0,72) == ESC) break;
                }
                else
                        *tmpstr = 0;
                fprintf(lrnfile,"\r\n*P%c%s\r\n",c,tmpstr);
                break;
        case 'Q':                  /* Terminate the looping sequence */
                fprintf(lrnfile,"\r\n*Q\r\n");
                break;
        case 'R':                  /* Return from call */
                fprintf(lrnfile,"\r\n*?\r\n");
                break;
        case 'W':
                putJc("Wait For a K)eypress or for T)riggered Status?  ");
                c = get_one();
                if (c == 'T')
                        fprintf(lrnfile,"\r\n*W%c\r\n",c);
                else
                if (c == 'K')
                        fprintf(lrnfile,"\r\n*W0%c\r\n",c);
                break;
        case 'T':
                close_mac();
                break;
        case ESC:
                d = ESC;
                break;
        default:
                return(d);
        }
        put_s2("Command Written to the Macro File");
        return(d);
} void new_mac()
{
```

```
            unsigned c;
            char    *hsave;
            hsave = topic;
            topic = "LEARN";
            put2(lrn_form);
            prmpt3("Enter the File Name For a Macro.  (NO Extension): ");
            if (get_con(tmpstr,0,64)!=ESC && tmpstr[0]!=0) {
                    sprintf(q.lrnname,"%s.mac",tmpstr);
                    lrnfile = fopen(q.lrnname,"rb");
                    if (lrnfile != NULL) {
                            fclose(lrnfile);
                            lrnfile = NULL;
                            sprintf(tmpstr,
                        "File %s Already Exists.  Overwrite?  (Y/N): ",q.lrnname
                            put3c(tmpstr);
                            c = get_one();
                            if (c != 'Y') goto lx1;
                    }
                    lrnfile = fopen(q.lrnname,"wb");
                    if (lrnfile != NULL) {
                            lrnstate[0] = 'P';
                            istate = 2;
                            sprintf(tmpstr,
                        "Macro File \"%s\" OPEN.  Programming Begins Now.",q.lrnname);
                    }
                    else {
                            sprintf(tmpstr,
                        "Could NOT Open Macro File %s.",q.lrnname);
                    }
            }
            put_s2(tmpstr);
lx1:
            topic = hsave;
            delay(2);
}
lrn_open(d,flg)        /* flg==0:normal, flg==1:repeat lact macro */
int     d;
int     flg;
{
            int     c,x;
            char    *hsave;

hsave = topic;
            topic = "PERF";
            rptcycle = 1;
            if ( flg == 0 || (flg == 1 && q.lastmacro[0] == 0)) {
                    directory("*.mac",1);
                    prmpt3("Enter the Macro Name (NO Extension): ");
                    c = get_con(tmpstr,0,64);
                    new_screen();
                    if (c != ESC) {
                            strcpy(q.lastmacro,tmpstr);
                            open_mac(tmpstr);
                    }
            }
            else if (flg == 1)
                    open_mac(q.lastmacro);
            else if (flg == 2)
                    open_mac(macroname);
            if (lrnfile != NULL) {
                    lrnstate[0] = 'E';
                    lrepeat = 0;
                    rmpi = -1;                  /* reset stack pointer */
                    if (d == 'R') {
                            prmpt3(
                        "Enter the Repetition Count, or  Enter -1 to Repeat Forever: ");
                            if (get_int(&x) != ESC) {
                                    lrepeat = x;
                                    lrnstate[0] = 'R';
                            }
                            else {
                                    close_mac();
                                    topic = hsave;
                                    return(0);
```

```
                        }
                        glberflg = 0;              /* clear error flag */
                        istate = 1;
                        c = 1;
                }
                else {
                        put_s2("Could not Open the Macro File");
                        c = 0;
                }
                topic = hsave;
                return(c);
}
chain_mac(str)
char    *str;
{
        if (istate == 1) {
                if (open_mac(str) == 0) {
                        istate = 0;
                        lrnstate[0] = ' ';
                        return(0);
                }
        }
        return(1);
}
void end_mac()
{
        if (istate == 1)
                fseek(lrnfile,0L,SEEK_END);     /* end of file */

}
void rstrt_mac()
{
        if (istate == 1)
                fseek(lrnfile,0L,SEEK_SET);     /* beginning of file */
}
void quit_mac()
{
        if (istate == 1)
                close_mac();
}
open_mac(str)
char    *str;
{
                if (lrnfile != NULL) {
                        fclose(lrnfile);
                        lrnfile = NULL;
                }
                zcache();                       /* zap the label cache */
                glberflg = 0;
                sprintf(q.lrnname,"%s.mac",str);
                lrnfile = fopen(q.lrnname,"rb");
                if (lrnfile == NULL)    {
                        sprintf(q.lrnname,"%s%s.mac",q.macprefix,str);
                        lrnfile = fopen(q.lrnname,"rb");
                        if (lrnfile == NULL)
                                return(0);
                }
                else
                        return(1);

}
void close_mac()
{
        if (isfile != NULL) {   /* input stream file */
                fclose(isfile);
                isfile = NULL;
                ismode[0] = 0;
        }
        fclose(lrnfile);
        lrnfile = NULL;
        lrnstate[0] = ' ';
        lrepeat = 0;
        istate = 0;
        rmpi = -1;
        activate();
        supdate();
}
```

```
/* MACRO CONTROL LANGUAGE PROCESSOR */ unsigned cnvrtxcp()      /* converts character following exception marker */
{
unsigned     c;
        c = toupper(readmac()); /* get next immeadiate character */
        if (c == 'R') c = '\r'; /* return a raw CR */
        else
        if (c == 'E') c = ESC;  /* return a raw escape */
        else
        if (c == 'B') c = BS;
        else
        if (c == 'S') c = ' ';
        return(c);
} unsigned gch_mac()       /* return next character from macro */
{
        unsigned c,d,e,f,g;
        char    *fmt;

int     dcflg,tmpvrdct,tndx,x,y,*z;     /* verdict for branching */
        int     *p,*tp;
        int     *pointer;
        char    temp[82];
        char    tchain[82];

if (*gchp != 0) {                       /* return second half of a double */
                c = *gchp++;                    /* if its waitng */
                return(c);
        }
gchloop:
        dcflg = 0;
        if (mon_ctlx()){
                do_mac();
        }
        if (forcend || glberflg) {
                end_mac();                      /* seek to end of macro file */
                forcend = 0;                    /* flag to force termination */
                c = EOF;
                lrepeat = 0;
        } else
        c = fltrctl();                          /* filter out cr and lf and tabs */
if (c == EOF)
        return(c);
if (c == '\\') {                                /* text escape character */
        c = cnvrtxcp();
}
else
if (c == '%') {
        gchp = gchsave;
        d = fltrctl();
        if (d == '%') {
                fmt = "%x";
                d = fltrctl();
        }
        else {
                fmt = "%d";
        }
        p = pars_arg(&tndx,&d,NULL);
        if (p == NULL) {
                do_err("Bad Variable Substituion Argument");
                goto founderr;
        }
        sub_parm(gchp,fmt,p,d);
        c = *gchp++;
}
```

```c
        else
        if (c == '@') {
                gchp = gchsave;
                gchsave[1] = 0;
                c = toupper(fltrctl());
                switch (c) {
                case 'A': gchsave[0] = ALT_A; break;
                case 'B': gchsave[0] = ALT_B; break;
                case 'C': gchsave[0] = ALT_C; break;
                case 'D': gchsave[0] = ALT_D; break;
                case 'E': gchsave[0] = ALT_E; break;
                case 'F': gchsave[0] = ALT_F; break;
                case 'G': gchsave[0] = ALT_G; break;
                case 'H': gchsave[0] = ALT_H; break;
                case 'I': gchsave[0] = F10; break;
                case 'J': gchsave[0] = ALT_J; break;
                case 'K': gchsave[0] = ALT_K; break;
                case 'L': gchsave[0] = ALT_L; break;
                case 'O': gchsave[0] = ALT_O; break;
                case 'P': gchsave[0] = ALT_P; break;
                case 'Q': gchsave[0] = ALT_Q; break;
                case 'R': gchsave[0] = ALT_R; break;
                case 'S': gchsave[0] = ALT_S; break;
                case 'T': gchsave[0] = ALT_T; break;
                case 'U': gchsave[0] = ALT_U; break;
                case 'V': gchsave[0] = ALT_V; break;
                case 'W': gchsave[0] = ALT_W; break;
                case 'X': gchsave[0] = ALT_X; break;
                case '8': gchsave[0] = U_ARW; break;
                case '2': gchsave[0] = D_ARW; break;
                case '6': gchsave[0] = R_ARW; break;
                case '4': gchsave[0] = L_ARW; break;
                case '7': gchsave[0] = HOME; break;
                case '1': gchsave[0] = END; break;
                case '0': gchsave[0] = INS; break;
                case '.': gchsave[0] = DEL; break;
                case '9': gchsave[0] = PG_U; break;
                case '3': gchsave[0] = PG_D; break;
                case '&': gchsave[0] = C_HOME; break;
                case '!': gchsave[0] = C_END; break;
                case '(': gchsave[0] = C_PGUP; break;
                case '/': gchsave[0] = C_PGDN; break;
                case '<': gchsave[0] = macromenu; break;
                default:  gchsave[0] = c;
                          do_err("Invalid Alternate Key Substitution Code");
                          goto founderr;
                }
                c = 0;
        }
        else
        if (c == ':') {                 /* ignore label */
                mac_gstr(tchain);
                chkbrkp(tchain);
                goto chkagain;
        }
        else
        if (c == ';') { /* ignore comments */
                do {
                        c = fgetc(lrnfile);
                        if (c == '\r'|| c == '\n') goto chkagain;
                } while (c != EOF);
        }
        else
        if (c == '?'|| c == '!') {      /* Test and Branch Instruction */
                dcflg = 0;              /* do call flag */
                tmpvrdct = 0;
                f = toupper(fltrctl());
                if (f == '?' || f == '!') {
                        dcflg = 1;                      /* flag call request */
                        f = toupper(fltrctl()); /* next character */
                }
                switch (f) {
```

```
case 'A':
      tmpvrdct = (mfi_stat() == '1'); /* armed */
      break;
case 'E':                  /* test for input file eof */
      if (isfile != NULL)
             tmpvrdct = feof(isfile);
      else tmpvrdct = 1;
      break;
case 'F':
      tmpvrdct = verdict==0?1:0;
      break;
case 'I':
      tmpvrdct = (mfi_stat() == '0'); /* idle */
      break;
case 'K':
      tmpvrdct = chq_ready(); /* key ready from user */
      break;
case 'O':
      tmpvrdct = (mfi_stat() == '2'); /* Auto Arm */
      break;
case 'P':
      tmpvrdct = verdict;
      break;
case 'T':
      tmpvrdct = (mfi_stat() == '3'); /* triggered */
      break;
case 'U':
      tmpvrdct = 1;
      break;
default:
      pointer = pars_arg(&tndx,&f,NULL);
      if (pointer == NULL) {
             do_err(
             "Invalid First Argument for Branch or Call");
             goto founderr;
      } g = fltrctl();        /* get relation op */
      if (g != '=' && g != '<' && g != '>') {
             do_err(
                   "Invalid Branch or Call Condition");
             goto founderr;
      }
      switch(f) {
      case 'K':              /* < and > default to = */
             e = toupper(fltrctl());
             if (e=='\\') e = cnvrtxcp();
             if (e == toupper(*pointer))
                   tmpvrdct = 1;
             break;
      case 'D':
      case 'T':
             mac_gstr(temp);      /* get next word */
             substitu(temp,15);
             tmpvrdct = cmp_str(pointer,temp,15);
             break;
      case 'S':              /* . < and > default to = */
             mac_gstr(tchain);           /* get next word
             substitu(tchain,63);
             tmpvrdct = cmp_str(pointer,tchain,63);
             break;
      case 'P':
      case 'X':
      case 'Y':
      case 'Z':
             x = *(int *)pointer;
             mac_gstr(temp);
             if( -1 == cnv_str(temp,&y,0))
                   goto founderr;
             if ( (g == '=' && x == y) ||
                  (g == '<' && x < y ) ||
                  (g == '>' && x > y )     )
                   tmpvrdct = 1;
             break;
```

```
                default:
                        do_err("Invalid Branch or Call Argument");
                        goto founderr;
                }
        }
        f = mac_gstr(temp);             /* get label for branch */
        if ( ( (tmpvrdct == 1) && (c == '?') ) ||
             ( (tmpvrdct == 0) && (c == '!') )     ) {
                if (dcflg == 1) {
                        if (-1 == push_pc()) {  /* return address */
                                do_err("Return Stack Overflow");
                                goto founderr;
                        }
                }
                if (fndlbl(temp) == 0) {
                        if (dcflg == 1)
                                pop_pc();/* no go, restore, continue */
                        sprintf(tchain,"Label (%s) Not Found",temp);
                        do_err(tchain);
                        goto founderr;
                }
                else {
                        chkbrkp(temp);
                }
        }
        goto chkagain;
}
else
if (c == '*') {
        c = toupper(fltrctl());
        switch(c) {
        case '?':
                if (-1 == pop_pc()) {
                        do_err("Return Address Stack Overflow");
                        goto founderr;
                }
                break;
        case 'D':
                mac_gstr(tchain);
                substitu(tchain,15);
                x = atoi(tchain);
                set_tmo(x);
                while (!tst_tmo());
                break;
        case 'E':       /* execute */
                mac_gstr(tchain);       /* macro get string */
                substitu(tchain,63);
                chain_mac(tchain);
                break;
        case 'F':                       /* macro filing functions */
                d = toupper(fltrctl());
                switch(d) {
                case 'C':
                        if (isfile != NULL)
                                fclose(isfile);
                        isfile = NULL;
                        ismode[0] = 0;
                        break;
                case 'O':                       /* open input file */
                        if (isfile != NULL) fclose(isfile);
                        isfile = NULL;
                        e = toupper(fltrctl());
                        mac_gstr(tchain);
                        substitu(tchain,64);
                        if (e == 'I') strcpy(ismode,"rt");
                        else if (e=='O') strcpy(ismode,"wt");
                        else break;
```

```
                        isfile = fopen(tchain,ismode);
                        break;
                case 'G':                /* get stabdard input */
                        d = toupper(fltrctl());
                        if (d == c) {            /* indicates hex */
                                e = 1; d = toupper(fltrctl());
                        }
                        else e = 0;
                        pointer = pars_arg(&tndx,&d,NULL);
                        if (pointer == NULL) {
                                do_err("Invalid Argument for Get");
                                goto founderr;
                        }
                        switch(d) {
                        case 'K':
                                if (isfile != NULL)
                                        *pointer = fgetc(isfile);
                                break;
                        case 'S':
                                if (isfile != NULL)
                                        fgets((char *)pointer,62,isfile)
                                break;
                        case 'X': case 'Y': case 'Z':
                                z = (int *)pointer;
                                if ( isfile != NULL) {
                                        fgets(tchain,32,isfile);
                                        if (e == 1) stch_i(tchain,z);
                                        else *z = atoi(tchain);
                                }
                                break;
                        }
                        break;
                case 'P':                /* put to file */
                        mac_glin(tchain);
                        substitu(tchain,80);
                        if (isfile != NULL && toupper(ismode[0])=='W'){
                                fputs(tchain,isfile);
                                fputc('\n',isfile);
                        }
                        break;
                }
                break;
        case 'O':                /* output byte to port function */
                mac_gstr(tchain);        /* get first argument */
                cnv_str(tchain,&e,0);    /* port specification */ mac_gstr(tchain);
                cnv_str(tchain,&f,0);    /* value */
                outp(e,f);
                break;
        case 'I':                /* input byte from port */
                mac_gstr(tchain);        /* get first argument */
                cnv_str(tchain,&e,0);    /* port specification */ d = fltrctl();           /* first character of dest */
                pointer = pars_arg(&tndx,&d,NULL);     /* address */
                if (pointer == NULL) {
                        do_err("Invalid Argument for Input from Port");
                        goto founderr;
                }
                switch(d) {
                        case 'K':
                        case 'X': case 'Y': case 'Z':
                                *pointer = inp(e);      /* get input */
                                break;
                }
                break;
        case 'L':
                d = fltrctl();
                if (d == '0') {
                        logflag = 0;
                        break;
```

```
            }
            else
            if (d == '1') {
                    logflag = 1;
                    break;
            }
            else
            if (d == '2')
                    mac_glin(tchain);
            else {
                    tchain[0] = d;
                    mac_glin(tchain+1);
            }
            if (-1 == substitu(tchain,80))
                    goto founderr;
            log_line(tchain);
            break;
    case 'P':
            d = toupper(fltrctl());
            e = 0;
            if (d == '0') {
                    inhibit();
                    break;
            }
            else
            if (d == '8') {
                    activate();
                    break;
            }
            if (d == '9') {
                    clr_screen(0,0,5,79);
                    mkbx(1,6,40,0);
                    break;
            }
            if (d == 'C') {
                    new_screen();
                    break;
            }
            if (d!= 'S' && d != 'B' && d!= 'D'
                && (d < '0' || d > '9')) {
                    do_err("Invalid Print Command");
                    goto founderr;
            }
            else
                    if ( -1 == do_msg(d) )
                      goto founderr;
            break;
    case 'W':
            d = toupper(fltrctl());
            if (d == c) {                          /* indicates hex */
                    e = 1; d = toupper(fltrctl());
            }
            else e = 0;
            pointer = pars_arg(&tndx,&d,NULL);
            if (pointer == NULL && d != 'T') {
                    do_err("Invalid Argument for Wait Command");
                    goto founderr;
            }
            switch(d) {
            case 'T':
                    trigger();
                    break;
            case 'K':
                    *pointer = hard_pause();
                    break;
            case 'S':
                    hard_string(pointer,63);
                    break;
            case 'P':
            case 'X':
            case 'Y':
            case 'Z':
                    z = (int *)pointer;
```

```
                hard_string(tchain,16);
                if (e == 1)
                        stch_i(tchain,z);
                else
                        *z = atoi(tchain);
                break;
        }
        break;
case 'S':               /* Set variable command */
        d = toupper(fltrctl());
        if (d == 'S') {
                g = 1;          /* hex constant mode */
                d = toupper(fltrctl());
        }
        else
                g = 0;          /* decimal constant */
        pointer = pars_arg(&tndx,&d,NULL);
        if (pointer == NULL){
                do_err(
                "Invalid first argument for Set Command?");
                goto founderr;
        }
        e = fltrctl();  /*   +, -, = */
        if (d == 'K') {
                if (e != '=') {
                        do_err(
                        "Invalid Expression for Set Command");
                        goto founderr;
                }
                *pointer = toupper(fltrctl());
        }
        else
        if (d=='S' || d=='P'|| d=='X' || d=='Y' || d=='Z'){
                if (e != '+' && e!='-' && e!='=' &&
                    e != '*' && e != '/' && e != '%'&&
                    e != '&' && e != '|' && e != '^') {
                        do_err(
                        "Invalid Expression for Set Command");
                        goto founderr;
                }
                else if (d=='S') {
                        mac_lstr(tchain);
                        if (-1 == substitu(tchain,63))
                                goto founderr;
                        cpy_str((char *)pointer,tchain);
                }
                else {
                        mac_gstr(tchain);
                        if (-1 == cnv_str(tchain,&x,g))
                                goto founderr;
                        z = pointer;
                        switch(e) {
                        case '=': *z  = x; break;
                        case '-': *z -= x; break;
                        case '+': *z += x; break;
                        case '*': *z *= x; break;
                        case '/': *z /= x; break;
                        case '%': *z %= x; break;
                        case '&': *z &= x; break;
                        case '|': *z |= x; break;
                        case '^': *z ^= x; break;
                        }
                }
        }
        else {
                do_err("Invalid Destination for Set Command");
                goto founderr;
        }
        break;
case 'R':
        rstrt_mac();
        break;
```

```
                        case 'Q':
                                return(EOF);
                        }
                        goto chkagain;
                }
                if (dbgflag & 2)  do_trace();
                if (dbgflag & 1)  do_step();
                return(c);

chkagain:
                if (dbgflag & 2)  do_trace();
                if (dbgflag & 1)  do_step();
                dbgndx = 0;                     /* reset trace string index */
                goto gchloop;
        founderr:
                if (errxx == 'C')
                        goto gchloop;
                else
                        return(EOF);
        } do_msg(d)
int     d;
{
        int     e;
        char    tchain[82];
        e = d - '0';
        mac_glin(tchain);                       /* get line from macro */
        substitu(tchain,80);                    /* perform variable substitution */
        suspend();
        if (d=='B') putbanner(tchain,q.hattr,0);
        else if (d=='D') put_con(tchain,2);
        else if (d == 'S') put_s2(tchain);
        else zap_menu(e,tchain);
        resume();
        if (logflag == 1) log_line(tchain);
        return(0);
}
readmac()
{
        int     c;
        c = fgetc(lrnfile);
        svmc(c);
        return(c);
}
svmc(c)
char    c;
{
        if (dbgflag & 3 && dbgndx < DBGMAX) {
                if (c=='@' || c=='*' || c=='?' || c=='!') {
                        if (svmcflg == 0 && dbgndx > 1) {
                                dbgndx = 0;
                                svmcflg = 1;
                        }
                        else
                                svmcflg = 0;
                }
                dbgstr[dbgndx++] = c;
                dbgstr[dbgndx] = 0;
                put_trace();
                if (c == '\\')
                        svmcflg = 1;
                else
                        svmcflg = 0;
        }
        return(1);
}
fltrctl()
{
        int     c,d;
```

```c
        if (lrnfile == NULL)
                return(EOF);
        d = 0;
        do {
                c = fgetc(lrnfile);              /* read character */
                if (d == '"') break;
                d = c;
        } while (c==' '||c==','||c=='"'||c=='\r'||c=='\n'||c=='\t');
                                                 /* filter out */
        svmc(c);
        return(c);
}
mac_lstr(d)
char    *d;
{
        int     c;
        c = fltrctl();
        do {
                if (c =='\r' || c =='\n' || c =='\t' || c =='"')
                        break;
                else {
                        *d++ = c;
                        *d = 0;
                }
                if ((c = readmac()) == EOF)
                        return(EOF);
        } while (1);
        return(0);
}
mac_gstr(d)
char    *d;
{
        int     c;
        c = fltrctl();
        do {
                if (c =='\r' || c =='\n'||c=='\t'||c ==' '||c ==','||c=='"')
                        break;
                else
                        *d++ = c;
                if ((c = readmac()) == EOF)
                        return(EOF);
        } while (1);
        *d = 0;
        return(0);
} mac_glin(d)
char    *d;
{
        int     c,n;

n = 0;
        do {
                if ( (c = readmac()) == EOF)
                        return(EOF);
                if (c == '\r')
                        break;
                else
                if (c == '\n')
                        break;
                else {
                        if (++n < 77)
                                *d++ = c;
                }
        } while (1);
        *d = 0;
}
void tagref(x,mode)
int     x;
```

```c
    int     mode;       /* 0 = integer, 1 = character */
{
        int     i;
        char    *fmt;
        char    temp[24];
        if (dbgflag & 3 && dbgflag & 0x08 && dbgndx < DBGMAX) {
                if (mode == 1)
                        fmt = "(%c)";
                else
                if (mode == 0) {
                        if (dbgflag & 0x10)
                                fmt = "(%x)";
                        else
                                fmt = "(%d)";
                }
                sprintf(temp,fmt,x);
                i = 0;
                while (temp[i] != 0) {
                        dbgstr[dbgndx++] = temp[i++];
                        dbgstr[dbgndx] = 0;
                        if (dbgndx >= DBGMAX) break;
                }
                put_trace();
        }
}
void do_trace()
{
        delay(cdval/100);
}
do_step()
{
        int     rx,cx;
        int     c;
        pcvgcp(&rx,&cx);
        suspend();      /* temporarily suspend inhibition */
        put_s2("Press Space to Continue, <Alt M> for Macro Execution Monitor");
        resume();
        put_trace();
        c = hard_pause();
        suspend();
        put_s2(" ");
        resume();
        pcvscp(rx,cx);
        return(c);
}
do_err(str)     /* Error Display for Macro Control Language Processor */
char    *str;
{
        int     rx,cx;
        pcvgcp(&rx,&cx);
        if(dbgflag & 3 == 0) {
                *dbgstr = 0;
        }
        put_trace();
        put_s2("ERROR: ");
        put_con(str,1);
        put_con(" C)ontinue or Q)uit? ",1);
        errxx = toupper(hard_pause());
        put_s2(" ");
        pcvscp(rx,cx);
        return(errxx);
}
void chkbrkp(str)
char    *str;
{
        strcpy(dbglabel,str);
        tuc_str(dbglabel);
        if (dbgflag & 4) {
                if (cmp_str(dbglabel,bkpnt,7)) {
                        dbgflag = 1;            /* set single step mode */
                }
        }
}
```

```c
int     *locate(ndx,c)              /* returns address of specified parameter */
int     ndx;
char    c;
{
        int     *t;

if (ndx >= 0 && ndx < VMAX)
        switch(c) {
        case 'K':
                t = &vark[ndx];
                tagref(*t,1);
                break;
        case 'T':
                _strtime(stctime);
                t = (int *)stctime;
                break;
        case 'D':
                _strdate(stcdate);
                t = (int *)stcdate;
                break;
        case 'S':
                if (ndx == 99)   /* Fault diagnosis */
                        t = (int *)glbdiag;
                else
                        t = (int *)&vars[ndx][0];
                break;
        case 'F':
                t = &failures;
                goto tagup;
        case 'P':               /*automatic program numeric variables */
                switch(ndx){
                case 0: t = &failures; break;
                case 1: t = &firsthigh; break;   /* scan results */
                case 2: t = &trancount; break;   /* transitions */
                case 3: t = &lastlevel; break;
                case 4: t = &scanpod; break;
                case 5: t = &scanchan: break;
                case 6: t = &startscan; break;
                case 7: t = &stopscan; break;
                case 8: t = &voffset; break;
                case 9: t = &dspoff; break;
                case 10:t = &firstlow; break;
                case 11:t = &curframe; break;
                case 12:t = &totframe; break;
                case 13:t = &ecrow; break;
                case 14:t = &eccol; break;
                case 15:t = &numchnls; break;
                case 16:t = &dsmax; break;
                case 17:t = &expansion; break;
                case 18:t = &xecrsp; break;
                case 19:t = &dsmin; break;
                case 20:t = &glbfom; break;
                case 21:t = &glbdnum; break;
                case 22:t = &anecol; break;
                case 23:t = &anerow; break;
                case 24:t = &anezero; break;
                case 25:t = &anrmax; break;
                case 26:t = &q.hsw; break;
                case 27:t = &q.compress; break;
                case 28:t = &rowlen; break;
                case 29:t = ¯omenu; break;
                case 30:t = &clim; break;
                case 39:
                        t = &rmpi;
                        break;
                default:
                        t = NULL;
                        return(t);
                }
                goto tagup;
        case 'X':
                t = &varx[ndx];
                goto tagup;
```

```
                case 'Y':
                        t = &vary[ndx];
                        goto tagup;
                case 'Z':
                        t = &varz[ndx];
tagup:
                        tagref(*t,0);
                        break;
                default:
                        t = NULL;
                        break;
                }
        else
                t = NULL;
        return(t);
}
cnv_str(src,dst,flg)
char    *src;
int     *dst;
int     flg;            /* 0 - decimal, 1 - hex */
{
        int     *temp;
        char    *t2;
        int     c,x,y;
        t2 = src;
        y = 0;
        while (*t2 != 0){                       /* scan for variable spec. */
                c = toupper(*t2);
                if (c == 'H') {                 /* terminate hex constant */
                        y = 1;
                        *t2 = 0;
                        break;
                }
                else
                if (c=='P'||c=='X'||c=='Y'||c=='Z'||c=='K')
                        y = 2;
                t2++;
        }
        if (y == 2) {
                t2 = src;
                c = *t2++;
                temp = pars_arg(&x,&c,&t2);
                if ( temp != NULL) {
                        *dst = *temp;           /* fetch value */
                }
                else {
                        do_err("String Conversion Error");
                        return(-1);
                }
        }
        else {
                if (flg == 1 || y == 1)
                        stch_i(src,dst);        /* Hex constant */
                else
                        *dst = atoi(src);       /* decimal constant */
        }
        return(0);
}
substitu(str,len)
char    *str;
int     len;
{
        char    *fmt;
        char    *save,*t,ts[88];
        int     *p;
        char    ts2[65],*t2;
        int     c,y,x = 0;
        save = str;
        t = ts;
        t2 = ts2;
        *t2 = 0;
        while (*str != 0 || *t2 != 0) {
                if (*t2 != 0)
                        *t++ = *t2++;
```

```
                        else {
                                if (*str == '\\')        /* text escape character */
                                        str++;
                                *t++ = *str++;
                        }
                        if (++x > 78) {
                                break;
                        }
                }
                *t = 0;
                cpy_str(save,ts);
}
void sub_parm(dst,fmt,p,c)
char    dst[];
char    *fmt;
int     *p;
int     c;
{
        switch (c) {
                case 'D':
                case 'T':
                case 'S':
                        cpy_str(dst,(char *)p);
                        break;
                case 'P':
                case 'X':
                case 'Y':
                case 'Z':
                        sprintf(dst,fmt,*p);
                        break;
                case 'K':
                        dst[0] = *(char *)p;
                        if (dst[0] == 0) {
                                dst[1] = (char) (*p >> 8);
                                dst[2] = 0;
                        }
                        else
                                dst[1] = 0;
                        break;
                default:
                        dst[0] = c;
                        dst[1] = 0;
                        break;
        }
}
fndlbl(s)                               /* find a label in the file */
char    *s;
{
        long    curpos;
        char    temp[24];
        int     z,c;
        tuc_str(s);                             /* translate to upper case */
        if (search(s,&curpos) == 1) {
                fseek(lrnfile,curpos,SEEK_SET);  /* address into file */
                return(1);
        }
        curpos = ftell(lrnfile);
        fseek(lrnfile,0L,SEEK_SET);             /* goto beginning of the file */
        do {
                c = fgetc(lrnfile);
                        if (c == ':') {          /* found a label */
                                z = dbgndx;
                                c = mac_gstr(temp);
                                tuc_str(temp);
                                if (cmp_str(temp,s,7)) {
                                        curpos = ftell(lrnfile);
                                        place(s,curpos);
                                        return(1);
                                }
                                dbgndx = z;
                        }
```

```c
        } while (c != EOF);
        fseek(lrnfile,curpos,SEEK_SET);
        return(0);              /* label not found */
}
cmp_str(t,l,len)                /* allows wild card in second string */
char    *t,*l;
int     len;
{
        int     x;
        x = 0;
        while ( *t == *l || *l == '?'|| *l == '*') {    /* test label id */
                x++;
                if (*l == 0 || x >= len || *l == '*')
                        return(1);
                t++;
                l++;
        }
        return(0);
}
void tuc_str(str)
char    *str;
{
        char    c;
        while (*str != 0) {
                c = *str;
                *str++ = toupper(c);
        }
}
push_pc()
{
        long    pos;

if (rmpi < RSMAX - 1) {
                pos = ftell(lrnfile);
                rmark[++rmpi] = pos;
                return(1);
        }
        else
                return(-1);
}
pop_pc()
{
        long    pos;

if (rmpi > -1) {
                pos = rmark[rmpi--];
                fseek(lrnfile,pos,SEEK_SET);
                return(1);
        }
         else
                return(-1);
}
static  pchflag = -1;

pch_mac(c)                      /* put char to macro file */
int     c;
{ int     e,d;
        e = 0;
        if (pchflag == 0) {
                e = '@';
                pchflag = -1;                   /* reset flag */
                switch (c) {
                case ALT_A: d = 'a'; break;
                case ALT_C: d = 'c'; break;
                case ALT_D: d = 'd'; break;
                case ALT_E: d = 'e'; break;
                case ALT_F: d = 'f'; break;
                case ALT_G: d = 'g'; break;
                case ALT_H: d = 'h'; break;
                case F10:
                case ALT_I: d = 'i'; break;
                case ALT_J: d = 'j'; break;
```

```
                case ALT_K: d = 'k'; break;
                case ALT_L: d = 'l'; break;
                case ALT_O: d = 'o'; break;
                case ALT_P: d = 'p'; break;
                case ALT_Q: d = 'q'; break;
                case ALT_R: d = 'r'; break;
                case ALT_S: d = 's'; break;
                case ALT_T: d = 't'; break;
                case ALT_U: d = 'u'; break;
                case ALT_V: d = 'v'; break;
                case ALT_W: d = 'w'; break;
                case ALT_X: d = 'x'; break;
                case U_ARW: d = '8'; break;
                case D_ARW: d = '2'; break;
                case R_ARW: d = '6'; break;
                case L_ARW: d = '4'; break;
                case HOME:  d = '7'; break;
                case EN_D:  d = '1'; break;
                case INS:   d = '0'; break;
                case DEL:   d = '.'; break;
                case PG_U:  d = '9'; break;
                case PG_D:  d = '3'; break;
                case C_HOME: d = '&'; break;
                case C_END:  d = '!'; break;
                case C_PGUP: d = '('; break;
                case C_PGDN: d = '#'; break;
                default:     d = c;  break;
                }
        }
        else {
                e = '\\';
                switch(c) {
                case '\r':          /* carriage return */
                        d = 'r';
                        break;
                        case ESC:              /* Escape key */
                                d = 'e';
                                break;
                        case BS:
                                d = 'b';
                                break;
                        case ' ':
                                d = 's';
                                break;
                        case '\\':
                        case '#':
                        case '*':
                        case ':':
                                d = c;
                                break;
                        case 0:
                                pchflag = 0;
                                return(0);
                        default:
                                e = 0;
                                d = c;
                                break;
                        }
                }
                if (e != 0){                /* text escape character */
                        fputc(e,lrnfile); /* Write char */
                        ccount++;
                }
                fputc(d,lrnfile);          /* Write character to file */
                if (++ccount > 70) {
                        fputc('\r',lrnfile);
                        fputc('\n',lrnfile);
                        ccount = 0;
                }
        }
}
void put_trace()
{
```

```
        char    temp[128];
        sprintf(temp,"%s:%s",dbglabel,dbgstr);
        suspend();
        zap_stat(temp);
        resume();
}
hard_pause()
{
        int     c;
        int     flg;
        flg = 0;
        if (istate == 1 || istate == 2) {
                suspend();              /* suspend innipition */
                istate += 2; /* sisable */
                flg = 1;
        }
        if ( (c = c_get()) == 0)
                c = c_get() * 256;
        if (flg == 1) {
                istate -= 2;
                resume();
        }
        return(c);

}
hard_string(str,max)
char    *str;
int     max;
{
        int     c;
        suspend();              /* suspend inhibition */
        if (istate == 1 || istate == 2) {
                istate += 2; /* sisable */
                c = get_con(str,0,max);
                istate -= 2;
        }
        else
                c = get_con(str,0,max);
        resume();               /* resume inhibition if set previously */
        return(c);
} define CHQSIZE 64 char    chqueue[CHQSIZE];
int     chqstart,chqnext;

void chq_init()         /* initialize type ahead buffer and escape monitoring */
{
        chqstart = 0;
        chqnext = 0;
        escflag = 0;
        ctlxflag = 0;
}
void chq_stash(c)
char    c;
{
        int     count;
        count = (CHQSIZE + chqnext - chqstart) % CHQSIZE;
        if ( count < CHQSIZE -1 ) {
                chqueue[chqnext] = c;
                if (count < CHQSIZE - 2)
                        chqnext = (chqnext + 1) % CHQSIZE;
        }
}
chq_ready()
{
        if (chqstart != chqnext)
                return(1);
        else
                return(0);
```

```c
}
chq_score()
{
        int     c;
        char    tstr[64];
        if (chqstart != chqnext) {
                c = 0x00ff & chqueue[chqstart++];
                chqstart %= CHQSIZE;
        }
        else
                c = getch();
        if (debugflg==1) {
                sprintf(tstr,"chq_score(): Returning(%d)",c);
                put_s2(tstr);
                delay(2);
        }
        return(c);

}
int     *pars_arg(ndx,c,str)            /* parses input file for variable refere
int     *ndx;                   /* ndx of variable is set here */
int     *c;                     /* called with lead character, returns with Var */
char    **str;                  /* input source if not null */
{
        int     *p;
        int     d;
        if (*c == '(') {                    /* test for idirect reference */
                if (str == NULL)
                        *c = toupper(fltrctl());
                else {
                        d = *(*str)++;
                        *c = toupper(d);
                }
                p = pars_ndx(ndx,c,str);
                if (p == NULL) return(NULL);
                *ndx = *p;
                do {
                        if (str == NULL)
                                *c = toupper(fltrctl());
                        else {
                                d = *(*str)++;
                                *c = toupper(d);
                        }
                } while (*c == ']');
                p = locate(*ndx,*c);
        }
        else {                                  /* direct reference */
                p = pars_ndx(ndx,c,str);        /* return pointer */
        }
        return(p);

}
int     *pars_ndx(ndx,c,str)            /* parses input file for direct referenc
int     *ndx;                   /* set to index of varaible */
int     *c;                     /* called with lead, returns with var */
char    **str;
{
        int     x,d,*p;
        *ndx = 0;
        x = 0;
        while (*c >='0' && *c <= '9') {
                x++;
                *ndx *= 10;
                *ndx += *c - '0';
                if (str == NULL)
                        *c = toupper(fltrctl());
                else {
                        d = *(*str)++;
                        *c = toupper(d);
                }
        }
        if (x>0) {
                p = locate(*ndx,*c);
        }
```

```c
        else
                p = (int *)NULL;
        return(p);
}
define LCMAX    32 typedef struct lbcrec {
        char    lnm[8];
        long    lad;
} LCR;

LCR     lblch[LCMAX];           /* declare the label cache storage */
int     lclast = -1;
int     lcnext = 0;

search(str,fpos)
char    *str;
long    *fpos;
{
        int i;
        for (i=0; i<= lclast; i++) {
                if (cmp_str(lblch[i].lnm,str,7) == 1) {
                        *fpos = lblch[i].lad;
                        return(1);
                }
        }
        return(0);
}
void place(str,fpos)
char    *str;
long    fpos;
{
        if (lclast < LCMAX - 1) {
                lclast++;
        }
        if (lcnext >= LCMAX)
                lcnext = 0;

cpy_str(lblch[lcnext].lnm,str);
        lblch[lcnext].lad = fpos;
        lcnext++;
}
void zcache()           /* clear out label cache indexes */
{
        lclast = -1;
        lcnext = 0;
}
/* COMMON SOURCE MODULE FOR MFI CONTROL PROGRAM 2 and 48 */
/*   COPYRIGHT(C)1986,1987,1988.  ARRAY ANALYSIS, INC.   */
/* DATA.C: version.h selects MFI-1000 or MFI-AG48 conditional source */ include         "constant.h"
include         "structrs.h"
#include         "setup.h"

/*      Buffered Files  */
int     debugflg = 0;
FILE    *hlp_file = NULL;
FILE    *lrnfile = NULL;
FILE    *log_file = NULL;

/*      Raw Files       */ int     hndxfile;               /* Help index file */
int     maskfile;
int     dtafile;

/*      Major Buffers   */
/*      Four buffers used in the analysis and copy functions */ char    *hdb;           /* Points to Header buffer */
char    *spb;           /* Points to Setup buffer */
char    *newbuf;        /* holds the error pattern */
char    *maskbuf;       /* Holds reference data */
```

```
char    *tolbuf;            /* Holds accumulated tolerances */
int     *drawbuf;

char    *databuf;
int     blocksize = 0;
char    analmap[NUMAC] = {0,0,0,0,0,0,0,0,0,0,0,0};

int     dsmin1,dsmax1,tmp_pilstart,file_pilstart,pilstart;

int     *window;            /* Screen Display Buffer */
char    *dname;

/*      Baud Rate Labels    */ char    *plist[] = {
        {" 110"},{" 150"},{" 300"},{" 600"},{"1200"},
        {"2400"},{"4800"},{"9600"},
        {0}
};

/*      Variables       */ char    *topic;         /* Help Topic */
char    tmpstr[128];
char    hlp_line[133];

int     istate = 0;
int     hlock = 0;
int     opmode;
int     ptmode;
int     status,curframe,totframe;
int     curset,totset;
char    *tmpsave;           /* address of current display buffer */
int     setsize = SETSIZ;   /* Size of the setup area */
char    *ssv_buf;
int     editmode = 0;
int     ecrow,eccol;
int     dsmin,dsmax;        /* display sample number min and max plug 0 */
int     somin,somax;
int     aoff,attr,ascale,offset,amax,hxpos,zline;
int     latfac;
unsigned lastway = 77*256;  /* Used in editing waveforms, last vert dir */
char    tmask[16];

/* Labels for Feedback on Hexpad Simulation */
char    *hextag[] = {
        {"Up Arrow"},{"Left Arrow"}, {"Help"},{"Enter"},
        {"Down Arrow"}, {"Right Arrow"},{"Trigger"},{"Decremnt / F"},
        {"Back / B"}, {"Menu / C"},{"Display / D"},{"Increment / E"},
        {"7"},{"8"},{"9"},{"Arm / A"},
        {"3"},{"4"},{"5"},{"6"},
        {"X"},{"0"},{"1"},{"2"}
};
int     dspmode = 0;        /* keeps track of hex or wave display */
int     dspclean = 0;
int     lrepeat = 0;        /* controls learn loop */
int     mpw = 4;            /* anal.c: minimum pulse width */
int     pksize = 1024;      /* size of packet binary data bytes */

/*      Display Control Variables       */ int     token[2] = { 0x065f, 0x06c4 };
int     cell;
int     level = 0;
int     resolution = 1;     /* Number of samples per bit */
int     expansion = 1;      /* Number of bits per sample for current chan.*/
int     gexp;               /* general expansion factor */
int     numchnls = 32;      /* Number of valid channels */
int     chnsize = 128;      /* Number of bytes per channel */
int     voffset = 0;        /* offset for beginning channel */
int     nc0,nc1,exp0,exp1;  /* Controls synchronization of dspl */
int     csz0,csz1,mxs;      /* channel sizes in samples */
int     np0,ncp0,np1,ncp1;  /* number pods, humber channels per pod */
int     clim = 16;          /* limit to number of channels on screen */
```

```
int     rowoff = 7;             /* first row to use for display */
int     linesize = 80;          /* total length of line */
int     coloff = 9;             /* chars used by the channel label */
int     rowlen = 80-16;         /* actual size of display area on line */
int     bufstate = 0;           /* set by set buf routine */
int     tstlock = 0;            /* prevent the nested execution of test */
int     nhchn = 0;              /* Next_high static channel variable */
int     cpdn,cchn;              /* current pod number and channel number */
int     rchn,cndx;              /* raw channel number. chan index */
char    *highsrc = NULL;        /* source for highlight funciton */
int     highstate = 0;
int     rptcycle = 0;           /* number of cycles through a command file */ unsigned fmark;                 /* address of first high */
unsigned scan_buf();            /* function defintion */ int     hidemrk = 0;            /* hide mark flag */
int     mrkflg = 0;             /* segment copy variables */
int     smkx = -1, emkx = -1, dmkx,
        smky = -1, emky, dmky;
char    *mrksrc;

/*      Variables for Hex Editting */ int     hexgrp = 0;             /* 0, 1, 2, 3 - 4 columns of data */
int     hexpos = 0;             /* Left to Right Virtual Index */
int     hexmax = 8;             /* Number of Digits for full sample */ long    gstep,gvalue;
int     gcount; /* counter generation variables */
int     gstart,glen;

int     verdict = 1;            /* record of last judgemnet */
int     differences = 0;
int     maxpass=1,maxfail=1,curpass,curfail;
char    *opts;
int     rptc;
int     statflg = 's';          /* last type of status displayed */
int     exflag = 0;             /* examine failure flag */
int     insmode = 0;    /* insert mode for comment editing */
int     inhbflg = 0;            /* menu display inhibition flag */
int     wkchar;                 /* last response from hard_pause */ char    *scantmp;               /* Buffer pointer for Scanning functions */
int     scanst = -1;            /* Buffer code for selected Scanning buffer */ unsigned int    failures = 0;           /* failures on last test */
int     firsthigh = -1;         /* first high position found */
int     firstlow = -1;          /* first low position found by channel scan */
int     trancount = 0;          /* number of transitions detected */
int     lastlevel = 0;          /* level of the previous bit */
int     startscan = 0;          /* start of scan */
int     stopscan = 1023;        /* end of scan */
int     scanpod = 0;            /* pod being scanned */
int     scanchan = 0;           /* channel being scanned */
int     xecrsp = 0;             /* xecute Dos command response */
int     vedge,hedge;
int     bandflag = 0;           /* controls analog reference banding */
int     microflg = 0;           /* controls special text feautres */
unsigned        ioswitc,bioerr;

unsigned int    dbmax = 1080 * 2 * 2;
unsigned char *dstart;
unsigned bitpos,holding;
int     pxpcol = 8;
int     pxprow = 8;
int     hpxo,                   /* Horizontal Pixel Offset */
        vpxo,                   /* Vertical Pixel Offset */
        vsh = 4;                /* Vertical Sample Width */
int     analcnt = 0;            /* Number of Analog Channels Present */
int     alim;                   /* number of rows */
int     tpxrow = 8, tpxcol = 7; /* stats for micro print font */
int     glbfom = -1;            /* global figure of merit */
int     glbdnum = -1;           /* global diagnosis number */
```

```
char    *glbdiag[65];           /* global diagnosis */
int     anecol=-1,anerow=-1,ancmax=-1,ancmin=-1,ancoff = -1, anroff = -1;
        anrmax=-1,anrmin=-1,ancinc=-1,anrinc=-1,aneon=-1,anezero=-1;
int     sprflag;
int     banksize;
int     dsp_regen;
int     rgn_dgtl;
STA     q;
int     hardcopy = 0;
int     log_menu = 0;
int     bankskew = 0;
int     clines,alines;          /* number of standard text lines for digital and
int     brieftestactive = 0;    /* suspends display if equal to 1 */
int     aoffcnt;
int     mdsp_toggle = 0;        /* 0=Off, 1=regenerate menu & title display */
int     mecurtog = 0;

/* COMMON SOURCE MODULE FOR MFI CONTROL PROGRAM 2 and 48 */
/*   COPYRIGHT(C)1988. ARRAY ANALYSIS, INC.   */
/* DUMYDIAG.C: version.h determines conditional source for MCP2 or MCP-AG48 */ include     "constant.h"
extern char  vlmcp[],datline[];
char    *cpyrghtf[] ={
        {"  MFI-1000  CONTROL PROGRAM 48              ARRAY   ANALYSIS, INC"},
        datline,
        {"  Copyright (c)1987,1988,1989              Ithaca, NY 14850"},
        vlmcp,
        0 };
diagnose(tflg)
int     tflg;
{
        tflg == tflg;
        put_s2("The Array Analysis Fault Diagnosis Module is NOT Here!");
        return(0);
}
/* COMMON SOURCE MODULE FOR MFI CONTROL PROGRAM 2 and 48 */
/*   COPYRIGHT(C)1986,1987,1988. ARRAY ANALYSIS, INC.   */
/* OTHER.C */
/* 7/14/88 Updated for Microsoft compiler */
/* 8/2/88 add Testing display control */ include     "constant.h"
include     "global.h"
#include     "process.h"        /* microsoft */
#include     "direct.h"

void    dir_chng();
char    *save_screen();
int     ptyptab[4] = {0,1,2,3};
char    *ptytag[4] ={ {"Epson FX"},{"IBM/Epson LX/MX"},
                      {"Okidata"},{"LaserJet"}
};
#define MAX_MDSAVE     8
int     mds_sequence = 0;
unsigned        mds_port[MAX_MDSAVE] = {0,0,0,0,0,0,0,0};
typedef struct mds {
        unsigned        sequence;
        int     start;
        int     width;
        int     compr;
        LTAG    labs[96];
} MDS;
MDS     mdsa[MAX_MDSAVE];       /* mfi display save area */ push_mds(index,port)            /* push labels and stat into storage */
unsigned        index,port;
{
        int     i,j;
        mds_port[index] = port; /* set port label */
        mdsa[index].sequence = mds_sequence++;
        mdsa[index].start = HO_STOFDSP;
        mdsa[index].width = q.hsw;
        mdsa[index].compr = q.compress;
```

```c
            for (i=0; i<96; i++)
                for(j=0;j<sizeof(LTAG); j++)
                    mdsa[index].labs[i].x[j] = HO_LABELS[i].x[j];
}
pop_mds(index,port)                 /* push labels and stat into storage */
unsigned        index,port;
{
        int i,j;
        if (mds_port[index] == port) {
                HO_STOFDSP = mdsa[index].start;
                q.hsw = mdsa[index].width;
                q.compress = mdsa[index].compr;
                for (i=0; i<96; i++)
                    for(j=0;j<sizeof(LTAG);j++)
                        HO_LABELS[i].x[j] = mdsa[index].labs[i].x[j];
                dsp_regen = 1;
        }
}
save_mds() {
        int     i,j;
        unsigned int    x,y,z;
/*      Calculate port code from program variables */
                                put_s2("THIS FRAME LOCKED AGAINST MODIFICATION")
                                break;
                        }
                        copy_buf();     /* These subs. in transfer.c */
                        display(tmpsave);
                        break;
                case 'D':       /* DOD functions */
                        topic = "CHANGE";
                        put2(cd_form);
                        dir_chng();
                        break;
                case 'E':
epfloop:
                        topic = "EPROM";
                        put_stat();
                        put2(epc_form);
                        put3("D)ownload To the MFI, U)pload From, or ESC)ape? ")
                        c = get_one();
                        if (c == ESC) break;
                        if (c > 255) goto fmrpt;
                        if (c != 'U' && c != 'D') goto epfloop;
                        if (c == 'U') put2(epu_form);
                        else put2(epd_form);
                        sprintf(tmpstr, "Please Enter the IMAGE %s File Name: ",
                                c =='U'?"Destination":"Source");
                        prmpt3(tmpstr);
                        if ( (d = get_con(tmpstr,0,72)) == ESC) goto epfloop;
                        if (c == 'U') {
                                e = rcv_epr(tmpstr,0,0);
                        }
                        else
                        if (c == 'D') {
                                prmpt3("Please Enter the Size in Kilobytes: ");
                                d = get_int(&x);
                                if (d == ESC) goto epfloop;
                                e = snd_epr(tmpstr,x*1024,0);
                        }
                        else goto epfloop;
                        if (e == 0)
                                put_con(" Complete ",1);
                        else
                        if (e == -2)
                                put_con(" Operation Aborted,1");
                        goto epfloop;
                case 'M':
                        topic = "PKMODE";
                        put3("Select H)ex, B)inary, Q)uick On or O)ff, ESC)ape:"
        sprintf(tmpstr, "QUICK MODE: %s,    ASYNC TRANSFER MODE: %s",
                                q.quickmode==1?"On ":"Off",q.pkmode=='b'?"Binary
                        put2(tmd_form);
                        zap_stat(tmpstr);
```

```
                c = get_one();
                if (c == 'B') q.pkmode = 'b';
                else if (c == 'H') q.pkmode = 'h';
                else if (c == 'Q') q.quickmode = 1;
                else if (c == 'O') q.quickmode = 0;
                break;
        case 'O':
                topic = "OUTPUT";
                put2(pot_form);
                prmpt3("Enter the Output Byte: ");
                if (get_hex(&x) != -1) {
                        out_mux (q.llport,x);
                }
                sprintf(tmpstr,"(%x) Sent to Parallel Port",x);
                put_s2(tmpstr);
                break;
        case 'L':
                topic = "LIST";
                dir_disp();
                break;
        case 'P':
        lp2 = 1;
        while (lp2 == 1) {
                topic = "PRNSEL";
                put2s(1,
"       PRINTING OPTIONS AND PARALLEL PORT SELECTION");
                if (q.prtype == 0) {
                        if (q.prdir == 1) d = 1;
                        else d = 0;
                }
                else if (q.prtype == 1) {
                        if (q.prdir == 1) d = 1;
                        else d = 0;
                }
                else if (q.prtype == 2) d = 0;
                else if (q.prtype == 3) {
                        if (q.prdir == 1) d = 3;
                        else d = 4;
                }
                sprintf(tmpstr," Printer Type: %s",ptytag[q.prtype]);
                put2s(2,tmpstr);
                sprintf(tmpstr,
"     Direction: %s      Size: %d, Max. Size: %d   ",
                q.prdir==0?"Vertical":"Horizontal",q.prsize,d);
                put2s(3,tmpstr);
                sprintf(tmpstr,"   Output  To: %s",
                        q.sprdest==0?"Printer.":q.sprfname);
                put2s(4,tmpstr);
                sprintf(tmpstr," PORT FOR MUX: %s Adapter",
                                q.llport==0x378?"Printer":"Monochrome");
                put2s(5,tmpstr);
put3("D)irection, O)utput Device, P)ort for MUX, S)ize, or T)ype?");
                c = get_one();
                switch(c) {
                case 'T':
                        topic = "PRNTYP";
put3c("TYPE: 0)Epson FX, 1)IBM/Epson LX/MX, 2)Okidata, or  3)LaserJet? "
                        c = get_one();
                        c -= 0x30;
                        if (c >= 0 && c <= 3) q.prtype = c;
                        break;
                case 'D':
                        topic = "PRNDIR";
                        put3c("DIRECTION: V)ertical or H)orizontal? ");
                        c = get_one();
                        if (c=='V') q.prdir = 0;
                        else if (c=='H') q.prdir = 1;
                        break;
                case 'S':
```

```c
                        topic = "PRNSIZ";
                        sprintf(tmpstr,"SIZE: 0) to %d)  ? ",d);
                        put3c(tmpstr);
                        c = get_one();
                        c -= 0x30;
                        if (c >= 0 && c <= d) q.prsize = c;
                        break;
                case 'O':
                        topic = "PROUTD";
                        put3c("Send Screen Dump to P)rinter or F)ile? ")
                        c = get_one();
                        if (c=='P') set_psdu();
                        else if (c == 'F') set_fsdu();
                        break;
                case 'P':
                        topic = "PPRSEL";
        c = posit("MUX PORT: P)rinter Adapter, M)onochrome or L) MFI Por
                        if (c == 'P')
                                q.llport = 0x378;       /* Printer Adapt
                        else if (c == 'M')
                                q.llport = 0x3bc;       /* Monochrome Ad
                        else if (c == 'L')
                                q.llport = 0xfff;               /* MFI P
                        break;
                default:
                        lp2 = 0;
                        men_regen();
                        break;
                }
        }
        break;
        case 'S':                       /* System Strings */
                topic = "SYSSTR";
    prmpt3("Edit the H)elp Prefix, L)og Name, or M)acro Prefix? ");
                c = get_one();
                if (c == 'H') {
                        topic = "HLPSTR";
                        cpy_str(temp,q.hlp_prfx);
                        prmpt3("Edit Help Prefix: ");
                        put_con(temp,0);
                        if ( CR == get_con(temp,0,64) ) {
                                cpy_str(q.hlp_prfx,temp);
                                put_s2("Help Prefix Changed.");
                        }
                }
                else
                if (c == 'L') {
                        topic = "LOGSTR";
                        cpy_str(temp,q.log_name);
                        prmpt3("Edit Log File Name: ");
                        put_con(temp,0);
                        if ( CR == get_con(temp,0,64) ) {
                                log_close();
                                cpy_str(q.log_name,temp);
    put_s2("Log File Name Changed.  Previous log file closed.");
                        }
                }
                if (c == 'M') {
                        topic = "MACSTR";
                        cpy_str(temp,q.macprefix);
                        prmpt3("Edit Macro Prefix: ");
                        put_con(temp,0);
                        if ( CR == get_con(temp,0,64) ) {
                                cpy_str(q.macprefix,temp);
                                put_s2("Macro Prefix Changed.");
                        }
                }
                break;
        case 'T':
                topic = "TSTDSP";
                do {
                        sprintf( tmpstr,
    "%s testing display in effect.  F)ull, B)rief, or ESC)ape?",
                                q.dispflg1 ? "Full" : "Brief" );
```

```
                                put3(tmpstr);
                                c = get_one();
                                if (c == ESC);
                                else if (c == 'F')  q.dispflg1 = 1;
                                else if (c == 'B')  q.dispflg1 = 0;
                                else continue;
                                break;
                        } while (1);
                        break;
                case 'X':                       /* execute dos command */
                        do_xec();
                        men_regen();
                        dspclean = 0;
                        break;
                default:
                        if (wrap_up(c) != 0)
                                loop = 0;
                        break;
                }
        }
        return(c);
}
do_xec()
{
        char    temp[81];
        topic = "XECUTE";
        cpy_str(temp," ");
        prmpt3("Enter Command: ");
        if (ESC != get_con(temp,0,80)) {
                execute(temp,1);
        }
        dsp_regen = 1;
        return(0);
}
execute(str,flg)                        /* 0 = return immediately, 1= wait for key */
char    *str;
{
        int     targc;
        int     turn;
        char    temp2[81],temp[81];
        char    *targv[16];
        turn = 1;
        esg_init(3);    /* restore text mode */
        strcpy(temp,str);
        cpy_str(temp2,temp);
        targc = chew(targv,temp);       /* load the vector */
        xecrsp = spawnvp(P_WAIT,targv[0],targv);
        if (xecrsp == -1) {
                turn = 2;
                sprintf(temp,"COMMAND /C %s",temp2);
                targc = chew(targv,temp);
                xecrsp = spawnvp(P_WAIT,targv[0],targv);
        }
        if (flg == 1) {
                sprintf(tmpstr,"(%d)Return Value = %d.  Press a Key ...",
                        turn,xecrsp);
                printf(tmpstr);
                get_one();
        }
        esg_init(q.videomd);
        dsp_regen = 1;
}
chew(dstv,src)
char    *dstv[];
char    *src;
{
        int     count;
        count = 0;
        do {
                while (*src == ' ') src++;      /* skip leading spaces */
                dstv[count] = src;              /* first parameter */
                while (*src!=0 && *src != ' ')
                        src++;                  /* skip by this parameter */
                count++;                        /* work on next parameter */
```

```c
                if (*src==' ') {                /* terminate parameter */
                    *src++ = 0;
                }
                else break;
        } while (1);
        dstv[count] = NULL;
        return(count);
}
int     atrlock = 0;
do_attr(){
        unsigned c,d;
        int     x,*sel,sif;
        char    tag[64];
        int     loop = 1;
        if (atrlock != 0) return(0);
        atrlock = 1;
        while (loop) {
                topic = "IVATTR";
                put1("CHANGE DISPLAY COLORS");
                put2(vdas_form);
                put3("Select the Attribute You Wish to Set? ");
                c = get_one();
                topic = "VATTR";
                switch (c) {
                case 'H':
                case 'M':
                        sel = &q.hattr;
                        strcpy(tag,"Menu");
                        goto accomp;
                case 'N':
                case 'D':
                        sel = &q.nattr;
                    strcpy(tag,"Data");
                    goto accomp;
                case 'F':
                    sel = &q.fattr;
                    strcpy(tag,"Fail Banner");
                    goto accomp;
                case 'P':
                    sel = &q.pattr;
                    strcpy(tag,"Pass Banner");
                    goto accomp;
                case 'R':
                    sel = &q.rattr;
                    strcpy(tag,"Reverse");
                    goto accomp;
                case 'B':
                    sel = &q.battr;
                    strcpy(tag,"Background");
                    goto accomp;
                case 'T':
                    sel = &q.tattr;
                    strcpy(tag,"Trigger Cursor");
                    goto accomp;
                case 'C':
                    sel = &q.cattr;
                    strcpy(tag,"Cursor");
                    goto accomp;
                case 'E':
                    sel = &q.eattr;
                    strcpy(tag,"Error");
                    goto accomp;
                case 'G':
                    sel = &q.gattr;
                    strcpy(tag,"Guard Band");
                    goto accomp;
                case 'K':
                    sel = &q.keyattr;
                    strcpy(tag,"Key Echo");
                    goto accomp;
                case ESC:
                    loop = 0;
                    break;
```

```
                case 'A':
                        prmpt3("Select an Analog Bank: ");
                        if (ESC == (c = get_one())) break;
                        if (!chk_hexchar(c)) break;
                        d = cnv_hexchar(c);
                        if (d < 0 || d > np0+np1) break;
                        sel = &q.analatr[d];
                        sprintf(tag,"Analog %x",d);
accomp:
                        colorsel(*sel);
                        sprintf(tmpstr,
        "The %s Color is (%xH).  Enter a New Value in Hex: ",tag,*sel);
                        prmpt3(tmpstr);
                        x = *sel;
                        if (get_hex(&x) != ESC) {
                                *sel = x;
                                sif = inhbflg;
                                if (c == 'B') esg_init(q.videomd);
                                inhbflg = sif;
                                dsp_regen = 1;
                                display(tmpsave);
                                put_stat();
                        }
                        men_regen();
                        break;
                }
        }
        atrlock = 0;
}
ch_baud()
{
        unsigned int c,svb;
        int loop = 1;
        topic = "BAUD";
        put2(baud_form);
        svb = q.baudrate;
        while (loop) {
                sprintf(tmpstr,
        "The Selected Rate is: %s.  To Set it Press the Enter Key: ",
                plist[q.baudrate]);
                put3c(tmpstr);
                c = get_one();
                switch (c) {
                case '+':
                        q.baudrate++;
                        if (q.baudrate > 7) q.baudrate = 0;
                        break;
                case '-':
                        q.baudrate--;
                        if (q.baudrate < 0) q.baudrate = 7;
                        break;
                case '\033':
                        loop = 0;
                        break;
                case '\r':
                        iobaud(q.baudrate,3,0,0);
                        loop = 0;
                        break;
                }
        }
        return('\033');
}
colorsel(cur)
int     cur;
{
        int     row,col,crow,ccol,width,depth,i;
        if (inhbflg != 1) {
                erase_cur();
                clr_screen(1,1,4,78);
                crow = 3; ccol = 2;
                row = pxprow + 2;
                col = pxpcol *2;
                width = pxpcol*7;
                depth = pxprow*2 - 7;
```

```c
                for(i=0; i<16; i++) {
                        grrtulc(col,row,width,depth,i);
                        move_cur(crow,ccol);
                        sprintf(tmpstr,"%1X",i);
                        put_ch(*tmpstr);
                        col += pxpcol*10;
                        ccol += 10;
                        if (col > 600) {
                                ccol = 2;
                                col = pxpcol * 2;
                                row += pxprow * 2;
                                crow += 2;
                        }
                }
        }
}
set_psdu() {                    /* set screen dump to printer */
        if (q.sprdest == 0) return(1);  /* return if already so */ if (sprflag != -1) {
                p_closfl();             /* close the screen dump file */
                sprflag = -1;           /* indicate no file open */
        }
        q.sprdest = 0;                  /* set dest flag for printer */
        return(1);
} set_fsdu()              /* set screen dump to file */
{
        int     c;
        if (q.sprdest == 1) {
                put_s2("Screen Dump File is Already Open!");
                return(0);
        }
        prmpt3("OUTPUT FILE: ");
        put_con(q.sprfname,0);
        c = get_con(q.sprfname,0,64);
        if (c == ESC) return(0);

sprflag = p_openfl(q.sprfname);
        if (sprflag == 0) {
                q.sprdest = 1;
                put_s2("Screen Dump Output File Open");
        }
        else put_s2("Could Not Open the Screen Dump Output File!");
}
void do_port()
{
        unsigned        c;
        topic = "PORTSEL";
        save_mds();     /*save mfi display control and labels */
dploop:
sprintf(tmpstr,"PORT NOW:%s%d. 0)-F) GPIB Ports, X)COM1, Y)COM2, or ESC? ",
                q.gpib==0?"COM":"GPIB",q.gpib==0?q.comport+1:q.gpib);
        put3(tmpstr);
        c = get_one();
        if (c == ESC) return(c);
        sprintf(tmpstr, "PORT SELECT: Attempting to Select Port %c.",c);
        put_s2(tmpstr);
        if (!set_port(c)) {
                goto dploop;
        }
        sprintf(tmpstr, "Port %c Selected.",c);
        put_s2(tmpstr);
        rest_mds();             /* restore mfi display labels and control */
        zap_sbar(8,9);
        return(c);

}
set_port(c)
int     c;
{
        int     d;
        if (c >= '0' && c <= '9')
                q.gpib = c - 0x30;
```

```
                else
                if (c >= 'A' && c <= 'F')
                        q.gpib = c - 0x37;
                else
                if (c == 'X' || c == 'Y') {
                        q.gpib = 0;
                        d = c-'X';
                        if (d != q.comport) {
                                q.comport = d;
                                ioinit(q.comport);
                                iobaud(q.baudrate,3,0,0);
                        }
                }
                else {
                        zap_stat("INVALID COMMUNICATIONS PORT SELECTION!");
                        return(0);
                }
                if (mfi_stat()==ESC) {
                        zap_stat("NO MFI ATTACHED TO SELECTED PORT");
                        msflag = 3;
                        q.mnemflg = 0;
                        return(0);
                }
                else msflag=0;
                q.current_port = c;
                return(1);
}
void dir_chng()
{
        int     x,y,z;
        char    name[65];
        topic = "CHANGE";
        put2(cd_form);
        getcwd(name,65);
        sprintf(tmpstr,"Current Working Directory: (%s)",name);
        put_s2(tmpstr);
        prmpt3("Enter The New Directory: ");
        x = 0;
        if (ESC != get_con(name,0,64)) {
                if (name[1] == ':') {
                        y = toupper(name[0]) + 1 - 'A';
                        _dos_setdrive(y,&z);
                }
                if (name[2]!=0) x = chdir(name);
        }
        else    x = -1;
        put3("    ");
        getcwd(name,65);
        sprintf(tmpstr,"%sCurrent Working Directory: (%s)",x<0?"ERROR: ":"New ")
        put_s2(tmpstr);
        if (q.gpib == 0) x = q.comport + 'X';
        else x = q.gpib;
/*      Search for this port already saved */
        for (i=0;i<MAX_MDSAVE;i++)
                if (mds_port[i] == x) break;
        if (i >= MAX_MDSAVE) {
                /*      Search for empty slot */
                for (i=0;i<MAX_MDSAVE;i++)
                        if (mds_port[i] == 0) break;
                if (i >= MAX_MDSAVE) {
                        /* search for oldest slot */
                        i = 0;
                        y = mdsa[0].sequence;
                        for (j=1;j<MAX_MDSAVE;j++) {
                                z = mdsa[i].sequence;
                                if (z < y) { y = z; i = j; }
                        }
                }
        }
        push_mds(i,x);
}
rest_mds() {
        int     i,j;
        unsigned int    x,y,z;
```

```
/*      Calculate port code from program variables */
        if (q.gpib == 0) x = q.comport + 'X';
        else x = q.gpib;

/*      Search for this port already saved */
        for (i=0;i<MAX_MDSAVE;i++)
                if (mds_port[i] == x) break;
        if (i < MAX_MDSAVE) {
                pop_mds(i,x);
        }
        else {
                if (dtafile == -1) dfltlabs();
        }
}
unsigned fun_men()                 /* Handles the other functions */
{
        int             loop = 1,lp2;
        int             e,x;
        unsigned        c,d;
        char    temp[82];
        dspcheck();
        while (loop == 1) {
                put_stat();
                topic = "OTHER";
                c = prompt(otmtitle,fun_form,"Please Select One");
fmrpt:
                put_s2(" ");
                switch(c) {
                case 'A':
                        do_attr();
                        break;
                case 'B':
                        ch_baud();
                        break;
                case 'C':
                        if (locked()) {

}
copy_buf()
{
        unsigned c,d,e,f,bs,bd;
        char    *src, *dst;
        int     zflag = 0;
        bs = blocksize;
        bd = blocksize;
        topic = "COPY";
        put2(cpb_form);
        c = posit("Select the Source Buffer or Z)eroes:");
        if (c == 'Z') {
                zflag = 1;
                src = NULL;
        }
        else {
                src = det_buf(c);
                if (src == NULL) return(0);
                if (c == 'S') bs = setupsize;
                else {
                        e = posit("Plugin 0), Plugin 1), or B)oth?  ");
                        if (e==ESC) return(0);
                        if (e=='0') bs = pilstart; /* plug 0 size */
                        else if (e=='1') {
                                bs = blocksize - pilstart;      /* plugin 1 size
                                src += pilstart;
                        }
                }
        }
        d = posit("What is the Destination");
        dst = det_buf(d);
        if (dst == NULL) return(0);
        if (d == 'S')
                bd = setupsize;                         /* Setup buffer only 2k */
        else {
                f = posit("Block 0), Block 1), or B)oth?  ");
                if (f == '0') bd = pilstart;
                else if (f == '1') {
```

```c
                bd = blocksize - pilstart;
                dst += pilstart;
            }
        }
        if (bd < bs) bs = bd;
        if (zflag == 1)
                clear_buf(dst,bs,0);
        else
                memcpy(dst,src,bs);
        return(1);
}
#include         "version.h"
/*      Screen forms     */
char    kempromp[] =
"BLIND MFI KEYPAD CONTROL MODE    Select a Key from Above: ";
char    kemtitle[] =
        " MFI CONTROL KEYS   |   CONTROL FUNCTIONS  |    PROGRAM MENUS ";
char    *key_form[] = {
    {" A ARM    H HELP   T TRIG  | P)ort Select       | @C)ontrol @M)acros   "},
    {" B BACK   M MENU   X EXEC  | Q)uit to DOS       | @E)diting @O)ther    "},
    {" D DSP    + INC    0 - F   | R)eset MFI         | @F)iling  @T)esting  "},
    {"{- ENTR   - DEC    {} ^\   | S)how MFI Displays | @H)elp PC @V)iewing  "},
    {0}
};
char    memprompt[] =
"MFI MENUS AND DATA DISPLAYED BELOW    Select a Key from Above: ";
char    memtitle[] =
        " MFI CONTROL KEYS   |   CONTROL FUNCTIONS  |    PROGRAM MENUS ";
char    *kmn_form[] = {
    {" A ARM    H HELP   T TRIG  | D)isplay MFI Data  | @C)ontrol @M)acros   "},
    {" B BACK   M MENU   X EXEC  | P)ort              | @E)diting @O)ther    "},
    {" D DSP    + INC    0 - F   | R)eset MFI   Q)uit | @F)iling  @T)esting  "},
    {"{- ENTR   - DEC    {} ^\   | S)top MFI Displays | @H)elp PC @V)iewing  "},
    {0}
};
char    temprompt[] =
"MFI TIMING DISPLAY SIMULATED BELOW    Select a Key from Above:";
char    temtitle[] =
        " MFI CONTROL   |   TIMING DISPLAY FUNCTIONS         |    PROGRAM MENUS  ";
char    *tdm_form[] = {
    {" A ARM    H HELP  | @A)ttrib.  C)han.List  P)ort  | @C)ontrol @M)acros  "},
    {" B BACK   M MENU  | @P)aram.   M)FI Menus  Q)uit  | @E)diting @O)ther   "},
    {" D DSP    T TRIG  | +/-)Mag.   S)top Dsp   R)eset | @F)iling  @T)esting "},
    {"{- ENTR   {} ^\   | 1-4)Curs   F10)Print   U)pdate| @H)elp PC @V)iewing "},
    {0}
};
char    otmtitle[] =
    "      OTHER FUNCTIONS PROGRAM MENU              |     PROGRAM MENUS";
char    *fun_form[] = { /* Other menu */
{"A)ttributes   E)PROM Comm.   O)utput Byte     | @C)ontrol @M)acros  "},
{"B)aud Rate    L)ist Files    P)rint Options   | @E)diting @O)ther   "},
{"C)opy Buf     M)ode of Xmit  S)ystem Strings  | @F)iling  @T)esting "},
{"D)ir. Change  T)est Display  X)ecute DOS Prog.| @H)elp PC @V)iewing "},
    {0}};
char    fmntitle[] =
    "      FILING FUNCTIONS PROGRAM MENU             |     PROGRAM MENUS ";
char    *file_form[] = {          /* Filing Menu */
{"O)pen    U)pload From  A)rm & Wait            | @C)ontrol @M)acros  "},
{"C)lose   D)ownload To  E)dit Comments         | @E)diting @O)ther   "},
{"R)ead    L)oad Both    N)ew Ref               | @F)iling  @T)esting "},
{"W)rite   S)ave Data    P)ort Select  Z)ecurity| @H)elp PC @V)iewing "},
    {0}
};

#ifdef MCP32
char    vwmtitle[] =
    "      VIEWING FUNCTIONS PROGRAM MENU            |     PROGRAM MENUS ";
char    *disp_form[] = {          /* Viewing Menu */
{"B)and Disp.  J)ump       A)rm/Upload   {} ^\  | @C)ontrol @M)acros  "},
{"C)hannels    M)ode       T)rig/Upload  PgUp   | @E)diting @O)ther   "},
{"E)xamine     R)esolution P)arameters   PgDn   | @F)iling  @T)esting "},
```

```c
    {"H)ighlight    S)elect       @A)ttributes F10)Print | @H)elp PC @V)iewing "},
        {0}
};
endif
ifdef MCP96
char    vwmtitle[] =
    "    VIEWING FUNCTIONS PROGRAM MENU              |    PROGRAM MENUS";
char    *disp_form[] = {        /* Viewing Menu */
{"B)and Disp.   J)ump          A)rm/Upload    {} ^\   | @C)ontrol @M)acros "},
{"C)hn. List    M)ode of Display T)rig/Upload    PgUp | @E)diting @O)ther   "},
{"E)xamine      R)esolution    P)arameters    PgDn    | @F)iling  @T)esting"},
{"H)ighlight    D)efault Labels S)elect       F10)Print | @H)elp PC @V)iewing"},
        {0}
};
endif char    tsmtitle[] =
    "    TESTING  FUNCTIONS PROGRAM  MENU            |    PROGRAM MENUS ";
char    *tst_form[] = {
{"T)est          C)ompare       A)ccept Failures | @C)ontrol @M)acros "},
{"O)ptions       E)xamine       B)and Display    | @E)diting @O)ther   "},
{"L)og Comment   F)ault Diag.   G)uard Data      | @F)iling  @T)esting"},
{"P)ort Select   S)can          R)eset Ref & Tol | @H)elp PC @V)iewing"},
        {0}
};
char    demtitle[] =
    "   DIGITAL EDITING FUNCTIONS PROGRAM MENU       |    PROGRAM MENUS ";
char    *wved_form[] = {
{"A)nalog Edit   G)enerate Count   S)elect Buffer | @C)ontrol @M)acros  "},
{"C)opy Segment  H)ighlight Buf    U)nmark        | @E)diting @O)ther   "},
{"D)uplicate     M)ark Segment     Z) Bit to Zero | @F)iling  @T)esting "},
{"F)ill Segment  #)Refresh Disp.   O) Bit to One  | @H)elp PC @V)iewing "},
        {0}
};
char    aemtitle[] =
    "   ANALOG EDITING FUNCTIONS PROGRAM MENU        |    PROGRAM MENUS ";
char    *aned_form[] = {
{"       G)enerate Analog       ARROWS - Cursor  | @C)ontrol @M)acros  "},
{"       O)perate On Anal.      S)elect Buffer   | @E)diting @O)ther   "},
{"       (-)Edit On/Off         P)arameters      | @F)iling  @T)esting "},
{"       D)igital Editing       #)ReDisplay      | @H)elp PC @V)iewing "},
        {0}
};
char    hemtitle[] =
    "  HEXIDECIMAL  EDITING FUNCTIONS PROGRAM NENU   |   PROGRAM MENUS       ";
char    *hex_form[] = {
{"                                                | @C)ontrol @M)acros  "},
{"J)ump  Sample     0-9, A-F  -  Data Entry       | @E)diting @O)ther   "},
{"S)elect Buffer                                  | @F)iling  @T)esting "},
{"                  ARROWS  -  Move Cursor        | @H)elp PC @V)iewing "},
        {0}
};
char    *baud_form[] = {
        {" CHANGE THE CURRENT RS-232 BAUD RATE "},
        {"  "},
        {"+   Next Higher Rate          {-     Set New Rate"},
        {"-   Next Lower  Rate          <ESC>  No Change   "},
        {0}
};
char    *mxr_form[]={
        {"TESTING OPTIONS SELECTION MENU"},
        {"  A)ux. Program     L)og Test Results    T)imeout while Armed   "},
        {"  D)efault Options  M)ultiplexer Codes   U)ser Prompt on Entry  "},
        {"  P)ass     F)ail   S)et Port on Load    W)rite New Test Options"},
};
char    *popt_form[]={

{"PASS OPTIONS              ACTIONS TAKEN ON PASSING   "},
        {"    C)ount         D)isplay Data      R)epeat Test"},
        {"    L)ink          N)o Action         S)ave Data   "},
        {"  "},
        {0}
```

```c
};
char    *fopt_form[]={
        {"FAILURE OPTIONS         ACTIONS TAKEN ON FAILING      "},
        {"      C)ount       A)ccept Fail.     F)ault Diagnosis"},
        {"      L)ink        D)isplay Data     R)epeat Test    "},
        {"      N)o Action   E)xamine Fail.    S)ave Data      "},
        {0}
};
char    *mac_form[] = {
        {" MACRO  CONTROL  MENU "},
        {" "},
{"E)xecute a Macro File    D)ebugging Functions    S)peed Adjustment   "},
{"P)rogram a Macro File    R)epeat a Macro File    ESC)ape to Continue"},
        {0},
};
char    *mpg_form[] = {
{" MACRO PROGRAM INSTRUCTIONS              MENU   OPTIONS   "},
{"B)ranch    E)xecute    Q)uit                                "},
{"C)all      L)abel      R)eturn     T)erminate Macro   "},
{"D)elay     P)rompt     W)ait       ESC)ape and Continue"},
        {0}
};
char    *mex_form[] = {
        {" MACRO  EXECUTION  MONITOR "},
        {" "},
{"D)ebugging     S)peed Adjustment     T)erminate Execution       ESC)ape"},
        {" "},
        {0}
};
char    *edit_form[] = {
{" FRAME TITLE AND COMMENT EDITING"},
{"STEP 1: Enter the Title and Comments.     "},
{"STEP 2: Use {} ^` to Move the Cursor.     "},
{"STEP 3: Press the ESCape key when finished"},
        {0}
};
char    *sel_form[] = {
        {" SELECT THE BUFFER TO BE DISPLAYED "},
        {" "},
        {"D)ata    Buffer     R)eference Buffer              "},
        {"F)ailure Buffer     T)olerance Buffer     ESC)ape"},
        {0}
};
char    *cpb_form[] = {
        {" COPY DATA FROM ONE BUFFER TO ANOTHER "},
        {" "},
        {"D)ata    Buffer     R)eference Buffer              "},
        {"F)ailure Buffer     T)olerance Buffer     ESC)ape"},
        {0}
};
char    *hl_form[] = {
        {" SELECT A BUFFER AS SOURCE FOR HIGHLIGHTING THE DISPLAY "},
        {" "},
        {"D)ata    Buffer     R)eference Buffer                        "},
        {"F)ailure Buffer     T)olerance Buffer     N)o  Highlight"},
        {0}
};
char    *gen_form[] = {
        {" GENERATE A DIGITAL COUNTING PATTERN "},
        {" STEP 1: Enter the Starting Value to Count From."},
        {" STEP 2: Enter the Step Value. (+ or -)n.        "},
        {" STEP 3: Enter the Number of Counts to Generate."},
        {0}
};
char    *cl_form[] = {
        {" CHANNEL DISPLAY ORDER AND LABEL EDITING "},
    {"  ^  Move Cursor Up          L  Label a Channel    INS   Insert a Line "},
    {"  `  Move Cursor Down        {- Enter a Label      DEL   Delete a Line "},
        {"nn  Bank and Channel # to Display                  ESC   Return to Menu"},
{0}
};
char *lc_form[] = {
        {" LABEL A CHANNEL "},
        {"STEP 1: Enter an Alpha-Numeric Label of up to 7 Characters.    "},
```

```
                    {"STEP 2: This Label will be shown after the Enter Key is pressed."},
                    {"STEP 3: To Clear a Channel Label Press the Enter Key by Itself. "},
                    {0}
            };
    char    *sf_form[] = {
                    {" OPEN A STORAGE FILE "},
                    {" "},
                    {"STEP 1: Type the Name of a Storage File."},
                    {"STEP 2: Press the Enter Key ({-).       "},
                    {0}
            };
    char    *rf_form[] = {
                    {" READ ONE FRAME FROM THE STORAGE FILE "},
                    {"STEP 1: Select the Frame of the File to Read From."},
                    {"STEP 2: Select Data Block or Reference Block.    "},
                    {"STEP 3: The Specified Operation is Performed.    "},
                    {0}
            };
    char    *wf_form[] = {
                    {" WRITE ONE FRAME TO THE STORAGE FILE "},
                    {"STEP 1: Select the Frame of the File to Write To."},
                    {"STEP 2: Select Data Block or Reference Block.    "},
                    {"STEP 3: The Specified Operation is Performed.    "},
                    {0}
            };
    char    *ui_form[] = {
                    {" UPLOAD   INFORMATION   FROM   THE   MFI-1000 "},
                    {" "},
                    {"\"DATA\":   Upload A Copy of the Current MFI Display Data."},
                    {"\"SETUP\":  Upload A Copy of the Current MFI Menu Setup.  "},
                    {0}
            };
    char    *di_form[] = {
                    {" DOWNLOAD INFORMATION TO THE MFI-1000 "},
                    {" "},
                    {" \"DATA\":   Download the Display Data Buffer to the MFI."},
                    {"\"SETUP\":  Download the Setup to the MFI.                "},
                    {0}
            };
    char    *li_form[] = {
                    {" AUTOMATIC LOAD FUNCTION "},
                    {"STEP 1: Select Which Frame of the File to Use.     "},
                    {"STEP 2: Read the Setup and Data from the Open File. "},
                    {"STEP 3: Setup and Data are Downloaded to the MFI.   "},
                    {0}
            };
    char    *si_form[] = {
                    {" AUTOMATIC SAVE FUNCTION "},
                    {"STEP 1: Select Which Frame of the File to Use.     "},
                    {"STEP 2: Setup and Data are Uploaded from the MFI.   "},
                    {"STEP 3: Setup and Data are Written to the Open File."},
                    {0}
            };
    char    *cr_form[] = {
                    {" CHANGE HORIZONTAL DISPLAY RESOLUTION "},
                    {" "},
                    {"STEP 1: Enter the New Width in Pixels for One Display Sample."},
                    {"STEP 2: The Waveforms are Redisplayed Using the New Factor.  "},
                    {0}
            };
    char    *sj_form[] = {
                    {" "},
                    {"STEP 1:  Type the Number of the Sample you Want to Display."},
                    {"STEP 2:  Press the Enter Key.                              "},
                    {" "},
                    {0}
            };
    char    *cd_form[] = {
                    {" CHANGING THE CURRENT DOS WORKING DIRECTORY "},
                    {" "},
                    {"STEP 1:  Type the Path Name of the New Default Directory."},
                    {"STEP 2:  Press the Enter Key.                            "},
                    {0}
```

```c
};
char    *lf_form[] = {
        {" LIST FILE NAMES IN THE CURRENT DOS WORKING DIRECTORY "},
        {" "},
        {"STEP 1:  For a Partial Listing Type a Wildcard Filename."},
        {"STEP 2:  Press the Enter Key.                           "},
        {0}
};
char    *cps_form[] = {
        {"1) GPIB 1           A) GPIB 10          X) COM1:   "},
        {"  )    .            )    .  .           Y) COM2:   "},
        {"  )    .  .         )    .  .                      "},
        {"9) GPIB 9           F) GPIB 15          0) GPIB Off"},
        {0}
};
char    *lrn_form[] = {
        {" BEGIN PROGRAMMING A MACRO FILE "},
        {"STEP 1: Enter the New Macro File Name. (NO Extension) "},
        {"STEP 2: The Macro is Programmed by Normal Execution.  "},
        {"STEP 3: ALT_M key Accesses the Macro Programming Menu."},
        {0}
};
char    *per_form[] = {
        {" EXECUTE A MACRO FILE "},
        {" STEP 1: Enter the Name of a Macro from the List Below."},
        {" STEP 2: The MCP Will Process the Command File.        "},
        {" STEP 3: To Cancel this Command Press the ESCape Key.  "},
        {0}
};
char    *tmd_form[] = {
        {" ASYNC TRANSFER MODE                      QUICK TRANSFER MODE "},
        {" "},
        {" H)ex    - Ascii Hex Characters.          Q)uick Mode: ON  "},
        {" B)inary - Raw Untranslated Data.                      : O)ff "},
        {0}
};
char    *exf_form[] = {
        {" FAILURE EXAMINATION IN PROGRESS "},
        {" STEP 1: Type \'E\' to Locate and Display More Failures."},
        {" STEP 2: To Test Again press the 'T' key.              "},
        {"         To Abort this Function Press the ESC key.     "},
        {0}
};
char    *epc_form[] = {
        {" EPROM PROGRAMMING COMMUNICATION FUNCTIONS "},
        {"D)ownload an EPROM Image to the MFI-1000"},
        {"U)pload an EPROM Image from the MFI-1000"},
        {"ESC)ape to the Other Menu               "},
        {0}
};
char    *epd_form[] = {
        {"EPROM  IMAGE  DOWNLOAD  FUNCTION"},
        {" "},
        {"STEP 1: Enter the Name of the File that Contains the IMAGE."},
        {"STEP 2: Enter the Size of the IMAGE in Kilobytes.          "},
        {0}
};
char    *epu_form[] = {
        {"EPROM  IMAGE  UPLOAD  FUNCTION"},
        {" "},
        {"STEP 1: Enter the Name of the File to Receive the IMAGE"},
        {" "},
};
char    *anp_form[] = {
        {"      SETUP  PARAMETERS            ANALOG  DISPLAY  PARAMETERS    "},
        {" B)ank Skew     T)rigger Skew      C)ompression     R)eduction    "},
        {" D)irection                        H)orizontal      S)ize of Display"},
        {" F)ormat        ESC)ape            O)ffset          V)oltage Scale "},
        {0}
};
char    *vdas_form[] = {
        {" VIDEO DISPLAY ATTRIBUTES "},
        {"C)ursors    G)uard Bands    R)everse        A)nalog Colors "},
        {"D)isplay    B)ackground     K)ey Echo       P)ass Banner   "},
        {"E)rrors     M)enu           T)rigger Cur.   F)ail Banner   "},
};
```

```
char    lrnstate[2] = " ";
int     dspstate = 0;

char    *dsptag[] = {
        {"None"},{"Data"},{"Ref."},{"Tol."},{"Dif."},{"Fail."}
};

/*      Array of Labels for the LA Status Report */ char    *latag[] = {
        {"IDLE"},{"ARMED"},{"AUTO A"},
        {"TRIG"},{"DELAY"},{"ERROR"},
        {"NO MFI"},
        {0}
};
char    *plgtag[] = {
        {"DEMO"},{"DDA200"},{"DDA50"},{"DA25"},{"PG25"},{"PG25SA"},
#ifdef MCP32
        {"EP1"},{"EE2"},{"CT64"},{" "},{" "},{" "},{" "},{" "},{" "},
#endif
ifdef MCP96
        {"EP1"},{"CT64"},{"AG48"},{" "},{" "},{" "},{" "},{" "},{" "},
#endif
        {"EMPTY"},{0}
};

char    *bsc_form[] = {
        {" BIT SCANNING FUNCTIONS "},
        {" S   Select Buffer          F   First Failure Scan    "},
        {" B   Full Buffer Scan       V   Scan Value of One Sample"},
        {" C   Scan One Channel       ESC Return to Menu         "},
        {0}
};
char    *aop_form[] = {
        {"ANALOG WAVEFORM OPERATIONS: Operation Selection"},
        {"+  Addition        /  Division    A  Abs. Value "},
        {"-  Subtraction     %  Modulus     L  Shift Left "},
        {"*  Multiplication  C  Copy        R  Shift Right"},
        {0}
};
char    *ao2_form[] = {
        {"ANALOG WAVEFORM OPERATIONS: Destination Channel Specification"},
        {"0) Analog Chn 0    2) Analog Chn 2"},
        {"1) Analog Chn 1    3) Analog Chn 3"},
        {"S) Select A Buffer              "},
        {0}
};
char    *ao3_form[] = {
        {" ANALOG WAVEFORM OPERATIONS: Source Channel Specification "},
        {" 0) Analog Channel 0    2) Analog Channel 2"},
        {" 1) Analog Channel 1    3) Analog Channel 3"},
        {" C) Use a Constant      S) Select a Buffer "},
        {0}
};
char    *ao4_form[] = {
        {" ANALOG WAVEFORM OPERATIONS: Buffer Selection"},
        {" "},
        {"D)ata        R)eference              "},
        {"F)ailure     T)olerance     ESC)ape "},
        {0}
};
/*      Prompt and Response Lines */ char    dcp2[] = "New Directory NOT Found";
char    *ptyp_form[] = {
        {" "},
        {"0) Epson FX           2) Okidata "},
        {"1) Epson LX & MX      3) LaserJet"},
        {" "},
        {0}
};
char    *pof_form[] = {
        {" OUTPUT BYTE TO PARALLEL PORT "},
```

```c
        {"  "},
        {" STEP 1: Enter a Value to Send to the Parallel Port,"},
        {" STEP 2: The entered value is sent to the port.    "},
        {0}
};
char    *bsk_form[] = {
        {"BANK DISPLAY SKEW FACTOR AND OPTIONS"},
        {"  "},
        {"  "},
        {"A)utomatic Mode    M)anual Mode    O)ff    S)et Skew Factors    ESC)ape"},
        {0}
};
char    *bdr_form[] = {
        {"BANK  DIRECTION  PARAMETERS"},
        {"  "},
        {"  "},
        {"  0 = Input (Acquisition),   1 = Output (Generation)   "},
};char   *bfp_form[] = {
        {"BANK  FORMAT  PARAMETERS"},
        {"  "},
        {"  "},
        {"  0 = Digital,   1 = Analog,   2 = Analog Off"},
};
/* COMMON SOURCE MODULE FOR MFI CONTROL PROGRAM 2 and 48 */
/*   COPYRIGHT(C)1986,1987,1988.  ARRAY ANALYSIS, INC.   */
/* EDIT.C */
/* 7/14/88 Updated for Microsoft compiler */ include         "constant.h"
include         "global.h"

void dsp_text(); void start(); void stamp();
void comments();

extern  int     boxrows, alim;
unsigned        edit_str();

char * beg_str(s)                   /* Return pointer to beginning of string */
char    *s;
{
        while (*(s-1) != '\n' && *(s-1) != 0) s--;
        return(s);
}
char * end_str(s)
char    *s;
{
        while (*s != '\n' && *s != 0)    s++;
        return(s);
} char * nxt_str(s)                   /* Return pointer to beg. of next string */
char    *s;
{
        char    *temp;
        temp = end_str(s);
        return(temp + 1);
} char * prv_str(s)                   /* Return pointer to beg. of previous string */
char    *s;
{
        char * temp;
        temp = beg_str(s);
        temp--;
        return(beg_str(temp));
}
char * cpy_str(d,s)
char    *d,*s;
{
        int     c;
        do {
                c = *d++ = *s++;
        } while (c != '\n' && c != 0);
        return(s);
```

```
}
char *   cpy_back(d,s)     /* do not copy the string terminator */
char    *d,*s;
{
        while (*s != 0)
                *d++ = *s++;
        return(s+1);
}
len_str(s)              /* Length including terminator */
char    *s;
{
        int     x;
        x = 1;
        while (*s != '\n' && *s != 0) {
                x++;
                s++;
        }
        return(x);
}
char    *put_str(s,x)   /* put lf terminated string to screen */
char    *s;             /* x is control byte: bit 0 - scroll up */
                        /* bit 1 - save and restore cursor */
int     x;
{
        int     r,c;
        pcvgcp(&r,&c);
        put_con(s,1);
        if (x & 0x02) move_cur(r+1,c+1);
        return(s + len_str(s) + 1);
}
void ins_char(string,c)
char    *string;
char    c;
{
        int     x;
        char    *sv2;
        x = len_str(string);
        sv2 = string + x;
        while (x--) {
                *sv2 = *(sv2 - 1);
                sv2--;
        }
        *string = c;
        put_con(string,0);
}
void del_char(string)
char    *string;
{
        char    *sv2,c;
        sv2 = string;
        while ( *(sv2+1) != 0 && *(sv2+1) != '\n') {
                *sv2 = *(sv2+1);
                sv2++;
        }
        *sv2 = ' ';
        put_con(string,0);
        while (*sv2 != 0) {
                *sv2 = *(sv2+1);
                sv2++;
        }
}
                /* Edit a text buffer */
char    *mastersave;
edit_com(s,l)   /* Edits a comment area. S = start, L = length */
char    *s;
int     l;
{
        int     rx,cx,change = 0;
        int     loop = 1, top = 7, bot = 22, row = 7,col = 9;
```

```
int     vertoff = 0;
char    *temp, *temp2, *save, *last, *finale, *source, *dest, *next;
unsigned        e,d,f;
int     g,h;
char            ectstr[512];    /* temporary one line buffer */
save = s;
mastersave = s;
temp = s;                       /* Edit comments */
last = s + l-1;                 /* Compute End of buffer */
top = boxrows;
row = top;
bot = top + nodrows - 1;
col = coloff;
for(finale=s;*finale!=0xff && finale <last;finale++)
        if (*finale==0) break; /* find end */
if (*finale != 0xff) *finale = 0xff;
row = top;
cx = col;
while (loop) {
        move_cur(row+1,cx+1);           /* position cursor at line */
        clear_buf(ectstr,512,0);        /* clear entry buffer */
        if (*temp == 0xff) {                    /* End of comments */
                source = temp;
                *finale = 0xff;
        }
        else
                source = cpy_str(ectstr,temp);  /* equals start of next
                                                /* locat
        d = edit_str(ectstr);           /* User edit of string */
        pcvgcp(&rx,&cx);
        e = len_str(ectstr);            /* first line length */
        f = strlen(ectstr);                     /* full buffer */
        next = temp + e;                        /* beginning of next lin
        dest = temp + f;                        /* just after new buffer
        if (f != e) change = 2;         /* change in number of lines */
        g = (int)(last - source);       /* lentgh of source */
        h = (int)(last - dest);         /* length of destination */
        finale += (int)(dest - source);
        if (h < g) g = h;
        if (g > 0) {
                memmove(dest,source,g); /* adjust buffer to insert strin
                cpy_back(temp,ectstr);  /*cpy new string into buffer */
                put_s2("");
        }
        else
        if (g < 0) {
                put_s2("COMMENT SPACE IS FULL: NO MORE ROOM");
                change = 2;
                if(temp < last) {
                        if (temp + f > last) {
                                f = (int) (last - temp);
                                ectstr[f-1]='\n';
                                ectstr[f] = 0;
                                *last = 0xff;
                        }
                        cpy_back(temp,ectstr);
                }
        }
        row = rx;
        switch (d) {
                case D_ARW:
                        if (next >= finale || *next==0xff) {
                                temp2 = temp;
                                break;
                        }
                case CR:
                case '\n':
                        if (next >= last) temp2 = temp;
                        else {
                                temp2 = next;   /* next string */
                                if (row < bot) {
                                        row++;
                                }
                                else {
```

```
                                vertoff += 1;
                                change = 2;
                        }
                }
                break;
        case 0:
                temp2 = temp;
                break;
        case U_ARW:
                temp2 = prv_str(temp);   /* beg. of previous string */
                if (temp2 < save) {
                        temp2 = save;
                        break;
                }
                if (row > top) {
                        row--;
                }
                else {
                        if (vertoff > 0) {
                                vertoff--;
                                change = 2;
                        }
                }
                break;
        case ESC:
                loop = 0;
        }
        temp = temp2;
        if (change == 2) {
                erase_cur();
                dsp_text(s,1,1,vertoff);
                change = 0;
        }
    }
    insmode = 0;
    topic = "FNCMNT";
    prmpt3("COMMENT EDIT: Save New Comments in File. Y)es or N)o? ");
    e = get_one();
    if (e == 'Y') write_head(dtafile,curframe);
} define MAXLEN  62
unsigned edit_str(string)                       /* Returns the terminator used */
char    *string;                                /* CR or U_ARW */
{                                               /* string points working string */
        int     x;
        unsigned c,d;
        int     rx,cx,cxs;
        char    *save;
        int     loop = 1;
        save = string;                          /* save  original value */
        pcvgcp(&rx,&cx);
        x = len_str(save)-1;
        if (cx > x + coloff) {  /* if cursor is past end set to end */
                cx = x + coloff;
                move_cur(rx+1,cx+1);
        }
        string += cx-coloff;    /* set pointer to character under cursor */
        do {
                if (c_ready() != 0) {   /* character is ready */
                        d = 0;
                        c = c_get();
                        if ( c == 0) {          /* Extended char set */
                                c = 0xff;               /* Anticipate a good cod
                                d = c_get();    /* get ext code */
                                switch (d) {
                                case R_ARW:
                                        if (*string!=0 && *string!='\n') {
                                                string++;
                                                goto testend;
                                        }
                                        c = *string;
```

```
                                        vertoff += 1;
                                        change = 2;
                                }
                                break;
                        case 0:
                                temp2 = temp;
                                break;
                        case U_ARW:
                                temp2 = prv_str(temp);   /* beg. of previous string */
                                if (temp2 < save) {
                                        temp2 = save;
                                        break;
                                }
                                if (row > top) {
                                        row--;
                                }
                                else {
                                        if (vertoff > 0) {
                                                vertoff--;
                                                change = 2;
                                        }
                                }
                                break;
                        case ESC:
                                loop = 0;
                        }
                        temp = temp2;
                        if (change == 2) {
                                erase_cur();
                                dsp_text(s,1,1,vertoff);
                                change = 0;
                        }
                }
                insmode = 0;
                topic = "FNCMNT";
                prmpt3("COMMENT EDIT: Save New Comments in File. Y)es or N)o? ");
                e = get_one();
                if (e == 'Y') write_head(dtafile,curframe);
} define MAXLEN 62
unsigned edit_str(string)               /* Returns the terminator used */
char    *string;                        /* CR or U_ARW */
{                                       /* string points working string */
        int     x;
        unsigned c,d;
        int     rx,cx,cxs;
        char    *save;
        int     loop = 1;
        save = string;                  /* save  original value */
        pcvgcp(&rx,&cx);
        x = len_str(save)-1;
        if (cx > x + coloff) {  /* if cursor is past end set to end */
                cx = x + coloff;
                move_cur(rx+1,cx+1);
        }
        string += cx-coloff;    /* set pointer to character under cursor */
        do {
                if (c_ready() != 0) {   /* character is ready */
                        d = 0;
                        c = c_get();
                        if ( c == 0) {          /* Extended char set */
                                c = 0xff;               /* Anticipate a good cod
                                d = c_get();    /* get ext code */
                                switch (d) {
                                case R_ARW:
                                        if (*string!=0 && *string!='\n') {
                                                string++;
                                                goto testend;
                                        }
                                        c = *string;
```

```
                break;
        case EN_D:
                while( *string!=0 && *string!='\n' && cx
                        string++;
                        cx++;
                }
                move_cur(rx+1,cx+1);
                break;
        case HOME:
                while (string != save) {
                        string--;
                        cx--;
                }
                move_cur(rx+1,cx+1);
                break;
        case L_ARW:
                if (string > save) {
                        string--;
                        cx--;
                        move_cur(rx+1,cx+1);
                        break;
                }
                else if (save == mastersave) break;   /*
                while( *string!=0 && *string!='\n' && cx
                        string++;
                        cx++;
                }
                move_cur(rx+1,cx+1);
        case U_ARW:
        case D_ARW:
                if (cx - coloff + len_str(string) > MAXL
                        cxs = cx;
                        while( *string!=0 && *string!='\
                                string++;
                                cx++;
                        }
                        if (++cx >= MAXLEN+coloff) {
                                cx = coloff;
                                while (*string != ' ') {
                                        *string--;
                                        cx++;
                                }
                                *string = '\n';
                        }
                        if (cxs > cx) cx = cxs;
                }
                if (d==L_ARW) {
                        cx = coloff+MAXLEN-1;
                        move_cur(rx+1,cx+1);
                        d = U_ARW;
                }
                return(d);
        case INS:
                if (insmode == 0) {
                        insmode = 1;
                        put_stat();
                }
                else {
                        insmode = 0;
                        put_stat();
                }
                break;
        case DEL:
                if (*string != 0) {
                        if (*string == '\n')
                                c = 0;
                        del_char(string);

}
                else
                        c = 0;
                break;
        }
```

```
                break;
        case EN_D:
                while( *string!=0 && *string!='\n' && cx
                        string++;
                        cx++;
                }
                move_cur(rx+1,cx+1);
                break;
        case HOME:
                while (string != save) {
                        string--;
                        cx--;
                }
                move_cur(rx+1,cx+1);
                break;
        case L_ARW:
                if (string > save) {
                        string--;
                        cx--;
                        move_cur(rx+1,cx+1);
                        break;
                }
                else if (save == mastersave) break;   /*
                while( *string!=0 && *string!='\n' && cx
                        string++;
                        cx++;
                }
                move_cur(rx+1,cx+1);
        case U_ARW:
        case D_ARW:
                if (cx - coloff + len_str(string) > MAXL
                        cxs = cx;
                        while( *string!=0 && *string!='\
                                string++;
                                cx++;
                        }
                        if (++cx >= MAXLEN+coloff) {
                                cx = coloff;
                                while (*string != ' ') {
                                        *string--;
                                        cx++;
                                }
                                *string = '\n';
                        }
                        if (cxs > cx) cx = cxs;
                }
                if (d==L_ARW) {
                        cx = coloff+MAXLEN-1;
                        move_cur(rx+1,cx+1);
                        d = U_ARW;
                }
                return(d);
        case INS:
                if (insmode == 0) {
                        insmode = 1;
                        put_stat();
                }
                else {
                        insmode = 0;
                        put_stat();
                }
                break;
        case DEL:
                if (*string != 0) {
                        if (*string == '\n')
                                c = 0;
                        del_char(string);

}
                else
                        c = 0;
                break;
        }
```

```
			}
			switch (c) {
			case CR:
			case '\n':				/* carriage return */
				move_cur(rx+1,coloff+1);
				if (insmode == 0 || d==R_ARW)
					*string++ = '\n';
				else
					ins_char(string,'\n');
			case 0:
			case ESC:
				loop = 0;
				break;
			case BS:				/* Back space key */
				if (string > save) {
					string--;
					b_s();
					del_char(string);
					cx--;
				}
			case 0xff:
				break;
			default:
				if (insmode==0 || d==R_ARW) *string++ = c;
				else ins_char(string++,c);
				put_ch(c);
testend:
				if (++cx >= MAXLEN+coloff) {
					cx = coloff;
					while (*string != ' ') {
						*string--;
						cx++;
					}
					*string = '\n';
					c = '\n';
					loop = 0;
				}
				move_cur(rx+1,cx+1);
				break;
			}
		}
	} while(loop);
	return(c);
}
void dsp_text(s,l,x,vertoff)
char	*s;
int	l,x;
int	vertoff;
{
	int	loop = 1;
	char	*temp, *temp2, *last;
	unsigned	c,count;
	last = s + l;				/* Compute End of buffer */
	temp = s;
	count = 0;
	new_screen();
	while (loop) {				/* Display comments */
		temp2 = temp + len_str(temp);
		if (vertoff > 0) {
			temp = temp2;
			vertoff -= 1;
		}
		else {
			count++;
			if (x == 1) {
				put_con(temp,2);
				temp = temp2;
				if( count > nodrows) {
					loop = 0;
				}
			}
			else {
```

```c
                                put_bot(temp);
                                temp = temp2;
                                if (count >= nodrows-3) {
                                        put_s2("Any Key to Continue, ESC)ape to
                                        c = get_one();
                                        put_s2("");
                                        if (c==ESC) {
                                                loop = 0;
                                                continue;
                                        }
                                        count = 0;
                                }
                        }
                        if (*temp == 0 || *temp == 0xff || temp > last){
                                if (x == 1) {
                                }
                                loop = 0;
                        }
                }
        }
}
void clear_notes()                      /* Zap note field */
{
        clear_buf(HO_TITLE,80,0);
        clear_buf(HO_NOTES,1024,0);
        *HO_NOTES = 0xff;
}
void stamp()
{
        char    temp[16];

_strdate(temp);
        strcpy(HO_DATE,temp);
        _strtime(temp);
        strcpy(HO_TIME,temp);
}
void comment()          /* edit the comment buffer */
{
        char    *hsave;
        int     c;

hsave = topic;
        topic = "CEINIT";
        prmpt3("Edit the E)xisting Comments or N)ew Comments?  (E/N): ");
        c = get_one();
        if (c != ESC) {
                if ( c == 'N')
                        clear_notes();
                topic = "TITLE";
                clrwx(1,1);
                dsp_text(HO_NOTES,1024,1,0);
                prmpt3("Title: ");
                put_con(HO_TITLE,0);
                get_con(HO_TITLE,0,62);
                put3(HO_TITLE);
                topic = "COMMENT";
                put2(edit_form);
                edit_com(HO_NOTES,1024);
        }
        topic = hsave;
}
/* COMMON SOURCE MODULE FOR MFI CONTROL PROGRAM 2 and 48 */
/*   COPYRIGHT(C)1986,1987,1988.  ARRAY ANALYSIS, INC.    */
/* TESTING.C FOR THE MCP2 and MCP-AG48 */
/*  version.h selects MFI-1000 or MFI-AG48 conditional source */

/*      Testing Functions */ include         "constant.h"
include         "global.h"

void evaluate(); void dsp_opts(); void vfy_opts(); void log_test();
void put_tstat(); void dig_tst();
```

```c
unsigned    capture();
extern int     numchbnk;

int     jwcount = 0;
int     strtstflg = 0;          /* activation flag for load start frame */
int     strtstfrm = -1;         /* starting test frame */
unsigned        numdif,numfail;

do_band()
{
        unsigned int c;
        topic = "BAND";
        sprintf(tmpstr,
        "Analog Guard Bands are %s.    V)isible or I)nvisible? ",
                bandflag==1?"VISIBLE":"INVISIBLE");
        put3c(tmpstr);
        c = get_one();
        if (c == 'V') bandflag = 1;
        if (c == 'I') bandflag = 0;
}
int     trefresh;
int     autotest;
do_test()                       /* Maintain the Test Menu */
{
        int             x,loop;
        int             rr;
        unsigned        c,d;
        char            *temp;
        loop = 1;
        trefresh = 2;
        autotest = 0;
        if (tstlock == 0)               /* check global front door */
                tstlock = 1;            /* lock it, we are in */
        else return(-1);                /* door locked, subrouitne in use */
        if (q.dispflg1) {
                dspcheck();
        }
        else {
                ns_wide();
                zap_stat("");
                brieftestactive = 1;
        }
        do {
                d = ' ';
                rr = rowlen;
                if (trefresh == 1|| trefresh == 4) { /* Control repainting test
                        if (trefresh == 1) trefresh = 2;
                        else trefresh = 0;
                        if (q.dispflg1) {
                                display(tmpsave);
                                put_tstat();
                        }
                }                       /* end of refresh segment */
                if (trefresh == 2) {
                        topic = "TEST";
                        put1(tsmtitle);
                        put2(tst_form);
                        trefresh = 0;
                }
                if (trefresh == 0 || trefresh == 3) {
                        trefresh = 0;
                        put3c("Please Select a Function or Menu");
                        if (!q.dispflg1) {
                                ns_wide(); zap_stat("");
                        }
                }
                if (autotest == 1) {
                        c = 'T';
                        autotest = 0;
                }
                else c = get_one();                     /* Get a character */
againfst:
                put_s2(" ");
                switch (c) {
```

```
case 'A':          /* Add exceptions to Tolerance */
    add_fail();
    break;
case 'B':
    do_band();
    trefresh = 1;
    break;
case 'C':                     /* compare data to reference */
    failures = 0;
    evaluate();
    trefresh = 4;
    break;
case 'F':
    if ('T' == diagnose(0)) {
        autotest = 1;
        trefresh = 0;
    }
    else
        trefresh = 2;
    break;
case 'E':                     /* examine failures */
    if (brieftestactive) brieftestactive++;
    if ('T' == ex_fail()) {
        autotest = 1;
        trefresh = 0;
    }
    else
        trefresh = 1;
    if (brieftestactive) brieftestactive--;
    break;
case 'G':
    do_guard();
    trefresh = 1;
    break;
case 'L':                     /* Write comment test to Log */
    topic = "LOGCOM";
    prmpt3("LOG: ");
    if (ESC == (get_con(tmpstr,0,72))) break;
    log_line(tmpstr);
    trefresh = 2;
    break;
case 'N':
    put_s2("N)ew References command CHANGED to R)eset Refere
    break;
case 'R':
    new_refs();
    trefresh = 1;
    break;
case 'O':
    topic = "OPTIO";
    prog_opt();        /* Program test options */
    trefresh = 1;
    break;
case 'P':
    do_port();
    trefresh = 2;
    break;
case 'S':
    trefresh = 2;
    topic = "SCAN";
    if (scanst == -1) {
        scantmp = tmpsave;      /* Default */
        scanst = dspstate;
    }
    put2(bsc_form);
    put3("Select the Scanning Function to Execute: ");
    c = get_one();
    switch(c) {
    case 'V':
        x = test_samp(scantmp);
        if (istate != 1) {
            sprintf(tmpstr,
            "Vertical Sample = %x", x);
            goto axsf1;
```

```
                                }
                                break;
                        case 'C':
                                x = test_chan(scantmp);
                                if (istate != 1) {
                                        sprintf(tmpstr,
"%d Bit%c High, First High %d ,First Low %d,  Transition Count = %d.",
                                                x,x>1?'s':' ',firsthigh,
                                                firstlow, trancount);
                                        goto axsf1;
                                }
                                break;
                        case 'B':
                                x = scan_buf(scantmp);
                                if (x != 0) verdict = 0;        /* Failed */
                                else verdict = 1;               /* Passed */
                                failures = x;           /* set the failures */
                                sprintf(tmpstr,
"The %s Buffer has %d Bit%c High.  The Verdict is Set.",
                                        dsptag[scanst],x,x>1?'s':' ');
                                goto axsf1;
                        case 'F':
                                x = next_high(scantmp,numchnls,0,
                                        0,q.mxbs);
                                if (istate != 1) {
                                        if (x != -1)
                                                sprintf(tmpstr,
"First Failure Found on Bank: %d, Chan: %d, Sample %d",
                                                        scanpod,scanchan,firsthigh);
                                        else
                                                sprintf(tmpstr,
                                                        "No Failures Found");
axsf1:
                                        put_s2(tmpstr);
                                }
                                break;
                        case 'S':
                                put2(sel_form);
                                sprintf(tmpstr,
"%s Now Selected.  Select a New Buffer for Scanning: ",
                                        dsptag[scanst]);
                                c = posit(tmpstr);
                                if (c == ESC) break;
                                temp = det_buf(c);
                                if (temp != NULL) {
                                        scantmp = temp;
                                        scanst = bufstate;
                                }
                                }
                                break;
                        case 'T':               /* do the test */
                                trefresh = 0;
                                judge();        /* evaluate data against ref. and tol.*/
                                break;
                        case ESC:               /* Continue testing */
                        default:
                                d = wrap_up(c);
                                if (d != 0)
                                        loop = 0;
                                else
                                        trefresh = 2;   /* redisplay banner */
                                break;
                }
        } while (loop);
        brieftestactive = 0;
        tstlock = 0;            /* unlock the front door. */
        return((int)d);
}
test_samp(src)
char    *src;
{
        int     z,mark;
        char    *st;
        unsigned bp;
```

```
        int     c;
        int     ndx,pod,chan;
        char    temp[8];
tslp5:
        prmpt3("Enter the beginning Bank and Channel Number: ");
        c = get_con(temp,0,7);
        if (c == ESC) goto tsmend;
        if (*temp == '*') goto runsamp;
        if (*temp == 0) goto tslp7;

pod  = temp[0] - '0';
        chan = temp[1] - '0';
        ndx = find_chn(pod,chan);
        if (ndx == -1) {
                put_s2("Cannot find the Specified Bank and Channel");
                goto tslp5;
        }
        scanpod = pod;
        scanchan = chan;
tslp7:
        sprintf(tmpstr,
                "Scanning Sample %d.  Enter the Sample Number to Scan: ",
                startscan);
        prmpt3(tmpstr);
        if (get_int(&startscan) == ESC) goto tsmend;
        if (startscan < dsmin || startscan > dsmax) goto tslp7;
runsamp:
        failures = 0;                                   /* scan count */
        mark = 0x01;
        ndx = find_chn(scanpod,scanchan);
        for ( z = 0; z< 16; z++) {
                init_chan(ndx);
                bp = 0x80 >> (startscan/expansion) % 8;    /* first bit */
                st = src + caloff(cndx) +
                        (startscan/expansion)/8; /* start of scan */
                if ( *st & bp ) {
                        failures |= mark;
                }
                mark <<= 1;
                if (ndx + 1 < numchnls) {
                        ndx++;
                }
                else
                        break;
        }
tsmend:
        return(failures);
}
test_chan(src)
char    *src;
{
        int     c;
        int     pod,chan;
        int     x;
        char    *st,tchain[8];
        unsigned bp;
loop5:
        prmpt3("Enter the Bank and Channel #: ");
        c = get_con(tchain,0,7);
        if (c == ESC) goto comp1;
        if (*tchain == '*') goto runchan;
        if (*tchain == 0) goto loop7;

pod = tchain[0] - '0';
#ifdef MCP96
        if (pod > 9) pod -= 7;
#endif
        chan = tchain[1] - '0';
        x = find_chn(pod,chan);
        if (x == -1) {
                put_s2("Cannot find Specified Bank and Channel");
                goto loop5;
        }
        scanpod = pod;
        scanchan = chan;
```

```
loop7:
        sprintf(tmpstr,
                "Starting at %d.  Enter the New Starting Sample Number: ",
                startscan);
        prmpt3(tmpstr);
        if (get_int(&startscan) == ESC) goto compl;
        if (startscan < dsmin || startscan > dsmax) {
                put_s2("Starting Sample Out of Range");
                goto loop7;
        }
loop8:
        sprintf(tmpstr,"Ending at %d.  Enter the New Ending Sample Number: ",
                stopscan);
        prmpt3(tmpstr);
        if (get_int(&stopscan) == ESC) goto compl;
        if (stopscan< dsmin || stopscan > dsmax) {
                put_s2("Ending Sample Out of Range");
                goto loop8;
        }
        if (stopscan < startscan) {             /* switch relative position */
                x = startscan;
                startscan = stopscan;
                stopscan = x;
        }
        put3c("Scanning the Channel Segment");
runchan:
        x = find_chn(scanpod,scanchan);
        init_chan(x);
        failures = 0;                                   /* scan count */
        firsthigh = -1;
        firstlow = -1;
        trancount = 0;
        bp = 0x80 >> (startscan/expansion) % 8;                 /* first bit */
        st = src + caloff(cndx) + (startscan/expansion)/8;      /* start of scan
        if (*st & bp)
                lastlevel = 1;
        else
                lastlevel = 0;
        for ( x = startscan; x<= stopscan; x += expansion) {
                if ( *st & bp ) {               /* bit is high */
                        failures += expansion;
                        if (firsthigh == -1)
                                firsthigh = x;  /* set first high marker */
                        if (lastlevel == 0) {
                                trancount++;    /* count transition */
                                lastlevel = 1;  /* set tracking level */
                        }

}
                else {                          /* bit is low */
                        if (firstlow == -1)
                                firstlow = x;
                        if (lastlevel == 1) {
                                trancount++;
                                lastlevel = 0;
                        }
                }
                if (bp == 0x01) {
                        bp = 0x80;
                        st++;
                }
                else
                        bp >>= 1;
        }
compl:
        return(failures);
}
ex_fail()
{
        int     w,dsave,vsave,hssv2;
        int     bw,             /* rounded off width in bits */
                tc,             /* total channels */
                vs,             /* mumber of channels on the screen */
                vo,             /* number oc chnnels offset vertically */
                dof,            /* display offset for start of screen */
                done;
```

```
            char      *hsave;
            unsigned c;
            hsave = highsrc;
            hssv2 = highstate;
            dsave = dspoff;
            vsave = voffset;
            topic = "EXAMF";
            dspinit();
            do_high('E');
            dof = dsmin;              /* display offset */
            vo = 0;                   /* vertical offset */
            done = 0;
            tc = numchnls;                    /* total channels */
            if (dspmode == 1) vs = tc;                /* Hex display  vertical size */
            else vs = clim;                           /* digital channels on s
            put3c("Searching for Failures");
            dspinit();
            if (dspmode == 1) bw = (nohgrps*nodrows/8)*8;    /* hex */
            else bw = (rowlen/8)*8;
            do {
                    w = next_high(newbuf,vs,vo,dof,bw);
                    if (dof+rowlen > dsmax) dspoff = dsmax - rowlen;
                    else dspoff = dof;
                    if (w != -1) {
                            vo = nhchn;
                            if (vo + clim > tc) voffset = tc - clim;
                            else voffset = vo;
                            display(tmpsave);
                            put_dstat();
                            sprintf(tmpstr,
                            "FAILURES FOUND: BEGINNING ON %X%d AT SAMPLE %d. ",
                            scanpod,scanchan,dof+w);
                            put_s2(tmpstr);
                            put3c("EXAMINE FUNCTION: E)xamine more, T)est Again, ESC
exloop:
                            c = get_one();
                            if(c == ESC || c=='T') break;
                            if (c != ' ' && c != 'E') {
                                    dspkey(c,tmpsave,0);
                                    goto exloop;
                            }
                            put3c("Searching for Failures");
                    }
                    vo += vs;                                 /* next vertical segment
                    if (vo + vs >= tc || vs==0) {     /*last v. segment or analog only
                            if (vo >= tc || vs==0) {
                                    if (done) {
                                            done = 2;
                                            put_s2("EXAMINATION COMPLETE");
                                            continue;
                                    }
                                    vo = 0;
                                    if (dspmode == 1) vs = tc;      /* Hex display
                                    else vs = clim;                          /* digit
                                    dof += bw;                /* next horizontal segme
                                    if (dof + bw >= dsmax) {
                                            bw = dsmax - dof;
                                            done = 1;
                                    }
                            }
                    }
            } while(done!=2);
            dspoff = dsave;
            voffset = vsave;
            highsrc = hsave;
            highstate = hssv2;
            return(c);
} next_high(src,vs,vo,dof,hs)                     /* Returns Position of the first High Bi
char    *src;
int     vs,vo,                  /* vertical size */
        dof,hs;                 /* horizontal size */
{
        char    *st;
        int     mark,x,z,bp,y,rr,ssn;
```

```
rr = hs;
nhchn = -1;
firsthigh = -1;
mark = 32000;
if (SO_ANSIZ < 3)                        /* if digital display is on at a
for(x=0; x<vs; x++) {                    /* Test The Digital Data */
        if (init_chan(x+vo) == 0xff) break;
        z = 0;
        st = src + caloff(cndx);         /* start of data */
        ssn = dof - sampskew + bankskew;     /* neutalize bankskew te
        if (ssn + rowlen <= 0) continue;     /* off screen */
        if (ssn <= 0) z = -ssn; /* # of samples not really here */
        else st += ssn/expansion/8; /* first byte*/ while (z<rr) { /* check specified area */
                if (*st != 0){                   /* not zero == e
                        for (y=0,bp=0x80;(*st&bp)==0;bp/=2) y++;
                        y = z + (y+bankskew) * expansion;
                        if (y < mark) { /*earlier and legitimate */
                                        mark = y;
                                        firsthigh = mark;
                                        scanpod = cpdn;
                                        scanchan= cchn;
                        }
                        if (nhchn == -1) nhchn = x + vo;  /* first channe
                        break;
                }
                z += 8*expansion;
                st++;
        }

}
if (vo==0 && analcnt>0 && SO_ANSIZ!=0)   /* first vertical segment */
for (x=0; x<MAXPD1; x++) {                                  /* check all ban
        if (SO_PODDT[x] == 1) {                             /* ANalog On ? *
                z = 0;
                setoffset(x);
                st = src + offset;               /* start of bank */
                ssn = dof - sampskew + bankskew; /* neutalize bankskew t
                if (ssn + rowlen <= 0) continue;        /* off screen */
                if (ssn <= 0) z = -ssn; /* # of samples not really here
                else st += ssn/expansion; /* first byte*/
                for ( ; z<rr; z += expansion) {
                        if (*st++ != 0) {
                                if (z + bankskew < mark) {     /* earli
                                        mark = z + bankskew;
                                        firsthigh = mark;
                                        scanpod = x;
                                        scanchan = 0;
                                }
                                break;
                        }
                }
        }
}
        dspinit();
/*      sprintf(tmpstr,"VS(%d), VO(%d), TC(%d), HO(%d), HS(%d), EO(%d)",
                vs,vo,numchnls,dof,rr,mark);       zap_stat(tmpstr); */
if (mark == 32000) return(-1);   /* no fault found */
else
        return(mark);
}
judge()
{
        int     c,x,rcode,d;
        rptc = 0;
        jwcount = 0;
        differences = 0;
        failures = 0;
        rcode = 1;
        chk_topts();    /* check for vaild test options */
        if (!strtstflg) strtstfrm = curframe;
        else {  /* check starting test frame */
                if ( strtstfrm != curframe) {
                        load_frame(strtstfrm);
```

```
                }
                strtstflg = 0;              /* clear the flag */
        }
jurstrt:
        putbanner("TESTING",q.hattr,0);         /* testing banner */
jdgstrt:
        if (mon_esc()) goto juret;
        if (HO_PRMCODE) {
                put3(HO_PROMPT);
                put_s2 ("Press Space Bar when Ready");
                d = hard_pause();
                put_s2(" ");
        }
        if (HO_MUXCODE != -1) {
                out_mux (q.llport, HO_MUXCODE);
        }
        if (HO_MUXDELAY > 0) {
                set_tmo(HO_MUXDELAY);
                put_s2("MUX Delay in Progress ...");
                while (!tst_tmo())
                        if (mon_esc()) break;
                put_s2(" ");
        }
        rptc++;
        curpass = 0;
        curfail = 0;
        glbfom = 0;                 /* clear at beginning of test */
        if (HO_FOMCUTOF != -1)
                HO_ONFAIL = -1;
        put_tstat();
        while (curpass < HO_MAXPASS && curfail < HO_MAXFAIL) {
                if (mon_esc()) goto juret;
                jwcount++;
                c = capture();
                if (c == -1) {
                        put_s2("TEST ABORTED");
                        goto juret;
                }
                dspclean = 0;                   /* screen needs update */
                put3c("Testing the Display Data");
                evaluate();             /* sets the verdict */
                put_tstat();
        }
        c = rcvset();
        if (c == -1) goto juret;
        if (curpass == HO_MAXPASS) {
                verdict = 1;            /* True, Pass */
                opts = HO_PASSOPT;
        }
        else {
                verdict = 0;            /* False, Fail */
                opts = HO_FAILOPT;
        }
        stamp();
        men_regen();
        if (verdict == 1)
                putbanner("PASSED",q.pattr,0);
        else if (verdict == 0)
                putbanner("FAILED",q.fattr,0);
        if (HO_MUXCD2 != -1)
                out_mux (q.llport, HO_MUXCD2);
        if (test_opts(opts,'E')) {
                If (brieftestactive) brieftestactive++;
                c = ex_fail();
                trefresh = 1;
        if (brieftestactive) brieftestactive--;
        if ('T' == c) {
                autotest = 1;
                trefresh = 0;
        }
}
if (test_opts(opts,'F')) {
        If ('T'==diagnose(1)) {
                autotest = 1;
                trefresh = 0;
```

```c
                }
                else
                        trefresh = 2;
        } if (q.autolog) {              /* log */
                log_test();
        }
        if (test_opts(opts,'D')) display(tmpsave);
        if (test_opts(opts,'A'))          add_fail();      /* add failures */
        if (test_opts(opts,'S')) {        /* save data in new frame */
                if (write_frame(dtafile,totframe + 1,hdb) == 0)
                        totframe++;
                else
                        goto juret;
        }
        if (verdict == 1) x = HO_ONPASS;
        else if (verdict == 0) x = HO_ONFAIL;
        if (x > -1) {
                strtstflg = 1;
                trefresh = 0;
                if (0 == load_frame(x)) goto jdgstrt;
                else goto juret;
        }
        if (test_opts(opts,'R')) {        /* do this test again */
                goto jurstrt;
        }
        rcode = 0;
juret:
        return(rcode);
}
void evaluate()         /* compare data to reference against tolerance */
{
        unsigned int x,y;
        exflag = 0;
        dig_tst();                  /* sets numdif and numfail for the test */
        y = numdif;     /* Number of differences */
        x = numfail;    /* Number of Exceptions */
        differences += y;
        failures += x;
        if (x==0) {
                curpass++;
                verdict = 1;
                if (y > 0) {
                sprintf(tmpstr,"%d Differences but No Failures",numdif);
                        put_s2(tmpstr);
                }
                else {
                        put_s2("Data and Reference Match");
                }
        }
        else {
                curfail++;
                verdict = 0;
                sprintf(tmpstr,"%d Failure%c",x,x>1?'s':' ');
                put_s2(tmpstr);
        }
}
settstopt()
{
        HO_MUXCODE = -1;        /* no initial mux setting */
        HO_MUXCD2 = -1;         /* no final mux setting */
        HO_MAXPASS = 1;
        HO_MAXFAIL = 1;
        vfy_opts(HO_PASSOPT,"D",1);
        vfy_opts(HO_FAILOPT,"E",0);
        HO_ONPASS = -1;         /* no forward link on pass */
        HO_ONFAIL = -1;         /* no forward link on fail */
        HO_FFON = 1;    /* turns transition mode on */
        HO_FFSPAN = 16; /* width in samples of first fault window */
        HO_FFWEIGHT = 33;       /* 33 percent becomes fraction 33/100 */
        HO_FRMPORT = 0; /* no port setting */
        HO_PRMCODE = 0; /* user prompt code */
        *HO_PROMPT = 0;
```

```
            HO_MUXDELAY =0;  /* delay after initial MUX write */
            *HO_AUXPRG = 0;
            *HO_AUXP2 = 0;
            *HO_AUXP3 = 0;
}
prog_opt()        /* interrogate testing options */
{
        int    x,c,b,k;
        char   tmp[16];
b = ' ';
while (b != ESC) {
    put2(mxr_form);
    put3("Press the First Letter to Modify an Option or ESC to Exit: ");
    show_opts();
    b = get_one();
    put_s2(" ");
    switch (b) {
        case 'A':
                do_auxprg();
                break;
    case 'D':
        settstopt();
        break;
    case 'M':
        topic = "MUXOPT";
        do {
                put3("Write to MUX Port BEFORE the TEST? Y)es or N)o: ");
                c = get_one();
        } while (c!=ESC&&c!='Y'&&c!='N'&&c!=CR);
        if (c == ESC) break;
        if (c == 'N') HO_MUXCODE = -1;
        else if (c != CR) {
                x = HO_MUXCODE;
                prmpt3("INITIAL MUX CODE: Enter the Output Code in Hex:");
                c = get_hex(&x);
                if (c != ESC) HO_MUXCODE = x & 0xff;
        }
        do {
                prmpt3("MUX DELAY: Delay after Write to MUX? Y)es or N)o: ");
                c = get_one();
        } while (c!=ESC && c!=CR && c!='N' && c!='Y');
        if (c == ESC) break;
        if (c == 'N') HO_MUXDELAY = 0;
        else if (c != CR) {
                x = HO_MUXDELAY;
                put3c("MUX DELAY: Enter Delay in Hundreths of a Second: ");
                c = get_int(&x);
                if (c != ESC) HO_MUXDELAY = x;
        }
        do {
                prmpt3("Write to MUX Port AFTER the TEST? Y)es or N)o: ");
                c = get_one();
        } while (c!=ESC && c!=CR && c!='N' && c!='Y');
        if (c == ESC) break;
        if (c == 'N') HO_MUXCD2 = -1;
        else if (c != CR) {
                x = HO_MUXCD2;
                prmpt3("FINAL MUX CODE: Enter the Output Code in Hex:");
                c = get_hex(&x);
                if (c != ESC) HO_MUXCD2 = x & 0xff;
        }
        break;
    case 'P':
pocntu:
        topic = "PASOPT";
        show_opts();
        put2(popt_form);
        prmpt3("C)ount, L)ink or Select PASS OPTIONS and Press Enter: ");
        if ((c=get_one()) == ESC) break;
        if (c== CR) break;
        if (c == 'C') {
                topic = "PASCNT";
                prmpt3("PASS COUNT: Enter the New Pass Count: ");
                x = HO_MAXPASS;
```

```
                if (get_int(&x) == ESC) break;
                if (x > 0 ) HO_MAXPASS = x;
                break;
        }
        else
        if (c=='L') {
                topic = "PASLNK";
                prmpt3("LINK ON PASS: Enter the Frame # or 0 for No Link: ");
                x = HO_ONPASS + 1;
                if (ESC == get_int(&x)) break;
                if (x >= 0 && x <= totframe+1) HO_ONPASS = x-1;
                break;
        }
        *tmp = c; *(tmp+1) = 0;
        put_ch(c);
        topic = "PASCHC";
        if (get_con(tmp,1,15) == ESC) break;
        vfy_opts(HO_PASSOPT,tmp,1);
        break;
    case 'S':
polp4:
        topic = "SPTOPT";
        put3("Select MFI Port BEFORE LOADING the TEST? Y)es or N)o: ");
        c = get_one();
        if (c == ESC) break;
        if (c == 'N') HO_FRMPORT = '0';
        else if (c== CR) break;
        else if (c != 'Y') goto polp4;
        else {
                prmpt3("MFI PORT SELECTION: Enter the Port Selection:");
                c = get_one();
                if (c == ESC) break;
                HO_FRMPORT = c;
        }
        break;
    case 'F':
        topic = "FALOPT";
        show_opts();
        put2(fopt_form);
        prmpt3("C)ount, L)ink or Select FAIL OPTIONS and Press Enter: ");
        if ((c = get_one()) == ESC) break;
        if (c== CR) break;
        if (c == 'C') {
                topic = "FALCNT";
                prmpt3("Enter the Maximum Fail Count: ");
                x = HO_MAXFAIL;
                if (get_int(&x) == ESC) break;
                if (x > 0) HO_MAXFAIL = x;
        }
        if (c == 'L') {
                topic = "FALLNK";
prmpt3("LINK ON FAIL: Enter Minimum FOM(1-100) or 0 for Direct Link: ");
                x = HO_FOMCUTOF;
                if (ESC != get_int(&x)) {
                        if (x > 0 && x <= 100) HO_FOMCUTOF = x;
                        else {
                                HO_FOMCUTOF = -1;
        prmpt3("LINK ON FAIL: Enter the Frame Number or 0 for No Link: ");
                                x = HO_ONFAIL + 1;
                                if (ESC == get_int(&x)) break;
                                if (x >= 0 && x <= totframe+1)
                                        HO_ONFAIL = x - 1;
                        }
                }
                break;
        }
        put_ch(c);
        topic = "FALCHC";
        *tmp = c; *(tmp+1) = 0;
        if (get_con(tmp,1,15) == ESC) return(ESC);
        vfy_opts(HO_FAILOPT,tmp,0);
        break;
    case 'L':
```

```
polp3:
        topic = "LOGOPT";
        put3("Write Reults of Test to the Log File?  Y)es / N)o: ");
        k = get_one();
        if (k == 'N') q.autolog = 0;
        else if (k=='Y') q.autolog = 1;
        else if(k!=ESC&&k!=CR) goto polp3;
        break;
    case 'U':   /* prompt and pause after test */
        topic = "USPOPT";
        put3("C)ancel or E)dit the User Prompt Message?");
        k = get_one();
        if (k == 'C') {
                HO_PRMCODE = 0;
        }
        else if (k=='E') {
                HO_PRMCODE = 1;
                prmpt3("PROMPT: ");
                put_con(HO_PROMPT,0);
                strcpy(tmpstr,HO_PROMPT);
                k = get_con(tmpstr,0,62);
                if (k == ESC) break;
                strcpy(HO_PROMPT,tmpstr);
        }
        break;
    case 'T':
        topic = "TMOOPT";
        sprintf(tmpstr,"Timeout is %d seconds.  Enter New Timeout:",q.timeout);
        prmpt3(tmpstr);
        x = q.timeout;
        if (ESC == get_int(&x)) break;
        q.timeout = x;
        break;
    case 'W':
        write_head(dtafile,curframe);
        break;
    default:
        glblcmnd(b);
        break;
    }   /* end switch(b) */
}       /* end while(b) */
}
do_auxprg()
{
        unsigned    c;
        topic = "AXPOPT";
        set_axprg(HO_AUXPRG,"INITIAL");
        set_axprg(HO_AUXP2,"ARMED");
        set_axprg(HO_AUXP3,"FINAL");
} set_axprg(str,str2)
char    *str,*str2;
{
        char    ts[AXPSIZE+16];
        strcpy(ts,str);
        sprintf(tmpstr,"Enter %s Aux. Program: ",str2);
        put3c(tmpstr);
        put_con(ts,0);
        if (ESC!=get_con(ts,0,AXPSIZE-1)) {
                strcpy(str,ts);
                show_opts();
        }
}
show_opts()
{
        char    *s;
        char    t1[32],t2[32],t3[32];
        new_screen();
```

```c
        sprintf(tmpstr,"FRAME %2d: %s",curframe+1,HO_TITLE);
        mon_screen(tmpstr,1);              /* one */
        sprintf(tmpstr," PROMPT: %s",HO_PRMCODE?HO_PROMPT:"OFF");

mon_screen(tmpstr,1);              /* three */
        friend_hex(t1,HO_MUXCODE,-1);
        friend_hex(t2,HO_MUXCD2,-1);
        friend_int(t3,HO_MUXDELAY,0);
        sprintf(tmpstr,
"  INITIAL MUX CODE: %3s    MUX DELAY: %3s    FINAL CODE: %3s",t1,t3,t2);
        mon_screen(tmpstr,1);              /* four */
        friend_char(t1,HO_FRMPORT,'0');
        sprintf(tmpstr, "  MFI PORT SELECTION: %s",t1);
        mon_screen(tmpstr,1);              /* five */ mon_screen(      "  PASS OPTIONS                  FAIL OPTIONS",1);  /* six *
        sprintf(tmpstr,"    COUNT: %3d                  COUNT: %3d",HO_MAXPASS, HO
        mon_screen(tmpstr,1);              /* seven */
        friend_int(t1,HO_ONPASS+1,0);
        friend_int(t2,HO_FOMCUTOF==-1?HO_ONFAIL+1:HO_FOMCUTOF,0);
        sprintf(tmpstr,"     LINK: %3s                  %s%s",t1,
            HO_FOMCUTOF==-1?"LINK: ":"FOM >= ",t2);
        mon_screen(tmpstr,1);              /* 8 */
        sprintf(tmpstr,"   ACTIONS: %3s                ACTIONS: %3s",HO_PASSOPT,H
        mon_screen(tmpstr,1);              /* 9 */
        mon_screen(" ",1);                 /* 10 */
        sprintf(tmpstr," INITAL PROGRAM: %s",*HO_AUXPRG?HO_AUXPRG:"OFF");
        mon_screen(tmpstr,1);              /* four */
        sprintf(tmpstr," ARMED  PROGRAM: %s",*HO_AUXP2?HO_AUXP2:"OFF");
        mon_screen(tmpstr,1);              /* four */
        sprintf(tmpstr," FINAL  PROGRAM: %s",*HO_AUXP3?HO_AUXP3:"OFF");
        mon_screen(tmpstr,1);              /* four */
        mon_screen(" ",1);                 /* 10 */ mon_screen("GLOBAL TESTING OPTIONS");  /* 11 */
        friend_int(t1,q.timeout,0);
        sprintf(tmpstr," LOGGING: %s     TIMEOUT: %s",q.autolog?"ON":"OFF",t1);
        mon_screen(tmpstr,1);              /* 12 */
}
void dsp_opts()
{
        sprintf(tmpstr,           /* build the status line */
"F(%d) MUX(%d,%d) PASS:(Max=%d,Opts[%s],Link=%d) FAIL:(Max=%d,Opts=[%s],%s%d)",
        curframe+1,HO_MUXCODE,HO_MUXCD2,HO_MAXPASS,HO_PASSOPT,HO_ONPASS+1,
        HO_MAXFAIL,HO_FAILOPT,HO_FOMCUTOF==-1?"Link=":"FOM>=",HO_FOMCUTOF==-1?HO
        zap_stat(tmpstr);
}
void vfy_opts(dst,str,f)
char    *dst,*str;
int     f;              /* 1 = pass, 0 = fail. */
{
        unsigned c;
        if (*str == 'C' || *str == 'c') *dst= 0;
        else
        while (*str != 0) {
                c = toupper(*str);
                switch (c) {
                case 'A':       /* add failures */
                case 'D':       /* display data */
                case 'E':       /* examine failures */
                case 'F':       /* fault dianosis */
                case 'L':       /* link to next test */
                case 'R':       /* repeat this test */
                case 'S':       /* save data */
                        *dst++ = c;
                        break;
                default:
                        break;

}
                *dst = 0;
                str++;
        }
}
```

```c
}
test_opts(src,c)                        /* returns true if found, false if not */
char    *src,c;
{
        while (*src != 0) {
                if (toupper(*src) == c)
                        return(1);
                src++;
        }
        return(0);
}
void tst_stat(dst)
char *dst;
{
        stamp();
        sprintf(dst,
"R%2d F%2d T%2d C%2d %s: P=(%d..%d,%s), F=(%d..%d,%s), %4d DFS,%4d FLS. %c:%s",
                rptcycle,curframe+1,rptc,jwcount,verdict==1?"PASS":"FAIL",
                curpass,HO_MAXPASS,HO_PASSOPT,curfail,HO_MAXFAIL,
                HO_FAILOPT,
                differences,failures,lrnstate[0],lrnstate[0]==' '?"":q.lrnname);
}
void log_stat(dst,line)
char *dst;
int     line;
{
        if(line == 1) {
                stamp();
                sprintf(dst,"\nFile:%s Frame:%d  %s  %s  %s",
        q.dtaname,curframe+1,HO_DATE,HO_TIME,verdict==1?"PASSED":"FAILED",
                HO_DATE,HO_TIME,lrnstate[0] ==' '?"":q.lrnname);
        }
        else if (line == 2) {
                sprintf(dst,"     Diagnosis #: %d    Figure of Merit: %d\%",
                        glbdnum,glbfom);
        }
        else if (line == 3)
                sprintf(dst,"     :\"%s\"",glbdiag);
}
void log_test()
{
        int     i,j;
        char    tstr[90];

if (glbfom > 0) j = 4;
        else j = 2;
        for (i=1;i<j;i++) {
                log_stat(tstr,i);
                log_line(tstr);
        }
} log_line(str)
char    *str;
{
        int     x;
        if (log_file == NULL) {
                log_file = fopen(q.log_name,"at");
                if (log_file == NULL) {
                        put_s2("Cannot open Log file");
                        return(0);
                }
        }
        x = fprintf(log_file,"%s\n",str);
        fclose(log_file);
        log_file = NULL;
        return(x);
}
void log_close()
{
        if (log_file != NULL) {
                fclose(log_file);
                log_file = NULL;
        }
```

```
}
void put_tstat()
{
        statflg = 't';
        tst_stat(tmpstr);
        if (q.dispflg1) zap_stat(tmpstr);
} void doxor(dst,src,src2,count)
unsigned char   *dst,*src,*src2;
int     count;
{
        while (count--) {
                *dst++ = *src++ ^ *src2++;
        }
} void doand(dst,src,src2,count)
unsigned char   *dst,*src,*src2;
int     count;
{
        while(count--)
                *dst++ = *src++ & *src2++;
} void door(dst,src,src2,count)
unsigned char   *dst,*src,*src2;
int     count;
{
        while (count--)
                *dst++ = *src++ | *src2++;
}
void dig_tst()   /* newbuf=exceptions */
{
        int     x, pod;
        dspinit();
        numdifs = 0; numfail = 0;               /* modified by tst_dpod and tst_ */
        for (pod = 0; pod < MAXPD1; pod++) {
                if (SO_PODDT[pod] == 0)  {
                        tst_dpod(pod);
                }
                else {
                        tst_apod(pod);
                }
        }
}
tst_dpod(pod)
int     pod;
{
        int count;
        unsigned int *dat,*ref,*tol,*dst1,tmp1,tmp2,m;

setoffset(pod);
        offset /= 2;
        dat = (unsigned int *) databuf + offset;
        ref = (unsigned int *) maskbuf + offset;
        tol = (unsigned int *) tolbuf + offset;
        dst1 = (unsigned int *) newbuf + offset;
        count = 0;
        do {
                tmp1 = *dat++ ^ *ref++;
                tmp2 = (tmp1 ^ *tol++) & tmp1;
                *dst1++ = tmp2;
                if(tmp1 != 0 ) for(m=0x8000;m>0;m>>=1) {
                    if(tmp1&m)numdif++;
                        if(tmp2&m)numfail++;
                }
        } while (++count < banksize/2);          /* number of integers */
}
tst_apod(pod)              /* counts all failures into numfail */
int     pod;
{
        int count,tmp,sign;
        unsigned char *dat,*ref,*tol;
```

```
signed char *dst1;
setoffset(pod);
dst1 = (signed char *) newbuf + offset;
count = 0;
if (SO_PODDT[pod] == 2) {
        while (count++ < banksize)
                *dst1++ = 0;
}
else {
    dat = (unsigned char *) databuf + offset;
    ref = (unsigned char *) maskbuf + offset;
    tol = (unsigned char *) tolbuf + offset;
    while ( count++ < banksize) {
            tmp = 0;                                /* assume equality */
            if (*dat < *ref) {
                    tmp = (*dat - *ref);
                    if (tmp < -127) tmp = -127;
                    numfail++;
            }
                    else
                    if (*dat > *tol) {
                            tmp = (*dat - *tol);
                            if (tmp > 127) tmp = 127;
                            numfail++;
                    }
            *dst1 = tmp;
            dat++; ref++; tol++; dst1++;
        }
    }
}
add_fail()
{
        int     x;
        if (locked())
                put_s2("THIS FRAME IS LOCKED AGAINST MODIFICATION");
        else {
                for (x = 0; x<MAXPD1; x++) {
                        setoffset(x);
                        if (SO_PODDT[x] == 0)
                        door(tolbuf+offset,tolbuf+offset,newbuf+offset,banksize)
                        else if (SO_PODDT[x] == 1)
                                aanal_fail(x);
                }
                put_s2("Failures Added to Tolerance");
        }
}
aanal_fail(pod)
int     pod;
{
        int count;
        unsigned char *dat,*ref,*tol;
        dspinit();
        setoffset(pod);
        dat = (unsigned char *) databuf + offset;
        ref = (unsigned char *) maskbuf + offset;
        tol = (unsigned char *) tolbuf + offset;
        count = 0;
        while ( count++ <= banksize) {
                if (*dat < *ref) {
                        *ref = *dat;
                }
                else
                if (*dat > *tol) {
                         *tol = *dat;
                }
                dat++; ref++; tol++;
        }
}
do_guard()
{
        int     c,i,j,x,factor;
        int     blip,last,sbit,dbit,j1,j2,ch;
        unsigned char   *src, *dst, *tmpdst;
        do {
```

```
        topic = "GGUARD";
        put3("GUARD DATA: A)nalog or D)igital Guarding? ");
        c = get_one();
} while (c!=ESC && c!='A' && c != 'D');
if (c== ESC) return(0);
if (c=='A'){
        topic = "AGUARD";
        anal_guard();
        return(1);
}
do {
        topic = "DGUARD";
        put3("DIGITAL GUARD: A)dd to Tolerances or N)ew Tolerances? ");
        c = get_one();
} while(c!= ESC && c != 'A' && c != 'N');
if (c==ESC) return(0);
put3c("DIGITAL GUARD: Enter the Guarding Factor: ");
factor = 0;
if (get_int(&factor) == ESC) return(0);
put3 ("Working ...");
if (c == 'N') gen_ref('D');        /* setup new digital references */
for (x = 0; x < np0+np1; x++)
if (SO_PODDT[x] == 0) {                /* digital bank */
        setoffset(x);
        for (ch=0; ch<numchbnk; ch++) {
                src = databuf + offset + ch*chnsize;
                dst = tolbuf + offset + ch*chnsize;
                j1 = 0; j2 = 0;
                blip = 0;                  /* tolerate this edge */
                last = 0;                  /* last bit sampled */
                sbit = 0x80;
                do {
                        do {
                                if (*src & sbit) {        /* bit is high *
                                        if (last == 0) {        /* last
                                                blip = 1;
                                                last = 1;
                                        }
                                }
                                else if (last) {
                                        blip = 1;
                                        last = 0;
                                }
                                if (blip == 1) {
                                        blip = 0;
                                        tmpdst = dst + j1;
                                        dbit = sbit;
                                        j2 = j1;
                                        for (i=0; i<=factor; i++) {
                                                *tmpdst |= dbit;
                                                if (dbit == 0x80){
                                                        tmpdst--;
                                                        dbit = 0x01;
                                                }
                                                else
                                                        dbit <<= 1;
                                        }
                                        tmpdst = dst + j1;
                                        dbit = sbit;
                                        for (i=1; i<factor; i++) {
                                                if (dbit == 0x01){
                                                        j2++;
                                                        if (j2>=chnsize)
                                                                break;
                                                        tmpdst++;
```

```
                                                    dbit = 0x80;
                                            }
                                            else
                                                    dbit >>= 1;
                                              *tmpdst |= dbit;
                                    }
                            }
                            if (sbit > 0x01) sbit >>= 1;
                            else {
                                    sbit = 0x80;
                            }
                    } while (sbit !=0x80 );
                    j1++;
                    src++;
            } while (j1 < chnsize && j2 < chnsize);
        }
    }
}
anal_guard()
{
        int     i,x,y;
        int     factor,hfactor,c,count;
        unsigned char *s1,*s2,*s3;
        if (locked()) {
                put_s2("THIS FRAME IS LOCKED AGAINST MODIFICATION");
                return(0);
        }
        put3c("Select the Bank Number to Guard: ");
        c = get_probe("");
        if (c == ESC || c == -1) return(0);
        x = c;
        sprintf(tmpstr,"Enter the Vertical Analog Guard Factor for A%d: ",x);
        prmpt3(tmpstr,0);
        c = get_int(&factor);
        if (c != ESC) {
        sprintf(tmpstr,"Enter the Horizontal Analog Guard Factor for A%d: ",x);
                prmpt3(tmpstr,0);
                c = get_int(&hfactor);
        }
        put3("A)dd to Bands, N)ew Bands");
        c = get_one();
        if (c != ESC) {
                if (SO_PODDT[x]==1) {
                        setoffset(x);
                        s1 = maskbuf+offset;
                        s2 = tolbuf+offset;
                        s3 = databuf + offset;
                        count = banksize;
                        if (c == 'N') {
                                for (y=0; v<count; y++) {
                                        s1[y] = s3[y];
                                        s2[y] = s3[y];
                                }
                        }
                        do {
                                y = *s3 - factor;
                                if (y < 0) y = 0;
/* vertical factor */           if (y < *s1) *s1 = y;
/* horiz factor */              for (i=1;i<=hfactor;i++) {
/* space behind */                      if (count-i < 0) break;
/* space in front */                    if (banksize-count < i) break;
/* change the minimum */                y = *(s3+i)-factor;
                                        if (y <= 0) y = 0;
/* check ahead */                       if ( y < *s1) *s1 = y;
/* change the minimum */                y = *(s3-i)-factor;
                                        if (y < 0) y = 0;
/* check ahead */                       if ( y < *s1) *s1 = y;
                                }
                                y = *s3 + factor;
                                if (y > 255) y = 255;
                                if (y > *s2) *s2 = y;
                                for (i=1;i<=hfactor;i++) {
                                        if (count-i < 0) break;
```

```
                              if (banksize-count < i) break;
                              y = *(s3+i)+factor;
                              if (y > 255) y = 255;
                              if (y > *s2) *s2 = y;
                              y = *(s3-i)+factor;
                              if (y > 255) y = 255;
                              if (y > *s2) *s2 = y;
                        }
                        s1++; s2++; s3++;
                  } while (--count > 0);
            }
            clip_pod(maskbuf,x,0);
            clip_pod(tolbuf,x,0xff);
            sprintf(tmpstr,"Analog Guarded by +/- VER:%d,  +/- HOR:%d",
                        factor,hfactor);
            put_s2(tmpstr);
      }
}
new_refs()
{
      int     x;
      unsigned c;
      if (locked()) {
            put_s2("THIS FRAME IS LOCKED AGAINST MODIFICATION");
      }
      else {
            topic = "NEWREF";
            do {
                  put3("Reset References for : A)nalog, D)igital, or B)oth
                  c = get_one();
            } while (c !=ESC && c!= 'A' && c != 'B' && c != 'D');
            put3("working ...");
            if (c != ESC) gen_ref(c);
            put_s2("REFERENCE RESET COMPLETE: New Ref. and Tol. data in memo
      }
}
gen_ref(c)
int      c;
{
            int     x;
            for (x = 0; x< MAXPD1; x++) {
                        setoffset(x);
/* digital */           if (SO_PODDT[x]==0 && (c=='D' || c == 'B') ) {
                              memcpy(maskbuf+offset,databuf+offset,banksize);
                              clear_buf(tolbuf+offset,banksize,0);
                              clip_pod(tolbuf,x,0xff); /* set margins hi */
                        }
                        else
/* analog data */       if ( SO_PODDT[x] == 1 && (c == 'A' || c == 'B') ){
                              memcpy(maskbuf+offset,databuf+offset,banksize);
                              memcpy(tolbuf+offset,databuf+offset,banksize);
                              clip_pod(maskbuf,x,0);   /* min band */
                              clip_pod(tolbuf,x,0xff); /* max band */
                        }
            }
}
clip_pod(buf,pod,bitval)          /* bitval is 00 or ff */
unsigned char    *buf;
int       pod;
int------bitval;
{
    int marg,x;
    int chsz,noch,chmin,chmax,expf;
    unsigned char          *src,*s2;
    if (dsmin == 0 && dsmax >= q.mxbs) return(0);        /* nothing to clip */
        setoffset(pod);
        if (pod < MAXPD0 ) {
              chsz = csz0; noch = ncp0; expf = exp0;
        }
        if (pod >= MAXPD0 ){
              chsz = csz1; noch = ncp1; expf = exp1;
        }
        chmin = dsmin / expf;
```

```
                chmax = dsmax / expf;
                src = buf + offset;
/* sprintf(tmpstr,"BANK:%d,CHSZ:%d,NOCH:%d, LIM1:%d,LIM2:%d,EXP:%d,OFF:%d",
pod,chsz,noch,chmin,chmax,expf,offset);
putl(tmpstr);
delay(5);*/
            if (SO_PODDT[pod] == 0) {        /* if the data is digital */
                while(noch-- > 0) {
                    s2 = src;        /* start of this channel */
                    marg = chmin;
                    while (marg >= 8) {
                        *s2++ = (unsigned char)bitval;
                        marg -= 8;
                    }
                    x = 0x00ff;
                    while (marg-- > 0)        /* set up clip mask */
                        x >>= 1;
                    if (bitval == 0)
                        *s2 &= (unsigned char)x;        /* clip bits */
                    else {
                        x ^= bitval;
                        *s2 |= (unsigned char)x;/* fill margin with bitval */
                    }
                    src += chsz;            /* start of next channel */
                    s2 = src - 1;           /* end of previous channel */
                    marg = q.mxbs/expf - chmax;    /* margin bits to clip */
                    while (marg >= 8) {        /* whole bytes */
                        *s2-- = bitval;
                        marg -= 8;
                    }
                    x = 0xff;
                    while(marg-- > 0)
                        x <<= 1;
                    if (bitval == 0)
                        *s2 &= (unsigned char)x;   /* mask any bits */
                    else {
                        x ^= 0xff;
                        *s2 |= (unsigned char)x;   /* fil margin high */
                    }
                }
            }
            else { /* analog pod */
                s2 = src;
                for (marg=chmin;marg>0;marg--)
                    *s2++ = bitval;
                s2 = src + q.mxbs/expf - 1;     /* last sample */
                for(marg=q.mxbs/expf-chmax;marg>0;marg--)
                    *s2-- = bitval;
            }
    }
}
load_frame(x)
int    x;
{
        if ( x >= 0 && x <= totframe) {
                curframe = x;
                zap_sbar(10,10);
                if (-1 !=get_frame(dtafile,curframe,hdb)) {
                        if (HO_FRMPORT > '0') {
                                if (q.current_port != HO_FRMPORT) {
                                        if (!set_port(HO_FRMPORT))
                                                return(-1);
                                }
                        }
                        if (-1 != sndset())
                        if (-1 != snddata()) {
                                get_mask();
                                return(0);
                        }
                }
        }
        return(-1);
}
chk_topts()
{
```

```
                if (HO_MAXPASS == 0) {
                        HO_MUXCODE = -1;
                        HO_MAXPASS = 1;
                        HO_MAXFAIL = 1;
                        HO_PASSOPT[0] = 'D';
                        HO_FAILOPT[0] = 'E';
                        HO_ONPASS = -1;
                        HO_ONFAIL = -1;
                        HO_FOMCUTOF = -1;
                }
}
unsigned capture()              /* Level One Capture Function for Testing */
                                /* returns 0-OK, or -1-Error */
{
        unsigned        c;
        if (*HO_AUXPRG != 0) execute(HO_AUXPRG,0);      /* Initial */
        put3("Capture Data From the MFI-1000");
        c = arm();
        if (c == -1) return(c);
        if (*HO_AUXP2 != 0) execute(HO_AUXP2,0);        /* Armed */
        c = trigger();
        if (c == -1 ) return(c);
        if (*HO_AUXP3 != 0) execute(HO_AUXP3,0);        /* Final */
        c = rcvdata();
        return(c);
}
/* COMMON SOURCE MODULE FOR MFI CONTROL PROGRAM 2 and 48 */
/*   COPYRIGHT(C)1986,1987,1988.  ARRAY ANALYSIS, INC.    */
/* HELP.C */ include "constant.h"
include "global.h"
include <malloc.h> extern char     p3sv[];

define MXH     140             /* Max number of Help Topics */
typedef struct {
        char    t[6];
        long    p;
} HXR;                          /* Help Index Record */
HXR     hndx[MXH];
int     nxthx = 0;              /* next help index */
char    *savscra;
char    *savscrb;
static char     htmp[84] = {"    "};
static char     htmp2[84] = {"    "};
static char     htop[84] = {"    "};
static char     hsav3[84];

void help_index();              /* Generate index of help file */
void help_close();
extern  int     alim;
help_open()
{
        sprintf(tmpstr,"%smcp2.hlp",q.hlp_prfx);
        hlp_file = fopen(tmpstr,"rt");  /* Open Input file */
        if (hlp_file == NULL) {
                put3("Cannot Open the Help File");
                delay(2);
                return(-1);
        }
        sprintf(q.hndxname,"%smcp2.ndx",q.hlp_prfx);
        hndxfile = open(q.hndxname,O_BINARY|O_RDONLY);  /* open to read */
        if (hndxfile == -1) {                           /* can't find it */
                help_index();                           /* generate index */
                hndxfile = open(q.hndxname,O_BINARY|O_WRONLY|O_CREAT,S_IREAD|S_I
                if (hndxfile != -1) {
                        write(hndxfile,(char *)hndx,MXH*sizeof(HXR)); /* dump th
                        write(hndxfile,(char *)&nxthx,sizeof(int));   /* save
                        close(hndxfile);
                }
        }
        else {
```

```
                read(hndxfile,(char *)hndx,MXH*sizeof(HXR));    /* Read the Inde
                read(hndxfile,(char *)nxthx,sizeof(int));       /* restore count
                close(hndxfile);
        }
        return(0);
}
void help_close()
{
        fclose(hlp_file);
}
void help_index()                       /* Generate index of help file */
{ char    c;
        int     i,j;
        long    pos;
        nxthx = 0;
        fseek(hlp_file,0L,SEEK_SET);            /* beginning of file */
        while (feof(hlp_file) == 0 && nxthx < MXH) {
                pos = ftell(hlp_file);  /* get help file pointer */
                fgets(hlp_line,84,hlp_file);    /* read a line */
                if (hlp_line[0] == '*') {       /* test for title line */
                        for (i=0,j=1;i<5;i++) {
                                c = hlp_line[j];
                                if (c == 0 || c == '\n')
                                        c = 0;
                                else
                                        j++;
                                hndx[nxthx].t[i] = c;
                        }
                        hndx[nxthx].t[5] = 0;   /* terminate string */
                        hndx[nxthx].p = pos;
                        nxthx++;
                }
        }
}
help_find(key)
char    *key;
{
        int     cur,x;
        cur     = 0;
        while (cur < nxthx) {
                if (strstr(key,hndx[cur].t) != NULL) {
                        x = fseek(hlp_file,hndx[cur].p,SEEK_SET);
                        return(1);
                }
                cur++;
        }
        return(0);
}
char    hsuplement[96]; /* supplemental topics available */
                        /* cleared on initial entry to help_one */
                        /* used by level that calls help_one() to */
                        /* supply user  optionally with more info */
help_one(key)
char    *key;
{
        int             x;
        unsigned        f,y,sr,sc,er,ec,bsize;
        char    *tmp,c;
        *hsuplement = 0;
        f = y = x = 0;                  /* Controls scrolling size */
        c = 'A';                        /* Anything but ESC */
        new_screen();                   /* clear screen, position text cur */
        put_s2("  ");
        if (hlp_file == NULL)           /* No Help file here. */
                c = ESC;                /* Force it to fall through */
        if ( !help_find(key))           /* locate position in index */
                fseek(hlp_file,0L,SEEK_END);    /* End of file */
        hlp_line[0] = ' ';
        hlp_line[1] = ' ';
        while (feof(hlp_file) == 0 && c != ESC) {       /* Not end of file */
                fgets(hlp_line+2,80,hlp_file);          /* get a line */
```

```c
        while (feof(hlp_file) == 0 && c != ESC) {        /* Loop topic */
                fgets(hlp_line+2,80,hlp_file);/* get a line */
                strcpy(htmp2,htmp);
                strcpy(htmp,hlp_line+1);
                if (hlp_line[2] == '*') {         /* If Endo fo TOpic */
                        if (y != 0) {   /* Filter out Phantoms */
                                return(CR);
                        }
                        c = ESC;
                        break;
                }
                if (hlp_line[2] == '$') {         /* If Sub Topic Marker *
                        strcpy(hsuplement,&hlp_line[2]);
                }
                else if (hlp_line[2] == '#') {    /* If Sub Topic Marker *
                        f = 1;          /* next line is subtitle */
                        x = nodrows+1;
                }
                else {                  /* Display one Line*/
                        if (f==0) {             /* First Line Title */
                                put3(hlp_line+2);
                                f = 1;                  /* next line is
                        }
                        else if (f==1) {                /* secondary tit
                                strcpy(htop,hlp_line+1);
                                new_screen();
                                put_con(htop,2);
                                put_con(" ",2);
                                x = 0;
                                f = 2;          /*clear 2nd title flag *
                        }
                        else {          /* body */
                                fill_out(htmp);
                                put_con(htmp,2);                /* put o
                        }
                        x++;
                }
                y++;
                if (x >= nodrows) {
                        zap_stat("Press Any Key for the Next Page, or ES
                        c = hard_pause();
                        zap_stat(" ");
                        if (f == 2) {
                                new_screen();
                                put_con(htop,2);
                                put_con(" ",2);
                                put_con(htmp2,2);
                                put_con(htmp,2);
                                x = 3;
                                y = 0;
                        }
                }
        }
}
if (c != ESC) {
        sprintf(htmp,"Cannot Find Help for %s",key);
        put_s2(htmp);
        c = ESC;
}
erase_cur();
        return(c);
}
#define TAB_SIZE        4
fill_out(str)
char    *str;
{
        int     i=0,j=0;
        char    tstr[96],*src,*dst;
        src = str;
        dst = tstr;
        while (*src != 0) {
                if (*src == '\t')
```

```
                    for ( i=TAB_SIZE-(j%TAB_SIZE); i>0; i--) {
                            *dst++ = ' ';
                            j++;
                    }
            else {
                    *dst++ = *src;
                    j++;
            }
            src++;
            if (j>62) break;
        }
        *dst = 0;
        strcpy(str,tstr);
}
help_all(topstr)                /* new high level governing routine */
char    *topstr;
{
        int     d,i,j,sc,sr,ec,er,p,q;
        char    c,*s,*s1,ths[96];       /* temporary help supplement string */
        int     row,col;
        if (hlock == 0) hlock = 1;      /* Come in and lock the door */
        else    return(0);              /* Prevent nested execution */
        *ths = 0;                       /* empty string */
        savscra = (char *)halloc(64000L,1);
        pcvgcp(&row,&col);
        sc = 72;
        sr = 70;
        ec = sc + 495;
        er = sr + 251;
        if (savscra!=NULL) get(sc,sr,ec,er,savscra);
        d = help_one(topstr);   /* initial call */
        if (*hsuplement != 0 && d!= ESC) {      /* supplemental topics were spec
                strcpy(ths,hsuplement);
                for(s=ths,i=0,j=0; j<94 && s[j]!=0;) {
                        if (s[j]==' '||s[j]==','||s[j]=='$') j++;
                        else if (s[j]!= 0){
                                s1 = s + j;
                                i=j;
                                while(s[i] != ' ' &&s[i]!=','
                                        &&s[i]!='$'&&s[i]!=0) i++;
                                c = s[i]; s[i] = 0;
        sprintf(tmpstr,"ESC TO Stop or 'Space' for Topic (%s)",s1);
                                zap_stat(tmpstr);
                                d = hard_pause();
                                zap_stat("  ");
                                if (d==ESC) break;
                                d = help_one(s1);
                                s[i] = c;
                                j = i;
                                if (d==ESC) break;
                        }
                }
        }
        if (d!=ESC) {
                zap_stat(" End of Topic, Press any Key to Return: ");
                hard_pause();
                zap_stat("  ");
        }
        if (savscra!=NULL) {
                put(sc,sr,savscra,1);
                hfree(savscra);
                savscra = NULL;
        }
        else
                        put_s2("NOT ENOUGH MEMORY TO RESTORE THE SCREEN");
        pcvscp(row,col);
        hlock = 0;              /* Unlock the front door */
}
```

```c
/* SOURCE MODULE FOR MFI CONTROL PROGRAM 48 */
/*   COPYRIGHT(C)1986,1987,1988.  ARRAY ANALYSIS, INC.   */ include         "constant.h"
include         "global.h"

extern  int     anecol;
extern  int     latfac;
int     lndx;
int     clipflag;
int     dskew0,dskew1,minsamp,maxsamp,sampskew,numbanks,numchbnk;

/* Init of legal channel list */
int     lch0[9] = {8, 0, 1, 2, 3, 4, 5, 6, 7};
int     lch1[9] = {8, 0, 1, 2, 3, 4, 5, 6, 7};
/*      Analysis and Display Functions */
int     show_cur();  void write_bit();
/*      These subroutines take binary data     */
/*      and map it to the display.             */ set_np(pgi)   /* returns number of pods per plug-in */
int     pgi;
{
        switch(pgi) {
        case 1:
                return(1);
        case 8: return(6);
        case 6: return (0);
        case 2:
        case 3:
        case 4:
        case 5:
        default:
                return(2);

}
}
set_ncp(pgi)     /* returns number of channels per probe */
int     pgi;
{
        switch(pgi) {
        case 8: return(8);
        case 1:
                return(4);
        case 6: return (0);
        case 2:
        case 3:
        case 4:
        case 5:
        default:
                return(8);
        }
}
set_lch1(x,list,plugin)
int     x;
int     list[];
int     plugin;
{
        int     nc,np;
        int     clock;
    int     latch;

nc = -1;
list[0] = 8;
list[1] = 0;
list[2] = 1;
list[3] = 2;
list[4] = 3;
list[5] = 4;
list[6] = 5;
list[7] = 6;
list[8] = 7;
if (SO_FASTPI == x) clock = SO_CLKCOD;
```

```
else clock = SO_CLKCOD2;
switch (plugin) {
case 1:                         /* dda200 */
        switch (clock) {
        case 0:                 /* 5 ns */
                list[0] = 2;
                list[1] = 1;
                list[2] = 3;
                nc = 2; np = 1;
                break;
        case 1:                 /* 10ns */
                list[0] = 4;
                list[1] = 0;
                list[2] = 1;
                list[3] = 2;
                list[4] = 3;
                nc = 4; np = 1;
                break;
        case 2:                 /* 20 ns */
                list[0] = 4;
                list[1] = 0;
                list[2] = 1;
                list[3] = 2;
                list[4] = 3;
                nc = 8; np = 1;
                break;
        default:
                list[0] = 4;
                list[1] = 0;
                list[2] = 1;
                list[3] = 2;
                list[4] = 3;
                nc = 16; np = 1;
        }
        break;
case 2:                         /* dda50 */
        if ( clock == 2) {      /* 20ns */
                list[0] = 4;
                list[1] = 0;
                list[2] = 2;
                list[3] = 4;
                list[4] = 6;
                nc = 4; np = 2;
        }
        break;
default:                        /* standard list ok for all others */
        break;

}
if (nc != -1) {
        if (x == 1) {
                ncp1 = nc; np1 = np;
        }
        else {
                ncp0 = nc; np0 = np;
        }
}

/*      sprintf(tmpstr,
    "(%d)PLUG=%d CLK=%d list(%d):%d,%d,%d,%d,%d,%d,%d,%d",x,plugin,clock,
list[0],list[1],list[2],list[3],list[4],list[5],list[6],list[7],list[8]);
        putl(tmpstr); hard_pause();*/
}
#define DIGITALSKEW     3
#define ANALOGSKEW      4
void dspinit()                  /* Initialize Display Variables */
{
        int     large0,large1;
        int     i,x,clk,acqcnt;
        gexp = exp0 = exp1 = 1;         /* No expansion effect */
        np0 = set_np(SO_PLUG0); /* number of probes */
        np1 = set_np(SO_PLUG1); /* ditto */
        ncp0 = set_ncp(SO_PLUG0);
```

```
ncp1 = set_ncp(SO_PLUG1);
set_lch1(0,lch0,SO_PLUG0);      /* sets up lch0[] and chks np0,ncp0 */
set_lch1(1,lch1,SO_PLUG1);      /* ditto for plugin 1 */
nc0 = np0 * ncp0;
nc1 = np1 * ncp1;
dskew0 = 0;
acqcnt = 0;
large0 = 0;
if (q.bskewmode==2) for(i=0;i<12;i++) q.bskew[i]=0;
if (SO_PLUG0 == 8 ) {                   /* test for ag48 */
        if (nc0 != 0)                   /* protect for /0 of ep1
                csz0 = pilstart / nc0;  /* possibly unnecessary */
        else
                csz0 = 256;
        dsmin = 0;
        dsmax = csz0 * 8;
        exp0 = 1;
        if (q.bskewmode == 2)           /* automatic mode */
                large0 = setbskew(0,np0,SO_AGMD0);
}
else {
        if (SO_FASTPI == 1)
                csz0 = (1+SO_SAMPSLW)/8;
        else
                csz0 = (1+SO_SAMPFST)/8;
        if (csz0<=0) csz0 = 128;
        dsmin = SO_BADSAMPS;
        dsmax = 1 + SO_DATAEND;
        if (SO_PLUG1 == 8)
                dskew0 = 1;
        exp0 = 1;
}
dskew1 = 0;
large1 = 0;
if (SO_PLUG1 == 8) {    /* test plug in 1 for ag48 */
                        /* no need to test for /0 here */
        if (nc1 != 0) csz1 = (blocksize - pilstart) / nc1;
        else csz1 = 256;
        dsmin1 = 0; dsmax1 = csz1 * 8;
        exp1 = 1;
        if (q.bskewmode == 2)                   /* automatic mode */
                large1 = setbskew(np0,MAXPD1,SO_AGMD1);
}
else {                          /* not 48 channel */
        if (SO_FASTPI == 1)
                csz1 = (1+SO_SAMPFST)/8;
        else
                csz1 = (1+SO_SAMPSLW)/8;
        if (csz1 <= 0) csz1 = 128;
        dsmin1 = SO_BADSAMPS;
        dsmax1 = 1 + SO_DATAEND;
        if (SO_PLUG0 ==8) dskew1 = 1;
        exp1 = 1;
}
if (SO_PLUG0 != 8 && SO_PLUG1 != 8) {           /* both old plugs */
        if (csz0 > csz1) exp1 = csz0 / csz1;
        if (csz1 > csz0) exp0 = csz1 / csz0;
}
else if (SO_PLUG0 != 8 || SO_PLUG1 != 8) { /* one of each */
        if (SO_PLUG0==8) {
                if (csz0/2 < csz1) exp0 = csz1/(csz0/2);
        }
        else {
                if (csz1/2 < csz0) exp1 = csz0/(csz1/2);
        }
}
if (q.bskewmode==2 && SO_PLUG0==8 && SO_PLUG1==8) {     /* adjust skew b
        if (large0 < large1) {
                for (i=0;i<np0;i++) q.bskew[11-i] += large1-large0;
        }
        else if (large1 < large0) {
                for (i=np0;i<MAXPD1;i++) q.bskew[11-i] += large0-large1;
        }
}
```

```
if (dskew0) { dskew0 = csz1*8*exp1 - csz0*8*exp0; }
if (dskew1) { dskew1 = csz0*8*exp0 - csz1*8*exp1; }
mxs = csz0>csz1?csz0:csz1;      /* Largest channel size in bytes */
q.mxbs = mxs * 8;               /* Max bit number for a channel
numchnls = SO_CHNUM;    /* Total number of channels selected*/
if (dsmin < 0 || dsmin > 32) dsmin = 0;
if (dsmax > q.mxbs || dsmax < 1000) dsmax = q.mxbs;
gexp = exp0>exp1?exp0:exp1;
analcnt = 0;
aoffcnt = 0;
for( i=0; i<MAXPD1, i++) {
        if (SO_PODDT[i] != 0) {
                aoffcnt++;
                if (SO_PODDT[i] == 1) analcnt++;         /* Analog on cou
        }
} if (SO_PLUG0==8) {
        i = q.mxbs - SO_TRGDLY;
        if (q.trgskewmode == 2) {
                x = 4;
                        if (SO_MCK0 <= 3) {              /* 40ns clock or less */
                                x = 5;
                                if (SO_TSCLK==0 && SO_AGMD0 == 1)        /* DATA,
                                        x = 4;
                        }
                        else if (SO_TSCLK == 0) {
                                if (SO_MCK0 == 4 || SO_MCK0 == 5)        /* 100ns
                                        x = 3;
                        }
                        q.trgskew = x;
                }
                if (q.trgskewmode > 0) i -= q.trgskew;   /* apply factor */
                SO_DTRIG = abs(i);
                SO_NEGTRIG = i<0?1:0;
        } clines = 16; alines = 0;
        if (analcnt == MAXPD1) { clines = 0; alines = 16; }
        else
        if (analcnt > 0) {
                switch (SO_ANSIZ) {
                case 0: clines = 16; alines = 0; break;
                case 1: clines = 8; alines = 8; break;
                case 2: clines = 4; alines = 12; break;
                case 3: clines = 0; alines = 16;break;
                }
        }
        clim = clines * pxprow / q.vsw;
        alim = alines * pxprow / q.vsw;
        if (numchnls <= clim) {
                voffset = 0;
        }
        else
        if (voffset > numchnls - clim)
                voffset = numchnls - clim;
        while ((rowlen = (nodcols*pxpcol/q.hsw)*q.compress) > dsmax-dsmin)
                q.compress--;
        if (dspoff + rowlen >= dsmax) dspoff = dsmax-rowlen;
        init_chan(0);
/* diagnostic msg */
/*      sprintf(tmpstr,
        "CSZ(%d,%d) NP(%d,%d) NCP(%d,%d) NC(%d,%d) MIN(%d) MAX(%d) LCH(%d,%d)",
        csz0,csz1,np0,np1,ncp0,ncp1,nc0,nc1,dsmin,dsmax,lch0[0],lch1[0]);
        put_s2(tmpstr); */
}
/* returns the largest skew encountered, will be four or three */
setbskew(start,stop,mode)
int     start,stop,mode;
{
        int     i,x,largest,digskw;
        largest = 0;
        digskw = DIGITALSKEW;
```

```
        if (mode == 1) digskw += 1;      /* add 1 if clocked */
        for (i=start; i<stop; i++) {/* compute the largest factor */
                x = 0;                                    /* temporary factor */
                if(SO_AGIO[11-i] == 0) { /* acquisition mode, find largest skew
                        if (SO_PODDT[i] == 0)    /* digital bank */
                                x = digskw;
                        else x = ANALOGSKEW;
                } if (x>largest) largest=x;                 /* y gets largest value
        }
        for (i=start; i<stop; i++) {
                x = 0;                         /* no skew for generation banks
                if (SO_AGIO[11-i] == 0) {      /* test for acquisition */
                        if (SO_PODDT[i] == 0)
                                x = digskw;
                        else x = ANALOGSKEW;
                }
                q.bskew[11-i] = largest - x;
        }
        return(largest);
}
init_chan(x)            /* Set exp. factor and channel size for a channel */
int     x;
{
        if (x >= numchnls)             /* channels selected for display */
                return(-1);
        cpdn = SO_CHLST[x*2];          /* get pod for this position */
        cchn = SO_CHLST[x*2 + 1];
        cnv_raw();       /* find cchn in real list */
        setoffset(cpdn);               /* set globals for specific bank */
        return(0);
} find_chn(pod,chan)      /* Return position of raw channel in channel list */
int     pod,chan;
{
        char    *s;
        int     x = 0;
        s = SO_CHLST;
        while (x < SO_CHNUM) {
                if (*s == pod && *(s+1) == chan)
                        return(x);
                else
                if (*s == 0xff) break;
                x++;
                s += 2;
        }
        return(-1);
} cnv_raw()       /* Returns raw channel number, 0-7, index in   */
{
        int     i;
        if (cpdn < 0) return(0xff);
        if (cpdn < np0 ) {      /* Plugin and validity */
                for(i=1;i<=lch0[0];i++) /* convert to physical index */
                        if ( lch0[i] == cchn ) {
                                rchn = i - 1; /* raw channel number */
                                break;
                        }
                if (SO_LATCH0 == 2) rchn = cchn + 1;
                else
                if (SO_LATCH0 == 1) rchn = cchn;
        }
        else
        if (cpdn >= np0 && (cpdn) < np0 + np1) {
                for (i=1;i<=lch1[0];i++)
                        if (lch1[i] == cchn) {
```

```c
                                rchn = i - 1;
                                break;
                        }
                        if (SO_LATCH1 == 2)   rchn = cchn + 1;
                        else
                        if (SO_LATCH1 == 1)   rchn = cchn;
                }
                else
                        return(-1);

if (cpdn < np0) {                       /* plugin 0 */
                        cndx = rchn + (cpdn * ncp0);
                }
                else {                                  /* plugin 1 */
                        cndx = rchn + nc0 + ( (cpdn-np0) * ncp1);
                }
                lndx = cpdn * 8 + cchn;
                return(rchn);
}
void cnv_pdc(raw)
int     raw;
{
        rchn = raw;
        if (raw < nc0) {
                if (ncp0 = 0) {                 /* protect against /0 */
                        cpdn = 0;
                        cchn = 0;
                }
                else {
                        cpdn = raw / ncp0;
                        cchn = raw % ncp0;
                }
        }
        else {
                if (raw < nc0 + nc1) {
                        raw -= nc0;
                        if (ncp1 = 0) {         /* protect against /0 */
                                cpdn = 0;
                                cchn = 0;
                        }
                        else {
                                cpdn = np0 + raw / ncp1;
                                cchn = raw % ncp1;
                        }
                }
        }
}
rl2(x,v)
int     x,v;
{
        hpxo = coloff*pxpcol;                           /* Leftmost pixel of display err
        vpxo = boxrows*pxprow + x * v + topbrdr;        /* Topmost pixel of disp
}
clear_anal()
{
        rl2(clines,pxprow);
        grrtulc(hpxo-tpxcol,vpxo,(rowlen/q.compress)*q.hsw+2*tpxcol,
                2+alines*pxprow,q.battr); /*clear */
}
/* clear screen one pixel higher */
show_anal(buf,flg,flg2,flg3)
char    *buf;
int     flg,flg2,flg3;          /* flg(0=clear;1=noclear),flg2(1=xor attr)*/
{                               /* flg3(0=normal,1=q.battr,2=q.gattr */
        unsigned        i;
        if (analcnt > 0) {
                if (flg == 0) { /* test clear screen flag */
                        clear_anal();
                }
                for (i=0;i<MAXPD1;i++) {
                        sa_one(i,buf,highsrc,flg2,flg3);
                }
        }
        return(0);
}
```

```
setoffset(bank)     /*call with bank no. returns byte offset to it */
int     bank;           /* sets globals for slected bank */
{
        offset = 0;
        if (bank < MAXPD0) {
                offset = bank*ncp0*csz0;
                banksize = csz0*ncp0;
                chnsize = csz0;         /* bytes per channel */
                minsamp = dsmin;
                maxsamp = dsmax;
                sampskew = dskew0;
                expansion = exp0;
                numbanks = np0;
                numchbnk = ncp0;
        }
        else if (bank < MAXPD1) {
                offset = pilstart + (bank-np0)*ncp1*csz1;
                banksize = csz1*ncp1;
                chnsize = csz1;         /* bytes per channel */
                minsamp = dsmin1;
                maxsamp = dsmax1;
                sampskew = dskew1;
                expansion = exp1;
                numbanks = np1;
                numchbnk = ncp1;
        }
        bankskew = 0;
        if (q.bskewmode > 0) {
                bankskew = q.bskew[11-bank];
                sampskew += q.bskew[11-bank];
        }
        return(offset);
}
sa_init(i,scrof)        /* sets offset to current screen start(dspoff) */
int     i;
int     scrof;          /* sample offset from dspoff */
{
        rl2(clim,q.vsw);                /* comput pixel orientation */
        somin = vpxo;
        somax = somin + alim*q.vsw;
        amax = alim*q.vsw / 2;
        zline = vpxo + amax - (int)((long)q.gbaoff*(long)q.glbscale/100L);
        hxpos = hpxo + (scrof/q.compress)*q.hsw*expansion;
        setoffset(i);           /* sets vars & offset to start of channel */
        attr = q.analatr[i];

aoff = SO_ANOFF[i].xxx[1];
        if (SO_ANOFF[i].xxx[0]==1)      aoff *= -1;
        ascale = achscale[i];           /* vertical compression */
        if (ascale <= 0 || ascale >500){
                ascale = 100;
                achscale[i] = ascale;
        }
        if ((dspoff+scrof)-sampskew >= 0) {
                offset += ((dspoff+scrof)-sampskew) / expansion;
                return(1);
        }
        else return(0);
}
sa_px(c)                        /* source value from buffer 0 - 255 */
unsigned char   c;
{
        int     x;
        x = (int)c - 128;
        x = (int)( ( (long)x * (long)ascale / 100L + (long)aoff ) *
                (long)q.glbscale / 100L );
        x = zline - x;
        if (x < somin) { if (clipflag<2)clipflag++; return(somin);}
        if (x > somax) { if (clipflag<2)clipflag++; return(somax);}
        clipflag = 0;
        return(x);
}
sa_piece(i,s,flg)       /* write one small piece for editing analog */
int     i;
```

```
unsigned char   *s;         /* ignored, assumed to be equal to tmpsave */
int     flg;
{
        int     atr,x,y,z;
        unsigned char   *src;
        if (!sa_init(i,((anecol/q.hsw)*q.compress)/expansion)) return(0);
        src = tmpsave + offset;         /* determine source address */
        if (flg==1) atr=q.battr; else atr = attr;
        x = sa_px(*(src-1));            /* previous value */
        base[0] = x; base[1]=hxpos-q.hsw*expansion;
        y = sa_px(*src);                /* current value */
        grmove(hxpos,y,atr);
        z = sa_px(*(src+1));    /* erase wave */
        grmove(hxpos+q.hsw*expansion,z,atr);
        return(1);
}

/* Routine modified to begin analog display at proper position */ sa_one(i,src,hsrc,flg2,flg3)    /* show one analog channel */
int     i;
unsigned char   *src,*hsrc;
int     flg2;
int     flg3;               /* 1 = battr, 2 = gattr */
{
        int     x,atr,e;
        unsigned        j,k;

if(SO_PODDT[i] == 1) {  /* test for analog on */
                for(j = 0; !sa_init(i,j); j++)
                        if (j >= rowlen/expansion) return(0);
/* Check here to see if we are in the right window yet */
                if (dspoff + rowlen <= sampskew)
                        return (0);

/* If we are in the right window, adjust offset, horiz pos, and display
   count for special situation of a partial display */
                if (dspoff < sampskew) {
                        offset += sampskew - dspoff;
                        hxpos += ((sampskew - dspoff)/q.compress)*q.hsw*expansio
                        j = sampskew - dspoff;
                }
                src += offset;
                if (hsrc != NULL)
                        hsrc += offset;
                if (flg3 == 1)
                        attr = q.battr;
                else if (flg3 == 2)
                        attr = q.gattr;
                for (x=0,k=0;k<q.compress;k++) x += sa_px(*src++);
                x /= q.compress;
                j += q.compress;
                base[0] = x;
                base[1] = hxpos;
                hxpos -= q.hsw * (dspoff % expansion);  /* is there some scrap *
                for (; j <= rowlen/expansion; ) {
                        hxpos += q.hsw*expansion;
                        for (x=0,k=0;k<q.compress;k++) x += sa_px(*src++);
                        x /= q.compress;
                        j += q.compress;
                        e = 0;
                        atr = attr;
                        if (hsrc!= NULL && flg3 == 0) {
                                for (k=0; k<q.compress; k++)
                                if (*hsrc++ != 0 ) {
                                        atr = q.eattr;
                                        e = 1;
                                }
                        }
                        if (clipflag == 0 || clipflag == 1)
                                drmove(hxpos,x,atr,e);
```

```c
                        if (clipflag == 2) {
                                base[0] = x;
                                base[1] = hxpos;
                        }
                }
        }
}
dspcheck()
{
        if (dspstate == 0) {
                do_disp('D');
                display(tmpsave);
        }
        else
        if (dspclean == 0) {
                display(tmpsave);
        }
}
display(src)
char    *src;
{
        if (dspstate == 0||inhbflg == 1 || brieftestactive == 1) return(-1);
        dspinit();
        dispgen(src,1);
        dspclean = 1;
}
dispgen(src,flg)
char    *src;
int     flg;
{
        char    *p,c;
        int     x,y,cyc;
        unsigned k;
        if (dspmode == 0) {
                if (flg == 1) shwlabel(0);
                rl2(0,q.vsw);                   /* locate left lower pixel */
                grrtulc(hpxo-tpxcol,vpxo,
                        nodcols*pxpcol+2*tpxcol,2+clines*pxprow,q.battr);
                rl2(1,q.vsw);
                vpxo -= 1;                      /* locate left lower pix
                for (x = 0; x < clim; x++) {
                        y = paintchn(x,src);
                }
                if (analcnt == 0) paintchn(clim,NULL,0);
                show_mrk();             /* Highlight marked area */
                show_tick();
                if (analcnt > 0) clear_anal();
                show_cur(HO_SC1,'1',1);
                show_cur(HO_SC2,'2',1);
                x = SO_DTRIG;
                if (SO_NEGTRIG == 1) x *= -1;
                show_cur(x,'T',1);
                c = HO_AC1;
                k = c & 0x00ff;
                show_cur(k,'3',1);
                c = HO_AC2;
                k = c & 0x00ff;
                show_cur(k,'4',1);
                if (analcnt > 0 && alim > 0) {
                        if (bandflag == 1) {
                                show_anal(maskbuf,1,1,2);
                                show_anal(tolbuf,1,1,2);
                                show_anal(src,1,0,0);
                        }
                        else    show_anal(src,1,0,0);
                }
        }
        else {                          /* hex display */
                rl2(0,q.vsw);                   /* locate left lower pixel */
                grrtulc(hpxo-tpxcol,vpxo,
                        nodcols*pxpcol+2*tpxcol,nodrows*pxprow,q.battr);
                cyc = dspoff;
                if ( cyc + nodrows*nohgrps > dsmax )
```

```
                cyc = dsmax - nodrows*nohgrps;
        for (x = 0; x<nohgrps; x++) {
                p = (char *) (wxbuf + 80 + x*20);
                sample(p,src,cyc,nodrows);
                cyc += nodrows;
        }
        dspwx(1,18);
        }
}
unsigned caloff(x)          /* return byte offset to channel x ( 0 .. 31 ) */
int     x;                  /* true channel index set by init_chan */
{
        unsigned    a;

if (x < nc0) {              /* in the first block */
                a = x * csz0;       /* byte offset to beginning of channel */
        }
        else {
                a = nc0*csz0 + (x-nc0)*csz1;
        }
        return(a);
}
static  tbshift=-1;

void    set_strt(s,dx)              /* set pointer to first word */
char    *s;                         /* set correct bit in bitpos */
int     dx;                         /* put first word in holding variable */
{
        int     d;
        dx -= sampskew;             /* # of non - existent samples */
        if (dx < 0) dx = 0;
        d = dx / expansion;         /* hard samples */
        dstart = s + caloff(cndx) + d/8;
        bitpos = 0x0080 >> d%8;
        holding = *dstart;
        tbshift = expansion - dx%expansion;
}
test_bit()
{
        int     result;

result = 0;
        if ((bitpos & holding) != 0) result = 1;

if (--tbshift == 0) {
                tbshift = expansion;
                bitpos >>= 1;
                if (bitpos == 0) {
                        bitpos = 0x0080;
                        dstart++;
                        holding = *dstart;
                }
        }
        return(result);
}
prev_bit()
{
        if (tbshift < expansion) tbshift++;
        else
        if(bitpos < 0x0080) {
                bitpos <<= 1;
                tbshift = 1;
        }
        else {
                dstart--;
                tbshift = 1;
                bitpos = 0x0001;
                holding = *dstart;
        }
}
void write_bit(b)
int     b;
{
```

```c
            int     i;
            for (i=0; i<q.compress; i++) {
                    if (b == 0)
                            *dstart &= (bitpos ^ 0x00ff);
                    else {
                            *dstart |= bitpos;
                            holding = *dstart;
                    }
                    test_bit();
            }
}
paintchn(x,src)         /* first channel = 0 */
int     x;
char    *src;
{
            int     lastbit = 0,tmpoff,tmpshift;
            int     mx,i,j,k,y,atr,z,e;
            int     *dstx,*dsty,*stx,*sty;
            unsigned        count = 0,count2;
            rl2(x+1,q.vsw);                 /* locate left lower pixel */
            vpxo -= 1;
            if (src == NULL) return(-1);
            y = init_chan(x+voffset);       /* set channel variables */
            if (y < 0 || dspoff+rowlen <= sampskew) {  /* off screen */
                    return(y);
            }
            if (dspoff < sampskew ) {
                    tmpshift = sampskew - dspoff;
            }
            else {
                    tmpshift = 0;
            }
            set_strt(src,dspoff);
            if (dspoff > dsmin+sampskew) {
                    prev_bit();
                    lastbit = test_bit();
            }
            else {
                    lastbit = test_bit();
                    prev_bit();
            }
            if (lastbit==1) vpxo -= vsh;
            hpxo += (tmpshift/q.compress)*q.hsw;/* adjust for skewed bufer size */
            stx = dstx = drawbuf;   /* buffer space in memory */
            sty = dsty = drawbuf + dbmax/2;
            *dstx++ = hpxo;
            *dsty++ = vpxo;         /* assumed low coordinates */
            count = 1;
            mx = rowlen;
            if ( q.mxbs - dspoff < mx)
                    mx = (q.mxbs - dspoff);
            for (i=tmpshift; i<mx;i += j ) {
                    for (k=0,j=0; j<q.compress; j++) {
                            if (bitpos & *dstart) k += 1;
                            if (--tbshift == 0) {
                                    tbshift = expansion;
                                    bitpos >>= 1;
                                    if (bitpos == 0) {
                                            bitpos = 0x0080;
                                            dstart++;
                                    }
                            }
                    }
            if (k == q.compress) k = 1;     /* all samples are high */
            else  if (k > 0) k = 1 ^ lastbit;
            if (k != 0) {           /* bit is high */
                    if (lastbit == 0) {             /* transit to high */
                            lastbit = 1;
                            *dstx++ = hpxo; /* last point of low run */
                            *dsty++ = vpxo;
                            vpxo -= vsh;
                            *dstx++ = hpxo; /* create rising edge */
```

```
                                *dsty++ = vpxo;
                                count += 2;              /* one more side */
                        }
                }
                else {                   /* bit is low */
                        if (lastbit == 1) {
                                lastbit = 0;
                                *dstx++ = hpxo;
                                *dsty++ = vpxo;
                                vpxo += vsh;
                                *dstx++ = hpxo;
                                *dsty++ = vpxo;
                                count += 2;              /* one more side */
                        }
                }
                hpxo += q.hsw;
        }                                /* for loop */
        *dstx++ = hpxo;                  /* set the final point */
        *dsty++ = vpxo;
        count++;
        if (highsrc == NULL)             /* no highlighting */
                grshape(stx,sty,count,q.nattr);
        else {
                rl2(x+1,q.vsw);          /* locate left lower pixel */
                vpxo -= 1;
                hpxo += tmpshift * q.hsw;        /* adjust for skewed buf */
                dstx = stx; dsty = sty;
                base[0] = *dsty++; base[1] = *dstx++;   /* library base */
                lastbit = 0;
                set_strt(highsrc,dspoff);
                hpxo += q.hsw;
                z = test_bit();
                i = 0;
                count2 = 1;
                while(i < mx && count2<count) {
                        if (z!=0) { atr=q.eattr; e = 1; }
                        else { atr = q.nattr; e = 0; }
                        if (*dstx < hpxo) {
                                count2++;
                                grmove(*dstx++,*dsty++,atr);
                        }
                        else {
                                if (*dstx == hpxo) {
                                        count2++;
                                        drmove(*dstx++,*dsty++,atr,e);
                                        hpxo += q.hsw;
                                }
                                else
                                if ( *dstx > hpxo) {     /* prior to current poin
/* draw to here */                      drmove(hpxo,*dsty,atr,e);
                                        hpxo += q.hsw;   /* next edge */
                                }
                                for (z=0,j=i; i < j+q.compress; i++) {
                                        if (bitpos & *dstart) z += 1;
                                        if (--tbshift == 0) {
                                                tbshift = expansion;
                                                bitpos >>= 1;
                                                if (bitpos == 0) {
                                                        bitpos = 0x0080;
                                                        dstart++;
                                                }
                                        }
                                }
                        }
                }
        }
        return(0);
}
drmove(x,y,color,err)
int    x,y,color,err;
{
        if (q.videomd != 20 || err == 0)         /* not hercules */
                grmove(x,y,color);
```

```
                else {
                        grdotb(base[1],base[0],x,y,color);
                        base[1] = x;
                        base[0] = y;
                }
}
show_cur(cur,tag,flg)
int     cur;            /* value of the display cursor */
char    tag;            /* cursor label */
int     flg;            /* 0 - Erase cursor; 1 - Display cursor */
                        /* 2 - print cursor label only */
{
        int     x,row,col,atr;
        int     dstx1,dsty1,dstx2,dsty2;
        char    lab[4];
        int     r,c;
        lab[0] = ' '; lab[1] = 0;
        pcvgcp(&r,&c);
        sa_init(0,0);
        dstx1 = -1;
        if (tag == '3' || tag=='4') {
                if(analcnt > 0) {
                        x = cur - 128;
                        x = (int)( (long)x * (long)q.glbscale / 100L );
                        x = zline - x;
                        if (x <= somin || x >= somax) {
                                dstx1 = -1;
                        }
                        else {
                                dsty1 = x;
                                dsty2 = dsty1;
                                dstx1 = hpxo;
                                dstx2 = dstx1 + nodcols*pxpcol;
                                row = dsty1+tpxrow/2;
                                col = 2 + dstx1 - pxpcol;
                        }
                }
        }
        else {
                x = (cur - dspoff);
                if (x >= 0 && x < rowlen) {
                        dstx1 = hpxo + x/q.compress*q.hsw;
                        dsty1 = boxrows*pxprow + topbrdr;
                        dstx2 = dstx1;
                        dsty2 = dsty1 + (alim + clim) * q.vsw;
                        row = dsty1;
                        col = dstx1-2;
                }
        }
        if (dstx1 != -1) {
                typedot(1);             /* turn on XOR */
                if (flg != 0)
                        lab[0] = tag;
                if (flg != 2) {
                    if (tag == 'T'){
                                atr = q.tattr ^ q.battr;
                                grdotb(dstx1,dsty1,dstx1,dsty2,atr);
                    }
                    else {
                        atr = q.cattr ^ q.battr;
                        grline(dstx1,dsty1,dstx2,dsty2,atr);
                    }
                }
                typedot(0);             /* back to normal */ grrtllc(col,row+1,tpxcol-3,tpxrow-1,q.battr);
                fontsprt(0,lab,col,row,0,q.cattr,0);
        }
        pcvscp(r,c);
        return(dstx1);                  /* -1 if out of range */
}
void    draw_pulse(x,y,b,f,le,re)
int     x,              /* horizontal pixel coordinate */
        y,              /* vertical pixel coordinate */
```

```
                b,              /* bit value to draw 0 = low, 1 = high */
                f,              /* flag 0 = not marked; 1 = marked area */
                le,             /* left edge flag */
                re;             /* right edge flag */
{
        int     natr,batr;
        natr = q.nattr;
        batr = q.battr;
        if (f) {                                /* modify attributes for marked */
                natr ^= 0x0f;
                batr ^= 0x0f;
        }
        typedot(0);
        grline(x,y-1,x,1+y-vsh,batr);                                           /*erase
        grline(x+q.hsw,y-1,x+q.hsw,y-vsh,batr);         /* erase right */
        if (b == 0) {
                grline(x,y-vsh,x+q.hsw*expansion,y-vsh,batr);   /* erase high */
                grline(x,y,x+q.hsw*expansion,y,natr);                   /* write
        }
        else {
                grline(x,y,x+q.hsw*expansion,y,batr);           /* erase
                grline(x,y-vsh,x+q.hsw*expansion,y-vsh,natr);   /* write high */
        }
        if (le) grline(x,y,x,y-vsh,natr);                                       /*draw l
        if (re) grline(x+q.hsw,y,x+q.hsw,y-vsh,natr);   /* draw right edge */
}
bit_change(b,src,bitnum)
int     b;
char    *src;
unsigned        bitnum;
{
        int     i,j,marked,le,re,prev,curr,comi;
        int     prjig,cujig,cojig;
        int     count;
        unsigned        tmpnum, tmprow;
        wve_cur(-1,0);                          /* erase wave edit cursor */
        count = q.compress;
        tmprow = ecrow + voffset;
        init_chan(tmprow);                      /* initialize channel dep. vars. */
        tmpnum = bitnum + eccol*q.compress;
        tmpnum -= (tmpnum % expansion);  /* adjust to bitnum boundary */
        if(tmpnum < sampskew) return(0);/* not on screen for this channel */
        marked = 0;                                                             /* default to no
        if (tmpnum>=smkx && tmpnum<=emkx && tmprow>=smky && tmprow<=emky)
                marked = 1;
        set_strt(src,tmpnum-count);
        if (tmpnum - count >= dsmin) {          /* sample prev bit(s) */
                set_strt(src,tmpnum-count);
                prev = test_bit();
                for (prjig = 0,i=1; i<count; i++) {
                        j = test_bit();
                        if (j != prev) prjig++;
                }
        }
        else prev = -1;
        if (tmpnum+count <= dsmax) {
                set_strt(src,tmpnum+count);
                comi = test_bit();
                for (cojig=0,i=1;i<count; i++) {
                        j = test_bit();
                        if (j != comi) cojig++;
                }
        }
        else comi = -1;
        set_strt(src,tmpnum);
        rl2(1+ecrow,q.vsw);                     /* sets hpxo and vpxo */
        vpxo -= 1;
        hpxo += eccol*q.hsw;    /* point to sample */
        typedot(0);
        if ( 1 ) {      /* new bit is different from old */
                write_bit(b);
                le = ( prev != -1 && prev != b && prjig == 0 );
                re = ( comi != -1 && comi != b && cojig == 0 );
                draw_pulse(hpxo,vpxo,b,marked,le,re);
```

```
                }
                typedot(0);
        }
sample(dst,src,cycle,cnt)               /* puts ascii chars of hex bytes at dst */
char    *dst;
char    *src;
int     cycle;
int     cnt;                    /* number of samples on a line */
{
        unsigned char   *d,tstr[32];
        unsigned char   *st,*hst;
        unsigned int    bp,db,e,s,n,x,t,hf,prb,pf,cf;
        for (t=0; t<cnt&&t<nodrows;t++) {        /* loop for col of samples */
                d = dst+6+(nc0+nc1)/4 + np0 + np1;
                sprintf(tstr,"%6d",cycle);
                fstd(dst,tstr,q.hattr);         /* label sample */
                *d-- = ' ';
                for (prb = 0; prb < np0+np1; prb++) {    /* for plugins 0 and 1 *
                        setoffset(prb);
                        s = chnsize;
                        n = numchbnk;
                        hf = 0;
                        hst = NULL;
                        pf = offset;
                        cf = cycle/expansion;
                        if (SO_PODDT[prb] != 0) { /* Analog Data */
                                if (highsrc != NULL)
                                        hst = highsrc + pf + cf;
                                st = src + pf + cf;
                                e = *st % 16;
                                *d-- = e + (e>9?0x37:0x30);
                                e = *st / 16;
                                *d = e + (e>9?0x37:0x30);
                                if (hst != NULL) {
                                        if (*hst != 0) {
                                                *(d+1) |= 0x80;
                                                *d |= 0x80;
                                        }
                                }
                                d--;
                        }
                        else {
                                e = 0;
                                db = 1;
                                bp = 0x80 >> cf%8;
                                if (highsrc != NULL)
                                        hst = highsrc + pf + cf / 8;
                                st = src + pf + cf / 8;
                                for (x=0; x<n; x++) {
                                        if (*st & bp) e |= db;
                                        if (hst != NULL) {
                                                hf |= *hst & bp;
                                                hst += s;
                                        }
                                        if (db == 0x08) {
                                                db = 1;
                                                *d = e + (e>9?0x37:0x30);
                                                if (hf != 0) {
                                                        *d |= 0x80;
                                                        hf = 0;
                                                }
                                                d--;
                                                e = 0;
                                        }
                                        else    db <<= 1;
                                        st += s;
                                }
                        }
                        *d-- = ' ';
                }
                while (d >= dst+6) {    /* fill to left with spaces */
                        *d-- = ' ';
                }
                cycle++;
                dst += linesize;
```

```
                }
                return(nc0+nc1);
}
void    stuf_sample(c,dst)          /* Write One Nibble back to buffer */
int     c;                          /* The Nibble */
char    *dst;                       /* Beginning of Buffer */
{
        int             bit,chan,cs,prb,e,x;
        int             fax;        /* low for low order nibble, 1 for high nibble *
        unsigned        bmask, smask;
        char            *d;
        d = dst;
        chan = 4 * hexpos;          /* Start of nibble */
        if (chan < nc0) {
                cs = csz0; e = exp0;
                prb = chan / ncp0;
                fax = hexpos % 2;
                d += chan * cs;                 /* beginning of 1st channel */
        }
        else {
                cs = csz1; e = exp1;
                prb = nc0/ncp0 + (chan-nc0)/ncp1;
                fax = hexpos % 2;
                d += nc0*csz0 + (chan-nc0) * cs;
        }
        bit = (dspoff + hexgrp * nodrows + ecrow)/e;    /* sample number */
        if (SO_PODDT[prb] != 0) {
                d = dst + prb*banksize + bit;
                x = *d;
                if (fax == 0) x = (*d & 0xf0) | c;
                else if (fax == 1)
                        x = c*16 + (*d & 0x0f);
                *d = x;
        }
        else {
                bmask = 0x80 >> bit % 8;
                d += bit / 8;
                for (smask = 1; smask < 0x10; smask <<= 1) {
                        if (c & smask)
                                *d |= bmask;
                        else
                                *d &= bmask ^ 0xffff;
                        d += cs;
                }
        }
}
copy_seg()              /* Copies segment from smkx thru emkx to dmkx */
{                       /* Source buffer = mksrc, Dest. = tmpsave */
        int     len;
        int     i,x,y;
        char    *s,*d;
        int     smask,dmask;

for (x = smky,y = dmky; x <= emky && y < numchnls; x++,y++) {
                init_chan(x);
                len     = (emkx - smkx) + expansion;
                if (len > dsmax - dmkx) len = dsmax - dmkx;
                len /= expansion;
                s = mrksrc + caloff(cndx) + (smkx/expansion) / 8;
                smask = 0x0080 >> (smkx/expansion) % 8;
                init_chan(y);
                d = tmpsave + caloff(cndx) + (dmkx/expansion) / 8;
                dmask = 0x0080 >> (dmkx/expansion) % 8;
                for (i=0; i < len; i++) {
                        if (*s & smask)         /* test bit */
                                *d |= dmask;    /* set dest on high */
                        else
                                *d &= dmask ^ 0xffff;   /* clear bit if low */
                        if (dmask > 0x01)       /* move dest bit mask */
                                dmask >>= 1;
                        else {
                                dmask = 0x80;
                                d++;
                        }
```

```
                    if (smask > 0x01)           /* move source bit mask */
                            smask >>= 1;
                    else {
                            smask = 0x80;
                            s++;
                    }
                }
        }
        return(len*expansion);
}
show_mrk()
{
        int     x;
        int     sx,ex,sy,ey;
        if (mrksrc != tmpsave || hidemrk == 1 || editmode == 0 ||
                inhbflg==1 || smkx == -1 || emkx == -1) return(0);
        init_chan(smky);                        /* start mark y */
        sx = smkx - dspoff;                     /* start mark x offset */
        if (sx < 0) sx = 0;
        else if (sx > rowlen) return(0);        /* off the screen */
        sy = smky - voffset;                    /* start mark y offset */
        if (sy < 0)     sy = 0;                 /* starts before left edge */
        else if (sy >= clim) return(0);         /* starts offscreen */ init_chan(emky);
        ex = expansion-1+emkx - dspoff;         /* end mark x offset */
        if (ex < 0)     return(0);              /* invalid */
        else
        if (ex >= rowlen) ex = rowlen - 1;      /* goes beyond left edge */
        ey = emky - voffset;                    /* end mark y offset */
        if (ey < 0)     return(0);
        else
        if (ey >= clim) ey = clim - 1;
        if (sx > ex ){  /* Ensure proper relation */
                x = ex;
                ex = sx;
                sx = x;
        }
        if (sy > ey) {
                x = ey;
                ey = sy;
                sy = x;
        }
        wve_cur(-1,0);            /* erase editing cursor */
        typedot(1);
        grrtulc(coloff*pxpcol + sx*q.hsw/q.compress - 1,          /* start x */
                2+boxrows*pxprow+(1+sy)*q.vsw,                    /* start
                (1+ex-sx)*q.hsw/q.compress,
                (1+ey-sy)*q.vsw-1,0x0f);
        typedot(0);
        wve_cur(ecrow,eccol);
}
set_chan()
{
        if (voffset + clim <= nhchn)    /* is channel now visible */
                voffset = nhchn - clim + 1;/* adjust channel view */
        else if (nhchn < voffset)
                voffset = nhchn;
        else    return(0);              /* no change */
        return(1);                      /* voffset changed */
} void one_cell(v)                /* generate count value for one period */
long    v;
{
        unsigned long    sm,tx;
        int     gl2;
        unsigned dm,gs2;
        char            *d;
        int             j,k;
        sm = 0x01L;
```

```
        if (gstart == -1) {
                gstart = smkx;   /* convert from dsp to actual*/
                init_chan(emky);
                glen = 1 + emkx + (expansion-1) - smkx;
        }
        if (gstart + glen > dsmax) glen = dsmax - gstart;
        for (j = smky; j <= emky; j++) {
                init_chan(j);
                gs2 = gstart; gl2 = glen;
                if (sampskew > 0 ) {
                        if (sampskew >= gstart+glen) continue;
                        if (sampskew > gstart) {
                                gs2 = 0; gl2 = glen - (sampskew - gstart);
                        }
                        else gs2 = gstart - sampskew;
                }
                d = mrksrc + caloff(cndx) + gs2/8/expansion;    /*byte offset*/
                dm = 0x80 >> (gs2/expansion) % 8;

tx = gvalue & sm;      /* is this bit high */
                if (tx != 0L) {
                        for(k=0;k<gl2/expansion;k++){
                                *d |= dm;
                                if(dm==1) {
                                        dm = 0x80;
                                        d++;
                                }
                                else dm >>= 1;
                        }
                }
                else {
                        for(k=0;k<gl2/expansion;k++){
                                *d &= dm ^0xffff;
                                if (dm==1) {
                                        dm = 0x80;
                                        d++;
                                }
                                else
                                        dm >>= 1;
                        }
                }
                if (sm < 0x80000000L) sm *= 2L;
                else sm = 0x01L;
        }
        gstart += glen;
    }
}
unsigned scan_buf(src)                      /* Returns the High Bit Count */
unsigned int    *src;
{
        unsigned        count;
        unsigned        c,d;
        unsigned        x;
        count = blocksize/2;
        x = 0;
        do {
                if ((d = *src++) != 0) {               /* zero is zero */
                        if (d == 0xffff) x += 16;
                        else
                                for (c=0x8000; c>0; c >>= 1)
                                        if (c & d)        /* test for */
                                                x++;       /* and count highs */
                }
        } while (--count);
        return(x);
}
        /* COMMON SOURCE MODULE FOR MFI CONTROL PROGRAM 2 and 48 */
/*   COPYRIGHT(C)1988.  ARRAY ANALYSIS, INC.    */
/* DIAGNOSE.C: version.h determines conditional source for MCP2 or MCP-AG48 */ include "constant.h"
include "global.h"
#include "malloc.h"
#include "diagnose.h"             /* local structures */
```

```
extern  char    vlxs[],datline[];
char    *cpyrghtf[] ={
        {" EXPERTEST   CONTROL PROGRAM              ARRAY   ANALYSIS, INC"},
        datline,
        {"  Copyright (c)1987,1988,1989              Ithaca, NY 14850"},
        vlxs,
        0 };
extern  char    fdmtitle[];
#define         OBBUFR          10
/* ALways change file dumydiag to keep up with Versions and Dates */
/* MCP2 Mods */ char    *fdm_form[] = {
{"B)est Match          D)elete Fault       R)eplace Fault       N)ew Fault  "},
{"C)hange Diagnosis    E)xamine Fault      Q)uery On Fault      S)how Next  "},
{"F)ind Diagnosis      L)ist Fault         O)ption Selection    T)est Again "},
{"                     I)nclude Fault                           ESC)ape     "},
{"      {0}
};
char    *fdopt_form[] = {
{"--------------- FAULT   DIAGNOSIS   OPTIONS --------------"},
{"A)utonomous Check    N)umber of Matches         W)eight for First Fault"},
{"C)heck for Shorts    S)ize of Fault Window      X)Save Options and EXit"},
{"F)ault Status Line   T)ype of Fault Storage     ESC)ape to Exit        "},
{0}
};
int     archfile;
char    archname[65];
char    faultnam[65];
int     faultfile;
char    *tfb = NULL;
float   *fom = NULL;
float   *fom2 = NULL;
int     ffon = true;
int     ffspan = 8;       /* defaults to off */
int     ffweight = 50;
int     ffdebug = 0;
int     fdi = 0;
float   mf2;
OBC     curobs;           /* holds structure from archive file */
OBC     whlobs;           /* holds secondary abstract */
                          /* holds recent abstraction */ float weight_match(index)
int     index;
{
        float tmv;
        if (fom2[index] != -1.0) {
                tmv = fom2[index] * (float)ffweight;
                tmv += fom[index] * (float)(100-ffweight);
        }
        else tmv = fom[index] * 100.0;
        return(tmv);

}
diagnose(tflg)
int     tflg;                     /* title flag */
{
        int     i,j,lnc,totm,bmi,equm,k,brkflg,lnc2,f;
        int     archindx = 0;
        unsigned c,d,e;
        char    curdiag[80];
        char    fltmsk[80];
        char    tprmpt[40];
        long    pos,x,a1,a2,a3;
        float   bmt,bestmatch,tfom,tmv,svfom=0.0,
                svfom2=0.0,svbmt=0.0;
        int     delindx,deleted[16],svbmi=0,optchng;
        OBC     *archbuf,*tmpobc;
        float   matchob();
        tfb = (char *)halloc(
                (long)(64+OBBUFR*ABSIZE+2*FPBUFSIZE*sizeof(float)),1);
        if (tfb==NULL) {
                put_s2("NOT ENOUGH MEMORY FOR FAULT DIAGNOSIS");
                goto dgexit;
        }
```

```
            fom = (float *)(32+tfb+OBBUFR*ABSIZE);
            fom2 = (float *)(48+tfb+OBBUFR*ABSIZE+FPBUFSIZE*sizeof(float));
            if (tflg == 0) put2(fdm_form);
            archfile = -1;
            if (archfile == -1) {           /* open the fault diagnosis files */
                    sprintf(archname,"%s.X%d",q.dfname,curframe+1);
                    sprintf(faultnam,"%s.F%d",q.dfname,curframe+1);
                    sprintf(tmpstr,"Interrogating Data Base File %s",archname);
                    put_s2(tmpstr);
                    archfile = open(
                            archname,O_BINARY|O_RDWR|O_CREAT,S_IREAD|S_IWRITE);
                    if (archfile == -1) {
                            put_s2("Cannot open the archive file");
                            hfree(tfb);
                            return(-1);
                    }
                    faultfile = open(
                            faultnam,O_BINARY|O_RDWR|O_CREAT,S_IREAD|S_IWRITE);
                    if (faultfile == -1) {
                            put_s2("Cannot open the fault file");
                            close(archfile); archfile == -1;
                            hfree(tfb);
                            return(-1);
                    }
            }
newtype:
            put1(fdmtitle);
            ffon = 1;       /* get first fault abstract */
            abstract(&curobs,newbuf,0);     /* process new error plane */
            abstract(&curobs,newbuf,1);     /* second half */
            ffon = 0;       /* get whole fault abstract */
            abstract(&whlobs,newbuf,0);
            abstract(&whlobs,newbuf,1);
            ffon = HO_FFON; /* set to preferred operating mode for frame */
            ffspan = HO_FFSPAN;
            ffweight = HO_FFWEIGHT;
stover:
            /* read file and build relative match table */
            ns_wide();
            archindx = 0;
            delindx = 0;                    /* next free space for deleted */
            brkflg = 0;
            glbfom = 0;
            fdi = 0;
            totm = 0;
            do {
                    i = 0;
                    pos = (long)archindx * (long)ABSIZE;
                    x = lseek(archfile,pos,SEEK_SET);       /* beginning of file */
                    if (x == pos) i = read(archfile,tfb,ABSIZE*OBBUFR);
                    if (i != ABSIZE*OBBUFR)  brkflg = 1;
                    archbuf = (OBC *)tfb;
                    for (j=i/ABSIZE; j > 0; j--) {
                            if (archbuf->cnt == -1) {
                                    if (delindx < 16)
                                            deleted[delindx++] = archindx;
                                    tfom = 0.0;
                                    mf2 = 0.0;
                            }
                            else {
                                    tfom = matchob(archbuf,&curobs,&whlobs);
                            }
                            fom[archindx] = tfom;
                            fom2[archindx] = mf2;   /* set by matchob()*/
                            archbuf++;
                            archindx++;
                    }
            } while(brkflg == 0);
            fom[archindx] = 0.0;
            fom2[archindx] = 0.0;
            if (ffdebug && fdi) {
                    put_s2("Press A key or ESC to Cancel Dump ... ");
                    if (ESC == hard_pause()) ffdebug = 0;
```

```
/*          }
            sprintf(tmpstr,"%d Entries in the Open Data Base",archindx);
            put_s2(tmpstr);*/
nextbst:
            ns_wide();
            if (totm==0) {
                    mon_screen(" ",2);
                    scan_critical();
            }
            mon_screen(" ",2);
            sprintf(tmpstr," #      FOM             DIAGNOSIS");
            mon_screen(tmpstr,2);
            lnc = 0;
            totm = 0;
autobest:
            bmi = -1;
            bestmatch = 0.0;
            for (j=archindx-1;j>=0;j--){
                    if (fom[j]==0.0&&fom2[j]==0.0)
                            tmv = 0.0;
                    else
                            tmv = weight_match(j);
                    if (tmv > bestmatch) {
                            bestmatch = tmv;
                            bmi = j;
                    }
            }
            if (bmi != -1) {
                    bmt = bestmatch;
                    j=bmi;
fdf0:
                    for (j=j;j>=0;j--) {
                            if (fom[j]==0.0&&fom2[j]==0.0)
                                    tmv = 0.0;
                            else
                                    tmv = weight_match(j);
                            if (fabs(tmv-bestmatch) < .05) {
                                    totm++;
                                    get_fault(j,curdiag);
                                    sprintf(tmpstr,"%3d    %3.1f%%:  %s",j,bmt,curdia
                                    lnc++;
                                    lnc2 = mon_screen(tmpstr,2);
                                    if(totm==1){    /* first match */
                                            svbmi = bmi;
                                            svfom=fom[bmi];
                                            svfom2=fom2[bmi];
                                            svbmt = bestmatch;
/* set macro variables */               glbfom = (int)bmt;
                                            glbdnum = j; /* ditto */
                                            strcpy(glbdiag,curdiag);
                                            if (scnforlnk(curdiag)) {
                                                    d = ' ';
                                                    goto dgexit;
                                            }
                                    }
                                    fom[j] = 0.0;
                                    fom2[j] = 0.0;
                                    if (lnc2) {
                                            put3("Press M for More, Select a Functio
                                            e = get_one();
                                            if (e != 'M') {
                                                    d = e;
                                                    goto nextb3;
                                            }
                                            else {
                                                    ns_wide();
                                                    goto fdf0;
                                            }
                                    }
                                    if (q.numfltdsp == 0) break;
                            }
                    }    /* end for(j */
                    if (lnc < q.numfltdsp) goto autobest;
```

```
            }       /* end if (bmi !=  -1) */
            else {
                    strcpy(tprmpt,"End of Data Base.");
                    put_s2(tprmpt);
            }
nextb2:
            topic = "FDIAG";
            if (q.shwfdstat) {
                    sprintf(tmpstr,
"FRAME(%d) %s:#%d  M1=%2.3f  SIZE=%d  M2=%2.3f  WEIGHT=%d   FOM = %2.3f",
                            curframe+1,ffon?"FIRST":"WHOLE",svbmi,svfom*100.0,
                                    ffspan,svfom2*100.0,ffweight,svbmt);
                    zap_stat(tmpstr);
            }
            put3("Select a Function or Press ESC for Test Menu: ");
            d = get_one();
nextb3:
            put_s2("  ");
            if (!q.shwfdstat) zap_stat("");
            if (ffon) tmpobc = &curobs;
            else tmpobc = &whlobs;
            switch (d){
            case 'A': put_s2("A)dd Fault command CHANGED to N)ew Fault!");
                    goto nextb2;
            case 'N':
                    prmpt3("NEW FAULT: ");
                    topic = "FDADD";
                    if (delindx > 0) bmi = deleted[--delindx];
                    else { bmi = archindx; archindx++; }
                    tmpobc->ndx = bmi;
                    tmpobc->cnt = 1;
                    pad_str(curdiag," ",79);
                    if (ESC == get_con(curdiag,0,62)) goto nextb2;
                    pos = (long)bmi * ABSIZE;
                    if (pos != lseek(archfile,pos,SEEK_SET)) goto fdierr;
                    if (ABSIZE != write(archfile,(char *)tmpobc,ABSIZE))
                            goto fdierr;
                    pos = (long)bmi * 80L;
                    if (pos != lseek(faultfile,pos,SEEK_SET)) goto fdierr;
                    if (80 != write(faultfile,curdiag,80)) goto fdierr;
                    sprintf(tmpstr,"Fault %d ADDED: %s",bmi,curdiag);
                    put_s2(tmpstr);
                    goto nextb2;
            case 'C':
                    topic = "FDCHAN";
                    prmpt3("Enter the Fault # to Edit:");
                    if (ESC == get_int(&bmi)) goto nextb2;
                    pos = (long)bmi * 80L;
                    if (pos != lseek(faultfile,pos,SEEK_SET)) goto fdierr;
                    if (80 != read(faultfile,curdiag,80)) goto fdierr;
                    sprintf(tmpstr,"Changing Fault Number %d.",bmi);
                    put_s2(tmpstr);
                    prmpt3("CHANGE FAULT: ");
                    put_con(curdiag,0);
                    if (ESC == get_con(curdiag,0,79)) goto nextb2;
                    pos = (long)(bmi * 80);
                    if (pos != lseek(faultfile,pos,SEEK_SET)) goto fdierr;
                    if (80 != write(faultfile,curdiag,80)) goto fdierr;
                    sprintf(tmpstr,"# %d Changed: %s",bmi,curdiag);
                    put_s2(tmpstr);
                    goto nextb2;
            case 'D':
                    topic = "FDDEL";
                    prmpt3("Enter the Fault Number to Delete:");
                    if (ESC == get_int(&bmi)) goto nextb2;
                    pos = (long)bmi * ABSIZE;
                    if (pos != lseek(archfile,pos,SEEK_SET)) goto fdierr;
                    if (ABSIZE != read(archfile,tfb,ABSIZE)) goto fdierr;
                    if (pos != lseek(archfile,pos,SEEK_SET)) goto fdierr;
                    archbuf = (OBC *)tfb;
                    archbuf->cnt = -1;
                    if (ABSIZE != write(archfile,tfb,ABSIZE)) goto fdierr;
```

```
                pad_str(curdiag," ",62);
                pos = (long)bmi * 80L;
                if (pos != lseek(faultfile,pos,SEEK_SET)) goto fdierr;
                if (80 != write(faultfile,curdiag,80)) goto fdierr;
                sprintf(tmpstr,"Fault #%d DELETED.",bmi);
                put_s2(tmpstr);
                goto nextb2;
        case 'F':
                topic = "FDFIND";
                prmpt3("Find: ");
                if (ESC == get_con(fltmsk,0,62)) goto nextb2;
                ns_wide();
                x = lseek(faultfile,0L,SEEK_SET);
                j=0; k=-1;
fdf1:
                lnc = 0;
                put_con(" ",2);
                sprintf(tmpstr,"Faults Matching: %s",fltmsk);
                put_con(tmpstr,2);
                put_con(" ",2);
                do {
                        if (80 != read(faultfile,curdiag,80)) {
                                sprintf(tmpstr,"%d Fault Description%s Found.",
                                        j,j!=1?"s":"");
                                put_s2(tmpstr);
                                break;
                        }
                        k++;
                        if (1 == find_str(fltmsk,curdiag)) {
                                sprintf(tmpstr,"%3d: %s",k,curdiag);
                                put_con(tmpstr,2);
                                j++;
                                lnc++;
                                if (lnc > 12) {
                                        sprintf(tmpstr,"%d Fault Description%s Found.",j,j>1?"s"
                                                put_s2(tmpstr);
                                                put3("Press M for More, Select a Functio
                                                e = get_one();
                                                if (e != 'M') {
                                                        d = e;
                                                        goto nextb3;
                                                }
                                                else {
                                                        ns_wide();
                                                        goto fdf1;
                                                }
                                }
                        }
                } while(1);
                goto nextb2;
        case 'I':                       /* include a new pattern */
                topic = "FDINCL";
                prmpt3("Include New Pattern with Fault #? ");
                if (ESC == get_int(&k)) goto nextb2;
                if (k < 0 || k >= archindx) goto fdierr;
                if (delindx > 0) bmi = deleted[--delindx];
                else { bmi = archindx; archindx++;}
                tmpobc->ndx = bmi;
                tmpobc->cnt = 1;
                pos = (long)k * 80L;
```

```
                    if (pos != lseek(faultfile,pos,SEEK_SET)) goto fdierr;
                    if (80 != read(faultfile,curdiag,80)) goto fdierr;
                    sprintf(tmpstr,"INCLUDING %d as: %s",bmi,curdiag);
                    put_s2(tmpstr);
                    pos = (long)bmi * 80L;
                    if(pos != lseek(faultfile,pos,SEEK_SET)) goto fdierr;
                    if (80 != write(faultfile,curdiag,80)) goto fdierr;
                    pos = (long)bmi * (long)ABSIZE;
                    if (pos != lseek(archfile,pos,SEEK_SET)) goto fdierr;
                    if (ABSIZE == write(archfile,(char *)tmpobc,ABSIZE))
                            goto nextb2;       /* add to file */
fdierr:             put_s2("Operation NOT Successfull");
                    goto nextb2;
            case 'S':                       /* show next best */
                    goto nextbst;
            case 'Q':                       /* redefine a fault */
                    topic = "FDQUER";
                    prmpt3("Enter the Fault # to Query On:");
                    if (ESC == get_int(&bmi)) goto nextb2;
                    if (bmi < 0 || bmi >= archindx) goto nextb2;
                    pos = (long)bmi * (long)ABSIZE;
                    if (pos != lseek(archfile,pos,SEEK_SET)) goto fdierr;
                    if (ABSIZE != read(archfile,(char *)&curobs,ABSIZE)) goto fdierr
                    goto stover;
            case 'R':                       /* redefine a fault */
                    topic = "FDREPL";
                    prmpt3("Enter the Fault # to be Replaced:");
                    if (ESC == get_int(&bmi)) goto nextb2;
                    if (bmi < 0 || bmi >= archindx) goto nextb2;
                    tmpobc->ndx = bmi;
                    tmpobc->cnt = 1;
                    pos = (long)bmi * (long)ABSIZE;
                    if (pos != lseek(archfile,pos,SEEK_SET)) goto fdierr;
                    if (ABSIZE != write(archfile,(char *)tmpobc,ABSIZE))
                            goto fdierr;
                    sprintf(tmpstr,"Fault %d Replaced with New Pattern.",bmi);
                    put_s2(tmpstr);
                    goto nextb2;
            case 'B':                       /* best match over */
                    goto stover;
            case 'X':
                    new_screen();
                    scan_critical();
                    goto nextb2;
            case ' ':
                    put2(fdm_form);
                    ns_wide();
                    goto nextb2;
            case 'Z':
                    sprintf(tmpstr,"FAULT DIAGNOSIS INTERNAL VARIABLE DISPLAY: %s",
                            ffdebug?"ON":"OFF");
                    put_s2(tmpstr);
                    put3("Z) FAULT MATCHING: Variable Display Y)es or N)o? ");
                    e = get_one();
                    if (e == 'Y') ffdebug = 1;
                    if (e == 'N') ffdebug = 0;
                    sprintf(tmpstr,"FAULT DIAGNOSIS INTERNAL VARIABLE DISPLAY: %s",
                            ffdebug?"ON":"OFF");
                    put_s2(tmpstr);
                    goto nextb2;
            case 'T':
            case ESC:
                    ns_wide();
                    break;
            case 'L':
                    hardcopy = 1;
            case 'E':                       /* examine fault */
                    topic = "FDEXAM";
                    prmpt3("Enter the Fault Number to Examine: ");
                    if (ESC == get_int(&bmi)) goto nextb2;
                    lnc = 0;
                    ns_wide();
```

```
exflp1:
            if (bmi >= 0) {
                if ( bmi >= archindx) goto nextb2;
                get_fault(bmi,curdiag);
                pos = (long)bmi * ABSIZE;
                x = lseek(archfile,pos,SEEK_SET);
                i = read(archfile,tfb,ABSIZE);
                archbuf = (OBC *)tfb;
            }
            else {
                i = ABSIZE;
                archbuf = tmpobc;
                if (abs(bmi) < archindx)
                bmt = weight_match(abs(bmi));
                else bmt = 0.0;
                sprintf(curdiag,
                    "Undiagnosed Error Pattern, F.O.M = %1.3f\%",bmt);
            }
            if (i==ABSIZE) {
                i = 0;
                sprintf(tmpstr,"Examine %d: %s (%d)",bmi,curdiag,archbuf
                put_con(tmpstr,2);
                lnc += 1;
                for (i=i; i<nc0 +nc1; i++) {
                    j = i/8; k = i % 8;
                    f = 0;
                    if (archbuf->u[j].a.t == 1 && archbuf->u[j].a.b[k] >
                        f = 1;
                        sprintf(tprmpt,"%8lx%8lx",archbuf->u[j].
                            archbuf->u[j].a.r2[k]);
                        fz(tprmpt);
                        sprintf(tmpstr,"%X%d %5s     %5d     %5d
                            j,i%8,HO_LABELS[i].x,archbuf->u[
                            archbuf->u[j].a.g[k],tprmpt);
                    }
                    else
                    if (archbuf->u[j].t.t == 2 && archbuf->u[j].t.c[k] >
                        f = 1;
                        sprintf(tprmpt,"%d, %d, %d, %d",
                            archbuf->u[j].t.tl[k][0],archbuf
                            archbuf->u[j].t.tl[k][2],archbuf
                        sprintf(tmpstr,"%X%d %5s     %5d     %5d
                            j,k,HO_LABELS[i].x,
                            archbuf->u[j].t.b[k],archbuf->u[
                    }
                    else
                    if (archbuf->u[j].s.t==3 && archbuf->u[j].s.c>k*4){
                        f = 1;
                        sprintf(tprmpt,"(%d,%d),(%d,%d),(%d,%d),
                            archbuf->u[j].s.l[k*4].s,
                            archbuf->u[j].s.l[k*4].v,
                            archbuf->u[j].s.l[k*4+1].s,
                            archbuf->u[j].s.l[k*4+1].v,
                            archbuf->u[j].s.l[k*4+2].s,
                            archbuf->u[j].s.l[k*4+2].v,
                            archbuf->u[j].s.l[k*4+3].s,
                            archbuf->u[j].s.l[k*4+3].v);
                        sprintf(tmpstr,"Analog %X %d %d    %s",
                            j,archbuf->u[j].s.c,k*4,tprmpt);
                    }
                    else
                    if (archbuf->u[j].w.t==4){
                        f = 0;
                        a1 = archbuf->u[j].w.sg[k*3];
                        a2 = archbuf->u[j].w.sg[k*3+1];
                        a3 = archbuf->u[j].w.sg[k*3+2];
                        if (a1 || a2 || a3) {
                            f = 1;
                            sprintf(tprmpt,"%8lX, %8lX, %8lX
                            sprintf(tmpstr,"Whole A%X (%3d)
                                j,archbuf->u[j].w.c,k*25
                        }
                    }
                    if (f) {
```

```
                                                lnc++;
                                                put_con(tmpstr,2);
                                        }
                                        if (lnc >= 16 && hardcopy == 0) {
                                                put3("Press M for More, Select a Functio
                                                e = get_one();
                                                if (e != 'M') {
                                                        d = e;
                                                        goto nextb3;
                                                }
                                                else {
                                                        ns_wide();
                                                        lnc = 0;
                                                        i -= 2;
                                                }
                                        }
                                }
                        }
                        if (bmi < 0) {
                                bmi = abs(bmi);
                                goto exflp1;
                        }
                        if (hardcopy == 1) hardcopy = 0;
                        goto nextb2;
                case 'O':
                        optchng = 0;
fdloop:
                        topic = "FDOPTI";
                        put2(fdopt_form);
                        sprintf(tmpstr,
    "TYPE=%s  WEIGHT=%d  SIZE=%d  NUMBER=%d  STATUS=%s  AUTON=%s  SHORTS=%s"
                        ffon?"FIRST":"WHOLE",ffweight, ffspan,q.numfltdsp,
                        q.shwfdstat?"ON":"OFF",q.autonomous?"ON":"OFF",q.shorts?"ON":"OF
                        zap_stat(tmpstr);
                        put3("Select a Fault Diagnosis Option: ");
                        k = get_one();
                        switch(k) {
                        case 'W':
                                topic = "WGTFDO";
                                sprintf(tmpstr,
                        "First Fault Weighting is %d\%.  Enter a Percentage (0--
                                ffweight);
                                prmpt3(tmpstr);
                                x = ffweight;
                                if (ESC != get_int(&x)) {
                                        if (x <= 100 && x >= 0) {
                                                ffweight = x;
                                                HO_FFWEIGHT = x;
                                        }
                                }
                                goto fdloop;
                        case 'S':
                                topic = "SIZFDO";
            sprintf(tmpstr,"First Fault Window Size is %d samples.  Enter New Size:"
                                prmpt3(tmpstr);
                                x = ffspan;
                                if (ESC != get_int(&x)) {
                                        ffspan = x;
                                        HO_FFSPAN = x;
                                        optchng = 1;
                                }
                                goto fdloop;
                        case 'A':
fdolp2:
                                topic = "ATNFDO";
                        put3("Check for Errors on Autonomous Nodes? Y)es / N)o: ");
                                k = get_one();
                                if (k == 'N') q.autonomous = 0;
                                else if (k=='Y') q.autonomous = 1;
                                else if(k!=ESC&&k!=CR) goto fdolp2;
                                goto fdloop;
                        case 'C':
```

```
fdolp3:
                        topic = "CKSFDO";
                        put3("Check for Shorts on Channels in Error? Y)es / N)o: ");
                                k = get_one();
                                if (k == 'N') q.shorts = 0;
                                else if (k=='Y') q.shorts = 1;
                                else if(k!=ESC&&k!=CR) goto fdolp3;
                                goto fdloop;
                        case 'F':
fdoplp:
                        topic = "FDSTLN";
                        put3("Display the Fault Diagnosis Status Line? Y)es or N)o: ");
                                k = get_one();
                                if (k == 'N') q.shwfdstat = 0;
                                else if (k=='Y') q.shwfdstat = 1;
                                else if(k!=ESC&&k!=CR) goto fdoplp;
                                goto fdloop;
                        case 'T':         /* Set the type of Fault Storage: First or Whole
polp3:
                                topic = "TPSFDO";
                                sprintf(tmpstr,
                                "Storage is %s Fault.  Select F)irst or W)hole Fault: ",
                                ffon ? "First":"Whole");
                                prmpt3(tmpstr);
                                k = get_one();
                                if (k == 'F') ffon = 1;
                                else if (k == 'W') ffon = 0;
                                else if (k!=ESC && k!=CR) goto polp3;
                                if (ffon != HO_FFON) HO_FFON = ffon;
                                goto fdloop;
                        case 'N':
                                topic = "NUMFDO";
                                sprintf(tmpstr,
"Show How Many Matches at a Time? (Current Value is %d) ",q.numfltdsp);
                                put3c(tmpstr);
                                x = q.numfltdsp;
                                if ( ESC==(k = get_int(&x))) goto fdloop;
                                if ( x < 0) x = 0;
                                else if (x > 12) x = 12;
                                else q.numfltdsp = x;
                                goto fdloop;
                        case 'X':
                                write_head(dtafile,curframe);
                        case ESC:
                                put2(fdm_form);
                                goto newtype;
                        default:
                                goto fdloop;
                        }
                        put2(fdm_form);
                        goto nextb2;
                default:
                        k = wrap_up(d);
                        put2(fdm_form);
                        tflg = 0;
                        if (k == 0)
                                goto nextb2;
                }
dgexit:
        if (tfb != NULL) {hfree(tfb); tfb = NULL;}
        close(archfile); archfile = -1;
        close(faultfile); faultfile = -1;
        return(d);
}
find_str(m,s)
char    *m,*s;
{
        char    *m2,*s2;
        while (*m!=0 && *s!=0) {
                if (toupper(*m) == toupper(*s) || *m == '?') { m++; s++;}
                else if (*m == '*') {
                        m2 = m + 1;
                        if (*m2==0) return(1);
```

```c
                        s2 = s;
                        while (*m2 != 0 && *s2 != 0) {
                                if (toupper(*m2) == toupper(*s2) || *m2 == '?')
                                        m2++; s2++;
                                }
                                else if (*m2 == '*') {
                                        break;
                                }
                                else {
                                        m2 = m+1;
                                        s++;
                                        s2 = s;
                                }
                        }
                        m = m2; s = s2;
                }
                else return(0);
        }
        if (*m == *s) return(1);
        else return(0);
}
get_fault(index,dst)
int     index;
char    *dst;
{
                long  pos,x;
                int   bmi,j;
                pos = (long)(index * 80);
                x = lseek(faultfile,pos,SEEK_SET);      /* beginning of file */
                j = read(faultfile,dst,80);
                if (j == 80) return(0);
                else    return(-1);
}
/* Determine degreee of correlation for two observation records */
/* aob points to the archive observation record ie from the data base */
/* nove points to the new observation record using digital transitions */
/* nobw points to the new observation using whole fault abstraction */
float matchob(aob,nob,nobw)             /* returns 1.00 for perfect match */
OBC     *aob,*nob,*nobw;
{
unsigned long   newbits,basebits,matbits,numdig,numanl,
                newgrps,basegrps,matgrps,
                newrnge,basernge,matrnge,
                newchns,basechns,matchns;
        int     a,b,c,d,e,f,g,i,numchn,sz,j,temp[FFDEPTH*2],jj,k,
                trndx,j1,j2,tmin,tmax;
        char    tstr[128];
        float   x,y,z,z2,matchfac,tmf;
        unsigned        nb,bb,ng,bg;
        unsigned long   m,rmin,rmin2;
        int     tc = 50;                /* test constant */
        matchfac = 0.0;
        if (ffdebug) new_screen();
        mf2 = 0.0;
        numchn = 0;
        matbits = basebits = newbits = 0L;
        matgrps = basegrps = newgrps = 0L;
        matrnge = basernge = newrnge = 0L;
        newchns = basechns = matchns = 0L;
        numdig = 0; numanl = 0;
    if (!aob->ftype) {                  /* whole fault mode */
            tc = 34;
                if (ffdebug) put_con("Whole Fault Mode",2);
            for (j=0; j<MAXPD1; j++) {
                    if (q.quickmode==1 && SO_AGIO[11-j] == 1) { /* quick: ig
                            if (ffdebug) put_con("Skip Bank  ",2); /* quick
                    }
                    else
                    if (SO_PODDT[j] == 1) { /* analog bank */
```

```
                    j1 = 0;
                    c = aob->u[j].w.c;
                    d = nobw->u[j].w.c;
                    basebits += c;
                    newbits += d;
                    matbits += c<d ? c:d;
                    e=f=g=0;
                    while (j1 < WASIZE) {
                            e += sum_bits(aob->u[j].w.sg[j1]);
                            f += sum_bits(nobw->u[j].w.sg[j1]);
                            g += sum_bits(nobw->u[j].w.sg[j1] & aob-
                            j1++;
                    }
                    basernge += e;
                    newrnge += f;
                    matrnge += g;
                    basegrps += e;
                    newgrps += f;
                    matgrps += g;
                    if (ffdebug) {
                            sprintf(tmpstr,
                            "%XA:(%lX,%lX,%lX),(%lX,%lX,%lX),(%lX,%l
                            newbits,basebits,matbits,newgrps,basegrp
                            matgrps,newrnge,basernge,matrnge);
                            put_con(tmpstr,2);
                    }
            }
            else
            if (SO_PODDT[j] == 0) {         /* digital bank */
                for (k=0; k<8; k++) {
                    nb = nobw->u[j].a.b[k]; bb = aob->u[j].a.b[k
                    if (nb > 0 || bb > 0) {
                            ng = nobw->u[j].a.g[k]; bg = aob
                            if (nb > 0 && bb > 0) numchn++;
                            newbits += nb;
                            basebits += bb;
                            newgrps += ng;
                            basegrps += bg;
                            if (ng > bg) matgrps += bg; else
                            if (nb > bb) matbits += bb; else
                            newrnge += sum_bits(nobw->u[j].a
                            newrnge += sum_bits(nobw->u[j].a
                            basernge += sum_bits(aob->u[j].a
                            basernge += sum_bits(aob->u[j].a
                            matrnge += sum_bits(nobw->u[j].a
                            matrnge += sum_bits(nobw->u[j].a
                    }
                }
                    if (ffdebug) {
                            sprintf(tmpstr,
                            "%XD:(%lX,%lX,%lX),(%lX,%lX,%lX),(%lX,%l
                            newbits,basebits,matbits,newgrps,
                            basegrps,matgrps,newrnge,basernge,matrng
                            put_con(tmpstr,2);
                    }
            }
    }
    matchfac = 0.0;
if (basebits != 0L && newbits != 0L) { /* compute match factor */
            x = (float)matbits * (float)matbits;
            y = (float)newbits * (float)basebits;
            if ( y > 0.0)   matchfac += x / y;
            x = (float)matgrps * (float)matgrps;
            y = (float)newgrps * (float)basegrps;
            if (y > 0.0)   matchfac += x / y;
            x = (float)matrnge * (float)matrnge;
            y = (float)newrnge * (float)basernge;
            if (y > 0.0)   matchfac += x / y;
            if (matchfac > 3.00) matchfac = 3.00;
            else
            if (matchfac < 3.000 && matchfac > 2.99985) matchfac = 2
            else if (matchfac < 0.0) matchfac = 0.0;
            matchfac /= 3.0;
```

```
            }
        mf2 = -1.0;                     /* secondary match value invalid */
    }
    else if (aob->ftype) {              /* first fault mode */
        tc = 34;
        if (ffdebug) put_con("First Fault Mode",2);
        for (j=0; j<MAXPD1; j++) {
                j1 = 0; j2 = 0;
                if (q.quickmode==1 && SO_AGIO[11-j] == 1) {
                        if (ffdebug) put_con("Skip Bank  ",2); /* quick
                }
                else
                if (SO_PODDT[j] == 1) { /* analog bank */
                        j1 = 0; j2 = 0;
                        c = aob->u[j].s.c;   d = nob->u[j].s.c; /* load c
                        while (j1 < c && j2 < d) {
                                e = abs(aob->u[j].s.l[j1].s - nob->u[j].
                                if (e > tc/2) e = tc/2;
                                matbits += e; basebits += tc/2;
                                f = abs(aob->u[j].s.l[j1].v - nob->u[j].
                                if (f>tc/2) f = tc/2;
                                matbits += f; basebits += tc/2;
                                j1++; j2++;
                        }
                        if (d-j2 > 0) { /* add in for unpaired samples *
                                a = (d-j2) * tc;
                                basebits += a;
                                matbits += a;
                        }
                        else if ( c-j1 > 0) {
                                a = (c-j1) * tc;
                                basebits += a;
                                matbits += a;
                        }
                        if (ffdebug) {
                                sprintf(tmpstr,
                                "%XA:(%lX,%lX,%lX),(%lX,%lX,%lX),(%lX,%l
                                newbits,basebits,matbits,newgrps,basegrp
                                matgrps,newrnge,basernge,matrnge);
                                put_con(tmpstr,2);
                        }
                }
                else
                if (SO_PODDT[j] == 0) {
                        for (k=0; k<8; k++) {    /* number of maximum cha
                                j1 = 0; j2 = 0;
                                c = aob->u[j].t.c[k];
                                d = nob->u[j].t.c[k]; /* load counts */
                                if (c>0 || d>0) {        /* if either tra
                                    if (c>0 && d>0) {    /* if both exist
                                        while (j1 < c && j2 < d)
                                                e=abs(aob->u[j].t.tl
                                                if (e > tc) e = tc;
                                                matbits += e; basebi
                                        }
                                    }
                                    e = 0;
                                    if (j1<c) e = (c-j1) * tc;
                                    else if (j2 < d) e = (d-j2) * tc
                                    matbits += e;
                                    basebits += e;
                                } /* if either transition end */
                        } /* end of for(k) loop */
                        if (ffdebug) {
                                sprintf(tmpstr,
                                "%XD:(%lX,%lX,%lX),(%lX,%lX,%lX),(%lX,%l
                                newbits,basebits,matbits,newgrps,
                                basegrps,matgrps,newrnge,basernge,matrng
                                put_con(tmpstr,2);
                        }
                }
        }       /* end of for j */
        if (basebits == 0)  /* nobody home in common at all */
```

```
                              matchfac = 0.0;
            else {            /* compute resultant factors */
                              matchfac = matbits;
                              matchfac /= basebits;
                              matchfac = 1.0 - matchfac;        /* convert from dif to 1
                              if (ffspan > -1) {                /* first fault compariso
                                  tmin = nob->ftran - ffspan; if (tmin<dsmin) tmin = d
                                  tmax = nob->ftran + ffspan; if (tmax>dsmax) tmax = d
                                  if (aob->ftran <= tmax && aob->ftran >= tmin ) {
                                      basebits = 0; matbits = 0;
                                      for (j=0; j<MAXPD1; j++) {      /* check
/* analog bank */                         if (SO_PODDT[j] == 1) {
                                              a = nob->u[j].s.l[0].s;
                                              b = aob->u[j].s.l[0].s;
                                              d = aob->u[j].s.c;
/* in range */                                if (nob->u[j].s.c>0&&a<=tmax&&a>=tmin){
                                                  if (d>0 && b>=tmin &
                                                      matbits
                                                      matbits
                                                      nob->u[j
                                                  }
                                                  else matbits += 2*ff
                                                  basebits += 2*ffspan
                                              }
                                              else
                                              if (d>0 && b<=tmax && b>
                                                  matbits += 2*ff
                                                  basebits += 2*ff
                                              }
                                          }
                                          else
/* digital bank */                        if (SO_PODDT[j] == 0) {
                                              for (k=0; k<8; k++) {
                                                  a = nob->u[j].t.
                                                  b = aob->u[j].t.
                                                  d = aob->u[j].t.
                                                  if (nob->u[j].t.
                                                      && a<=tmax &
                                                      if (d > 0 && else mat
                                                          basebits +=
                                                      }
                                                      else
                                                      if (d>0 && b<=tm
                                                          matbits
                                                          basebits
                                                      }
                                                  }
                                              }      /* end of if di
                                          }
                                      }
                                  }
                                  else {        /* first fault not in range */
                                      matbits = 0L;    /* does not match on thi
                                      basebits = 0L;
                                  }
                                  mf2 = matbits;
                                  if (basebits > 0) mf2 /= basebits;
                                      else mf2 = 1.0;
                                  mf2 = 1.0 - mf2;   /* convert from dif factor to li
                              }
            }   /* end of for j */
        }
        if (ffdebug) {
sprintf(tmpstr,"Match To #%d = %1.3f.  Space to Continue or ESC to Cancel.",
                aob->ndx,matchfac);
            put_s2(tmpstr);
            if (ESC == hard_pause()) ffdebug = 0;
        }
        return(matchfac);
}
sum_bits(r)
unsigned long    r;
{
```

```
                unsigned long m;
                int     a=0;
                if (r != 0)
                        for (m = 0x80000000L; m>0L; m >>= 1)
                                if ((m & r) != 0L) a++;
                return(a);
}
/* fills observation buffer with abstraction from error plane */
abstract(dst,src,pgin)
OBC     *dst;
unsigned char   *src;
int     pgin;
{
        int     len,nch,coff,boff,lastbit;
        char    tmp,tmp2;
        char    *stsrc;
        unsigned char *tsrc;
        unsigned        m,c;
        unsigned long   *tdst,dvalue;
        int     i,x,g,gc,bc,rf1,rf2,j,trndx,tran,sz,k;
        unsigned long   tr,ormask;
        int     rngwidth;
        int     vsum,dvsum,neg,sign,dcount,limit,rbits;
        unsigned char   value,tval;
    if(pgin==1) {len = csz1; nch=nc1; coff = nc0; boff = nc0*csz0;}
    else { len=csz0; nch=nc0; coff=0; boff=0; dst->ftran = 40000; }
    rngwidth = (len * 8) / 64;  /* in bits */
    dst->ftype = ffon;
    dst->mweight = 50;
    dst->fweight = ffweight;
    src += boff;
    for ( j = coff/8; j < (nch + coff) / 8; j += 1) {
                if (SO_PODDT[j] == 0) { /* is this bank digital */
                        if (!ffon ) {
                        /* process fault in whole mode ie create digital abstraction *
                                dst->u[j].a.t = 1;
                                if (q.quickmode==1 && SO_AGIO[11-j] == 1) {
                                        for (i=0; i<8; i++) {
                                                dst->u[j].a.r1[i] = 0L;
                                                dst->u[j].a.r2[i] = 0L;
                                                dst->u[j].a.g[i] = 0;
                                                dst->u[j].a.b[i] = 0;
                                        }
                                }
                                else
                                for (i=0; i<8; i++) {   /* total number of chann
                                        tsrc = src + len*i;
                                        tr = 0L;
                                        ormask = 0x80000000L;
                                        g=0; gc=0; bc=0; rf1 = 0; rf2 = 0;
                                        x = len;
                                        while (x-- > 0) {       /* total number
                                                c = *tsrc++;
                                                if (c == 0) g = 0;      /* clear
                                                else {
                                                        rf2 = 1;
                                                        for(m=0x80;m>0;m>>=1){
                                                                if((c & m) != 0)
                                                                        bc++;
                                                                if (g ==

}
                                                }
                                                else g = 0;
                                        }
                                }
                                rf1 += 8;       /* begin to meas
                                if (rf1 % rngwidth == 0) {
                                        if (rf2 != 0) {
                                                tr |= ormask;
                                                rf2 = 0;
                                        }
```

```
                                        if (rfl != rngwidth*32)
                                                ormask >>= 1;
                                        else {
                                                dst->u[j].a.r1[i
                                                tr = 0L;
                                                ormask = 0x80000
                                        }
                                }
                        }      /* end while */
                        dst->u[j].a.r2[i] = tr;
                        dst->u[j].a.g[i] = gc;
                        dst->u[j].a.b[i] = bc;
        }      /* end of for i loop */
}
else {  /* First Fault DIGITAL Mode */
        dst->u[j].t.t = 2;
        if (q.quickmode==1 && SO_AGIO[11-j] == 1) {
                for (i=0; i<8; i++) {
                        trndx = 0;
                        dst->u[j].t.c[i] = 0;     /* numbe
                        while (trndx < FFDEPTH)
                                dst->u[j].t.tl[i][trndx+
                }
        }
        else
        for (i=0; i<8; i++) {    /* total number of chann
                tsrc = src + len*i;
                x = len;
                tran = 0;
                trndx = 0;
                lastbit = 0;
                while (x-- > 0) {           /* total number
                        if ((*tsrc==0 && lastbit==0)
                                ||(*tsrc==0xff && lastbi
                                tran += 8*sizeof(char);
                        else
                        for (rfl=0x80; rfl>0 && trndx<FF
                                if (*tsrc & rfl) { /* is
                                        if (lastbit == 0
                                                lastbit
                                                dst->u[j
                                        }
                                }
                                else if (lastbit == 1) {
                                        lastbit = 0;
                                        dst->u[j].t.tl[i
                                }
                                tran++;
                        }
                        tsrc++;
                        if ( trndx >= FFDEPTH ) break;
                }
                if (trndx<FFDEPTH && lastbit==1) {
                        lastbit = 0;
                        dst->u[j].t.tl[i][trndx++] = len
                }
                dst->u[j].t.c[i] = trndx;           /* numbe
                for (k=0,x=0; k < trndx; k++) if (2*(k/2
                        x += dst->u[j].t.tl[i][k] - dst-
                dst->u[j].t.b[i] = x;               /* numbe
                while (trndx < FFDEPTH) {           /* fill
                        dst->u[j].t.tl[i][trndx++] = 0;
                }
        } /* end of for (i*/
        for (i=0; i<8; i++) {                 /* scan for new
                if (dst->u[j].t.c[i] > 0)
                        if (dst->u[j].t.tl[i][0] < dst->
```

```
                                                    dst->ftran = dst->u[j].t
            }
        }                   /* end of first fault processing */
    }                 /* end of digital processing */
    else if (SO_PODDT[j] == 1) {      /* ANalog channel on */
        if (ffon) {                                         /* first
            dst->u[j].s.t = 3;
            if (q.quickmode==1 && SO_AGIO[11-j] == 1) {
                dst->u[j].s.c = 0;
                for (i=0; i<FFDEPTH*8; i++) {
                    dst->u[j].s.l[i].s = 0;  /* sampl
                    dst->u[j].s.l[i].v = 0;
                }
            }           /* end of quickmode skip processing */
            else {
                i = 0;
                tsrc = src;
                for (x = 0; x < len*8; x++) {
                    if (*tsrc != 0) {
                        dst->u[j].s.l[i].s = x;
                        dst->u[j].s.l[i].v = *ts
                        if (++i >= FFDEPTH*8) br
                    }
                    tsrc++;
                }
                dst->u[j].s.c = i;
                for (i=i; i<FFDEPTH*8; i++) {
                    dst->u[j].s.l[i].s = 0; /* sampl
                    dst->u[j].s.l[i].v = 0;
                }
                if (dst->u[j].s.c > 0) {
                    if (dst->u[j].s.l[0].s < dst->ft
                        dst->ftran = dst->u[j].s
                }
            }
        }            /* end of analog first fault */
        else {
            dst->u[j].s.t = 4;                  /* whole fault a
            dst->u[j].w.c = 0;
            if (q.quickmode==1 && SO_AGIO[11-j] == 1) { /* s
                for (i=0; i<WASIZE; i++) {
                    dst->u[j].w.sg[i] = 0L;  /* clear
                }
            }
            else {               /* condense whole analog fault
                stsrc = src;                      /* use s
                tdst = &(dst->u[j].w.sg[0]);
                dcount = 0;
                dvalue = 0L;
                tmp2 = 0;
                for (i=0; i*16 < banksize; i++) {
                    vsum = 0; dvsum = 0; neg = 0;
                    tmp = *stsrc++;
                    if (tmp < 0) neg++;       /* watch
                    dvsum = abs(tmp - tmp2);
                    vsum += tmp;                 /* initi
                    tmp2 = tmp;
                    for( x=1; x<16; x++) {
                        tmp = *stsrc++;
                        if (tmp !=0) {
                            dst->u[j].w.c++;
                            dvsum += abs(tmp
                            vsum += tmp;
                            if (tmp < 0) neg
                        }
                        tmp2 = tmp;
                    }
                    value = 0;
                    if (dvsum > 0) {
                        for (limit=4;dvsum>=limi
                            if (++value >= 3
                        if (neg > 0) value += 4;
                        value <<= 3;
                        for (tval=1,limit=4;vsum
```

```
                                        if (++tval >= 7)
                                            value += tval;
                                    }
                                    if (dcount < 32-6) {
                                        dvalue = (dvalue << 6)
                                        dcount += 6;
                                    }
                                    else {
                                        rbits = 32 - dcount;
                                        dcount = 6 - rbits;
                                        *tdst++ = (dvalue << rbi
                                        dvalue = value;
                                    }
                                }    /* end of for loop governing who
                            }        /* end of whole fault analog processing
                        }
                    }
                    src += len*8;
        }            /* end of for j loop */
}
scnforlnk(str)            /* scan dignosis for link to another test */
char    *str;
{
        int    x,z = 0;
        while(*str != 0) {
                switch(z) {
                case 0: if(*str=='*') z++; else z = 0;break;
                case 1: if(*str=='/') z++; else z = 0; break;
                case 2: if(*str == '$') {
                            x = 0;
                            x = atoi(str+1);
                            x--;
                            if (x >= 0 && x <= totframe) {
                                if(HO_FOMCUTOF!=-1&&glbfom>=HO_FOMCUTOF){
                                    HO_ONFAIL = x;
                                    put_s2("Fault Diagnosis Link Processed")
                                        return(1);
                                }
                                ;
                            }
                            else z = 0;
                            break;
                        }
                        str++;
                }
        return(0);
}
count_tran(tsrc,len)    /* returns number of transitions on channel */
char    *tsrc;
int     len;
{
        int    x;
        int    tran = 0;
        int    count = 0;
        int    lastbit;
        unsigned rf1;
        lastbit = 0;
        while (len-- > 0 && count < 4) {          /* total number of bytes */
                if ((*tsrc==0 && lastbit==0)
                        ||(*tsrc==0xff && lastbit==1))
                        tran += 8;
                else
                for (rf1=0x80; rf1>0; rf1/=2) {
                        if (*tsrc & rf1) { /* is bit high */
                            if (lastbit == 0) {
                                lastbit = 1;
                                count++;
                            }
                        }
                        else if (lastbit == 1) {
                            lastbit = 0;
                            count++;
```

```
                    }
                    tran++;
                }
                tsrc++;
            }
            return(count);
}
scan_critical()
{
        int     i,j,k,l,errors,attempts,p,c,x,z;
        char    *s,*s2;
        unsigned int *st,*st2,*st3,*st4;
        unsigned int os;
        errors = 0;
        attempts = 0;
        if (q.autonomous || q.shorts)
        for (i=0; i<numchnls; i++) {
                if (0xff == init_chan(i)) break;
                p = cpdn; c = cchn;
                x = cndx;
                z = chnsize/2;
                os = caloff(cndx);
                st = (unsigned int *)(newbuf + os);
                st2 = (unsigned int *)(databuf + os);
                for (j=0; j<z; j++) {
                        if (*st != 0) { /* yes there are errors */
                             s = HO_LABELS[x].x;
                             if (q.autonomous) {
                                s2 = strstr(s,"!");
                                if (s2!=NULL && *(s2+1) == 0) { /* ? in Label */
                                    errors++;
                                    sprintf(tmpstr,
                                "Autonomous Node %s(%X%d) is in Error.",s,p,c);
                                    mon_screen(tmpstr,0);
```

/* COMMON SOURCE MODULE FOR MFI CONTROL PROGRAM 2 and 48 */
/*    COPYRIGHT(C)1986,1987,1988.  ARRAY ANALYSIS, INC.      */
/* MENU.C */ include "constant.h"
include "global.h"

```
void menu_init(), bxs(), fstd(), dspbx(), dsp_wnd(), put1();
void clrbx(); void clrwx(); void clrbuf(); void put2(); void put3c();
extern  int     pxprow,pxpcol,alim,vsh;
extern  *cpyrghtf[];
/* This module contains souped up menu processor functions */
/* The program version number is contained in the menu routine below */
/* 218,196,191,179,195,180,192,217 */ define bxrows   6 extern  int     prevrow,prevcol; /* found in screen.c */ int     boxrows = bxrows;
char    bxbuf[bxrows*80];                /* box buffer */
char    wxbuf[20*80];
int     svscrflg = 0;
int     rotat = 2;

int     factor;
char    *save_put1 = NULL;
char    **save_put2 = NULL;
char    **p2sv1 = NULL,**p2sv2 = NULL,p3sv[80];
clr_screen(x,c1,y,c2)
int     x,c1,y,c2;
{
        if (prevrow >= x && prevrow <= y) erase_cur();
        grrtulc(c1*pxpcol,x*pxprow,(1+c2-c1)*pxpcol,(1+y-x)*pxprow,0);
}
void menu_init()
{
        factor = 1;
        clrbx(1,24);    /* Clear menu buffer and window buffer */
```

```
        clr_screen(0,0,24,79);
        if (q.videomd == 20) {
                pxprow = 14;
                pxpcol = 8;
        }
        else
        if (q.videomd == 16) {
                pxprow = 14;
                pxpcol = 8;
        }
        else {
                pxprow = 8; pxpcol = 8;
        }
        vsh = q.vsw/2;
        vedge = pxprow/2;
        hedge = pxpcol/2;
        dsp_regen = 1;
}
void copyright()
{
        put1("A R R A Y   A N A L Y S I S   I N C. ");
        put2(cpyrghtf);
        put3c("Press ESC to Continue or ALT H for Help");
}
void copywait()
{
        int     c;
        set_tmo(300);                   /* max delay of 3 seconds */
        while (tst_tmo() == 0) {        /* while timer is still running */
                if (kbhit()) {  /* if a character is ready */
                        c = getch();
                        if(c == 0) {
                                c = getch();
                                if (c == ALT_H) help_all(topic);
                        }
                        break;
                }
        }
}
mkbx(x,y,offset,len)
int     x,y,offset,len;
{
        int     atr,z,z2,z3,h,v;
        int     r,c;
        v = pxprow/2;
        h = pxpcol/2;
        pcvgcp(&r,&c);
        atr = q.rattr/16;
        for(x=x; x<y+1; x++) {
                switch(x) {
                case 1:
                        z = v;
                        z2 = offset*pxpcol - h;
                        z3 = z2 + (1+len)*pxpcol + h;
                        grline(h,z,h,z+v,atr);
                        grline(639-h,z,639-h,z+v,atr);
doline:
                        v -= 1;
                        if (q.rattr/16 != 0) {
                                typedot(1);
                                grrtulc(z2,z-v,z3-z2,v*2,atr);
                                typedot(0);
                        }
                        grline(h,z,z2,z,atr);
                        grline(z3,z,639-h,z,atr);
                        grline(z2,z-v,z2,z+v,atr);
                        grline(z2+1,z-v,z2+1,z+v,atr);
                        grline(z3,z-v,z3,z+v,atr);
                        grline(z3+1,z-v,z3+1,z+v,atr);
                        break;
                case 6:
                        z = (x-1)*pxprow+v;
                        z2 = offset*pxpcol-h;
```

```
                        z3 = z2 + (1+len)*pxpcol+h;
                        grline(h,z-v,h,z,atr);
                        grline(639-h,z-v,639-h,z,atr);
                        goto doline;
                case 2:
                case 3:
                case 4:
                case 5:
                        grline(h,(x-1)*pxprow,h,x*pxprow-1,atr);
                        grline(639-h,(x-1)*pxprow,639-h,x*pxprow-1,atr);
                        break;
                }
        }
        pcvscp(r,c);
        return(atr);
}
void bxs(r,c,str)
int     r,c;
char    *str;
{
        char    *p;
        p = bxbuf + ((r-1)*80) + (c-1); /* compute address */
        while(*str!= 0)
                *p++ = *str++;
}
void fstd(dst,src,attr)         /* fast display: into buffer */
unsigned char   *src,*dst;
{
        while (*src != 0 && *src != '\n')
                *dst++ = *src++;
} void help_box()         /* Draw box around help */
{
        dspbx(6,6);
}
void dspbx(x,y)
int     x,y;
{
        int     atr;
        char    *p1,*p2,c;
        x -= 1;
        while (x < y) {
                p1 = bxbuf + x*80;
                p2 = p1 + nodcols;
                c = *p2;
                *p2 = 0;
                if (x == 0 || x == 5 || x == 24)
                        atr = q.rattr;
                else
                        atr = q.hattr;
                big_str(p1,0,x,atr,0);
                *p2 = c;
                x += 1;
        }
}
void    dspwx(x,y)
int     x,y;
{
        char    *p1,*p2,c;
        x -= 1;
        while (x < y) {
                p1 = wxbuf + x*80;
                p2 = p1 + nodcols;
                c = *p2;
                *p2 = 0;
                hgh_str(p1,coloff,x+bxrows,q.nattr,0);
                *p2 = c;
```

```
                x += 1;
        }
}
void clrbx(x,y)
int     x,y;
{
        clrbuf(bxbuf,x,y);
}
void clrwx(x,y)
int     x,y;
{
        clrbuf(wxbuf,x,y);
}
void clrbuf(buf,x,y)    /* x = 0..79, y = 0..24 */
char    *buf;
int     x,y;
{
        int     i;
        char    *p;
        x -= 1;
        p = buf + x*80;
        i = 80 * (y-x);
        for (i=i; i>0; i--) {
                *p++=' ';
        }
} putbanner(s,atr,flg)    /* flg=0:background,erase */
char    *s;
int     atr,flg;
{
        int     x,y,z,a,b,c;
        int     l;
        char    piece[16];
        if (inhbflg != 1) {
                men_regen(); /* record destruction of existing Display */
                l = strlen(s);
                if (l > 12) pad_str(piece,s,12);
                else pad_str(piece,s,l);
                x = pxpcol * 2;
                y = 5 * pxprow - 1;
                z = fontpixn(2,s,0,strlen(piece));
                a = 639-4*pxpcol;
                if (flg != 1) {
                        grrtllc(x,y,a,4*pxprow-1,atr/16);
                }
                if (a >= z) x += (a-z)/2;
                fontsprt(2,piece,x,y-6,0,atr%16,0);
        }
}
big_str(s,col,row,atr,flg)      /* flg=0:background,erase */
unsigned char   *s;
int     col,row,atr,flg;
{
        int     x,y,z,atr2;
        unsigned char   c;
        x = pxpcol * col;
        y = (pxprow-1) + row * pxprow;
        if (flg == 0) {
```

```
                z = fontpixn(1,s,0,strlen(s));
                grrtllc(x,y,z,pxprow-1,atr/16);
        }
        fontsprt(1,s,x,y-pxprow/5,0,atr%16,0);
}
hgh_str(s,col,row,atr,flg)              /* flg=0:background,erase */
unsigned char   *s;
int     col,row,atr,flg;
{
        int     x,y,z,atr2;
        unsigned char   c;
        x = pxpcol * col;
        y = (pxprow-1) + row * pxprow;
        z = fontpixn(1,s,0,strlen(s));
        grrtllc(x,y,z,pxprow-1,atr/16);
        fcurloc(x,y-pxprow/5);
        while( *s != 0) {
                c = *s++;
                atr2 = atr;
                if (c > 0x80 != 0) {
                        atr2 = q.eattr;
                        c -= 0x80;
                }
                fcurch(1,c,0,atr2,0);
        }
}
void stuf_bln(str)                      /* scroll up in buffer */
char    *str;
{
        scroll_up(0,8,80,8,1);
        scroll_up(0,15,80,8,1);
        big_str(str,0,22,q.nattr,0);
} void stuf_top(str)
char    *str;
{
        memmove(wxbuf+160,wxbuf+80,80*(alim+clim-1));
        pad_str(tmpstr,str,80);
        fstd(wxbuf+80,tmpstr,q.hattr);
}
fonstr(str,atr,col,row)
char    *str;
int     atr, col, row;
{
        int     llpc,llpr;
        llpc = (pxpcol-1) + pxpcol * col;
        llpr = (pxprow -1) + pxprow * row;
        fontsprt(1,str,llpc,llpr,0,atr,0);
}
put_men(row,str,flg)
int     row;
char    *str;
int     flg;                            /* flg = 1: centered, flg = 0: left just */
{
        int     len,pos,atr,r,c,olen;
        char    tstr[96];
        pcvgcp(&r,&c);
        clr_screen(row-1,0,row-1,79);
        olen = len = strlen(str) + 1;
```

```c
        if (flg == 1)
                pos = (80-len)/2;
        else if (flg == 2)
                pos = 1;
        else {
                pos = 10;
                len = 62;
                if (row==6)
                        erase_cur();
        }
        tstr[0] = ' ';
        atr = q.hattr;
        if (row == 1 || row == 6) atr = q.rattr%16 ^ q.rattr/16;
        pad_str(tstr+1,str,len);
        big_str(tstr,pos,row-1,atr,0);
        atr = mkbx(row,row,pos,len);
        if (flg==0 && row==6) {
                r = row-1;
                c = pos+olen+1;
                move_cur(row,c+1);
        }
        pcvscp(r,c);
        if (log_menu) log_line(tstr);
        return(pos);
}
scroll_up(col,row,cl,rl,count)
unsigned        col,row,cl,rl,count;
{
        char    * buffer;
        unsigned        size,dy,sx,sy,lx,ly;
        size = ((cl*pxpcol) / 2)   * (1+rl-count)*pxprow + 64;
        buffer = (char *)calloc(size,1);
        if (buffer != NULL) {
                dy = row * pxprow;
                sx = col*pxpcol;
                sy = (row+count)*pxprow;
                ly = (rl-count)*pxprow; lx = cl*pxpcol;
                get(sx,sy,sx+lx-1,sy+ly-1,buffer);
                put(sx,dy,buffer,1);
                free(buffer);
        }
}
void zap_menu(i,str)
int     i;
char    *str;
{
        int     len,flg;
        men_regen();            /* toggle reconstruction of menu box */
        len = strlen(str);
        if (i > 6) {
                scroll_up(0,1,80,4,1);
                i = 5;
        }
        if (i == 1) {
                flg = 1;
        }
        else if (i==6)
                flg = 0;
        else flg = 2;
        len += put_men(i,str,flg);
```

```
}
men_regen()
{
        mdsp_toggle = 2;
}
void put1(str)
char    *str;
{
        if (inhbflg!=1 && str!=NULL && (save_put1!=str || mdsp_toggle>0)) {
                mdsp_toggle -= 1;
                save_put1 = str;
                put_men(1,str,1);
        }
}
void put2(form)
char    **form;
{
        char            **a;
        unsigned        x,y,i;
        if ( inhbflg!=1 && form!=NULL && (save_put2!=form || mdsp_toggle>0)) {
                mdsp_toggle -= 1;
                save_put2 = form;
                p2sv2 = p2sv1;
                p2sv1 = form;
                y = (pxprow-1) + pxprow;
                grrtulc(pxpcol,pxprow,78*pxpcol,4*pxprow,q.hattr/16);
                for (a=form,i=0;**a!=0&&i<4;a++,i++) {
                        x = pxpcol*(79-strlen(*a))/2;
                        fontsprt(1,*a,x,y,0,q.hattr%16,0);
                        y+=pxprow;
                        if (log_menu) log_line(*a);
                }
                mkbx(2,5,1,1);
        }
}
p2_rest()
{
        if (p2sv2 != NULL) put2(p2sv2);
}
void put2s(x,str)       /* put 1,2,3,or 4 within put2 area */
int     x;
char    *str;
{
        if (inhbflg != 1) {
                if (x >=1 && x <= 4)
                        put_men(x+1,str,0);     /* left justified */
        }
}
void put3(str)
char    *str;
{
        if (inhbflg != 1) {
                strcpy(p3sv,str);
                put_men(6,str,1);
        }
}
void put3c(str)
char    *str;
{
        int len;

if (inhbflg != 1) {
                strcpy(p3sv,str);
                erase_cur();
                len = strlen(str);
                len += put_men(6,str,1);
                move_cur(6,len+2);
```

```c
        }
}
void prmpt3(str)
char    *str;
{
        int     len;
        if (inhbflg != 1) {
                strcpy(p3sv,str);
                erase_cur();
                len = strlen(str);
                len += put_men(6,str,0);
                move_cur(6,len+2);
        }
}
unsigned posit(str)
char    *str;
{
        unsigned x;
        prmpt3(str);
        x = get_one();
        put3("  ");                     /* clear the prompt */
        return(x);
}
unsigned prompt(str1,str2,str3)
char    *str1,**str2,*str3;
{
        unsigned        c;
        if (inhbflg != 1) {
                put1(str1);
                put2(str2);
                put3c(str3);
        }
        c = get_one();
        put3("  ");
        return(c);
}
void put_bot(s)
char    *s;
{
        stuf_bln(s);
} void put_top(str)
char    *str;
{
        stuf_top(str);
        dspwx(1,18);
}
void zap_stat(str)                              /* scroll up in buffer */
char    *str;
{
        int     r,c;
        char    tstr[82];
        if (inhbflg != 1) {
                pcvgcp(&r,&c);
                pad_str(tstr,str,79);           /* fill the line out */
                big_str(tstr,0,24,q.rattr,0);
                pcvscp(r,c);
        }
}
void put_s2(str)                                /* scroll up in buffer */
char    *str;
{
        char    tstr[82];
        int     len;
        if (inhbflg != 1) {
                erase_cur();
                len = strlen(str);
                pad_str(tstr,str,71);           /* fill the line out */
                big_str(tstr,9,23,q.hattr,0);
                move_cur(24,10+len+1);
                pcvscp(23,9+len);
```

```c
        }
void inhibit()          /* inhibit screen display */
{
        if (inhbflg != 1) inhbflg = 1;
}
void activate()         /* reactiviate normal displays */
{
        if (inhbflg != 0) {
                dsp_regen = 1;          /* regenerate display labels 4/19/89 */
                inhbflg = 0;
        }
}
void suspend()          /* momentarily suspend inhibition of display */
{
        if (inhbflg == 1) inhbflg = 2;
}
void resume()           /* resume previous inhibition of display */
{
        if (inhbflg == 2) inhbflg = 1;
}
/* COMMON SOURCE MODULE FOR MFI CONTROL PROGRAM 2 and 48 */
/*   COPYRIGHT(C)1986,1987,1988.  ARRAY ANALYSIS, INC.   */
/* DSPKEY.C: version.h selects MFI-1000 or MFI-AG48 conditional source */ include         "constant.h"
include         "global.h"

char    *save_screen();
extern  int     dspflg,hxpos,offset,aoff;
extern  char    *save_put1, **save_put2, p3sv[], *cpyrghtf[];
extern  char    *avltag[];
int     savprobe = -1;          /* save last probe selection */
int     lgcc = -1; lgcr = -1;
#define KEY_DELAY       25
avalinit()
{
        rl2(clim,q.vsw);        /* tope of analog area */
        anroff = vpxo;
        ancoff = hpxo;
        expansion = gexp;
        ancinc = q.hsw * expansion;
        anrmin = 0;
        anrmax = alim*q.vsw;
        anezero = anrmax/2 - (int)((long)q.gbaoff*(long)q.glbscale/100L);
        ancmin = 0;
        ancmax = rowlen/q.compress*q.hsw - ancinc;
        anrinc = 1;
        if (anecol > ancmax) anecol = ancmax;
        if (anerow > anrmax) anerow = anrmax;
        anecol -= anecol % ancinc; /* adjust to legitimate boundary */
}
analedit(x)
int     x;
{ ec_clear();
        if (x == 1) {
                avalinit();             /* init analog control values */
                anecol = 0;             /* edit cursor column position */
                anerow = anezero;       /* anaolg edit cursor row pos */
                aneon = -1;             /* Not Actualy changing data */
                if (dspoff%expansion != 0) {
                        dspoff = (dspoff/expansion)*expansion;
                        display(tmpsave);
                }
                editmode = 3;
        }
        else {
                editmode = 1;
        }
        ec_show();
```

```
}
ane_set(doff)
int     doff;
{
        unsigned s,i;
        long    t,x,y;
        unsigned char *src;
        if (aneon == -1) return(-1);
        if (dspoff != doff && doff >= dsmin && doff <= dsmax)
                dspoff = doff;
        sa_init(aneon,0);       /* set screen coordinates */
        x = anezero - anerow;           /* cursor pos value as +/- pixels */
        y = x*100/q.glbscale - aoff;
        t = y*100/ascale;
        s = (int)(t) + 128;             /* legit sample value */
        if (s < 0) s = 0; else if (s>255) s = 255;
        offset += ((anecol/q.hsw)*q.compress)/expansion;
        src = tmpsave + offset;
        ec_clear();
        sa_piece(aneon,tmpsave,1);              /* erase old */
        for (i = 0; i < q.compress; i++) {
                *src++ = s;
        }
        sa_piece(aneon,tmpsave,0);              /* write new */
        ec_show();
}
dgc(x,y)                /* draw graphics cursor */
int     x,y;
{
        int     atr,w=3;
        atr = q.battr ^ q.cattr;
        typedot(1);
        if (lgcc != -1) {       /* erase old cursor */
                grline(lgcc-w,lgcr,lgcc+w,lgcr,atr);
                grline(lgcc,lgcr-w,lgcc,lgcr+w,atr);
                lgcc = -1;
        }
        if (x != -1){
                x += ancoff;            /* offset to left boundary of display */
                y += anroff;            /* offset to top of disply */
                grline(x-w,y,x+w,y,atr);
                grline(x,y-w,x,y+w,atr);
                lgcc = x, lgcr = y;
        }
        else lgcc = -1;
        typedot(0);
}
do_mvcur(tag,adr,lo,hi,flg)
int     tag;
int     *adr;
int     lo,hi;
int     flg;                    /* 0=analog, 1=digital */
{
        char    *hsave;
        int     change = 0;
        char    ts[16];
        char    hstr[80];
        unsigned d;
        int     x,y,i,j,k,loop=1,fact,last;
        int     toggle;
        hsave = topic;
        fact = 1,last = -1;
        if (tag=='1'||tag=='2') topic = "VERCUR";
        else topic = "HORCUR";
        sprintf(hstr,
"MOVE C%c: Use Arrow Keys, Enter a Value.  Press '~ when Done: ",tag);
        prmpt3(hstr);
        toggle = 1;
```

```
x = *adr;
if (flg == 0) x -= 128;
d = get_one();
fact = 1;
while(loop) {
        y = x;                          /* save the original value */
        last = d;
        if (d == 256*D_ARW) {
                if (flg == 0) {
                        if (x - fact >= lo) {
                                x -= fact;
                        }
                        else x = lo;
                        change = 1;
                }
        }
        else
        if (d == 256*U_ARW) {
                if (flg == 0 ) {
                        if (x+fact < hi) x += fact;
                        else x = hi-1;
                        change = 1;
                }
        }
        else
        if (d == 256*L_ARW) {
                if ( flg == 1 ) {
                        if (x - fact >= lo) x -= fact;
                        else x = lo;
                        change = 1;
                }
        }
        else
        if (d == 256*R_ARW) {
                if ( flg == 1 ) {
                        if ( x+fact < hi) x += fact;
                        else x = hi-1;
                        change = 1;
                }
        }
        else
        if (( d >= '0' && d <= '9') || d == '-') {
                *ts = d;
                put_ch(d);
                if (ESC != get_con(ts,1,15)) {
                        x = atoi(ts);
                        if (x >= lo && x < hi)
                                change = 1;
                        else x = y;
                        toggle = 0;
                }
                else break;
        }
        else
        if (d == CR) break;
        else
        if ((d=wrap_up(d)) != 0) break;
        if (change == 1) {
                if (flg == 0) {
                        x += 128;
                        y += 128;
                }
                j = show_cur(y,tag,0);                          /* erase old cu
                k = show_cur(x,tag,1);
                if (flg != 0) { j = 0; k = 0; } /* slide for digital */
                if (-1 != k) {  /* write new cursor */
                        *adr = x;
                        if (flg == 0) zap_albl(MAXPD1,MAXPD1);
                        else    zap_sbar(3,5);
                }
                else {
```

```
                                if (j != -1) {              /* last position was on
                                        x = y;
                                        show_cur(y,tag,1);      /* write cursor
                                }
                                else {                          /* store new pos
                                        *adr = x;
                                        if (flg == 0) {
                                                zap_albl(MAXPD1,MAXPD1);
                                        }
                                        else
                                                zap_sbar(3,5);
                                }
                        }
                        if (flg == 0) x -= 128;
                        change = 2;
                }
                set_tmo(KEY_DELAY);
                while (!c_ready() && !tst_tmo());
                if (c_ready()) {
                        d = get_one();
                        if (last == d) fact++;
                        else fact = 1;
                }
                else {
                        if (toggle==0) {
                                toggle = 1;
                                prmpt3(hstr);
                        }
                        d = get_one();
                        fact = 1;
                }
        }
        if (change == 2) {                              /* if the value has changed */
                show_tick();
                show_cur(HO_SC1,'1',2);
                show_cur(HO_SC2,'2',2);
                show_cur(SO_DTRIG,'T',2);
                if (flg == 0) {                         /* store new value */
                        orientad();
                        zap_albl(0,MAXPD1);
                }
        }
        put3(" ");
        topic = hsave;
}
get_probe(bypass)       /* return probe selection from user */
char    *bypass;        /* string of allowable tokens,upper case */
{
        int     a,i;
        char    *s;
        if (savprobe != -1) {
                put_ch(savprobe);b_s();
                a = get_one();
                if (CR == a) a = savprobe;
        }
        else a = get_one();
        if (a == ESC) return(ESC);
        for(s=bypass; *s != 0; s++) if (*s == a) return(a);
        if (a >= '0') {
                i = a-'0';
                if (i > 9) i -= 7;
                if (i < MAXPD1) {
                        savprobe = a;
                        return(i);
                }
        }
        return(-1);
}
int     anplock = 0;
char    *forlab[3] = { "Digital" , "Analog On", "Analog Off" };
do_anpar() {
        char    *hsave;
```

```
              int     i,x,z,c,d,e,k,loop = 1,change = 1,fact = 1;
              char    *s,*ip,tstr1[64],tstr2[64],*tstr3;
       if (anplock != 0) return(0);
       anplock = 1;
       hsave = topic;
       if (editmode != 0) ec_clear();
       do {
              topic = "DSPPAR";
              if (change >= 1) {
                     put2(anp_form);
                     change = 0;
              }
              put3("Please Select a Display Parameter: ");
              c = get_one();
              put_s2(" ");
              switch(c) {
              case 'B':
                     do_bskew();
                     change = 1;
                     break;
              case 'C':
                     topic = "APCOMP";
                     s = "COMPRESSION";
                     tstr3 = "";
                     goto daplb1;
              case 'D':
                     do_bdirect();
                     change = 1;
                     break;
              case 'T':
                     do_trgskew();
                     change = 1;
                     break;
              case 'O':
                     topic = "APOFFS";
                     s = "OFFSET";
                     tstr3 = " or G)lobal";
daplb1:
                       sprintf(tmpstr,"Change %s For a Bank %s: ",s,tstr3);
                       put3c(tmpstr);
                       e = get_probe("G");
                       if (e==ESC) break;
                       else if (e == -1) {
                              put_s2("Invalid Bank Number");
                              goto daplb1;
                       }
                       put_s2(" ");
                       if (c == 'C')           /* analog compression */
                              sprintf(tstr1,"%d",achscale[e]);
                       else {                  /* load x with paramters current value */
                              if (e== 'G') x = q.gbaoff;
                              else {
                                     x = SO_ANOFF[e].xxx[0]==0?1:-1; /* sign */
                                     x *= SO_ANOFF[e].xxx[1];        /* value
                              }
                              sprintf(tstr1,"%d",x);
                       }
                       if(e=='G'||SO_PODDT[e]==1) {
hcloop:
                              if (e=='G') sprintf(tstr2,"Global %s",s);
                              else sprintf(tstr2,"%s for Bank %X",s,e);
                              sprintf(tmpstr,
                                     "%s = %s.  Enter a New Value: ",tstr2,tstr1);
                              prmpt3(tmpstr);
hcloop2:
                              if (e=='G')
                                     zap_albl(MAXPD1+1,MAXPD1+1);
                              else
                                     zap_albl(e,e);
                              if (c == 'O') {
                                     d = get_one();
                                     if (d == ESC) break;
                                     else if (d=='-' || (d>='0' && d<='9')) {
                                            *tmpstr = d; *(tmpstr+1) = 0;
```

```
                                put_ch(d);
                                d = get_con(tmpstr,1,8);
                                if (d != ESC) {
                                        x = atoi(tmpstr);
                                        if (x>=-255 && x <=255) {
                                                if (e=='G') q.gbaoff = x;
                                                else {
                                                        SO_ANOFF[e].xxx[
                                                        SO_ANOFF[e].xxx[
                                                }
                                        }
                                }
                                else
                                if (d ==256*U_ARW) {
                                        x += fact;
                                        if ( x > 255) x = 255;
                                        goto regroup;
                                }
                                else
                                if (d == D_ARW*256) {
                                        x -= fact;
regroup:                                if (x < -255) x = -255;
                                        if (e == 'G') {
                                                q.gbaoff = x;
                                        }
                                        else {
                                                SO_ANOFF[e].xxx[0] = x<0?1:0;
                                                SO_ANOFF[e].xxx[1]=abs(x);
                                        }
                                        set_tmo(KEY_DELAY);
                                        sprintf(tstr1,"%d",x);
                                        while(!c_ready()&&!tst_tmo());
                                        if (c_ready()) {
                                                fact += 1;
                                                goto hcloop2;
                                        }
                                        fact = 1;
                                        display(tmpsave);
                                        goto hcloop;
                                }
                        }
                        else if (c == 'C') {
                                d = get_int(&x);
                                if (d==ESC) break;
                                if (x >= 1 &&x <=1000)
                                        achscale[e] = x;
                        }
                }
                dspflg = 1;
                break;
        case 'V':
                topic = "APVOLT";
                s = "Voltage Scale";
apvol:
                put3c("VOLTAGE SCALE: Select an Analog Bank: ");
                e = get_probe("");
                if (e==ESC) break;
                if (e == -1) {
                        put_s2("Invalid Bank Number");
                        goto apvol;            /* break on error */
                }
apvloop:
                sprintf(tmpstr,"BANK %X VOLTAGE SCALE IS %s: +), -), OR ESC",
                        e,avltag[SO_ANALSET[e]]);
                put3(tmpstr);
                d = get_one();
                if (d == ESC) break;
                k = SO_ANALSET[e];
                if (d == '+') {
                        k++;
```

```
                    if (k > 6) k = 6;
                    SO_ANALSET[e] = k;
                    zap_albl(e);
                    goto apvloop;
            }
            else
            if (d == '-') {
                    k--;
                    if (k < 0) k = 0;
                    SO_ANALSET[e] = k;
                    zap_albl(e);
                    goto apvloop;
            }
            break;
        case 'F':
            topic = "APFORM";
            s = "Format";
            change = 1;
            put2(bfp_form);
apfinv:
            bskewreport("FORMAT    ",tstr1,tmpstr,SO_PODDT,0,0);
            put2s(2,tstr1); put2s(3,tmpstr);
            put3c("DATA FORMAT: Select a Bank or Press ESC: ");
            e = get_probe("");
            if (e==ESC) break;
            if (e == -1) {
                    put_s2("Invalid Bank Number");
                    goto apfinv;           /* break on error */
            }
            put_s2("");
            sprintf(tmpstr,
                    "BANK %X FORMAT: %s.  D)igital, A)nalog, Analog O)ff? ",
            forlab[SO_PODDT[e]]);
            put3(tmpstr);
            if ((c = get_one()) == ESC) goto apfinv;
            if (c=='D')x=0;
            else if(c=='A')x=1;
            else if(c=='O')x=2;
            else {put_s2("Invalid Selection"); goto apfinv; }
            z = 0;
            if (SO_PODDT[e] == 0 && (x==1||x==2)) {
                    z = 1;
                    ctaf(tmpsave,e);
                    if (achscale[e] <= 0)
                            achscale[e] = 100;
            }
            else                                    /* a to d */
            if (x==0 && (SO_PODDT[e]==1 || SO_PODDT[e]==2)) {
                    z = 1;
                    ctdf(tmpsave,e);
                    putback(e);             /* modify channel list */
            }
            else
            if (SO_PODDT[e]==2 && x == 1) z = 1;
            SO_PODDT[e] = x;
            ip = SO_ACHLST;
            analcnt = 0;
            for(i=0;i<MAXPD1;i++) {
                    if(SO_PODDT[i] != 0)  {
                            *ip++ = i;      /* set analog chn */
                            if (SO_PODDT[i] == 1) analcnt++;
                            exclude(i);             /* modify digital chann
                    }
            }
            *ip = 0xff;
            if (z) setanlsiz();    /* check enough analog room */
            dspflg = 1;
            if (!c_ready()) {
                    dspflg = 0;
                    display(tmpsave);
            }
```

```
                        goto apfinv;
        case 'M':
        case 'R':
                topic = "ANREDU";
                sprintf (tmpstr,
                "REDUCTION SCALE = %d\%.  Enter a Percentage from 1 to 500: ",
                        q.glbscale);
                prmpt3(tmpstr);
                c = get_int(&x);
                if (c != ESC) {
                        if (x >= 1 && x <= 1000) q.glbscale = x;
                        dspflg = 1;
                }
                break;
        case 'S':
                topic = "ANSIZE";
                sprintf(tmpstr,
                "ANALOG DISPLAY SIZE: %d.  0) None, 1) 1/2, 2) 2/3, 3) Full? ",
                        SO_ANSIZ);
                prmpt3(tmpstr);
                c = get_one();
                x = c - '0';
                if (c != ESC && x >= 0 && x <=3)
                        SO_ANSIZ = (unsigned char)x;
                dspflg = 1;
                break;
        case 'H':
                do_resol();
                change = 1;
                break;
        default:
                if (wrap_up(c) != 0) loop = 0;
        }
        if (dspflg == 1) { display(tmpsave); dspflg = 0; }

} while (loop == 1);
if (editmode == 3) avalinit();
if (editmode != 0) ec_show();
topic = hsave;
anplock = 0;
}
do_trgskew()
{
        int     c,d,x;
        char    *mdlab;
        topic = "TRGSKW";
        do {
                switch (q.trgskewmode) {
                        case 0: mdlab = "Off   "; break;
                        case 1: mdlab = "Manual"; break;
                        case 2: mdlab = "Auto. "; break;
                }
                sprintf(tmpstr,"TRIGGER MODE = %s,   TRIGGER SKEW = %d",mdlab,q.t
                zap_stat(tmpstr);
                put3c("TRIGGER SKEW: A)uto, M)anual, O)ff, or ESC)ape? ");
                c = get_one();
                switch(c) {
                case 'A':
                        q.trgskewmode = 2;
                        dspflg = 1;
                        break;
                case 'M':
                        q.trgskewmode = 1;
                        put3c("Enter a Trigger Skew Factor: ");
                        x = q.trgskew;
                        d = get_int(&x);
                        if ( d==ESC ) break;
                        if (x >= 0 && x < 16) {
                                q.trgskew = x;
                                dspflg = 1;
                        }
                        break;
                case 'O':
```

```
                                q.trgskewmode = 0;
                                dspflg = 1;
                                break;
                }
                if (dspflg == 1) { display(tmpsave); dspflg = 0; }
        } while (c != ESC);
}
do_bskew()
{
        int     c,d,e,x;
        char    ts2[80];
        topic = "BNKSKW";               /* bank skew for display */
        put2(bsk_form);
        do {
                bskewreport("SKEW      ",tmpstr,ts2,q.bskew,q.bskewmode,1);
                put2s(2,tmpstr); put2s(3,ts2);
                put3c("Select a Bank Skew Function or Option: ");
                c = get_one();
                if (c == 'A') { q.bskewmode = 2; dspflg = 1; }
                else if (c == 'M') { q.bskewmode = 1; dspflg = 1; }
                else if (c == 'O') { q.bskewmode = 0; dspflg = 1; }
                else if (c == 'D') {
                        do_bdirect();
                }
                else if (c == 'S') {
                        do {
                                put3c("SET BANK SKEW: Select a Bank or Z)ero all
                                e = get_probe("Z");
                                if (e==-1) put_s2("Invalid Bank Selection.  Try
                                else put_s2("");
                        } while (e==-1);
                        if (ESC != e) {
                                if (e == 'Z') {
                                        for (x=0; x<MAXPD1; x++) q.bskew[x] = 0;
                                        put_s2("Bank Skew Factors Zeroed for ALL
                                        dspflg = 1;
                                ;
                                else {
                                        do {
                                                x = q.bskew[11-e];
                                                sprintf(tmpstr,
                                                "BANK %X SKEW FACTOR = %d: Enter
                                                put3c(tmpstr);
                                                d = get_int(&x);
                                                if (x < 0 || x >= 16) put_s2("In
                                                else put_s2("");
                                        } while (x < 0 || x >= 16);
                                        if (d != ESC) {
                                                q.bskew[11-e] = x;
                                                sprintf(tmpstr,"Bank %x Skew Fac
                                                put_s2(tmpstr);
                                                dspflg = 1;
                                        }
                                }
                        }
                }
                if (dspflg == 1) { display(tmpsave); dspflg = 0; }
        } while (c != ESC);
        return(0);
}
bskewreport(labl, str1, str2, srcarray,mode,flg)
char    *labl,*str1,*str2, srcarray[];
int             mode;
int     flg;            /* 0 = left to right; 1 = right to left */
{
                int i,j;
                char    *ts,tstr[30];
                *str1 = 0;
                *str2 = 0;
                if (flg == 1) {
```

```
                if (mode == 0) ts = "Off       ";
                else if (mode == 2) ts = "Automatic";
                else ts = "Manual    ";
                sprintf(str1,"MODE           ");
                sprintf(str2,"%9s ",ts);
        }
        strcat(str1," BANK        ");
        sprintf(tstr," %9s ",lab1);
        strcat(str2,tstr);
        for (i=MAXPD1-1;i>=0;i--) {
                if (flg==1)j = 11 - i;
                else     j = i;
                sprintf(tstr," %X ",i); strcat(str1,tstr);
                sprintf(tstr,"%2d ",srcarray[j]); strcat(str2,tstr);
        }
}
do_bdirect()
{
        int c,d,e,x,y;
        char    *ts,ts2[80];
        topic = "BNKDIR";                /* bank direction for display */
        put2(bdr_form);
        do {
                do {
                        bskewreport("DIRECTION",tmpstr,ts2,SO_AGIO,q.bsk
                        put2s(2,tmpstr); put2s(3,ts2);
                        put3c("Select a bank, S)et All banks to Input, o
                        e = get_probe("S");
                        if (e==-1) put_s2("Invalid Bank Selection.  Try
                        else put_s2("");
                } while (e==-1);
                if (ESC != e) {
                        if (e == 'S') {
                                do {
                                        put3c("Set All Banks to I)nput o
                                        c = get_one();
                                        put_s2("");
                                        if (c == 'I') y = 0;
                                        else if (c== 'O') y = 1;
                                        else if (c==ESC) break;
                                        else {
                                                put_s2("Invalid Selectio
                                                continue;
                                        }
                                        for (x=0; x<MAXPD1; x++) SO_AGIO
                                        put_s2("Bank Direction Set for A
                                        dspflg = 1;
                                        break;
                                } while(1);
                        }
                        else {
                                do {
                                        sprintf(tmpstr,
                                                "BANK %X DIRECTION(%s):
                                                e,SO_AGIO[11-e]==1?"Outp
                                        put3c(tmpstr);
                                        d = get_one();;
                                        if (d!='I' && d!='O') put_s2("Il
                                        else put_s2("");
                                } while (d!='I'&&d!='O'&&d!=ESC);
                                if (d != ESC) {
                                        if (d=='O') SO_AGIO[11-e] = 1;
                                        else SO_AGIO[11-e] = 0;
                                        sprintf(tmpstr,"BANK %X DIRECTIO
                                                e,SO_AGIO[11-e]==1?"Outp
                                        put_s2(tmpstr);
                                        dspflg = 1;
                                }
                        }
                }
                if (dspflg == 1) {display(tmpsave); dspflg = 0;}
        } while (e != ESC);
```

```
}
setanlsiz(){
        int     smax;
        dspinit();
        if (analcnt >= MAXPD1) smax = 3;
        else if (analcnt > 2) smax = 2;
        else if (analcnt > 0) smax = 1;
        else smax = 0;
        SO_ANSIZ = smax;
}
int     pwvex=-1,pwvey;
wve_cur(row,col)
int     row,col;
{
        int     x,y;
        x = coloff*pxpcol + col*q.hsw;
        y = boxrows*pxprow + row*q.vsw + topbrdr;
        typedot(1);
        if (pwvex!=-1){ /* erase old cursor */
                grrtulc(pwvex,pwvey,q.hsw-1,q.vsw-1,0xf);
                pwvex = -1;
        }
        if (row != -1) {
                grrtulc(x,y,q.hsw-1,q.vsw-1,0xf);
                pwvex = x; pwvey = y;
        }
        typedot(0);
}
wve_clr()
{
        pwvex = -1;
} jmp_sample()
{
        int     i,pod,chn;
        char    *s,tstr[80];
        unsigned        c,x,dspmax;
        topic = "JUMPS";
        prmpt3("Enter the Sample Number to Jump To: ");
        c = get_con(tstr,0,16);
        put3(" ");
        if (c == ESC) return(-1);
        if (toupper(*tstr)=='C') {      /* Jump to a specific pod and channel */
                sscanf(tstr+1,"%x",&x); /* get pod and channel number */
                /* find channel in channel list */
                pod = x / 16; chn = x % 16;
                for (i=0; i<numchnls; i++) {
                        if (SO_CHLST[2*i] == pod
                            && SO_CHLST[2*i+1] == chn) /* find pod */
                                break;
                }
                sprintf(tmpstr,"Jump to Channel %X%d",pod,chn);
                put_s2(tmpstr);
                if (i < numchnls) {     /* if the digital channel is found */
                        if (dspmode == 0 && editmode != 3) {
                                /* determine if channel is on screen */
                                if (i < voffset || i >= voffset + clim) {
                                        /* adjust screen to display channel */
                                        voffset = i - clim/2;
                                        if (voffset < 0) voffset = 0;
                                        if (voffset + clim >= numchnls)
                                                voffset = numchnls - clim;
                                }
                                if (editmode == 1) {    /* digital editing */
                                        /* put edit cursor on channel */
                                        ecrow = i - voffset;
                                        init_chan(i);
                                }
                        }
                        else if (editmode == 3) {   /* analog edit */
                                /* test if analog channel exists */
                                if (i>0xf) i /= 0x10;
```

```
                            if ( i < MAXPD1) {
                                    if (SO_PODDT[i] == 1) {
                                            aneon = i;
                                            ane_set(dspoff);
                                    }
                            }
                    }
            }
            return('C');
    }
    /* process horizontal jump */
    x = atoi(tstr);
    if ( x > dsmax) x = dsmax;       /* clip against right hand margin */
    else if (x < dsmin) x = dsmin;   /* clip agianst left margin */ if (dspmode==1) dspmax = dsmax - nodrows * nohgrps;
    else dspmax = dsmax - rowlen;/* greatest value for left edge */ if (editmode == 3) {             /* analog editing */
            if (x % gexp != 0)       /* adjust to sample boundary*/
                    x -= x % gexp;
            anecol = rowlen / 2;                   /* mid point for cursor */
            if (x < anecol+dsmin) {                /* x is less than mid point */
                    anecol = x - dsmin;            /* set edit cursor */
                    x = dsmin;                     /* display edge at left edge*/
            }
            else
            if (x > dspmax + anecol) {
                    anecol = x - dspmax;           /* set cursor offset */
                    x = dspmax;
            }
            else x -= anecol;
            anecol /= q.compress;
            anecol *= q.hsw;
            dspoff = x;
    }
    else if (editmode == 1) {
            if (x % expansion != 0)                /* adjust to sample boundary*/
                    x -= x % expansion;
            eccol = rowlen/2;                      /* mid point for cursor */
            if (x < eccol+dsmin) {                 /* x is less than mid point */
                    eccol = x - dsmin;             /* set edit cursor */
                    x = dsmin;                     /* display edge at left edge*/
            }
            else
            if (x > dspmax + eccol) {
                    eccol = x - dspmax;            /* set cursor offset */
                    x = dspmax;
            }
            else x -= eccol;
            dspoff = x;
            eccol /= q.compress;
    }
    else if (editmode == 0) {                      /* not editing */
            if (x > dspmax) x = dspmax;
            if (x % gexp != 0)
                    x -= x % gexp;
            dspoff = x;
    }
    else if (editmode == 2) {        /* hex editing */
            if (x >= dspoff + nohgrps * nodrows) {  /* sample is to the righ
                    dspoff = x - nodrows;
                    if (dspoff > dspmax)
                            dspoff = dspmax;
            }
            else if (x < dspoff) {   /* sample is to the left */
                    if ( x > nodrows) dspoff = x - nodrows;
                    else dspoff = 0;
                    if (dspoff < dsmin) dspoff = dsmin;
            }
            if (x >= dspoff && x < dspoff+nohgrps*nodrows) { /* on screen*/
                    hexgrp = (x - dspoff) / nodrows;
```

```c
                        ecrow = (x-dspoff) % nodrows;
                        set_eccol();
                }
        }
        return('S');
}
glblcmnd(c)
int     c;                      /* Processes a Global Command */
{
        char    *tsave, **msave;
        char    temp[84];
        tsave = save_put1;
        msave = save_put2;
        strcpy(temp,p3sv);      /* save prompt line */
        switch(c) {
        case 'J':
        case 256*ALT_J:
                c = jmp_sample();
                break;
        case 256*ALT_G:
                if (dtafile != -1) {
                        if (0xff != rdq1()) {
                                get_frame(dtafile,curframe,hdb);
                                get_mask();
                        }
                }
                break;
        case 256*ALT_A:         /* Alt A */
                c = do_attr();
                break;
        case 256*ALT_L:
                do_load(2);
                break;
        case 256*ALT_S:
                do_save(1);
                break;
        case 256*ALT_W:
                if (dtafile != -1) {
                        if (0xff != wrq1()) {
                                write_frame(dtafile,curframe,hdb);
                                put_mask();
                        }
                }
                break;
        case 256*ALT_U:
                rcvset();
                rcvdata();
                break;
        case 256*ALT_D:
                sndset();
                snddata();
                break;
        case 256*ALT_P:         /* ALT P */
                do_anpar();
                break;
        case 256*F10:
                scrndump(q.prtype,q.prdir,q.prsize,0,0,1,1,1);
                break;
        default:
                return(c);
        }
        put1(tsave);
        put2(msave);
        put3(temp);
        return(0);
}
unsigned dspkey(c,buffer,flg)           /* Process the display keys */
unsigned c;
char    *buffer;
int     flg;    /* 0: normal, 1: slave */
{
char    *msave,*hsave;
int     change = 0;
```

```
        int     loop = 1;
        int     dxo,x,y,z;
        int     anlmax,fact,zaplo,zaphi;
        unsigned d;
                d = 0,zaplo=0,zaphi=0;
                fact = 1;
        hsave = topic;
        while (loop) {
                dxo = dspoff;
                anlmax = 128;
                if (editmode == 1) init_chan(ecrow+voffset);
                if (c==d) fact++;
                else {fact = 1; d = c;}
restart:
                switch (c) {
                case '1':
                        do_mvcur(c,&HO_SC1,dsmin,dsmax,1);
                        change = 1;
                        goto com;
                case '2':
                        do_mvcur(c,&HO_SC2,dsmin,dsmax,1);
                        change = 1;
                        goto com;
                case '3':
                        do_mvcur(c,&HO_AC1,-anlmax,anlmax,0);
                        change = 1;
                        goto com;
                case '4':
                        do_mvcur(c,&HO_AC2,0-anlmax,anlmax,0);
                        change = 1;
                        goto com;
                case '+':
                        if (editmode != 2) {
                                ec_clear();
                                if (q.compress > 1) q.compress--;
                                else if (q.hsw < 32) {
                                        q.hsw *= 2;
                                        dspinit();
                                        avalinit();
                                        if (editmode == 1) {
                                                eccol/=2;  /* digital editing */
                                                if (eccol >= rowlen) eccol = rowlen - ex
                                        }
                                }
                                change = 2;
                        }
                        goto com;
                case '-':
                        if (editmode != 2) {
                                ec_clear();
                                if (q.hsw > 1) {
                                        q.hsw /= 2;
                                        dspinit();
                                        avalinit();
                                        if (editmode==1) {
                                                eccol*=2;
                                                if (eccol>=rowlen) eccol=rowlen-expansio
                                        }
                                }
                                else if (q.compress < q.mxbs/(nodcols*pxpcol))
                                        q.compress++;
                                change = 2;
                        }
                        goto com;
                case 'f':
                        change = 2;
                        goto com;
                case 'Z':                       /* digital editor, zero bit */
                        if (editmode == 1) {
                                zaphi = 0;
                                zaplo = 1;
                                c = lastway;
                                goto restart;
```

```
                }
                goto com;
        case 'O':                       /* digital editor, One bit */
                if (editmode == 1) {
                        zaphi = 1;
                        zaplo = 0;
                        c = lastway;
                        goto restart;
                }
                goto com;
        case 'V':
                check_version(1);
                goto com;
        case 0:
                put_s2("Invalid Input for Keyboard");
                goto com;
        case 'J':
        case 256*ALT_J:
        case 256*ALT_G:
        case 256*ALT_A:                 /* Alt A */
        case 256*ALT_P:
        case 256*ALT_L:
        case 256*ALT_S:
        case 256*ALT_U:
                dspoff = dxo;
                glblcmnd(c);
                dxo = dspoff;
                change = 2;
                goto com;
        case 256*ALT_W:
        case 256*ALT_D:
        case 256*F10:                   /* f10 */
                glblcmnd(c);            /* perform global command */
                change = 1;
                goto com;
        case 256*L_ARW:                 /* left arrow */
                lastway = c;
                if (editmode == 0) {
                        if (dxo+fact <= dsmax - rowlen) {
                                dxo += fact * gexp;
                                change = 2;
                        }
                }
                else
                if (editmode == 1) {
                        z = fact;
                        while(z>0) {
                                if (zaphi == 1) bit_change(1,tmpsave,dxo);
                                else
                                if (zaplo == 1) bit_change(0,tmpsave,dxo);
                                if (eccol >= expansion) eccol -= expansion;
                                else if (dxo >= expansion){
                                        dxo -= expansion;
                                        change = 2;
                                }
                                z--;
                        }
                        zaphi = zaplo = 0;
                }
                else
                if (editmode == 2) {
                        if (hexpos < hexmax) hexpos++;
                        else
                        if (ecrow > 0) {
                                hexpos = 0;
                                ecrow -= 1;
                        }
                        else
                        if (hexgrp > 0) {
                                hexpos = hexmax; hexgrp -= 1;
                                ecrow = nodrows-1;
                        }
                        else
```

```
                if (dxo > dsmin) {
                        dxo -= 1; hexpos = hexmax;
                        change = 2;
                }
                set_eccol();
        }
        if (editmode == 3) {
                if (aneon == -1) {
                        y = fact*gexp; z = 1;} /*not on*/
                else { y = gexp; z = fact;;
                while (z) {
                        anecol -= y*q.hsw;
                        if (anecol < ancmin) {
                                anecol = ancmin;
                                if (dxo >= y){
                                        dxo -= y;
                                        change = 2;
                                }
                        }
                        ane_set(dxo);

z--;
                }
        }
        goto com;
case 256*R_ARW: /* right arrow */
        lastway = c;
        if (editmode == 0) {
                if (dxo >= fact * gexp) {
                        dxo -= fact * gexp;
                        change = 2;
                }
        }
        if (editmode == 1) {
                z = fact;
                while (z>0) {
                        if (zaphi==1) bit_change(1,tmpsave,dxo);
                        else
                        if (zaplo == 1) bit_change(0,tmpsave,dxo);
                        if (eccol < rowlen/q.compress - expansion) {
                                eccol += expansion;
                        }
                        else
                        if (dxo + rowlen + expansion <= q.mxbs) {
                                dxo += expansion;
                                change = 2;
                        }
                        z--;
                }
                zaplo = zaphi = 0;
        }
        else
        if (editmode == 2) {
                if (hexpos > 0) { hexpos -= 1; }
                else
                if (ecrow < nodrows - 1) {
                        hexpos = hexmax; ecrow++;
                }
                else
                if (hexgrp+1 < nohgrps) {
                        hexpos = 0; hexgrp++;
                        ecrow = 0;
                }
                else
                if (dxo < dsmax - nohgrps*nodrows) {
                        dxo++; hexpos = 0;
                        change = 2;
                }
                set_eccol();
        }
        else
        if (editmode == 3) {
```

```
                    if (aneon == -1) {y = fact*gexp; z = 1;}
                    else { y = gexp; z = fact;}
                    while(z) {
                            anecol += q.hsw*y;
                            if (anecol > ancmax) {
                                    anecol = ancmax;
                                    if (dxo+y <= dsmax-rowlen) {
                                            dxo += y;
                                            change = 2;
                                    }
                            }
                            ane_set(dxo);
                            z--;
                    }
            }
            goto com;

case 256*U_ARW: /* Up arrow */
            if (editmode == 0) {
                    if (dspmode == 1) {       /* hex mode */
                            if (dxo + fact + nohgrps*nodrows < dsmax) {
                                    dxo += fact;
                                    change = 2;
                            }
                    }
                    else {
                            change = 2;
                            if (voffset+fact <= numchnls-clim)
                                    voffset += fact;
                            else voffset = numchnls - clim;
                    }
            }
            else
            if (editmode == 1) {
                    if (ecrow-fact >= 0)      ecrow -=fact;
                    else {
                            ecrow = 0;
                            change = 2;
                            if (voffset-fact >= 0)
                                    voffset -= fact;
                            else
                                    voffset = 0;
                    }
                    goto com2;
            }
            else
            if (editmode == 3) {
                    anerow -= fact*anrinc;
                    if (anerow < anrmin) {
                            anerow = anrmin;
                    }
                    ane_set(dxo);
            }
            else
            if (editmode == 2) {
                    if (ecrow > 0) ecrow--;
                    else
                    if (hexgrp > 0) {
                            hexgrp--; ecrow = nodrows-1;
                            set_eccol();
                    }
                    else
                    if (dxo > dsmin) {
                            dxo--;
                            change = 2;
                    }
            }
            goto com;
    case 256*D_ARW: /* down arrow */
```

```
              if (editmode == 0) {          /* Non Edit mode */
                   if (dspmode == 1) {     /* Hex */
                        if (dxo > fact) dxo -= fact;
                        else dxo = 0;
                        if (dxo < dsmin) dxo = dsmin;
                        change = 2;
                   }
                   else {                   /* Wave form */
                        change = 2;
                        if (voffset-fact >= 0)
                              voffset -= fact;
                        else
                              voffset = 0;
                   }
              }
              else
              if (editmode == 1) {
                   ecrow += fact;
                   if (ecrow >= clim || ecrow >= numchnls) {
                        ecrow = (numchnls<clim?numchnls:clim)-1;
                        if (voffset+fact <= numchnls-clim)
                              voffset += fact;
                        else
                              voffset = numchnls - clim;
                        change = 2;
                   }
com2:
                   init_chan(ecrow+voffset);      /* set vars for new row
                   if (dxo % expansion >= 0)      /* adjust edge */
                        dxo -= dxo % expansion;
                   if (eccol % expansion != 0)
                        eccol -= eccol % expansion;
              }
              else
              if (editmode == 3) {
                   anerow += anrinc*fact;
                   if (anerow > anrmax)
                        anerow = anrmax;
                   ane_set(dxo);
              }
              else
              if (editmode == 2) {
                   if (ecrow < nodrows-1) ecrow++;
                   else
                   if (hexgrp+1 < nohgrps) {
                        hexgrp++; ecrow = 0;
                        set_eccol();
                   }
                   else
                   if (dxo < dsmax - nodrows * nohgrps) {
                        dxo++; change = 2;
                   }
              }
              goto com;
         case 256*79:   /* End Key */
              if (editmode == 2) {
                   if (hexpos != 0)
                        hexpos = 0;
                   else
                   if (hexgrp+1 < nohgrps) { hexpos = hexmax;
                        hexgrp++;
                   }
                   else {
                        ecrow = nodrows-1;
                        hexpos = 0;
                   }
                   set_eccol();
              }
              else
              if (editmode == 1)
                   if (eccol < rowlen/q.compress-1)
                        eccol = rowlen/q.compress - 1;
```

```
                        else {
                                ecrow = clim-1;
                                if (ecrow >= numchnls) ecrow = numchnls-1;
                                goto com2;
                        }
                else if ( editmode == 3) {
                        if (anecol != ancmax) anecol = ancmax;
                        else anerow = anezero;
                }
                goto com;
    case 256*117:   /* ctrl end key */
                if (editmode != 2) {
                        switch (q.vsw) {
                                case 112: q.vsw = 56; break;
                                case 56:  q.vsw = 28; break;
                                case 28:  q.vsw = 14; break;
                                case 14:  q.vsw = 9;  break;
                                case 9:   q.vsw = 7;  break;
                                default: goto com;
                        }
                        vsh = q.vsw / 2;
                        change = 2;
                }
                goto com;
    case 256*71:    /* Home key */
                if (editmode == 2) {
                        if (hexpos != hexmax) hexpos = hexmax;
                        else
                        if (hexgrp > 0) {
                                hexgrp--;
                                hexpos = 0;
                        }
                        else {
                                ecrow = 0;
                        }
                        set_eccol();
                }
                else
                if (editmode == 1 )
                        if (eccol != 0)
                                eccol = 0;
                        else {
                                ecrow = 0;
                                goto com2;
                        }
                else
                if (editmode == 3) {
                        if (anecol != ancmin) anecol = ancmin;
                        else anerow = anezero;
                }
                goto com;
    case 256*119:   /* Ctrl Home key */
                if (editmode != 2) {
                        switch (q.vsw) {
                                case 7:   q.vsw = 9;   break;
                                case 9:   q.vsw = 14;  break;
                                case 14:  q.vsw = 28;  break;
                                case 28:  q.vsw = 56;  break;
                                case 56:  q.vsw = 112; break;
                                default: goto com;
                        }
                        vsh = q.vsw / 2;
                        change = 2;
                }
                goto com;
    case 256*81:    /* page down */
                if (dspmode == 1)       /* hex display */
                        dxo = dxo>nodrows*nohgrps?dxo-nodrows*nohgrps:dsmin;
                else {                  /* wave display */
                        if (dxo-dsmin > rowlen)
                                dxo -= rowlen;
                        else
                                dxo = dsmin;
```

```
                    if (dxo % gexp != 0)
                            dxo -= dxo % gexp;
            }
            change = 2;
            goto com;
    case 256*118:   /* control page down */
            if (dspmode != 0) goto com;

if (voffset - clim > 0) {
                    voffset -= clim;
            }
            else
                    voffset = 0;
            change = 2;
            goto com;
    case 256*132:   /* control page up */
            if (dspmode != 0) goto com;
            if (voffset <= numchnls - clim*2)
                    voffset += clim;
            else
                    voffset = numchnls - clim;
            change = 2;
            goto com;
    case 256*73:    /* page up */
            if (dspmode == 1) {     /* hex display */
                    dxo += nohgrps*nodrows;
                    if (dxo +nohgrps*nodrows > dsmax)
                            dxo = (dsmax)-nohgrps*nodrows;
            }
            else {
                    if (dxo + 2 * rowlen <= dsmax)
                            dxo += rowlen;
                    else
                            dxo = dsmax- rowlen;

if (dxo % gexp != 0)
                            dxo -= dxo % gexp;
            }
            change = 2;
            goto com;
    case 256*115:   /* control left arrow */
            x = 2;
            if (dspmode != 0) goto com;
            dspinit();
            y = 0;
            while (y != ESC) {
                    if (dxo+x < dsmax - rowlen) {
                            dxo += x;
                            dspoff = dxo;
                            dispgen(buffer,0);
                            putdsmp();
                    }
                    else break;
                    if (kbhit()) {
                            y = get_one();
                            if ( y==256*115) x *= 2;
                            else if (y == 'S')
                                    break;
                    }
            }
            goto com;
    case 256*116:   /* control right arrow */
            x = 2;
            if (dspmode != 0) goto com;
            dspinit();
            y = 0;
            while (y != ESC) {
                    if (dxo-x >= dsmin) {
                            dxo -= x;
                            dspoff = dxo;
                            dispgen(buffer,0);
                            putdsmp();
```

```
                        }
                        else break;
                        if (kbhit()) {
                                y = get_one();
                                if ( y==256*116) x *= 2;
                        }
                }
                goto com;
com:
                c = 0xff;
                if (dxo != dspoff) {
                        dspoff = dxo;
                        putdsmp();
                }
                ec_show();
                if (flg == 1) {loop = 0; break; }
                if (istate != 1) {              /* not executing a macro */
                        set_tmo(KEY_DELAY);
                        while (!c_ready()) {
                                if (tst_tmo()) break;
                        }
                }
                        if (c_ready()) {
                                c = get_one();
                                goto cntu1;
                        }
                        if (change > 0) {
                                ec_clear();
                                if (change == 2) {
                                        display(buffer);
                                        putdsmp();
                                        ec_show();
                                }
                        }
                        loop = 0;
cntu1:
                        break;
                default:
                        loop = 0;
                        break;
                }
        }                       /* while loop */
        topic = hsave;
        return(c);
}
ec_show()
{
        if (editmode == 1) wve_cur(ecrow,eccol);
        else
        if (editmode == 3) dgc(anecol,anerow);
        else
        if (editmode == 2) move_cur(1+ecrow+rowoff,eccol);
}
ec_clear()
{
        if (editmode == 1) wve_cur(-1,0);
        else if (editmode == 3) dgc(-1,0);
        else if (editmode == 2) erase_cur();
}
int     sv_dispsel = 'N';
void do_disp(x)                         /* save display selection */
int     x;
{
        sv_dispsel = x;                 /* save this selection */
        switch (x) {
        case 'D':
                dspstate = 1;
                tmpsave = databuf;
                break;
        case 'R':               /* Display Mask */
                dspstate = 2;
                tmpsave = maskbuf;
                break;
```

```
                        case 'T':
                                dspstate = 3;
                                tmpsave = tolbuf;
                                break;
                        case 'E':
                        case 'F':
                                dspstate = 5;
                                tmpsave = newbuf;
                                break;
                }
        }
        int     sv_highsel = 'N';
        void do_high(x)
        int     x;
        {
                sv_highsel = x;
                switch(x) {
                case 'D':
                        highstate = 1;
                        highsrc = databuf;
                        break;
                case 'R':
                        highstate = 2;
                        highsrc = maskbuf;
                        break;
                case 'T':
                        highstate = 3;
                        highsrc = tolbuf;
                        break;
                case 'E':
                case 'F':
                        highstate = 5;
                        highsrc = newbuf;
                        break;
                default :
                        highstate = 0;
                        highsrc = NULL;
                }
        }
        reset_dispbufs()           /* reset buffer addresses after reallocation */
        {
                do_disp(sv_dispsel);
                do_high(sv_highsel);
        }
        check_version(flg)
        int     flg;               /* flg = 0: no prompt, flg = 1: prompt and wait */
        {
                        put2(cpyrghtf);
                        get_live_version();
                        put1(tmpstr);            /* string set by g_l_v() */
                        if (flg) {
                                put3("Press Space Bar to Continue");
                                get_one();
                                put3(" ");
                        }
        }
        set_eccol()                /* set eccol from Hex edit variables */
        {
                int     x,y,z=0;
                eccol = coloff + 8 + hexmax + hexmax/2 - (hexpos + hexpos/2);  /* 0 == 1
        }
        exclude(probe)
        int     probe;             /* eliminate this bank from digital display */
        {
                int     x,i;
                x = 0;
                while(x < numchnls) {
                        if (SO_CHLST[2*x] == probe) {
                                for (i=x*2;i<numchnls*2; i+=2) {

SO_CHLST[i]=SO_CHLST[i+2];
                                        SO_CHLST[i+1] = SO_CHLST[i+3];
```

```
                        }
                        numchnls--;
                        SO_CHNUM--;
                }
                else x++;
        }
}
putback(probe)                  /* put this bank back into the digital display list */
int     probe;
{
        int     x,i;
        x = numchnls;
        for (x = 0; x < numchnls; x++) {
                if (probe <= SO_CHLST[2*x])
                        break;
        }
        if (numchnls + 8 <= nc0 + nc1) {
                for (i=numchnls-1; i>=x; i--) {
                        SO_CHLST[2*(8+i)] = SO_CHLST[2*i];
                        SO_CHLST[1+2*(8+i)] = SO_CHLST[1+2*i];
                }
                for (i=0;i<8; i++) {
                        SO_CHLST[2*x]=probe;    /* bank number */
                        SO_CHLST[2*x+1] = i;    /* channel number */
                        numchnls++;
                        SO_CHNUM++;
                        x++;
                }
        }
}
/* GLOBAL.H  Copyright(C)1986  Array Analysis, Inc. */
/* v1.43 7/8/88 add global reference for compress variable */
#include         "structrs.h"
#include         "setup.h"

/*      External Data Declarations      */
extern  int     debugflg;
extern  FILE    *hlp_file;
extern  FILE    *lrnfile;
extern  char    memprompt[],temprompt[];
extern  int     dfile;
extern  int     dtafile,setfile,hndxfile;
extern  char    setname[];
extern  int     maskfile;

#ifdef  MCP32
extern  char    databuf[];
#endif
ifdef  MCP96
extern  char    *databuf;
extern  int     dsmin1,dsmax1,pilstart,tmp_pilstart,file_pilstart,sampskew;
endif extern  char    *hdb,*spb;
extern  char    *maskbuf,*newbuf,*tolbuf;

extern  char    hlp_line[];
extern  int     hlock;

extern  char    *topic,tmpstr[],clrscrl[],dirscrl[],toppos[],botpos[];
extern  char    *dname;
extern  int     opmode,status,totframe,curframe,curset,totset;
extern  int     ptmode;

extern  char    *key_form[],*dos_form[],*fun_form[],*file_form[],*tran_form[];
extern  char    *disp_form[],*sel_form[],*anal_form[],*ref_form[],*wved_form[];
extern  char    *baud_form[],*edit_form[],*opt_form[],*first[],
                *screen1[],*screen3[],*aned_form[],
                *screen4[],*screen5[],*screen6[],*dsptag[],*cl_form[],
                *passban[],*failban[],*si_form[],*li_form[],*tmd_form[],
                *vp_form[],*cr_form[],*sj_form[],*hl_form[],*testban[],
                *mxr_form[],*popt_form[],*fopt_form[],*gen_form[],*tdm_form[],
                *sf_form[],*rf_form[],*wf_form[],*ui_form[],*di_form[];
extern  char    *cd_form[],*lf_form[],*cps_form[],*lc_form[],*sgc_form[],
```

```
                      *lrn_form[],*per_form[],*hex_form[],*tst_form[],
                      *mac_form[],*mpg_form[],*mex_form[],*exf_form[],
                      *epc_form[],*epd_form[],*epu_form[],*kmn_form[];
extern    char        prmpt1[],prmpt2[],prmpt4[],prmpt5[],
                      prmpt6[],prmpt7a[],prmpt7b[],prmpt8[],prmpt9a[],prmpt10[];
extern    char        prmsel[],pos1[],pos2[],pos3[],pos4[],clr123[],clrbot[],clrall[];
extern    char        rsp1[],rsp2[],rsp3a[],rsp3b[],rsp4a[],rsp4b[],*statscr[],stfnme[
extern    char        *latag[],curfrm[],frmcnt[],lastat[],mfis_pos[],
                      dsptype[],dsptime[],timepos[],*dsptag[],lrnstate[],colcount[];
extern    int         dspstate;
extern    int         dspclean;
extern    int         voffset;         /* Vertical Offset */
extern    char        wxbuf[];
extern    int         *window;
extern    int         token[];
extern    int         chnsize;         /* Number of bytes per channel */ extern    int         numchnls;        /* Number of valid channels */
extern    int         cell;
extern    int         level;
extern    int         lastlevel;
extern    int         linesize,resolution;
extern    int         setsize;
extern    int         istate;

extern    char        *plist[];
extern    char        *tmpsave;
extern    int         blocksize;
extern    int         dsmin,dsmax;
extern    char        *ssv_buf;

extern    int         editmode,ecrow,eccol;
extern    char        baudpos[];
extern    char        rsp7[];
extern    char        nrmscrol[],helpscrol[],shrtscrol[];
extern    char        rsp8[];
extern    char        rsp9[];
extern    char        rsp10[];
extern    unsigned    lastway;
extern    char        tmask[];
extern    char        kpadscrl[];

extern    char        ddp1[],ddp2[],ddp3[],dcp1[],dcp2[],dcp3[];

extern    int         msflag;          /* defined in transfer.c */
extern    int         dspmode;         /* display mode: 0: Wave, 1:Hex */
extern    int         lrepeat;         /* controls loop in learn.c */
extern    int         mpw;             /* anal.c: minimum pulse width */
extern    int         pksize;          /* size: # of binary data bytes in packet */

/* Labels for Keypad Emulation Routine */
extern *hextag[];

long      lseek();
char      * det_buf();

unsigned int    get_one(),posit(),prompt();

unsigned        prompt();

char            *det_buf();

/*        Display Control Variables      */ extern    int         token[2];
extern    int         cell;
extern    int         level;
extern    int         lastlevel;
extern    int         resolution;      /* Number of samples per bit */
extern    int         expansion,gexp;  /* Number of bits per sample */
extern    int         numchnls;        /* Number of valid channels */
extern    int         chnsize;         /* Number of bytes per channel */
extern    int         voffset;         /* offset for beginning channel */
```

```
extern    int       nc0,nc1,exp0,exp1;        /* Contrcls synchronization of dspl */
extern    int       csz0,csz1,mxs;            /* channel sizes in samples */
extern    int       np0,ncp0,np1,ncp1;        /* number pods, number channels per pod
extern    int       clim;                     /* limit to number of channels on screen
extern    int       rowoff;                   /* first row to use for display */
extern    int       linesize;                 /* total length of line */
extern    int       coloff;                   /* chars used by the channel label */
extern    int       rowlen;                   /* actual size of display area on line *
extern    int       bufstate;                 /* set by set buf routine */
extern    int       tstlock;                  /* prevent the nested execution of test
extern    int       nhchn;                    /* Next_high static channel variable */
extern    int       cpdn,cchn;                /* current pod number and channel number
extern    int       rchn,cndx;                /* raw channel number, chan index */
extern    char      *highsrc;                 /* source for highlight funciton */
extern    int       highstate;                /* state of highligh function */
extern    int       rptcycle;                 /* cycles through command file */
extern    int       somin,somax;
extern    unsigned  fmark;                    /* address of first high */
unsigned  scan_buf();                         /* function defintion */ extern    hidemrk;            /* hide mark flag */
static    mrkflg;             /* segment copy variables */
extern    smkx,emkx,dmkx,
          smky,emky,dmky;
extern    char      *mrksrc;

/*        Variables for Hex Editting */ extern    hexgrp;             /* 0, 1, 2, 3 - 4 columns of data */
extern    hexpos;             /* Left to Right Virtual Index */
extern    hexmax;             /* Number of Digits for full sample */
extern    long gstep,gvalue;
extern    gcount;             /* counter generation variables */
extern    gstart,glen;

extern    int       verdict;                  /* record of last judgemnet */
extern    int       differences;
extern    int       maxpass,maxfail,curpass,curfail;
extern    char      passchain[32], failchain[32];
extern    char      *opts;
extern    FILE      *log_file;
extern    char      log_name[65];

extern    unsigned int failures;
extern    int       differen;
extern    int       firsthigh;                /* failures on last test */
extern    int       trancount;
extern    int       lastlevel;
extern    int       scanpod;
extern    int       scanchan;
extern    int       startscan;
extern    int       stopscan;

extern    int       rptc;
extern    int       statflg;
extern    int       exflag;
extern    int       insmode;                  /* used comment editor mode */
extern    int       wkchar;
extern    int       inhbflg;
extern    char      *scantmp;
extern    int       scanst;
extern    int       firstlow;
extern    char      *vdas_form[];
extern    int       xecrsp;
extern    int       graphics;
extern    char      *anp_form[];
extern    int       *drawbuf;
extern    unsigned  dbmax;
extern    int       hedge,vedge;
extern    int       ioswitc;
extern    int       bandflag;
```

```
extern   int      microflg;
extern   int      *drawbuf;
extern   unsigned int    dbmax;
extern   unsigned char *dstart;
extern unsigned bitpos,holding;
extern   int      pxpcol, pxprow;
extern   int      hpxo,               /* Horizontal Pixel Offset */
         vpxo,                        /* Vertical Pixel Offset */
         vsh;                 /* Vertical Sample Width */
extern   int      analcnt;            /* Number of Analog Channels Present */
extern   char     analmap[4];
extern   int      alim;               /* number of rows */
extern   int      tpxrow, tpxcol;
extern   int      boxrows;
extern   int      base[2];     /* grphics library variable */
extern   char     *cku[];
extern   char     *plgtag[];
extern   int      anecol,anerow,ancmax,ancmin,ancoff,anroff,
                  anrmax,anrmin,ancinc,anrinc,aneon,anezero;
extern char       *ptyp_form[];
extern   int      aoff,attr,ascale,offset,amax,hxpos,zline;
extern   char     memtitle[],temtitle[],otmtitle[],fmntitle[],vwmtitle[];
extern   char     tsmtitle[],hemtitle[],aemtitle[],demtitle[],kemtitle[];
extern char       kemprompt[],memprompt[],temprompt[],*bsc_form[],*cpb_form[];
extern   int      dspclean;
extern   char     *aop_form[],*ao2_form[],*ao3_form[],ao4_form[],*pof_form[];
extern   char     *fdm_form[];
extern   int      glbfom,glbdnum;
extern   char     glbdiag[];
extern   int      sprflag;
extern   int      banksize;
extern   STA      q;           /* sticky area structure */
extern   int      dsp_regen;   /* egenaerate all display labels */
extern   int      rgn_dgtl;    /* regenerate digital labels */
extern   int      hardcopy;
extern   int      log_menu;
extern   char *bsk_form[], *bdr_form[];
extern   int bankskew;
extern   char     *bfp_form[];
extern   int      clines,alines;
extern int brieftestactive;
extern   int      aoffcnt;
extern   int      mdsp_toggle;
extern   int      mecurtog;

/* COMMON SOURCE MODULE FOR MFI CONTROL PROGRAM 2 and 48 */
/*    COPYRIGHT(C)1986,1987,1988.  ARRAY ANALYSIS, INC.    */
/* STRUCTRS.h: version.h selects MFI-1000 or MFI-AG48 conditional source */ ifdef MCP32
/* Here commence certain Data Structures */
typedef  struct tag {
         char tagg[8];
} TAG;
#define dspoff   (sp->doff)
typedef struct  hdr {                  /* Frame Header */
         char    date[16];
         char    time[16];
         char    title[96];
         int     ssz;                  /* size of setup area */
         TAG     labels[32];
         int     vbfsize;
         int     ac1,ac2;
         unsigned long    lock;        /* lock for data frame */
         unsigned long    fdmlock;     /* future lock for FDM data base */
         int     frmport,muxcode;      /* frame port selection, mux code */
         int     maxpass,maxfail;
         char    passopt[16],failopt[16];
         int     onpass, onfail;       /* next frame, -1 == stop */
         int     muxcd2,fomcutof;
         char    filler[1024-(16+16+96+2+32*8+6+8+8+32+8)];
         char    notes[1024];
```

} HDR;
endif
ifdef MCP96
/* 5/23/88 Added bufsize and pi1start to header record */
/* Here commences the Frame Header Record description for Microsoft */
typedef struct { char x[6]; } LTAG;
define HO_DATE        ((char *)&(hdb[0]))
define HO_TIME        ((char *)&(hdb[16]))
define HO_TITLE       ((char *)&(hdb[32]))
define HO_SSZ         *((int *)&(hdb[128]))
define HO_VBFSIZE     *((int *)&(hdb[130]))
define HO_AC1         *((int *)&(hdb[132]))
define HO_AC2         *((int *)&(hdb[134]))
define HO_LOCK        *((unsigned long *)&(hdb[136]))
define HO_FDMLOCK     *((unsigned long *)&(hdb[140]))
define HO_FRMPORT     *((int *)&(hdb[144]))
define HO_MUXCODE     *((int *)&(hdb[146]))
define HO_MAXPASS     *((int *)&(hdb[148]))
define HO_MAXFAIL     *((int *)&(hdb[150]))
define HO_PASSOPT     ((char *)&(hdb[152]))
define HO_FAILOPT     ((char *)&(hdb[168]))
define HO_ONPASS      *((int *)&(hdb[184]))
define HO_ONFAIL      *((int *)&(hdb[186]))
define HO_MUXCD2      *((int *)&(hdb[188]))
define HO_FOMCUTOF    *((int *)&(hdb[190]))
define HO_BUFSIZE     *((int *)&(hdb[192]))
define HO_PI1START    *((int *)&(hdb[194]))
define HO_LABELS      ((LTAG *)&(hdb[196]))
define HO_STOFDSP     *((unsigned int *)&(hdb[772]))
define HO_FFON        *((int *)&(hdb[774]))
define HO_FFSPAN      *((int *)&(hdb[776]))
define HO_FFWEIGHT    *((int *)&(hdb[778]))
define HO_PRMCODE     *((int *)&(hdb[780]))

define HO_PROMPT      ((char *)&(hdb[782]))
define HO_MFIVER      *((int *)&(hdb[850]))
define HO_SC1         *((int *)&(hdb[852]))
define HO_SC2         *((int *)&(hdb[854]))
define HO_PODDT       ((char *)&(hdb[856]))
define HO_ACHLST      ((char *)&(hdb[868]))
define HO_ANSIZ       (hdb[881])
define HO_ANVRTC      ((int *)&(hdb[882]))           /* 12 ints */
define HO_ANALSET     ((char *)&(hdb[906]))          /* 12 chars */
define HO_MUXDELAY    *((int *)&(hdb[918]))          /* leave space */
define HO_AXPMODE     (hdb[920])
define HO_AUXPRG      ((char *)&(hdb[921]))
define HO_AXPMD2      (hdb[954])
define HO_AUXP2       ((char *)&(hdb[955]))
define HO_AXPMD3      (hdb[988])
define HO_AUXP3       ((char *)&(hdb[989]))
define AXPSIZE 32
define HO_NOTES       ((char *)&(hdb[1024]))                        /* size
define CMNTSIZE       1024 define achscale       HO_ANVRTC
define dspoff         HO_STOFDSP
define SO_ANALSET     HO_ANALSET
define SO_ACHLST      HO_ACHLST
define SO_PODDT       HO_PODDT
define SO_ANSIZ       HO_ANSIZ
define HOFF_LOCK      136
define HOFF_BUFSIZE   192
define HOFF_PI1START  194
define HOSZ_LABELS    6

/* Here commences the original structure declaration */ typedef struct  hdr {                   /* Frame Header */
        char    date[16];               /* :0 */
        char    time[16];               /* :16 */
        char    title[96];              /* :32 */
        int     ssz;                    /* size of setup area :128 */
        int     vbfsize;                /* :130 */
        int     ac1,ac2;                /* :132, :134 */

```c
        unsigned long    lock;              /* lock for data frame :136 */
        unsigned long    fdmlock;           /* future lock for FDM data base :140*/
        int     frmport,muxcode;            /* frame port:144 , mux code :146 */
        int     maxpass,maxfail;            /* :148, :150 */
        char    passopt[16],failopt[16];    /* :152 , :168 */
        int     onpass, onfail;             /* next frame, -1 == stop :184 ,:186 */
        int     muxcd2,fomcutof;            /* :188, :190 */
        int     bufsize;                    /* buffer size of stored frame :192 */
        int     pilstart;                   /* division of plug in buffer :194 */
        char    labels[96][6];              /* six char strings for labels :196 */
        unsigned int stofdsp;               /* start of display :772 */
        char    filler[1024-(16+16+96+2+6+8+8+32+12+96*6+2)];
        char    notes[1024];                /* :1024 */
} HDR;
#define PRMFILSIZ       512
typedef struct sticky_area {
    int     baudrate;
    int     comport;                        /* baud rate setting, first of parm group */
    int     nattr;                          /* display attributes */
    int     hattr;
    int     rattr;
    int     mxbs;                           /* maximum bit number */
    int     llport;                         /* parellel port address */
    int     gpib;               /* gpib address of the MFI-1000 */
    int     gpctl;              /* gpib controller base address */
    int     tattr;              /* trigger cursor attribute */
    int     cattr;              /* cursors attribute */
    int     eattr;              /* errors attribute */
    int     biomode;                        /* bios io switch:0 = Off,1 = On. */
    int     battr;              /* background attribute */
    int     videomd;            /* video display mode */
    int     analtype;
    int     analdiv;
    int     keyattr;
    int     mnemflg;
    int     gattr;              /* guard band attribute */
    int     hsw;                /* Horizontal Sample Width */
    int     vsw;                /* Vertical Sample Width */
    int     prtype;
    int     prdir;
    int     prsize;             /* 3 variables for ESG scrndump */
    int     gbaoff;             /* total of 517 */
    int     glbscale;           /* total of 519, global display scale */
    int     pattr,fattr;
    int     sprdest;            /* screen print destination: 0-Printer, 1-File */
    int     analatr[NUMAC];     /* analog display attributes */
    int     compress;           /* waveform display compression */
    int     dispflg1;           /* Testing Display mode: Full or Brief */
    char    pkmode;             /* determines hex or binary data in packets */
    char    xxx;
    char    passopt[8],failopt[8];  /* total of 535 */
    char    sprfname[65];
    char    hlp_prfx[65];
    char    log_name[65];
    char    lrnname[65];
    char    dfname[65];         /* data file name as entered */
    char    dtaname[65];        /* data file name assembled for DOS */
    char    maskname[65];
    char    hndxname[65];       /* 7 * 65 = 455 */
    char    lastmacro[65];
    int     shwfdstat;
    int     numfltdsp;          /* number of faults to display */
    int     autonomous;
    int     shorts;
    int     autolog;
    int     timeout;
    int     current_port;
    char    macprefix[65];
    int     bskewmode;                      /* bank skew mode:0-off,1-manual,2-automatic */
    char    bskew[12];          /* actual bank skew factor */
    int     trgskewmode;        /* trigger skew mode: 0-off,1-manual,2-automatic */
    int     trgskew;                        /* correction factor for trigger display */
    int     quickmode;                      /* controls upload, download, test of certain ba
```

```c
        int     filler[PRMFILSIZ];
        char    stick_end;
} STA;              /*keep as last variable, used to compute size */
                    /* END OF THE STICKY AREA */
endif /* diagnose.h - strucutre for fault diagnosis */
define FFDEPTH         4
/* Fault Diagnosis Mods */
/* v2.02 Source module made common for both MCP2 and MCP48 */ define DTRHD   6
define DTFSZ   2
#define ASRHD   6
define ASFSZ   3 typedef struct dar {    /* digital abstract record,one channel * 8 */
        int     t;      /* type of record = 1 */
        int     id;
        int     b;
        int     g;
        unsigned long r1;
        unsigned long r2;
} DCA;
typedef struct dtr {
        int     t;      /* type of record = 2 */
        int     id;     /* bank and channel number
        int     c;      /* number of transitions */
        int     l[1];   /* list of transitions */
} DCT;
typedef struct asr {
        int     t;      /* type Analog Sample record = 3 */
        int     id;     /* bank and channel, 0 for analog */
        int     c;      /* number of sample points recorded */
        struct asf {
                int     s;      /* sample number */
                signed char v;  /* value of sample */
        } s[1];
} ACS;
typedef union uu1{
        DCA     a;
        DCT     t;
        ACS     s;
} UC;

typedef struct obcell {             /* cell for observing one error plane */
        int     ndx;                /* index number */
        int     cnt;                /* deleted flag or number of times accepted */
        int     ftype;              /* fault type: ffon is copied to here */
        unsigned ftran;             /* first transition in time */
        int     fhistory;           /* history factor for this fault */
        int     mweight;            /* degree of significance to one sided match */
        int     fweight;
        int     records;               /* number of channel records in this fau
        unsigned link;              /* size of entire record in bytes */
        char    xxx[16];            /* future expansion */
} OBC;

#define ABSIZE          (sizeof(OBC))
#define FPBUFSIZE       256
#define         MCP96   1
/* Lattice C Declarations                                       */
/* Rev. C.1                                                     */
/*                                                              */
/* You MUST include the following three declarations in         */
/* your program.                                                */
/*                                                              */
/* Status variables declared public by cib*.obj.                */ extern  int     ibsta;  /* status word                  */
extern  int     iberr;  /* GPIB error code              */
extern  int     ibcnt;  /* number of bytes sent         */
```

```c
/* diagnose.h - strucutre for fault diagnosis */
define FFDEPTH         4
#define WASIZE          24
/* Fault Diagnosis Mods */
/* v2.02 Source module made common for both MCP2 and MCP48 */
typedef struct obcell {              /* cell for observing one error plane */
        int     ndx;                 /* index number */
        int     cnt;                 /* deleted flag or number of times accepted */
        int     ftype;               /* fault type: ffon is copied to here */
        unsigned ftran;              /* first transition in time */
        int     fhistory;            /* history factor for this fault */
        int     mweight;             /* degree of significance to one sided match */
        int     fweight;
        char    xtra[2];             /* fututre expansion */
        union uu1{
                struct dab{          /* digital abstract record,one channel * 8 */
                        int     t;   /* type of record = 1 */
                        int     g[8];
                        int     b[8];
                        unsigned long r1[8];
                        unsigned long r2[8];
                } a;
                struct dtr {
                        int     t;   /* type of record = 2 */
                        int     c[8]; /* number of transitions */
                        int     b[8]; /* number of bits high */
                        int     tl[8][FFDEPTH];
                } t;
                struct asr {
                        int     t;   /* type Analog Sample record = 3 */
                        int     c;
                        struct asf {
                                int     s;   /* sample number */
                                signed char v; /* value of sample */
                        } l[FFDEPTH*8];
                } s;
                struct aab {
                        int     t;   /* type Analog Sample record = 4 */
                        int     c;   /* total number of error samples */
                        unsigned long sg[WASIZE];         /* error
                } w;                 /* whole analog */
        } u[CHDEPTH/8];
} OBC;
#define ABSIZE          (sizeof(OBC))
#define FPBUFSIZE       256

/* 2/20/86 */
/* 5/23/88 -- Modified setup record for MFI 48 firmware -- DHW */
/* Modified records are seperated by new line */

/* For Microsoft COmiler must address setup variables expicitly */
/*      char *spb is the addres of setup buffer, set by init() in pc.c*/
typedef struct { unsigned char xxx[2]; } AAR;
#define SO_PLUG0        (spb[1])
#define SO_PLUG1        (spb[2])
#define SO_CHNUM        (spb[4])
#define SO_CHLST        ((char *)&(spb[5]))
/*      define  SO_ACHLST       ((char *)&(spb[205])) */
#define SO_LATCH0       (spb[222])
#define SO_LATCH1       (spb[223])
#define SO_DSPMAGC      (spb[226])
#define SO_DSPMAG       (spb[227])
#define SO_PGEX         (spb[228])
/*      define  SO_PODDT        ((char *)&(spb[229])) */
/*      define  SO_ANSIZ        (spb[241]) */
#define SO_ANOFF        ((AAR *)&(spb[242]))
#define SO_ANVRTC       ((char *)&(spb[266]))
#define SO_HC1          ((unsigned char)spb[278])
#define SO_HC2          ((unsigned char)spb[279])
/*      define  SO_ANALSET      ((unsigned char *)&(spb[280])) */
#define SO_TRGDLY       *((unsigned *)&(spb[317]))
#define SO_FASTPI       (spb[319])
#define SO_CLKCOD2      (spb[320])
#define SO_CLKUNIT2     (spb[321])
```

```c
#define SO_CLKPER2    *((unsigned *)&(spb[322]))
#define SO_CLKCOD     (spb[328])
#define SO_CLKUNIT    (spb[329])
#define SO_CLKPER     *((unsigned *)&(spb[330]))
#define SO_DTRIG      *((unsigned *)&(spb[344]))
#define SO_DCU1       *((unsigned *)&(spb[351]))
#define SO_DCU2       *((unsigned *)&(spb[358]))
#define SO_NEGTRIG    (spb[381])
#define SO_SAMPFST    *((unsigned *)&(spb[382]))
#define SO_SAMPSLW    *((unsigned *)&(spb[384]))
#define SO_BADSAMPS   *((unsigned *)&(spb[392]))
#define SO_DATAEND    *((unsigned *)&(spb[394]))
#define SO_CHNUM0     (spb[505])
#define SO_CHNUM1     (spb[506])
#define SO_MCK0       (spb[715])
#define SO_MCK1       (spb[716])
#define SO_TSCLK      (spb[741])
#define SO_AGIO       ((char *)&(spb[1530]))
#define SO_AGAD       ((char *)&(spb[1542]))
#define SO_AGMD0      (spb[1566])
#define SO_AGMD1      (spb[1567])
/* ROM Version 8.10 adds 192 bytes at offset 1566 10/22/88 */
#define SO_TDLAB      ((char *)&(spb[1757]))
typedef struct sup {
    char     cksm;           /* Setup area checksum */
    char     plug0;          /* type of plugin 0 :1*/
    char     plug1;          /* type of plugin 1 :2*/
    char     dspdirt;        /* 0 - if good, otherwise no good */
    char     chnum;          /* :4 */
    char     chlst[2*97];    /* pod-chanel couples for display :5*/
    char     fill1[6];       /* new fill for AG48 :199*/
    char     achlst[13];     /* analog channel list ; 0,1,2,3 .. FF :205*/
    char     sfl1a[4];       /* :218 */
    char     latch0;         /* latch mode for display data :222*/
    char     latch1;         /* same for plugin 1 :223*/
    char     inv0;           /* :224 */
    char     inv1;           /* :225 */
    char     dspmagc;        /* code for magnification :226*/
    char     dspmag;         /* magnification character :227*/
    char     pgex;           /* :228 */
    char     poddt[12];      /* 0=digital,1=analog,2=anal off :229 */
    char     ansiz;          /* 0=0 anal, 1=1/3 anal, 2=2/3, 3=2/3;0 :241 */
    unsigned char anoff[12][2]; /* :242 */
    char     anvrtc[12];     /* 0 = no compression,1 = 1/2 compression :266*/
    unsigned char hc1;       /* :278 */
    unsigned char hc2;       /* :279 */
    unsigned char analset[12]; /*10,20,50,100,200,500 mv :280*/
    char     sfl1b[25];      /* :292 */
    unsigned trgdly;         /* samples betweeen the trigger & EOR :317*/
    char     fastpi;         /* fastest plugin, 2 = same :319*/
    char     clkcod2;        /* code for slow speed :320 */
    char     clkunit2;       /* clock period for slow plug in :321 */
    char     clkper2[6];     /* clock period for slow, numeric part :322 */
    char     clkcod;         /* code for fast clock period :328 */
    char     clkunit;        /* fast clock period :329 */
    int      clkper;         /* fast period, numeric part :330*/
    char     clkpd[5];       /* :332 */
    unsigned doff;           /* offset in bits into display :337*/
    char     doffd[5];       /* :339 */
    int      dtrig;          /* :344 */
    char     dtrigd[5];      /* display trigger :346 */
    int      dcu1;           /* :351 */
    char     dcu1d[5];       /* display cursor 1 :353 */
    int      dcu2;           /* :358 */
    char     dcu2d[5];       /* display cursor 2 :360 */
    char     sfl1c[16];      /* :365 */
    char     negtrig;        /* 0 = positive,1 = negative trigger :381 */
    unsigned sampfst;        /* # of sample in fast data block :382 */
    unsigned sampslw;        /* # of samples in slow data block :384 */
    unsigned samps;          /* meaningful sample points; fast block :386 */
    unsigned samps2;         /* meaningful sample points; slow block :388 */
    char     reps;           /* number of reps ? :390 */
    char     igbits;         /* # of bits to ignore :391*/
```

```c
        unsigned badsamps;    /* # of samples to skip at beg and end :392 */
        unsigned dataend;     /* samps + badsamps :394 */
        char     sf12c[106];  /* fill to end of hardware set up area :396 */
        char     sf13[3];     /* fill in 3 bytes into menu set up area :502*/
        char     chnum0;      /* Number of channels is plug in 0 :505 */
        char     chnum1;      /* Number of channels in a plug in 1 :506*/
        char     sf14[1090];  /* skip to labels :507 */
        char     tdlab[32*5]; /* mfi labels :1597 */
                              /* :1757 */
/* WARNING!! Do not allocate more label space until firmware has been upgraded
to do so.  Currently only 32 channels may have labels!! */

}SA;
/* COMMON SOURCE MODULE FOR MFI CONTROL PROGRAM 2 and 48 */
/*   COPYRIGHT(C)1986,1987,1988.  ARRAY ANALYSIS, INC.   */
/* CONSTANT.H  MCP2 Program Constants */ include        <sys\types.h>
include        <sys\stat.h>
#include        <dos.h>
#include        <fcntl.h>
#include        <math.h>
#include        <string.h>
#include        <stdio.h>
#include        <stdlib.h>
#include        <time.h>
#include        "version.h"    /* sets MFI Type version definition */

/*    This program uses the PC as a front end to the LA */ ifdef  MCP32
define NUMAC           4              /* largest number of analog channels */
#define MAXPD0          2
#define MAXPD1          4
#define CHDEPTH         32
#define nohgrps         3
#define bufsize         4096
endif ifdef  MCP96
define NUMAC           12             /* largest number of analog channels */
#define MAXPD0          np0
#define MAXPD1          np0+np1
#define CHDEPTH         96
#define nohgrps         1
#define dfltbuf         4096           /* default value of display buffer */

/* AG48 definitions */
/* WARNING!! These definitions are based on a 2K AG48 and must be changed
        accordingly for other configurations */
#define PODSIZE48       2048           /* size of one bank on the AG48 */
#define PISIZE48        (PODSIZE48 * 6) /* size of one AG48 */
define ag48            0x08           /* plug-in code for an AG48 */ endif define hdrsize         2048           /* Header record size */
define setupsize       2048           /* set up buffer size */
#define        nodrows          16
#define        nodcols          62
#define        tnorows          25
#define        tnocols          80
#define        cbxcols          0
#define        mrgcols          1
#define        lsdcoff          72
#define        topbrdr          8
#define false           0
#define true            1
#define SETSIZ          0x5dd
#define BLINKON         0x8000         /* Attribut for blink */
#define BRIGHTON        0x0800         /* High Intensity Attribute */

/* PC extended key codes recognized */
```

```
#define ALT_A    30
#define ALT_B    48
#define ALT_C    46
#define ALT_D    32
#define ALT_E    18
#define ALT_F    33
#define ALT_G    34
#define ALT_H    35
#define ALT_I    23
#define ALT_J    36
#define ALT_K    37
#define ALT_L    38
#define ALT_M    50
#define ALT_N    49
#define ALT_O    24
#define ALT_P    25
#define ALT_Q    16
#define ALT_R    19
#define ALT_S    31
#define ALT_T    20
#define ALT_U    22
#define ALT_V    47
#define ALT_W    17
#define ALT_X    45
#define ALT_Y    21
#define ALT_Z    44
#define ALT_1    120
#define U_ARW    72
#define D_ARW    80
#define L_ARW    75
#define R_ARW    77
#define HOME     71
#define PG_D     81
#define PG_U     73
#define EN_D     79
#define INS      82
#define DEL      83
#define BT       15
#define F1       59
#define F2       60
#define F3       61
#define F4       62
#define F5       63
#define F6       64
#define F7       65
#define F8       66
#define F9       67
#define F10      68
#define SF1      84
#define SF2      85
#define SF3      86
#define SF4      87
#define SF5      88
#define SF6      89
#define SF7      90
#define SF8      91
#define SF9      92
#define SF10     93
#define CF1      94
#define CF2      95
#define CF3      96
#define CF4      97
#define CF5      98
#define CF6      99
#define CF7      100
#define CF8      101
#define CF9      102
#define CF10     103
#define AF1      104
#define AF2      105
#define AF3      106
#define AF4      107
#define AF5      108
```

```c
#define AF6        109
#define AF7        110
#define AF8        111
#define AF9        112
define AF10       113 define C_END      117
define C_PGDN     118
#define C_HOME     119
#define C_PGUP     132

/* Ascii control codes      */
#define CTLX       24
#define BS         8
#define HT         9
#define LF         0x0a
#define VT         11
#define FF         12
#define CR         0x0d
#define SI         15
#define SYN        22
#define CTLW       23               /* Used for help key */
#define CAN        24
#define SUB        26
#define ESC        27
#define RS         30               /* Home */
define SOE        0x1e /* Cursor type contstants */
define MA_COFF1      0x0d
#define MA_COFF2      0x00          /* Monochrome adapter, cursor off */
#define MA_CBLK1      0x00          /* Monochrome adapter, cursor off */
#define MA_CBLK2      0x0c          /*                   , block */
#define MA_CUL1       0x0b          /*                   , block */
#define MA_CUL2       0x0c          /*                   , under line */
#define CA_COFF1      0x08          /*                   , under line */
#define CA_COFF2      0x00          /* Color adapter, cursor off */
#define CA_CBLK1      0x00          /* Color adapter, cursor off */
#define CA_CBLK2      0x07          /*              , block */
#define CA_CUL1       0x06          /*              , block */
#define CA_CUL2       0x07          /*              , under line */
                                    /*              , under line */

/* Window Border Construction Characters */ define BOX_VL        0xb3                  /* Single Vertical Line */
```

```
        page    88,130

;       Assembly Subroutines for PC Interrupt driven I/O

;       Hardware Port Definitions base        equ     3f8h            ; Base address of Async board
trb         equ     0               ; Transmit Receive Buffer
ier         equ     1               ; Interrupt Enable Register
iir         equ     2               ; Interrupt Identification Register
lcr         equ     3               ; Line Control Register
mcr         equ     4               ; Modem Control Register
lsr         equ     5               ; Line Status Register
msr         equ     6               ; Modem Status Register
dll         equ     trb             ; Divisor Latch: LSB
dlm         equ     ier             ; Divisor Latch: MSB ;       ISR program states rque        equ     1
rblk        equ     2               ; receive into circular queue
qmsk        equ     07ffh           ; receive in block mode
                                    ; 2048 byte input queue ;       Argument structure on stack when called from C programs
```

```
a       struc
a_bp    dw      ?       ; reference pointer
a_rtn   dw      ?       ; return address
        dw      ?       ; large model: segment pointer
a_1     dw      ?       ; argument 1
a_2     dw      ?
a_3     dw      ?
a_4     dw      ?
a       ends ;       macro to load i/o address
ldio    macro   offset
        mov     dx,offset
        add     dx,cs:as_base
        endm dgroup  group   data
data    segment public  'data'
assume  ds:dgroup public  as_err as_err  dw      0

;       Baud Rate Divisor Table baudtab         label   word
                dw      417h            ; 7 - 110
                dw      180h            ; 6 - 300
                dw      0c0h            ; 5 - 600
                dw      060h            ; 4 - 1200
                dw      040h            ; 3 - 1800
                dw      030h            ; 2 - 2400
                dw      018h            ; 1 - 4800
                dw      00ch            ; 0 - 9600 baud divisor
                dw      600h            ; 8 - 75

;       Dynamic variables for async i/o activity rd_adr    dw    ?
rd_seg    dw    ?               ; Buffer address  for ioread
rd_cnt    dw    0
wr_adr    dw    ?               ; Character count for ioread
wr_seg    dw    ?               ; Buffer address  for iowrite
wr_cnt    dw    0
io_state  dw    1               ; Character count for iowrite
io_head   dw    0               ; Set initially to idle state
io_tail   dw    0               ; Queue head offset
io_buf    db    2064 dup(?)     ; Queue tail offset
                                ; io character queue
data    ends
pgroup  group   prog
prog    segment public 'prog'
        assume  cs:pgroup
        public  _as_int
        public  _ioInit
        public  _iioget
        public  _iioread
        public  _iowrite
        public  _ioput
        public  _ioflush
        public  _iobaud
        public  _iostat
        public  _ioquit
        public  _iobrk ;       Variables used to store entry state of Async hardware d_seg   dw      0               ; set by init
v_off   dw      0               ; old vector offset
v_seg   dw      0               ; old vector segment
sv_ier  db      0               ; save Interrupt enable register
sv_mcr  db      0               ; save modem control register
sv_pic  db      0               ; interrupt controller(8259)
```

```
                db      0
;       Variables storing current base address and async port as_base         dw      base            ; com port base address
pt_sel          dw      0               ; port select: 0 = com1, 1 = com2

;       Port selection parameter table ps_tab  label   word
                dw      CDF0CH          ; 8259 enable mask, int vector:COM1
                dw      03F8H           ; I/O port address base: COM1
                dw      0F70BH          ; enable mask, vector :COM2
                dw      02F8H           ; I/O port base address: COM2

;       Interrupt Service Routine Jump Table
inttab          label   byte
                dw      pgroup:iexit    ; Modem Status Interrupt
                dw      pgroup:tr_int   ; Transmitter Ready Interrupt
                dw      pgroup:dr_int   ; Data Ready Interrupt
                dw      pgroup:ls_int   ; Line Status Interrupt ;       Interrupt Service Routine Entry Point _as_int proc    far sti                     ; Set interrupts
                push    ax
                push    dx ;       Re-enable interrupt controller mov     dx,0020h        ; 8259 Inetrrupt controll port
                mov     al,20h          ; Interrupt acknowledge bit on 8259
                out     dx,al           ; Acknowledge the interrupt
                push    ds              ; Save current data segment
                push    bx
                push    di
                push    es ;       Setup data segment register mov     dx,cs:d_seg     ; Get program data segment
                mov     ds,dx           ; Make this the current data seg.

;       Interrogate the Interrupt Identification Register ldio    iir             ; Load address of Int. Id. Reg.
                in      al,dx           ; Read it
                mov     ah,al           ; Save it
                and     ah,01h          ; Test Int. pending bit
                jnz     iexit           ; No interrupt if high lea     di,cs:inttab    ; Get address of ISR jump table
                add     di,ax           ; Add int. id. to get correct offset
                jmp     cs:word ptr[di] ; Jump to appropiate service routine iexit:
                pop     es
                pop     di
                pop     bx
                pop     ds
                pop     dx
                pop     ax
                iret ;       Line Status Interrupt ls_int:
                jmp     iexit           ; Ignore Receiver Line Status ;       Data Ready Interrupt dr_int:
                ldio    lsr             ; Address the line status register
```

```
dr_nrdy:
        in      al,dx                       ; Get the line status
        and     al,01h                      ; Test for data ready, really
        jz      dr_nrdy                     ; Wait up for it
dr_again:
        ldio    trb                         ; Address the data register in      al,dx                       ; Read the byte cmp     byte ptr io_state,rblk      ; test for que state
        jnz     dr_que                      ; add this character to the que dec     word ptr rd_cnt             ; Update the read count
        mov     bx,rd_adr                   ; Get address of next buffer spot
        mov     es,rd_seg
        mov     byte ptr es:[bx],al         ; Save byte
        inc     rd_adr                      ; Increment buffer address
        test    rd_cnt,0ffffh               ; Make sure of buffer room
        jnz     iexit                       ; If so continue.
        mov     byte ptr io_state,rque      ; Count goes to Zero; go back to que
        jmp     iexit
dr_que:                                     ; Data ready, put character on queue
        mov     bx,io_tail
        mov     byte ptr io_buf[bx],al      ; stuff character
        inc     bx
        and     bx,qmsk                     ; mask off head offset
        cmp     bx,io_head
        jz      iexit                       ; if equal que is full mov     word ptr io_tail,bx
        jmp     iexit ;       Transmit Buffer Empty Interrupt
tr_int:
        test    wr_cnt,0ffffh               ; Test the transfer count
        jz      tr_none dec     wr_cnt                      ; Count in this byte
        ldio    lsr                         ; Line status register
tr_nrdy:
        in      al,dx                       ; Get the line status
        and     al,020h                     ; Make sure the register is empty
        jz      tr_nrdy                     ; Loop until mov     bx,wr_adr                   ; Get address of next byte
        mov     es,wr_seg
        inc     wr_adr                      ; Bump the address
        mov     al,es:[bx]                      ; Get the byte ldio    trb                         ; Transfer buffer
        out     dx,al                       ; Send character to transmit buffer jmp     iexit
tr_none:                                    ; This transfer is complete
        ldio    ier                         ; Interrupt enable register
        in      al,dx
        and     al,0dh                      ; Disable Tx Empty interrupt
        out     dx,al
        jmp     iexit
_as_int endp _ioinit proc    far push    bp
        mov     bp,sp
        mov     ax,[bp].a_1                 ; get port selection code
        push    bx
        push    es
        push    dx mov     cs:d_seg,ds                 ; save ds for int routine
```

```
        sal     ax,1
        sal     ax,1                    ; multiply by 4
        mov     cs:pt_sel,ax            ; save port select for use
        lea     bx,cs:ps_tab            ; offset of parameter table
        add     bx,ax push    bx                      ; save pointer to parameters
        push    ds                      ; save data segment mov     ax,cs:[bx + 2]          ; get I/O address
        mov     word ptr cs:as_base,ax  ; save base I/O address
        mov     al,byte ptr cs:[bx]     ; get vector number push    ax                      ; save vector number mov     ah,35h
        int     21h                     ; Do retrieve vector call
        mov     word ptr cs:v_off,bx    ; save old vector
        mov     word ptr cs:v_seg,es mov     dx,cs                   ; Code segment
        mov     ds,dx
        lea     dx,_as_int              ; Get offset for vector pop     ax                      ; Get vector number back
        mov     ah,25h                  ; DOS set int. vector call
        int     21h                     ; Do the DOS call to set the vector pop     ds                      ; Restore Data segment ldio    trb                     ; Transfer buffer
        in      al,dx                   ; Clear the receive buffer ;       Initialize Interrupt Enable Register ldio    ier
        in      al,dx
        mov     cs:byte ptr sv_ier,al   ; save old value mov     al,01h                  ; Receive Interrupts
        out     dx,al ;       Initialize Modem Control Register ldio    mcr
        in      al,dx
        mov     cs:byte ptr sv_mcr,al   ; save old value mov     al,0fh                  ; set bit3 to activate interrupts
        out     dx,al ;       Initialize state variables
        mov     al,rque
        mov     byte ptr io_state,al    ; set isr state to enque characters
        mov     ax,0
        mov     word ptr io_head,ax
        mov     word ptr io_tail,ax pop     bx in      al,21h                  ; read 8259A
        mov     cs:byte ptr sv_pic,al   ; save old value
        mov     ah,byte ptr cs:[bx + 1] ; get int enable mask
        and     al,ah                   ; mask off bit
        out     21h,al                  ; enable interrupt ;       Restore Registers and Return
        pop     dx
        pop     es
        pop     bx
        pop     bp
```

```
            ret
_ioinit  endp

;       iioget()                        Returns a character from io char queue
;
;               returns 0xff if there are no characters
;               returns 0x00cc where cc is the character _iioget  proc    far
         push    bx
         mov     bx,io_head
         cmp     bx,io_tail
         jz      iognone
         xor     ax,ax
         mov     al,io_buf[bx]
         inc     bx
         and     bx,qmsk           ; mask off overflow counts
         mov     word ptr io_head,bx    ; new head pointer
         pop     bx
         ret
iognone:                           ; No characters for the taking
         pop     bx
         mov     ax,0ffffh         ; Signal no characters
         ret
_iioget  endp ;       Read "count" bytes from the io port and save at "address"
;
;       iioread(address,count)             called by a C program
;
;       Returns:
;               0000h - Read operation complete
;               xxxxh - Remaining count
;               count - New read initiated
;
;       This routine, if called with a 0 count can be used to poll
;       the status of the currently pending read.

_iioread        proc    far

;        test    word ptr rd_cnt,0ffffh  ; Test current count
;        jz      stub1                   ; If zero we can start again
;        mov     ax,rd_cnt               ; Return the remaining count
         ret                             ; Read is already pending
;stub1:
;        push    bp                      ; Save
;        mov     bp,sp                   ; point to top of stack
;        mov     ax,[bp].a_3             ; Get new count
;        or      ax,ax                   ; Test for zero
;        jz      stub2                   ; Jump if dummy request
;
;        mov     bx,[bp].a_1             ; Get new address
;        mov     word ptr rd_adr,bx      ; Setup new address
;        mov     word ptr rd_cnt,ax      ; Setup new count
;        mov     byte ptr io_state,rblk  ; Set the block mode for ISR
;stub2:
;        pop     bp
;        ret
_iioread        endp ;       Write "count" bytes from "address" to I/O port
;
;       iowrite(address,count)
;
;       Returns:
;               0000h - Write operation complete
;               xxxxh - Remaining count
;               count - New read initiated
;
;       If called with a count of 0 can be used to poll previous write status
```

```
_iowrite proc   far
        test    wr_cnt,0ffffh           ; Test write count
        jz      wr_go                   ; Last write done, we can go on mov     ax,wr_cnt
        ret
    wr_go:
        push    bp
        mov     bp,sp
        push    bx
        push    dx
        push    es
        mov     ax,ss:[bp].a_3          ; Get count argument
        test    ax,ax
        jz      wr_done                 ; Dummy(polling) call mov     bx,ss:[bp].a_1          ; Get new address
        mov     es,ss:[bp].a_2          ; segment
        dec     ax                      , Decrement new count
        jz      wr_one                  ; One byte only, no ints
        inc     ax
        mov     word ptr wr_cnt,ax      ; Save count
        mov     word ptr wr_adr,bx      ; Save address
        mov     word ptr wr_seg,es      ; save segment
        ldio    ier
        in      al,dx                   ; Get int. enable register
        or      al,02h                  ; Enable transmit bit
        out     dx,al                   ; Enable the hardware
        jmp     wr_done wr_one:
        ldio    trb                     ; Data register
        mov     al,es:[bx]                  ; Get the byte
        out     dx,al                   ; write the first byte
    wr_done:
        pop     es
        pop     dx
        pop     bx
        pop     bp
        ret
_iowrite        endp _ioput  proc    far
        push    bp
        mov     bp,sp                   ; set up the frame pointer
        push    dx ldio    lsr
    ioplp1:
        in      al,dx                   ; get the line status
        and     al,020h                 ; test for tx register empty
        jz      ioplp1                  ; loop until ldio    trb                     ; get address of tx register
        mov     ax,ss:[bp].a_1          ; get the byte to send
        out     dx,al                   ; send the byte pop     dx
        pop     bp
        ret
_ioput  endp
_iostat proc    far
        push    bx
        mov     ax,0                    ; anticipate no character status
        mov     bx,io_head
        cmp     bx,io_tail
        jz      iost0
        mov     ax,0100H                ; set character ready bit
    iost0:
        pop     bx
        ret
_iostat endp
```

```
_ioflush        proc    far
        cmp     byte ptr io_state,rblk
        jnz     iof1 mov     byte ptr io_state,rque  ; resort to que state
        mov     word ptr rd_cnt,0       ; cancel any pending count
iof1:
        ret
_ioflush        endp _ioquit proc    far
        push    bx
        push    dx mov     dx,21h
        mov     al,cs:byte ptr sv_pic
        out     dx,al                   ; restore original value
        ldio    ier
        mov     al,cs:byte ptr sv_ier
        out     dx,al                   ; restore original value ldio    mcr
        mov     al,cs:byte ptr sv_mcr   ; get original value
        out     dx,al                   ; restore original setting lea     bx,cs:ps_tab            ; port sel parameter table
        add     bx,cs:pt_sel            ; add parameter offset
        mov     al,byte ptr cs:[bx]     ; get vector number push    ds
        cli
        mov     dx,cs:v_off             ; original vector offset
        mov     ds,cs:v_seg             ; original vector segment
        mov     ah,25h
        int     21h                     ; restore original vector
        pop     ds pop     dx
        pop     bx
        sti
        ret
_ioquit endp _iobrk  proc    far
        push    bp
        push    dx
        push    bx ldio    lcr
        in      al,dx
        mov     ah,al
        or      al,40h          ; break
        out     dx,al
        mov     bx,9000h
loop1:
        dec     bx
        jnz     loop1
        mov     al,ah
        out     dx,al           ; disable break pop     bx
        pop     dx
        pop     bp
        ret
_iobrk  endp ;               Set the Baud Rate and line control parameters
;
;       a_1     - baud rate (7 = 9600, ... see baudtab)
;       a_2     - word length (0 = 5, 1 = 6, 2 = 7, 3 = 8 character bits)
;       a_3     - stop bits (0 = 1, 1 = 2 stop bits)
;       a_4     - parity (0=None, 1=Odd, 3=Even, 5=Stick 1, 7= Stick 0)
```

```
_iobaud   proc    far
          push    bp
          mov     bp,sp mov     bx,ss:[bp].a_1          ; get baudrate index add     bx,bx                   ; double to be index
          mov     cx,baudtab[bx]          ; get proper divisor from table ldio    lcr
          mov     al,080h                 ; go into divisor latch
          out     dx,al                   ; set divisor latch bit in lcr mov     al,cl                   ; get low byte of divisor
          ldio    dll
          out     dx,al mov     al,ch                   ; msb of divisor rate
          ldio    dlm
          out     dx,al mov     ah,byte ptr ss:[bp].a_4     ; get parity parameter
          mov     cl,3
          rol     ah,cl                   ; put bits in proper place
          mov     al,byte ptr ss:[bp].a_3     ; get stop bit parameter
          dec     cl
          rol     al,cl                   ; put stop bits in proper position
          or      ah,al                   ; combine the two
          or      ah,byte ptr ss:[bp].a_2     ; throw in word length ldio    lcr                     ; address control register again
          mov     al,ah                   ; get setting
          out     dx,al                   ; set it
          pop     bp
          ret
_iobaud   endp prog      ends
          end
page      80,132
title     CURSOR.ASM      Copyright(C)1986  Array Analysis, Inc.
page
;
;         access to bios routines for Large Model programs
;
dgroup              group   data
data                segment word public 'DATA'
                    assume  ds:dgroup
data                ends
                    page
pgroup              group   prog
;
;         argument structure on stack long model
;
a                   struc
a_bp                dw      ?               ;saved bp
a_rtn               dw      ?               ;return address
                    dw      ?
a_1                 dw      ?               ;first argument
a_2                 dw      ?               ;second argument
a_3                 dw      ?               ;third argument
a_4                 dw      ?               ;fourth argument
a_5                 dw      ?
a                   ends
;
;         dos function calls
;
DOS_GET_DTA         equ     2fh             ;get dta address in es:bx
DOS_SET_DTA         equ     1ah             ;set dta address to ds:dx
DOS_FFMF            equ     4eh             ;find first matching file
DOS_FNMF            equ     4fh             ;find next matching file
```

```
DOS_MKDIR        equ     39h             ;make a directory
DOS_RMDIR        equ     3ah             ;remove a directory
DOS_CHDIR        equ     3bh             ;change directory
DOS_CREAT        equ     3ch             ;create a file
DOS_OPEN         equ     3dh             ;open a file
DOS_CLOSE        equ     3eh             ;close a file
DOS_READ         equ     3fh             ;read from a file
DOS_WRITE        equ     40h             ;write to a file
DOS_DELETE       equ     41h             ;delete a file
DOS_LSEEK        equ     42h             ;seek within a file
DOS_CHMODE       equ     43h             ;change file attribute
DOS_GTDIR        equ     47h             ;get the current directory
DOS_RENAME       equ     56h             ;rename a file
DOS_GET_DATE     equ     2ah             ;get date
DOS_GET_TIME     equ     2ch             ;get time
DOS_SET_DATE     equ     2bh             ;set date
DOS_SET_TIME     equ     2dh             ;set time
;
;       dos error codes
;
DE_IFN           equ     -1              ;Invalid function number
DE_FNF           equ     -2              ;file not found
DE_PNF           equ     -3              ;path not found
DE_TMOF          equ     -4              ;too many open files
DE_AD            equ     -5              ;access denied
DE_IH            equ     -6              ;invalid handle
DE_MCBD          equ     -7              ;memory control blocks destroyed
DE_IM            equ     -8              ;insufficient memory
DE_IMBA          equ     -9              ;invalid memory block address
DE_IE            equ     -10             ;invalid environment
DE_IF            equ     -11             ;invalid format
DE_IAC           equ     -12             ;invalid access code
DE_ID            equ     -13             ;invalid data
DE_IDS           equ     -15             ;invalid drive specified
DE_ATRCD         equ     -16             ;attempt to remove current directory
DE_NSD           equ     -17             ;not same device
DE_NMF           equ     -18             ;no more files ;       dos File Attribute Values FA_RO            equ     01h             ;file is read only
FA_HF            equ     02h             ;file is hidden file
FA_SF            equ     04h             ;file is system file
FA_VL            equ     08h             ;entry is volume label
FA_SD            equ     10h             ;entry is subdirectory
FA_A             equ     20h             ;archive bit: set to 1 when file
;                                         written to
                 page
;
;       program segment definition
;
prog             segment byte public 'PROG'
                 public  _pcvgcp
                 public  _pcvscp
                 public  _pcvwc
                 assume  cs:pgroup
;
;       dos function invocation
;
dos              macro   func
                 mov     ah,func         ;set function code
                 int     21h             ;dos interrupt
                 endm
                 page ;       bios functions
;
_pcvgcp          proc    far     ; get the cursor position
                 push    bp      ; save old frame pointer
                 mov     bp,sp   ; set the new frame pointer
                 push    bx
                 push    cx
                 push    dx
```

```
                mov     ah,3
                mov     bh,0
                int     10h
                push    es
                push    di
                mov     di,ss:[bp].a_1
                mov     es,ss:[bp].a_2
                mov     ch,0
                mov     cl,dh
                mov     word ptr es:[di],cx
                mov     di,ss:[bp].a_3
                mov     es,ss:[bp].a_4
                mov     cl,dl
                mov     word ptr es:[di],cx
                pop     di
                pop     es
                pop     dx
                pop     cx
                pop     bx
                pop     bp
                ret
_pcvgcp         endp _pcvscp         proc    far
                push    bp
                mov     bp,sp
                push    bx
                push    dx
                mov     dh,byte ptr ss:[bp].a_1
                mov     dl,byte ptr ss:[bp].a_2
                mov     bh,0
                mov     ah,2
                int     10h
                pop     dx
                pop     bx
                pop     bp
                ret
_pcvscp         endp _pcvwc          proc    far
                push    bp
                mov     bp,sp
                mov     ah,10
                push    bx
                push    cx
                mov     bh,0
                mov     cx,1
                mov     bl,byte ptr ss:[bp].a_2
                mov     al,byte ptr ss:[bp].a_1
                int     10h
                pop     cx
                pop     bx
                pop     bp
                ret
_pcvwc          endp
prog            ends
                end

.END
```

What is claimed is:

1. A human interactive adaptive inference system having an operative program for predicting causes of a previously unobserved fault appearing in an electric or electronic device or assembly from relationships with other known and previously stored fault data and information gathered for said electric or electronic device or assembly in prior tests, said adaptive inference system comprising:

a) testing means for performing position dependent, time-ordered tests upon electrical or electronic devices or assemblies to provide a test data array containing a pattern of faults;

b) storage means defining a reference array containing stored data and information representing patterns of faults of said electric or electronic device or assembly, and data and information patterns of said electrical or electronic device or assembly that conforms to operating requirements, said reference array having means for receiving and incorporating information representative of human judgment, which incorporated information is added to the fault patterns;

c) display means operatively connected to said data array of said testing means and said reference array of said storage means for displaying fault data and information;

d) means operatively connected to said data array of said testing means and said reference array of said storage means for entering human judgment information to said fault patterns to assist in obtaining a diagnostic analysis of said fault patterns; and e) comparison means operatively connected to said data array of said testing means and said reference array of said storage means for providing a diagnostic analysis of said electrical or electronic device or assembly in accordance with said entered human judgment information, said comparison means being able to discern variances in fault data patterns from data patterns obtained from previously tested conforming electrical and electronic devices or assemblies, whereby said human interactive adaptive inference system is able to learn and predict causes of faults that were not previously experienced or stored within said human interactive adaptive inference system.

2. The human interactive adaptive inference system of claim 1, wherein said testing means includes means for receiving test parameters.

3. The human interactive adaptive inference system of claim 1, wherein said storage means defining a reference array includes a tolerance data array.

4. The human interactive inference system of claim 1, wherein said at least one of a plurality of operating modes can be selected in accordance with said program.

* * * * *